(12) United States Patent
Clarke et al.

(10) Patent No.: US 11,112,436 B2
(45) Date of Patent: Sep. 7, 2021

(54) SPARK GAP STRUCTURES FOR DETECTION AND PROTECTION AGAINST ELECTRICAL OVERSTRESS EVENTS

(71) Applicant: ANALOG DEVICES INTERNATIONAL UNLIMITED COMPANY, Limerick (IE)

(72) Inventors: David J. Clarke, Patrickswell (IE); Stephen Denis Heffernan, Co. Tipperary (IE); Nijun Wei, Lianyungang (CN); Alan J. O'Donnell, Castletroy (IE); Patrick Martin McGuinness, Pallaskenry (IE); Shaun Bradley, Patrickswell (IE); Edward John Coyne, Athenry (IE); David Aherne, Limerick (IE); David M. Boland, Limerick (IE)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 16/360,356

(22) Filed: Mar. 21, 2019

(65) Prior Publication Data

US 2019/0293692 A1    Sep. 26, 2019

Related U.S. Application Data

(60) Provisional application No. 62/648,360, filed on Mar. 26, 2018, provisional application No. 62/648,745, filed on Mar. 27, 2018.

(51) Int. Cl.
*G01R 19/165* (2006.01)
*G01R 31/00* (2006.01)
(Continued)

(52) U.S. Cl.
CPC ..... *G01R 19/16504* (2013.01); *G01R 31/002* (2013.01); *G01R 31/2832* (2013.01);
(Continued)

(58) Field of Classification Search
CPC ............ G01R 19/16504; G01R 31/002; G01R 31/2832; G01R 31/2856; G01R 19/165;
(Continued)

(56) References Cited

U.S. PATENT DOCUMENTS

| 3,810,063 A | 5/1974 | Blewitt |
| 4,514,712 A * | 4/1985 | McDougal ............. H01F 38/12 123/169 PA |

(Continued)

FOREIGN PATENT DOCUMENTS

| CN | 1628382 A | 6/2005 |
| CN | 101350516 A | 1/2009 |

(Continued)

OTHER PUBLICATIONS

International Search Report and Written Opinion dated Oct. 19, 2019 in corresponding PCT Application No. PCT/EP2019/057472; 14 pages.

(Continued)

*Primary Examiner* — Christopher P McAndrew
(74) *Attorney, Agent, or Firm* — Knobbe, Martens, Olson & Bear, LLP

(57) ABSTRACT

The disclosed technology generally relates to electrical overstress protection devices, and more particularly to electrical overstress monitoring devices for detecting electrical overstress events in semiconductor devices. In one aspect, an electrical overstress monitor and/or protection device includes a two different conductive structures configured to electrically arc in response to an EOS event and a sensing circuit configured to detect a change in a physical property (Continued)

of the two conductive structures caused by the EOS event. The two conductive structures have facing surfaces that have different shapes.

20 Claims, 66 Drawing Sheets

(51) Int. Cl.
    *G01R 31/28*     (2006.01)
    *H02H 9/04*     (2006.01)
    *H01L 27/02*     (2006.01)
    *H01L 23/60*     (2006.01)
    *H01L 23/62*     (2006.01)
    *H01L 23/525*     (2006.01)
    *H02H 9/00*     (2006.01)

(52) U.S. Cl.
    CPC ...... *G01R 31/2856* (2013.01); *H01L 23/5256* (2013.01); *H01L 23/60* (2013.01); *H01L 23/62* (2013.01); *H01L 27/0288* (2013.01); *H02H 9/00* (2013.01); *H02H 9/042* (2013.01)

(58) Field of Classification Search
    CPC .. G01R 31/2884; G01R 31/2879; H02H 9/00; H02H 9/042; H02H 9/041; H02H 9/044; H01L 27/0288; H01L 23/60; H01L 23/62; H01L 23/5256
    USPC ...................................................... 324/76.11
    See application file for complete search history.

(56) References Cited

U.S. PATENT DOCUMENTS

| | | | |
|---|---|---|---|
| 4,726,991 A | 2/1988 | Hyatt et al. | |
| 4,939,619 A * | 7/1990 | Borkowicz | H01C 7/12 257/177 |
| 5,315,472 A | 5/1994 | Fong et al. | |
| 5,786,613 A | 7/1998 | Kalnitsky | |
| 6,977,468 B1 * | 12/2005 | Baginski | H01J 17/46 313/602 |
| 8,633,575 B1 | 1/2014 | Mangrum | |
| 9,184,569 B2 | 11/2015 | Ehrhardt et al. | |
| 9,575,111 B1 | 2/2017 | Karp et al. | |
| 9,871,373 B2 | 1/2018 | O'Donnell et al. | |
| 10,380,869 B1 | 8/2019 | Matyac | |
| 10,418,806 B2 | 9/2019 | Lopez Rodriguez et al. | |
| 10,418,808 B2 | 9/2019 | Bodette et al. | |
| 10,677,822 B2 * | 6/2020 | Clarke | G01N 25/04 |
| 2001/0002103 A1 | 5/2001 | Karins et al. | |
| 2002/0076840 A1 | 6/2002 | Englisch | |
| 2003/0089979 A1 | 5/2003 | Malinowski et al. | |
| 2006/0044717 A1 * | 3/2006 | Hill | H05K 1/026 361/56 |
| 2006/0250744 A1 * | 11/2006 | McTigue | H01T 4/08 361/120 |
| 2006/0274799 A1 | 12/2006 | Collins et al. | |
| 2006/0284307 A1 | 12/2006 | Baier et al. | |
| 2007/0139050 A1 * | 6/2007 | Ivanov | G01R 31/002 324/457 |
| 2007/0201177 A1 * | 8/2007 | Kladar | H01H 85/44 361/118 |
| 2007/0216015 A1 * | 9/2007 | Schnitt | H01L 27/0248 257/692 |
| 2008/0050113 A1 | 2/2008 | Mathes | |
| 2008/0122027 A1 * | 5/2008 | Ueda | H01L 23/5256 257/529 |
| 2008/0266730 A1 | 10/2008 | Viborg et al. | |
| 2009/0287435 A1 | 11/2009 | Ker et al. | |
| 2010/0271742 A1 | 10/2010 | Shannon et al. | |
| 2011/0069419 A1 | 3/2011 | Su et al. | |
| 2011/0089540 A1 * | 4/2011 | Drost | H01L 27/0288 257/660 |
| 2011/0169495 A1 | 7/2011 | Lee et al. | |
| 2013/0257624 A1 | 10/2013 | Ayotte et al. | |
| 2014/0268440 A1 | 9/2014 | Chen et al. | |
| 2014/0334050 A1 * | 11/2014 | Henke | H02H 1/0015 361/91.5 |
| 2015/0001635 A1 | 1/2015 | Kwon | |
| 2016/0009547 A1 | 1/2016 | Mason et al. | |
| 2016/0094026 A1 * | 3/2016 | Coyne | H02H 7/16 361/17 |
| 2016/0285255 A1 | 9/2016 | O'Donnell et al. | |
| 2016/0322813 A1 * | 11/2016 | Aipperspach | H02H 9/041 |
| 2017/0299649 A1 * | 10/2017 | Coyne | G01R 31/2874 |
| 2018/0088155 A1 * | 3/2018 | Clarke | H01L 23/5256 |
| 2018/0115155 A1 | 4/2018 | Kuo | |

FOREIGN PATENT DOCUMENTS

| | | |
|---|---|---|
| CN | 101689750 A | 3/2010 |
| CN | 102201666 A | 9/2011 |
| CN | 102570902 A | 7/2012 |
| CN | 102769282 A | 11/2012 |
| CN | 202549831 U | 11/2012 |
| CN | 203562642 U | 4/2014 |
| CN | 103872670 A | 6/2014 |
| TW | 2003-03060 | 8/2003 |
| TW | 2013-10828 | 3/2013 |
| WO | WO 2013/009661 A2 | 1/2013 |
| WO | WO 2012/090731 A1 | 6/2014 |

OTHER PUBLICATIONS

Invitation to Pay Additional Fees dated Aug. 16, 2019 in PCT Patent Application No. PCT/EP2019/057472; 13 pages.
Office Action dated Feb. 25, 2020 in Taiwan Patent Application No. 108110439.
European Patent Office Communication dated Feb. 18, 2019 in European Patent Application No. 17 193 556; 7 pages.
European Search Report for European Application No. 17193556.2, dated Mar. 6, 2018 in 17 pages.
Extended European Search Report dated Jun. 19, 2018 in corresponding European Patent Application No. 17193556.2; 16 pages.
Office Action dated Jul. 22, 2019 in P.R.C. Patent Application No. 201710890198.9; 10 pages.
Office Action dated Jan. 25, 2021 in Chinese Application No. 201710890198.9.

\* cited by examiner

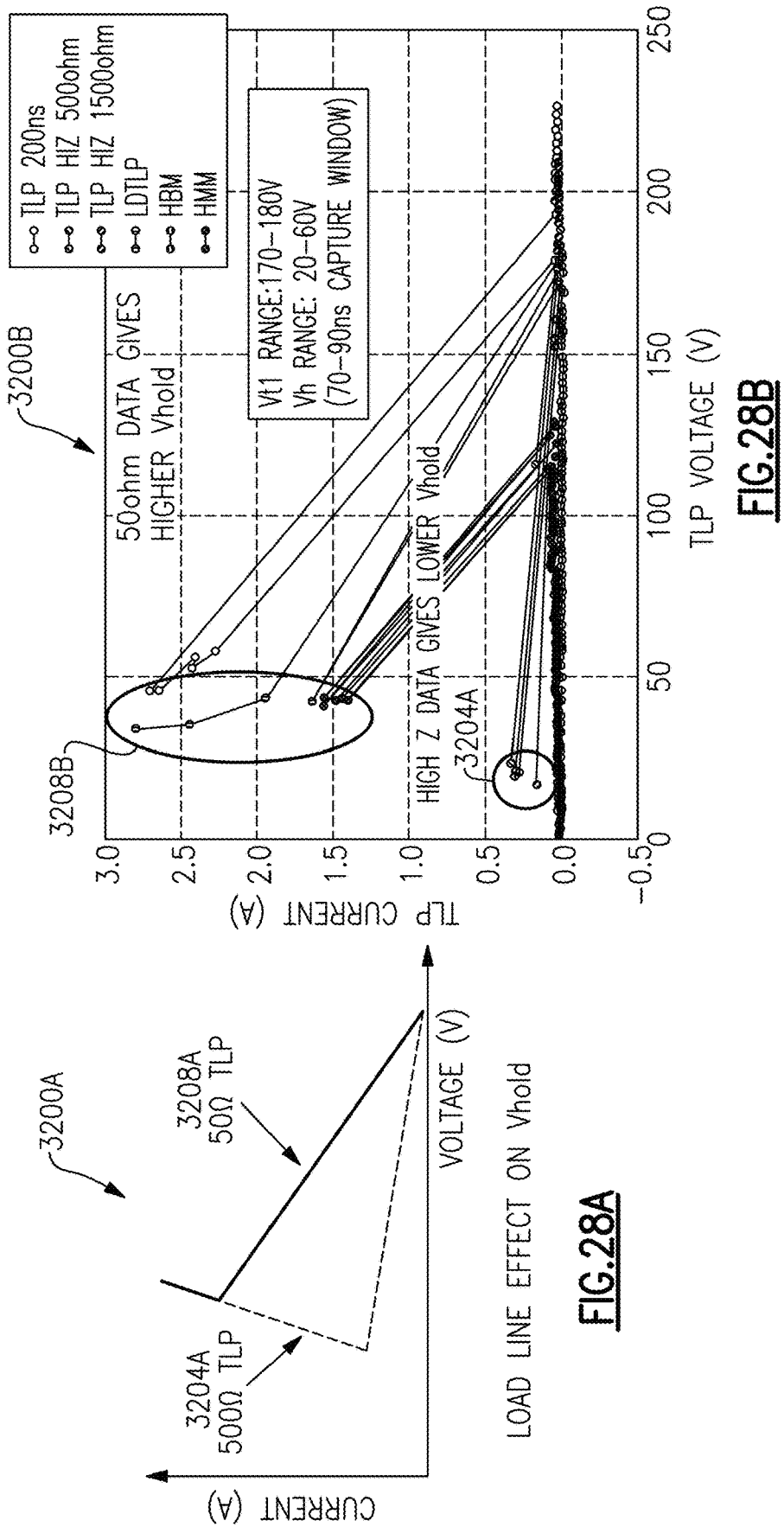

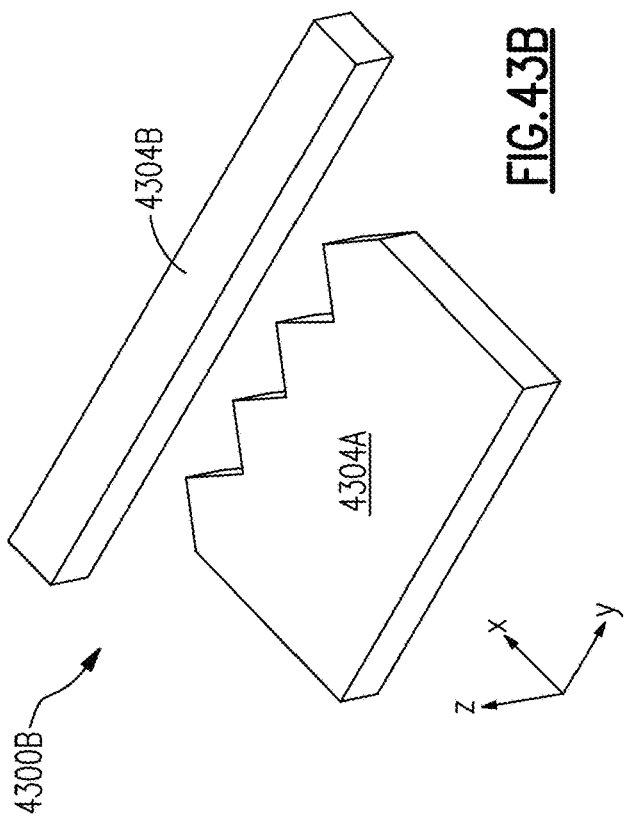
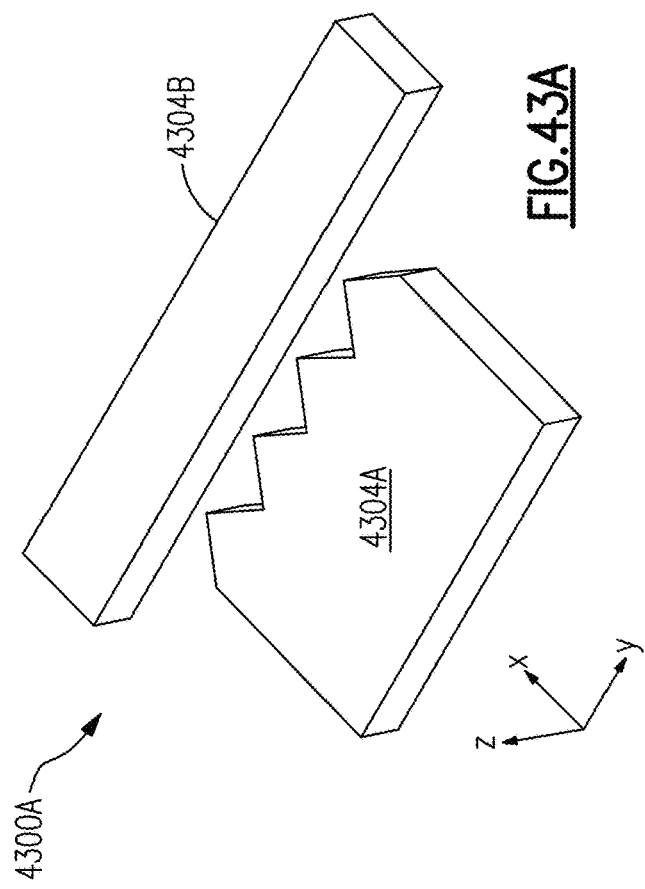

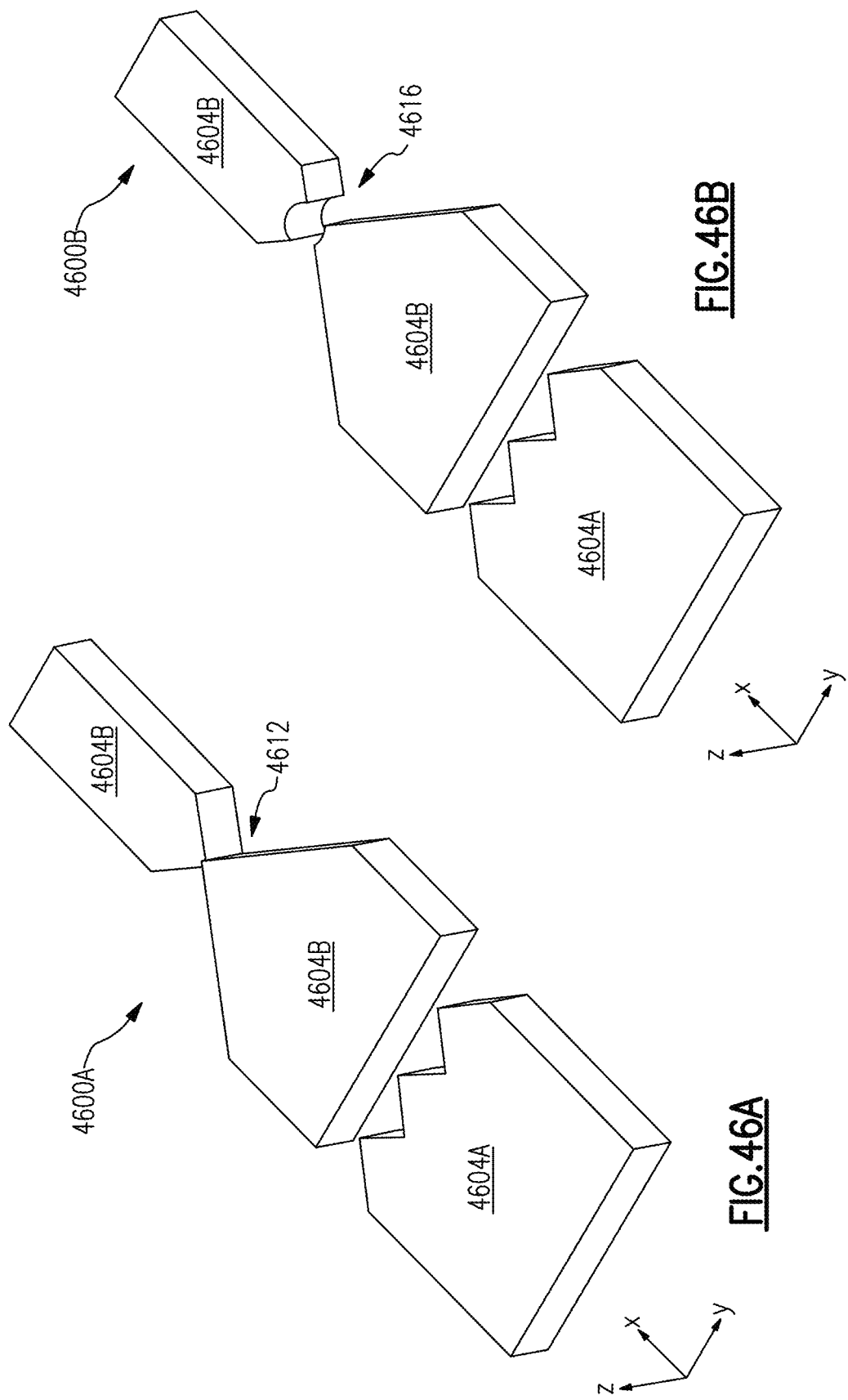

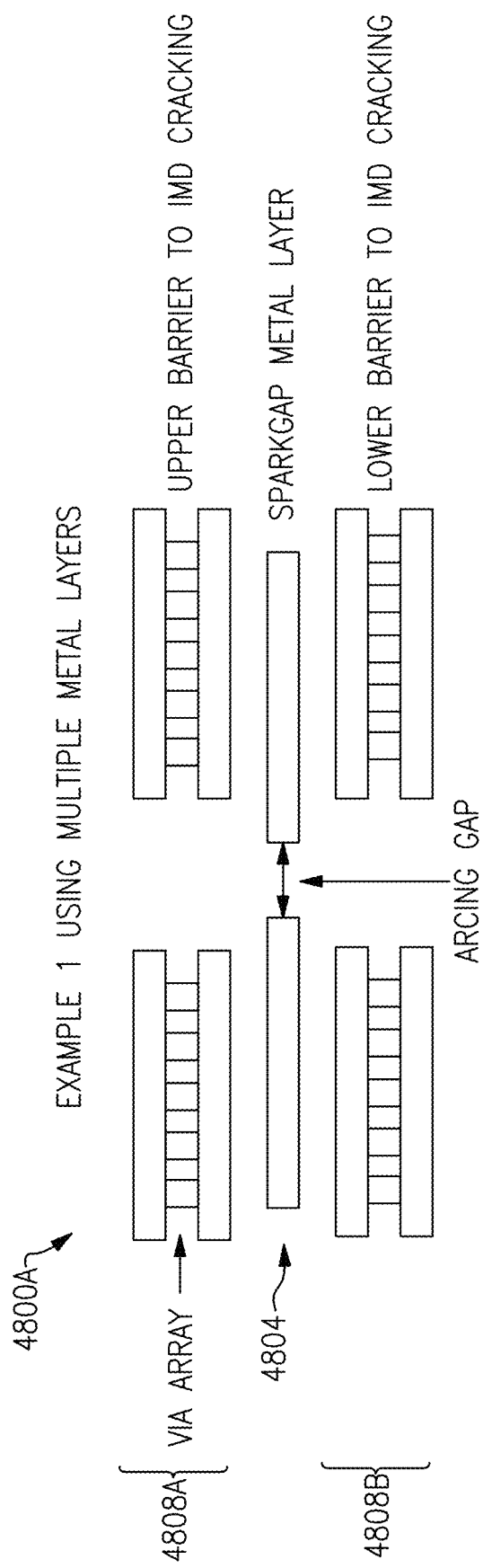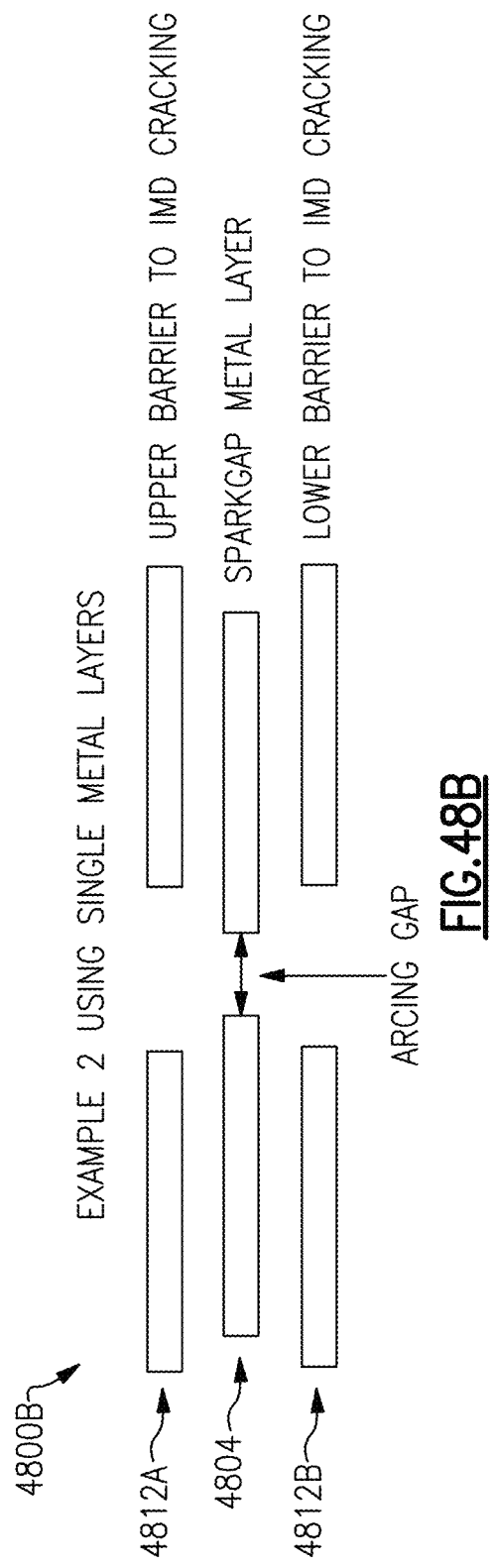

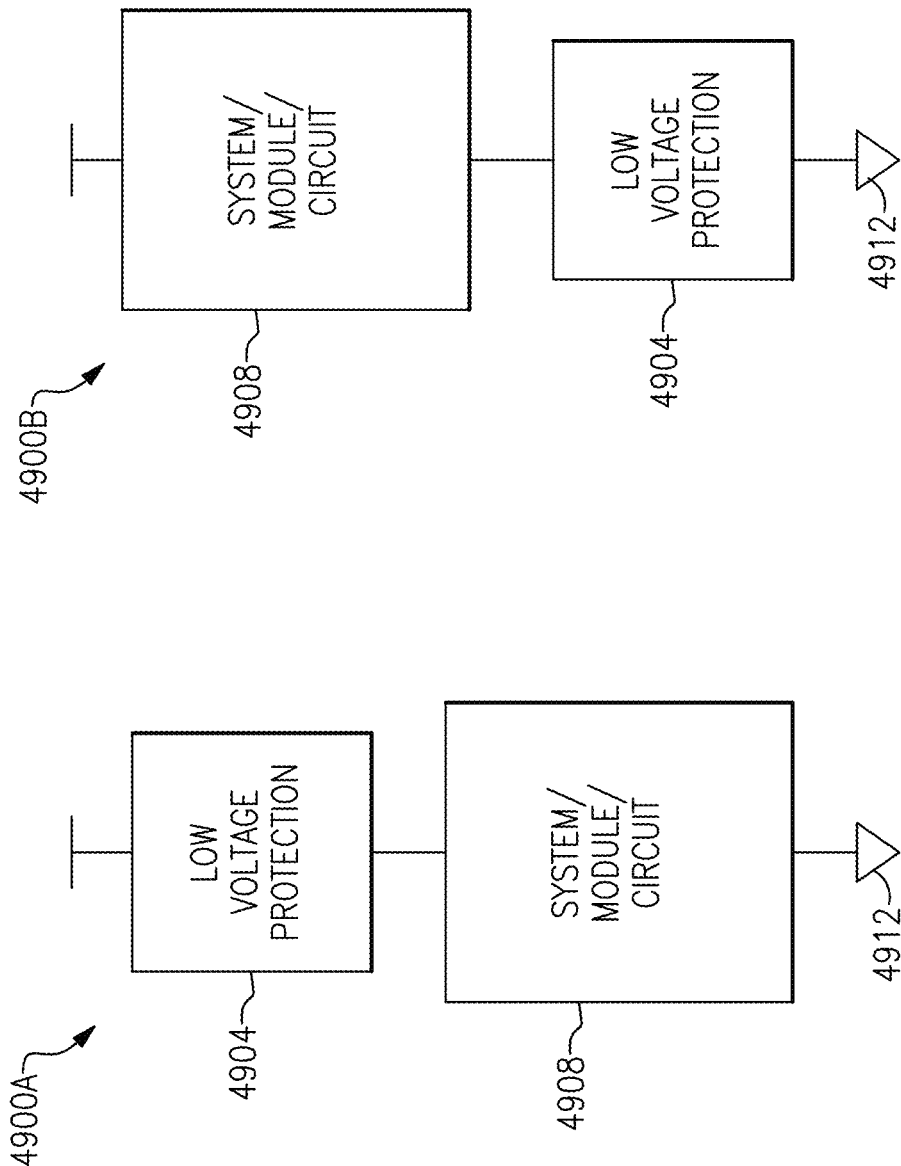

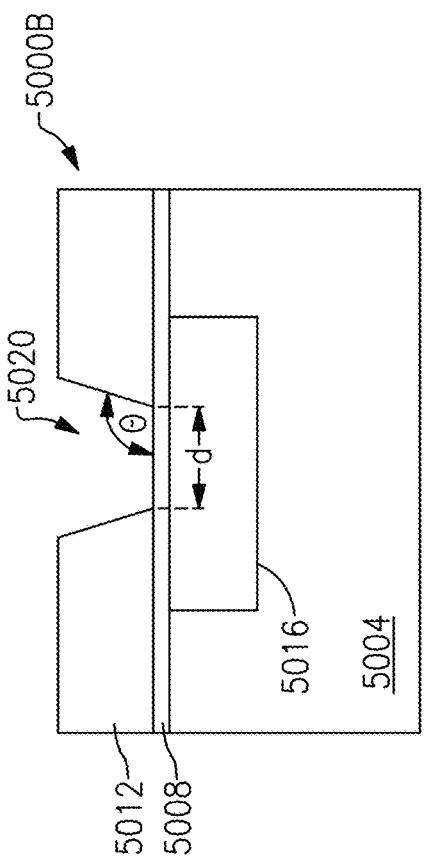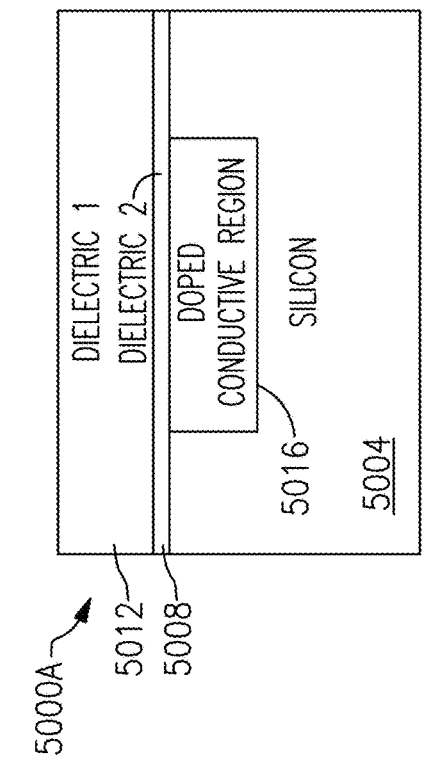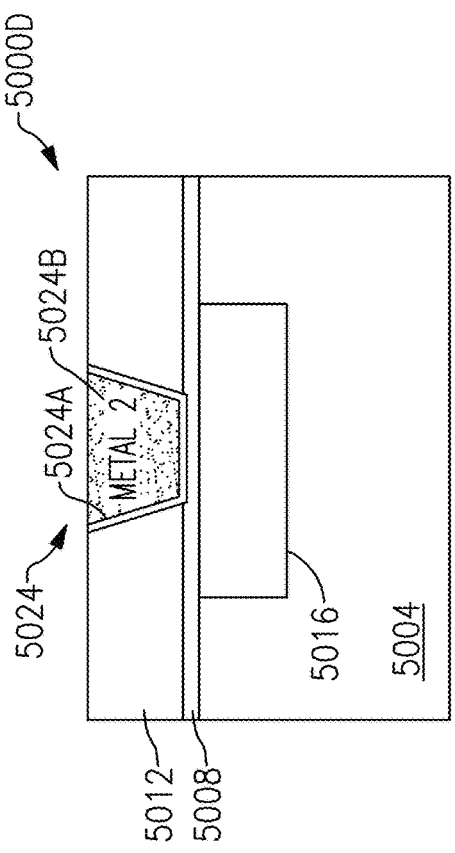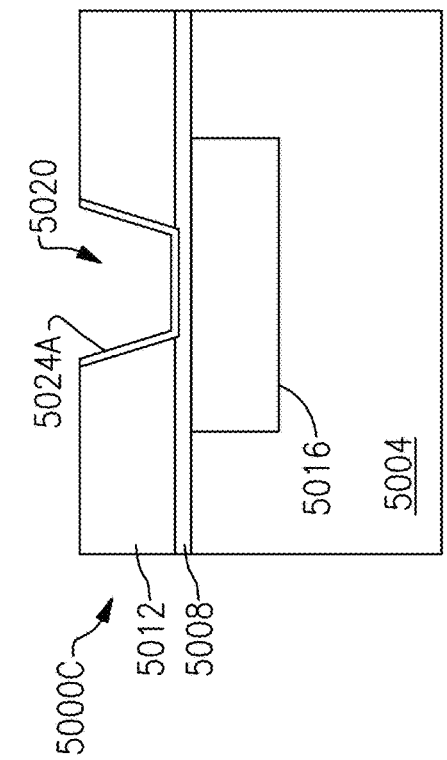

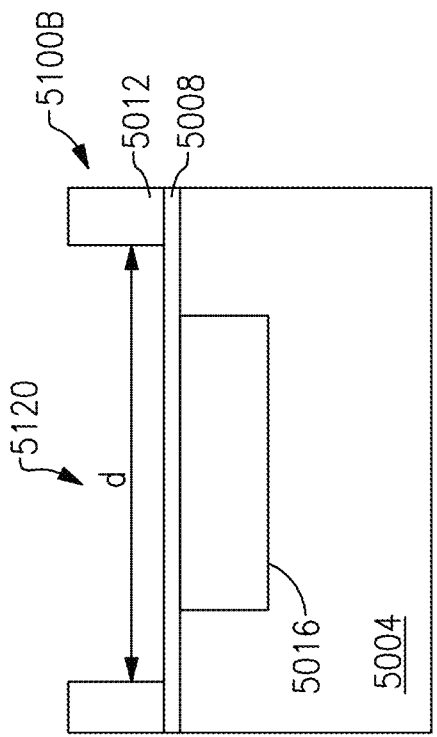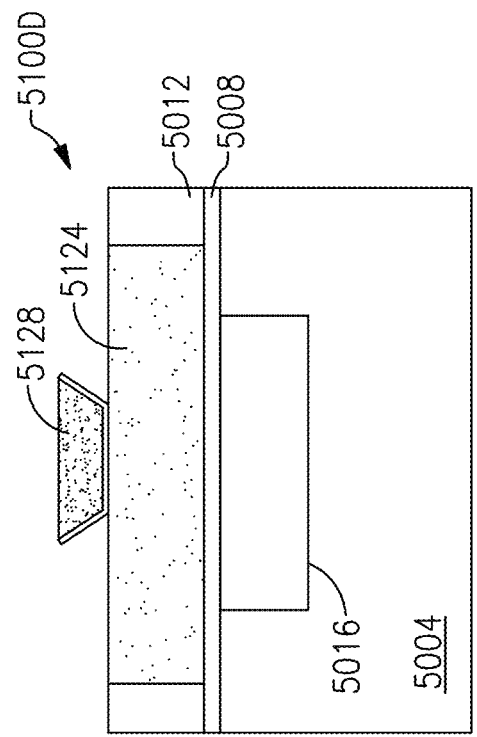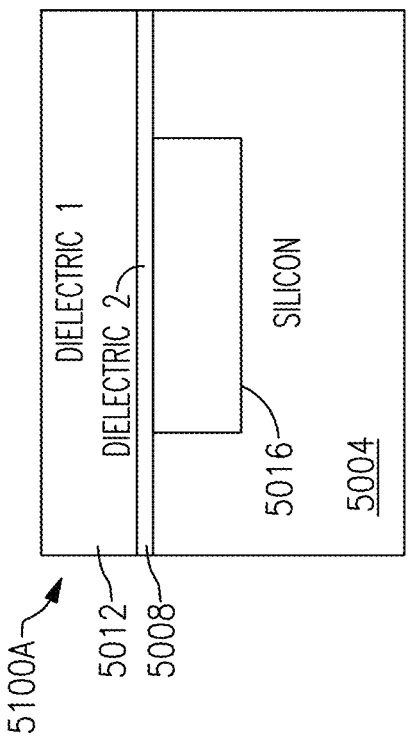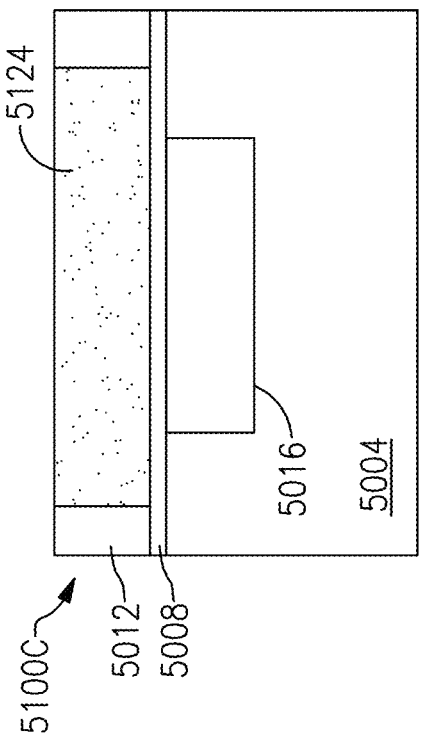

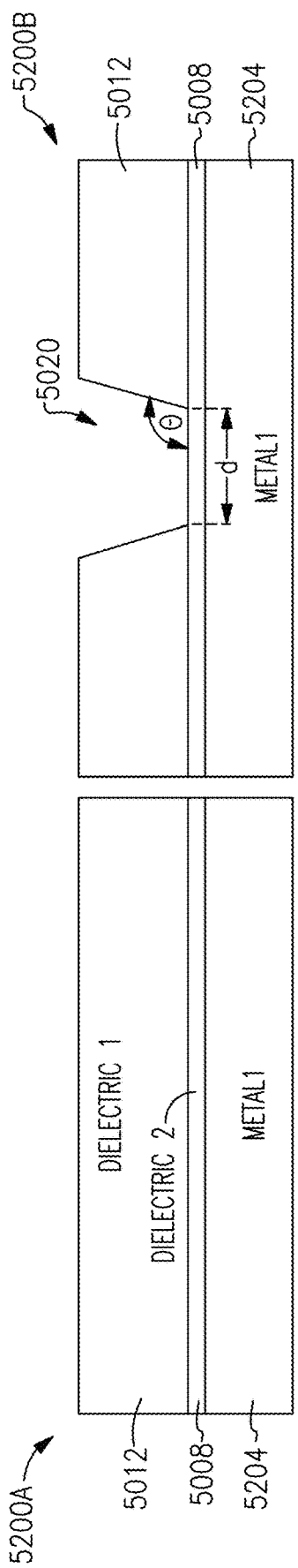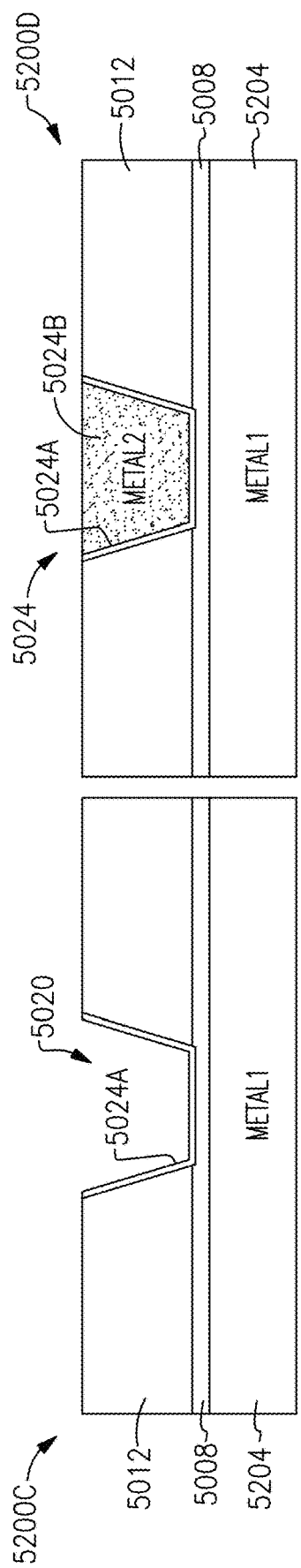

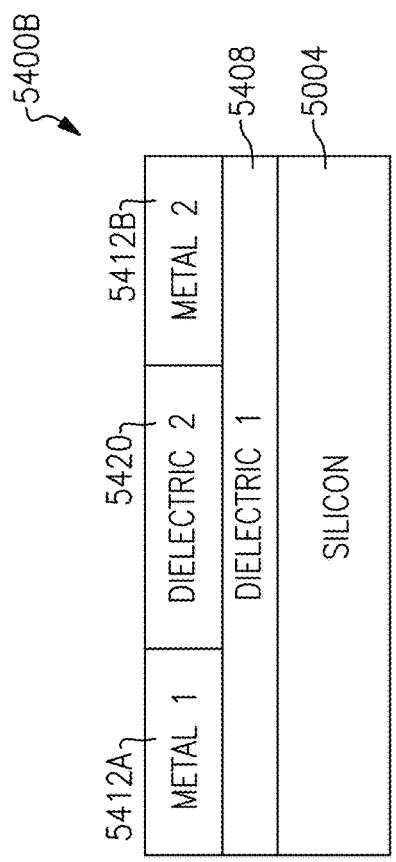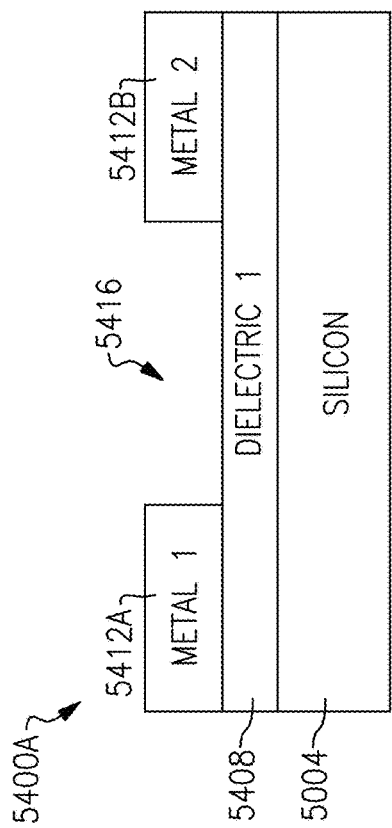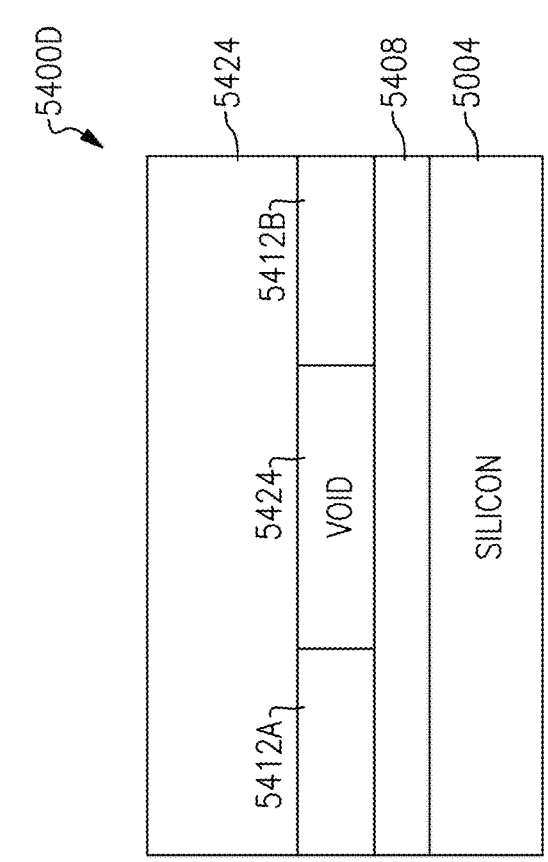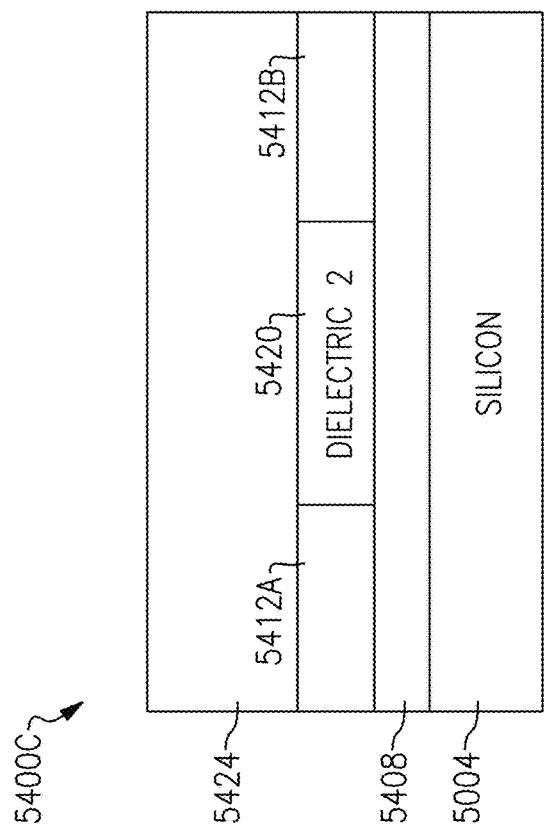

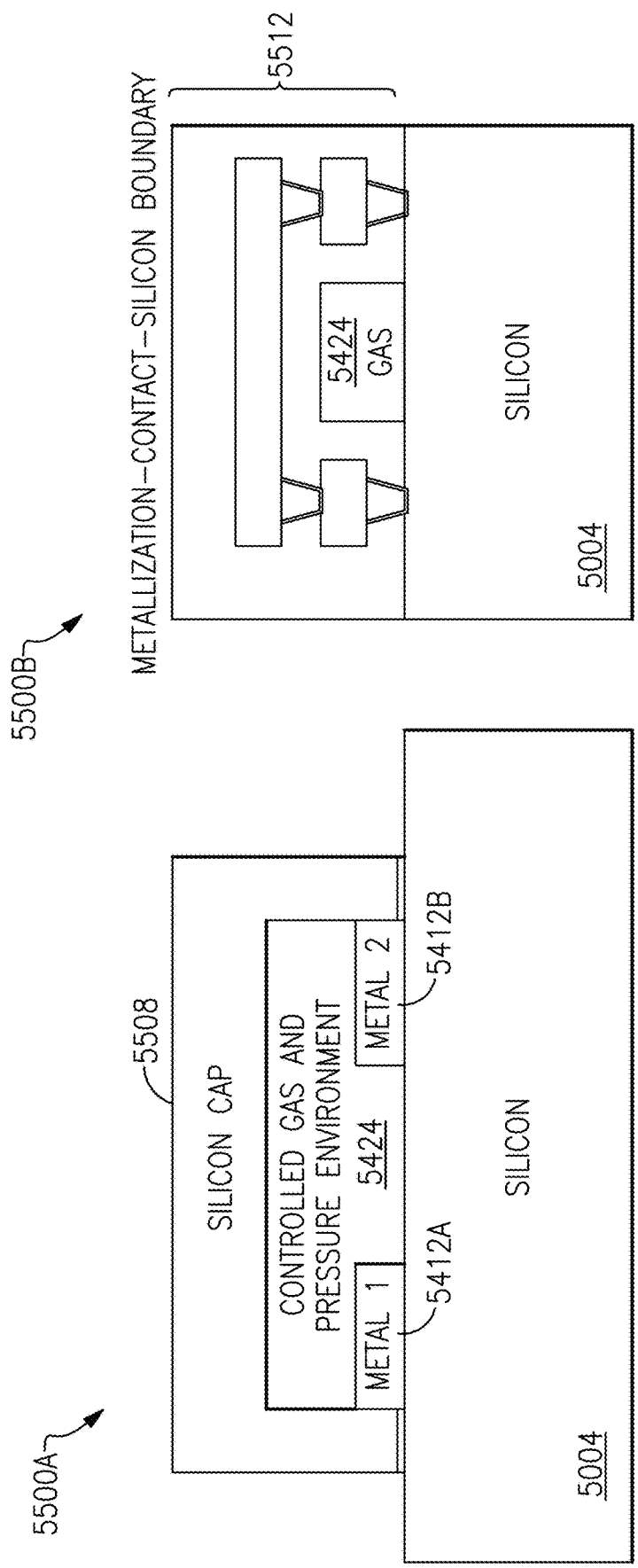

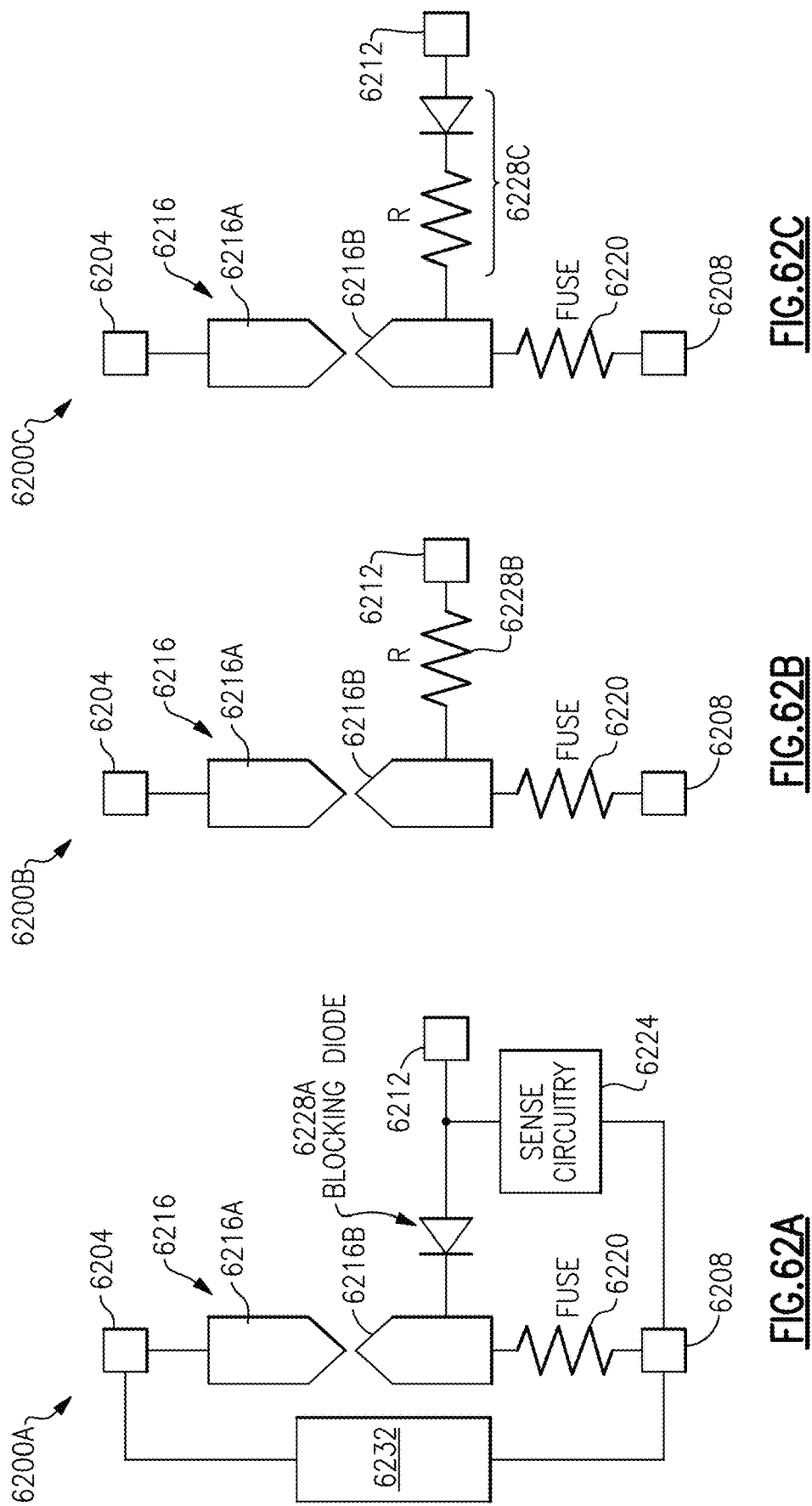

DETECTED EOS EVENTS ARE FLAGGED WIRELESSLY FROM REMOTE LOCATIONS TO "COMMAND CENTER".

PLANAR OR COMPLEX 3D STRUCTURE OF MANY LAYERS

SPARK GAP STRUCTURES FOR DETECTION AND PROTECTION AGAINST ELECTRICAL OVERSTRESS EVENTS

INCORPORATION BY REFERENCE

This application claims the benefit of priority of U.S. Provisional Application No. 62/648,360, filed Mar. 26, 2018, and U.S. Provisional Application No. 62/648,745, filed Mar. 27, 2018, the entire disclosures of which are incorporated herein by reference in their entireties for all purposes.

This application is also related to U.S. application Ser. No. 15/708,958, filed Sep. 19, 2017, the entire disclosure of which is incorporated by reference herein for all purposes.

FIELD OF THE DISCLOSURE

The disclosed technology generally relates to devices for addressing electrical overstress, and more particularly to device for detecting, monitoring, and/or protecting against electrical overstress events in semiconductor devices.

BACKGROUND

Certain electronic systems can be exposed to electrical overstress (EOS) events. Such events can cause damage to an electronic device as a result of the electronic device experiencing a current and/or a voltage that is beyond the specified limits of the electronic device. For example, an electronic device can experience a transient signal event, or an electrical signal lasting a short duration and having rapidly changing voltage and/or current and having high power. Transient signal events can include, for example, electrostatic discharge (ESD) events arising from an abrupt release of charge from an object or person to an electronic system, or a voltage/current spike from the electronic device's power source. In addition, EOS events can occur whether or not the device is powered.

Electrical overstress events, such as transient signal events, can damage integrated circuits (ICs) due to overvoltage conditions and high levels of power dissipation in relatively small areas of the ICs, for example. High power dissipation can increase IC temperature, and can lead to numerous problems, such as gate oxide punch-through, junction damage, metal damage, surface charge accumulation, the like, or any combination thereof.

To diagnose device failures or predict device lifespan, it can be useful to characterize EOS events, e.g., in terms of voltage, power, energy and duration. However, such characterization is difficult, for example, because the duration of some EOS events can be extremely short. Thus, there is a need to develop an EOS monitor that can detect and relay a warning, and can provide at information about EOS events that are at least semi-quantitative.

SUMMARY OF SOME ASPECTS OF THE DISCLOSURE

In an aspect, an electrical overstress (EOS) monitor/protection device comprises two different conductive structures separated by a gap therebetween and configured to electrically arc in response to an EOS event, wherein facing surfaces of the two conductive structures have different shapes. The EOS monitor/protection device additionally comprises a sensing circuit configured to detect a change in physical property of EOS monitor/protection device caused by the EOS event.

In another aspect, an electrical overstress (EOS) monitor/protection device comprises a pair of conductive structures configured to electrically arc in response to an EOS event at a trigger voltage less than about 100V. The two conductive structures are integrated on a semiconductor substrate and separated by a dielectric layer serving as an arcing medium.

In another aspect, an electrical overstress (EOS) monitor/protection device comprises a pair of conductive structures configured to electrically arc in response to an EOS event and a fuse electrically connected to one of the conductive structures. The EOS monitor/protection device additionally comprises a blocking device electrically connected to the one of the conductive structures and configured such that a greater amount of current flows through the fuse relative to the blocking device in response to the EOS event.

In another aspect, an electrical overstress (EOS) monitor device comprises an EOS monitor structure comprising one or more spark gap structures configured to electrically arc in response to an EOS signal. The EOS monitor device additionally comprises a sensing circuit configured to detect a change in a physical property of the EOS monitor structure caused by the EOS signal.

In another aspect, an integrated circuit device comprises a semiconductor substrate and one or more spark gap structures integrated on the semiconductor substrate and configured to electrically arc in response to an EOS signal at a trigger voltage less than about 100V.

In another aspect, an apparatus comprises a pair of conductive structures serving as a cathode-anode pair configured to electrically arc in response to an EOS signal, the apparatus further comprising an integrated fuse serially connected to the pair of conductive structures.

In another aspect, an apparatus comprises a pair of conductive structures serving as a cathode-anode pair configured to electrically arc in response to an EOS signal, wherein one but not the other of two conductive structures of the pair comprises a plurality of protrusions.

In another aspect, an apparatus comprises a pair of conductive structures serving as a cathode-anode pair configured to electrically arc in response to an EOS signal, wherein one of the conductive structures comprises a straight edge facing the other of the conductive structures.

In another aspect, an apparatus comprises a pair of conductive structures serving as a cathode-anode pair configured to electrically arc in response to an EOS signal, wherein one of the pair of conductive structures comprises a conductive line configured to be reduced in width upon passing current therethrough, such that a gap distance between the pair of conductive structures is tunable.

In another aspect, an apparatus comprises a pair of conductive structures serving as a cathode-anode pair configured to electrically arc in response to an EOS signal, wherein one or both of the conductive structures are configured to be positionally displaced relative to one another such that a gap distance between the pair of conductive structures is tunable.

In another aspect, an apparatus comprises a pair of conductive structures serving as a cathode-anode pair configured to electrically arc in response to an EOS signal, wherein the conductive structures comprises a first conductive structure serving as one of a cathode or an anode during arcing, and a second conductive structures laterally surrounding the first conductive structure and serving as the other of the cathode or the anode during arcing.

In another aspect, an apparatus comprises a plurality of pairs of conductive structures serving as cathode-anode pairs configured to electrically arc in response to an EOS signal, wherein different pairs of conductive structures are interposed by different arcing media, such that the different pairs are configured to arc under different conditions.

In another aspect, an apparatus comprises a plurality of pairs of conductive structures vertically stacked over a substrate, wherein each of the pairs of serves as a cathode-anode pair configured to electrically arc in response to an EOS signal.

In another aspect, an apparatus comprises a pair of conductive structures serving as a cathode-anode pair configured to electrically arc in response to an EOS signal, wherein the pair of conductive structures comprises a partial conductive via formed between two metal layers, wherein the partial conductive via contacts one of the two metal layers at a first end while being separated from the other of the two metal layers at a second end.

In another aspect, an apparatus comprises a pair of conductive structures serving as cathode-anode pair configured to electrically arc in response to an EOS signal, wherein the pair of conductive structures comprises a doped region in a semiconductor substrate that is doped heavier relative to a semiconductor substrate, the doped region serving as one of a cathode or an anode during arcing, and a conductive structure formed above the doped region serving as the other of the cathode or the anode during arcing, wherein the doped region and the conductive structure are interposed by a dielectric layer.

In another aspect, an apparatus comprises a conductive layer formed over the substrate serving as one of a cathode or an anode during arcing and a conductive structure formed above the conductive layer serving as the other of the cathode or the anode during arcing, wherein the conductive layer and the conductive structure is interposed by a dielectric layer.

In another aspect, an apparatus comprises one or more spark gap structures, wherein the one or more spark gap structures comprise a pair of metal layers laterally separated by void, wherein the pair of metal layers are formed vertically between dielectric layers.

In another aspect, an apparatus comprises a plurality of pairs of conductive structures serving as cathode-anode pairs configured to electrically arc in response to an EOS signal, wherein the pairs of conductive structures comprise a first conductive structure serving as one of a cathode or an anode during arcing, and a plurality of second conductive structures serving as the other of the cathode or the anode during arcing.

In another aspect, an apparatus comprises a pair of conductive structures serving as a cathode-anode pair configured to electrically arc in response to an EOS signal, wherein the apparatus further comprises a fuse connected electrically in series to one of the conductive structures, and wherein the apparatus further comprises a blocking device formed between the one of the conductive structures and a sensing circuit, wherein the blocking device is configured such that a current path through the blocking device is a higher resistance path relative to a current path through the fuse.

In another aspect, an apparatus comprises a plurality of pairs of conductive structures serving as cathode-anode pairs configured to electrically arc in response to an EOS signal, wherein the pairs of conductive structures are isolated from each other by a tub isolation comprising a buried doped layer formed in a substrate.

In another aspect, an electrical overstress (EOS) monitor/protection device comprises two conductive structures separated by a gap therebetween and configured to electrically arc in response to an EOS event, wherein facing surfaces of the two conductive structures comprise straight edges that extend in a direction orthogonal to a direction of shortest separation between the conductive structures. The EOS monitor/protection device additionally comprises a sensing circuit configured to detect a change in a physical property of the EOS monitor/protection device caused by the EOS event.

In another aspect, an electrical overstress (EOS) monitor/protection device comprises two conductive structures separated by a gap therebetween and configured to electrically arc in response to an EOS event, wherein the two conductive structures are formed at a first metallization level. The EOS monitor/protection device additionally comprises a barrier structure formed at one or both of a second metallization and a third metallization that are metallization levels immediately adjacent to the first metallization level, wherein the barrier structure is configured to suppress formation or propagation of a crack caused the EOS event.

BRIEF DESCRIPTION OF THE DRAWINGS

Embodiments of this disclosure will now be described, by way of non-limiting example, with reference to the accompanying drawings.

FIG. 28A schematically illustrates experimentally controlling effective holding voltage under transmission line pulse testing using transmission lines that have different load values.

FIG. 28B illustrates experimental verification of the effect of load values on holding voltage illustrated with respect to FIG. 28A.

FIGS. 43A-43B are schematic perspective views of before and after a post-fabrication adjustment of a gap between a pair of conductive structures of an EOS monitor/protection device that is configured to arc in response to an EOS event, where a first conductive structure includes one or more protrusions and serves as one of a cathode or an anode, and a second conductive structure comprises a line having an adjustable width that serves as the other of the cathode or the anode, according to embodiments.

FIGS. 46A-46B are schematic perspective views before and after triggering (arcing) of a pair of conductive structures of an EOS monitor/protection device that is configured to self-limit the current flow through an integrated fuse structure, according to embodiments.

FIG. 48A is a schematic side view of a metallization structure including a pair of conductive structures of an EOS monitor/protection device that is configured to arc in response to an EOS event, where the device is interposed between barrier structures configured to suppress formation and/or propagation of cracks, according to embodiments.

FIG. 48B is a schematic side view of a metallization structure including a pair of conductive structures of an EOS monitor/protection device that is configured to arc in response to an EOS event, where the device is interposed between barrier structures configured to suppress formation and/or propagation of cracks, according to embodiments.

FIG. 49A illustrates an integrated system that includes a low voltage EOS monitor/protection device electrically connected to and configured to monitor and/or protect a core system/module/circuit, where the low voltage EOS monitor/ protection device includes a pair of conductive structures that is configured to arc in response to an EOS event, according to embodiments.

FIG. 49B illustrates an integrated system that includes a low voltage EOS monitor/protection device electrically connected to and configured to monitor and/or protect a core system/module/circuit, where the low voltage EOS monitor/protection device includes a pair of conductive structures that is configured to arc in response to an EOS event, according to embodiments.

FIGS. 50A-50D illustrate side views of intermediate structures at various stages of fabricating a pair of conductive structures of an EOS monitor/protection device that is configured to arc in response to an EOS event at a trigger voltage less than about 100V, according to embodiments.

FIGS. 51A-51D illustrate side views of intermediate structures at various stages of fabricating a pair of conductive structures of an EOS monitor/protection device that is configured to arc in response to an EOS event at a trigger voltage less than about 100V, according to embodiments.

FIGS. 52A-52D illustrate side views of intermediate structures at various stages of fabricating a pair of conductive structures of an EOS monitor/protection device that is configured to arc in response to an EOS event at a trigger voltage less than about 100V, according to embodiments.

FIGS. 53A-53D illustrate side views of intermediate structures at various stages of fabricating a pair of conductive structures of an EOS monitor/protection device that is configured to arc in response to an EOS event at a trigger voltage less than about 100V, according to embodiments.

FIGS. 54A-54D illustrate side views of intermediate structures at various stages of fabricating a pair of conductive structures of an EOS monitor/protection device that is configured to electrically arc in response to an EOS event, where the arcing medium can be customized, according to embodiments.

FIG. 55A illustrates a side view of a pair of conductive structures of an EOS monitor/protection device that is configured to electrically arc in response to an EOS event, where the arcing medium is a sealed gas environment, according to some embodiments.

FIG. 55B illustrates a side view of a pair of conductive structures of an EOS monitor/protection device that is configured to electrically arc in response to an EOS event, where the arcing medium is a sealed gas environment, according to some embodiments.

Figure 56:
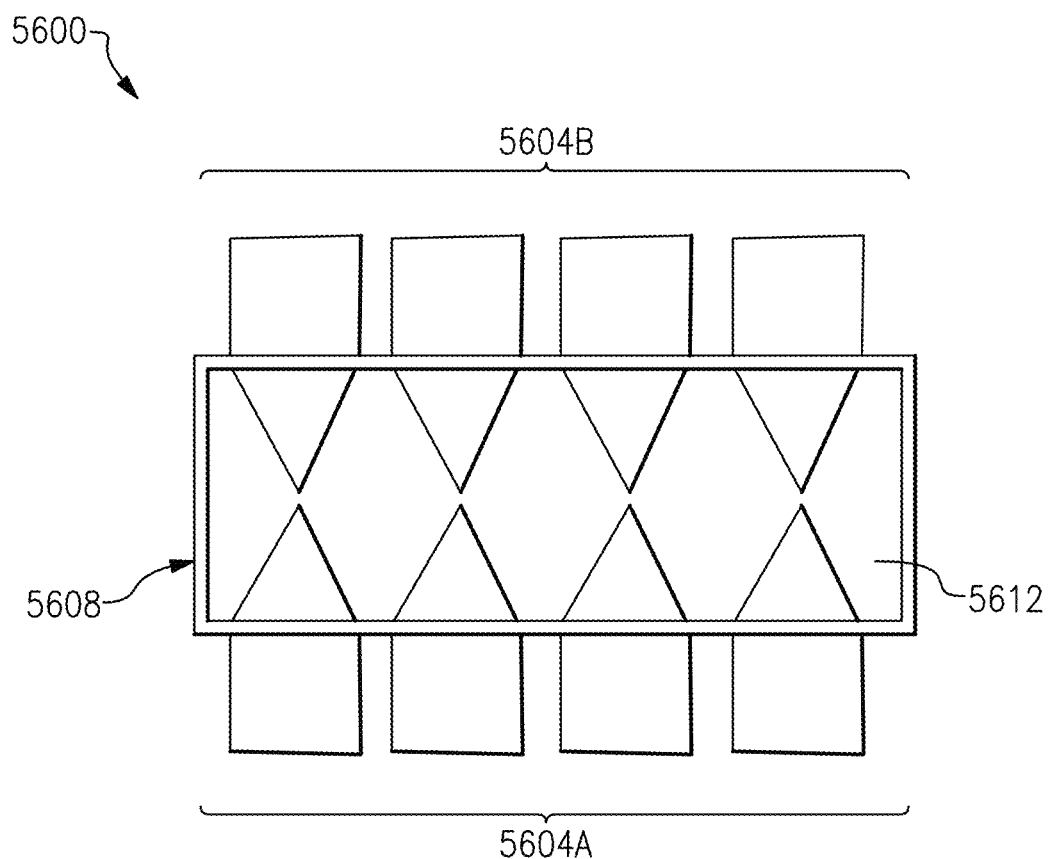

FIG. 56 illustrates a top down view of pairs of conductive structures of an EOS monitor/protection device that are configured to electrically arc in response to an EOS event, where the arcing medium is configured to be customized, according to some embodiments.

Figure 57:
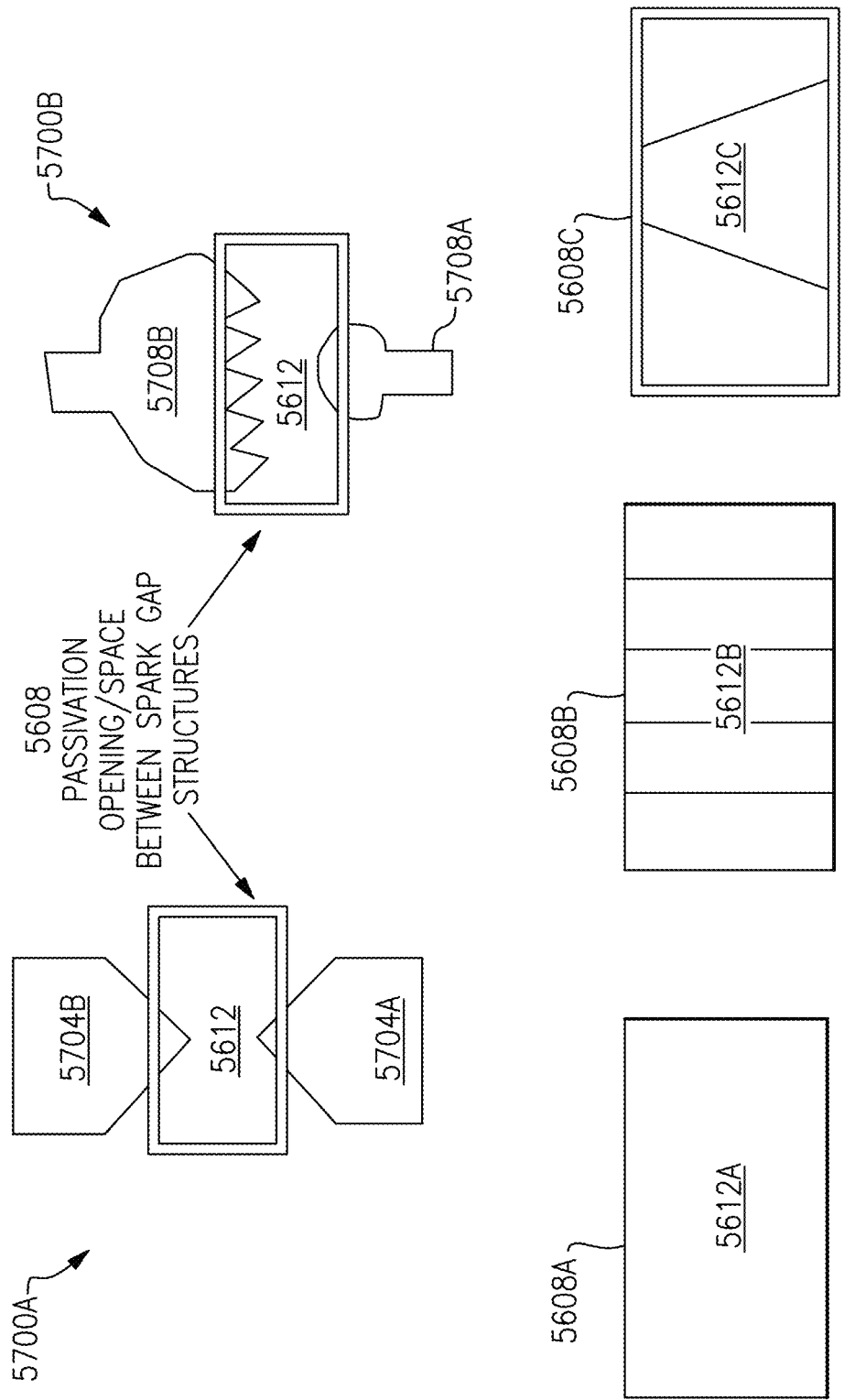

FIG. 57 illustrates a top down view of pairs of conductive structures of an EOS monitor/protection device that are configured to electrically arc in response to an EOS event, where the arcing medium is configured to be customized, according to some embodiments.

Figure 58:
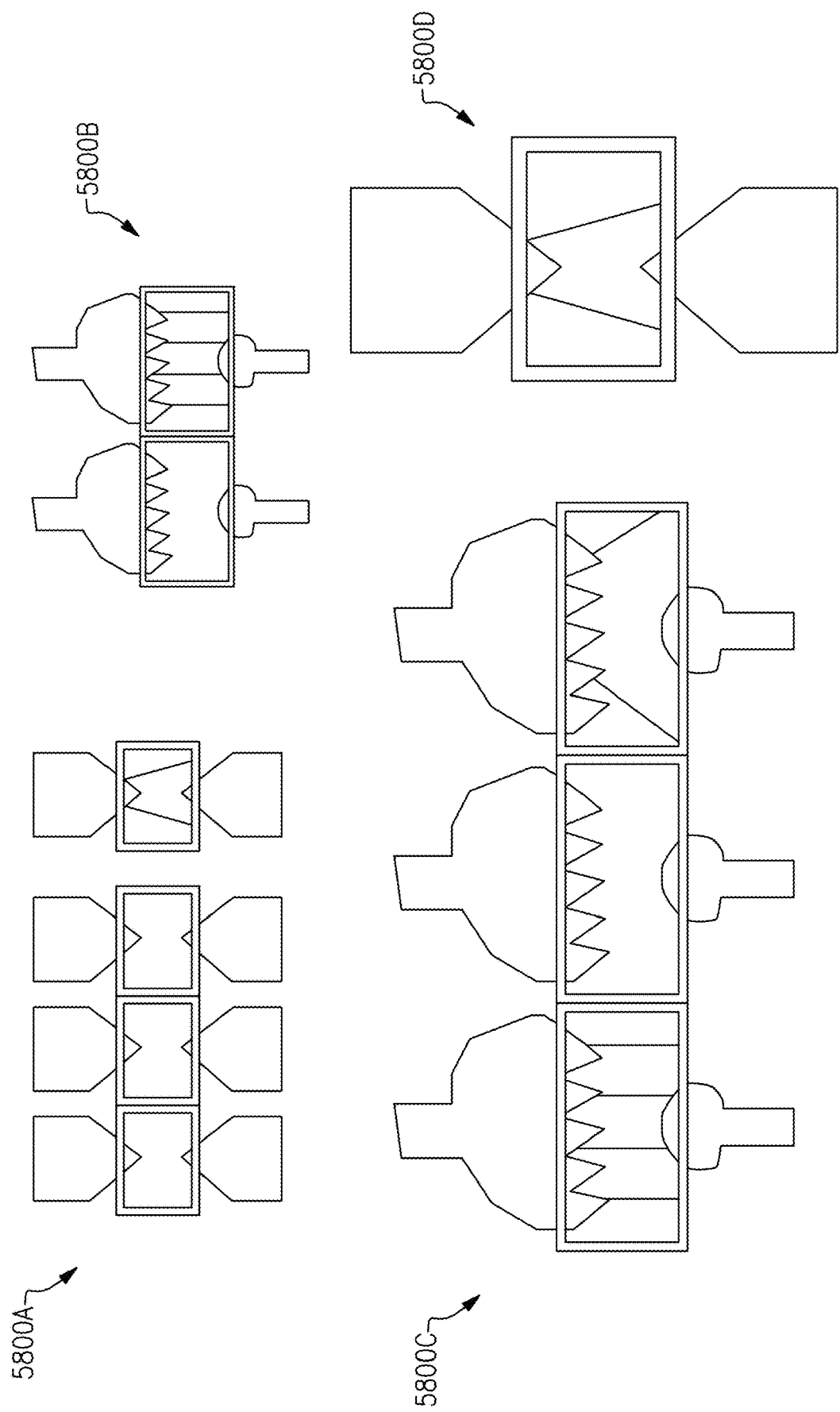

FIG. 58 illustrates a top down view of pairs of conductive structures of an EOS monitor/protection device that are configured to electrically arc in response to an EOS event, where the arcing medium is configured to be customized, according to some embodiments.

Figure 59:
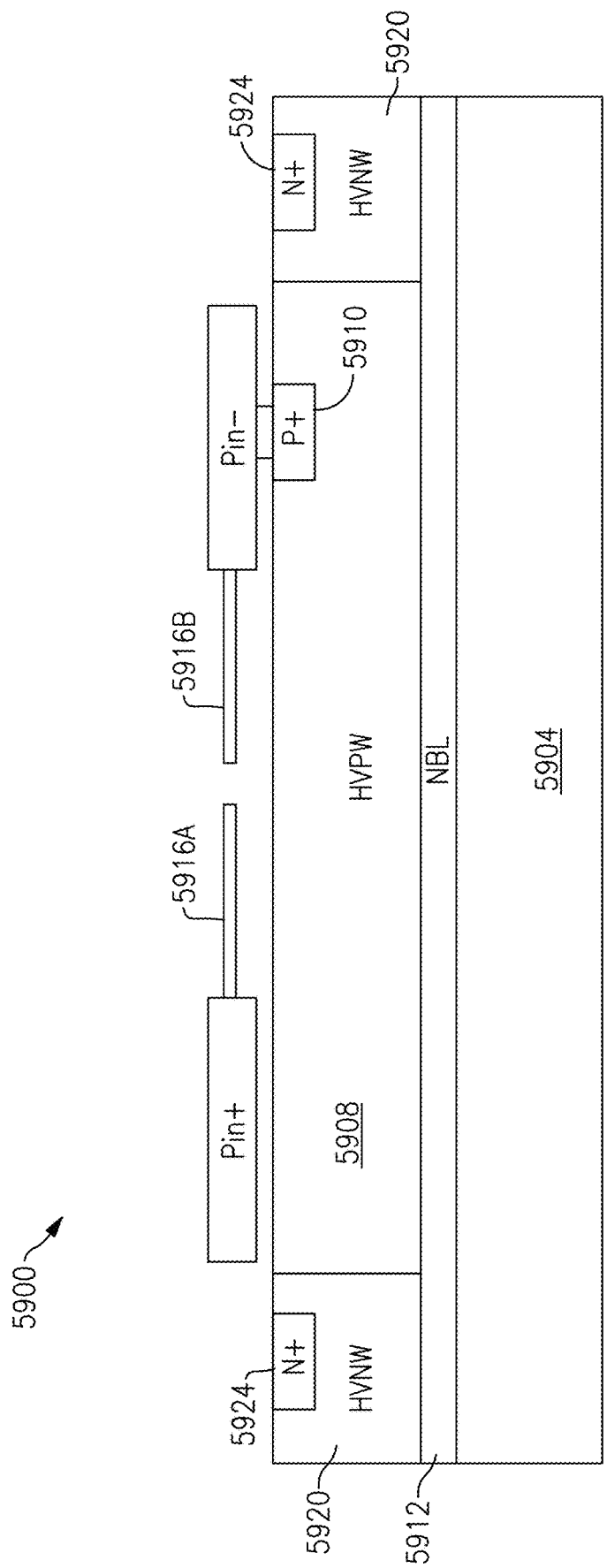

FIG. 59 illustrates a side view of a pair of conductive structures of an EOS monitor/protection device that is configured to electrically arc in response to an EOS event with substrate isolation, according to embodiments.

Figure 60:
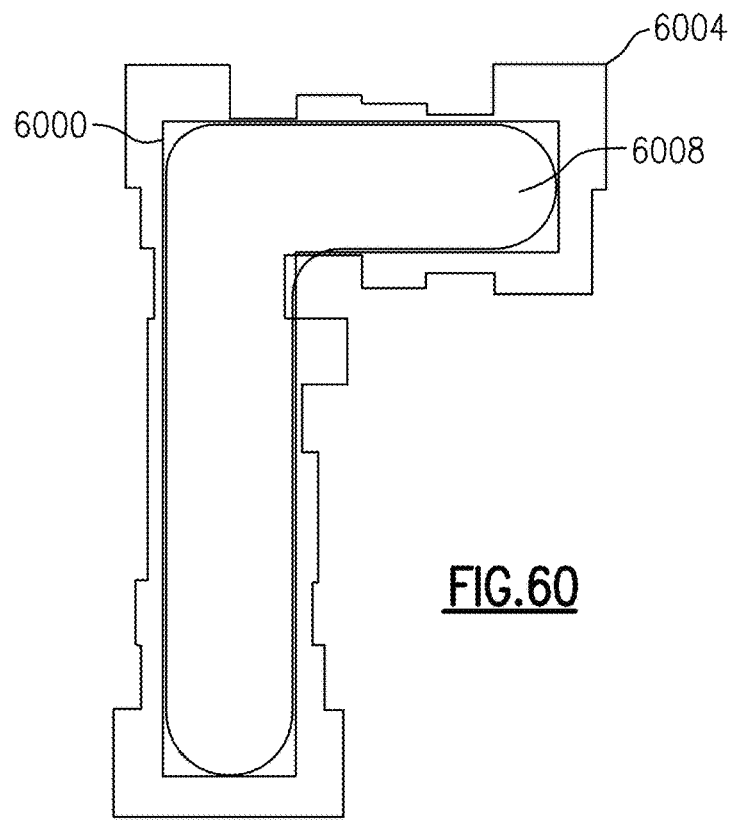

FIG. 60 illustrates overlaid images of a pattern to be printed on the wafer, a mask pattern that is printed based on optical proximity correction, and a pattern that may actually be printed using optical proximity correction, illustrating an example of optical proximity correction that may be employed to fabricate a pair of conductive structures of an EOS monitor/protection device that are configured to electrically arc in response to an EOS event, according to embodiments.

Figure 61:
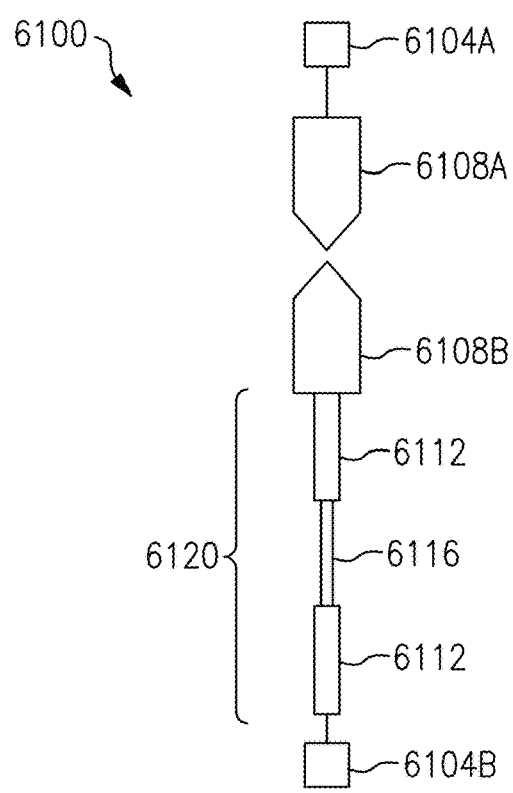

FIG. 61 schematically illustrates a pair of conductive structures of an EOS monitor/protection device that is configured to electrically arc in response to an EOS event connected in series with a hybrid fuse comprising a thin film/poly fuse in series with a metal fuse, according to embodiments.

FIGS. 62A, 62B and 62C are circuit block diagrams of EOS monitor / protection devices each comprising a pair of conductive structures configured to electrically arc in response to an EOS event connected in series with a fuse and a blocking device, according to embodiments.

FIGS. 62D, 62E, 62F and 62G are example semiconductor-based ESD protection devices that can be implemented in conjunction with EOS monitor/protection devices comprising a pair of conductive structures configured to electrically arc in response to an EOS event, according to embodiments.

Figure 63:
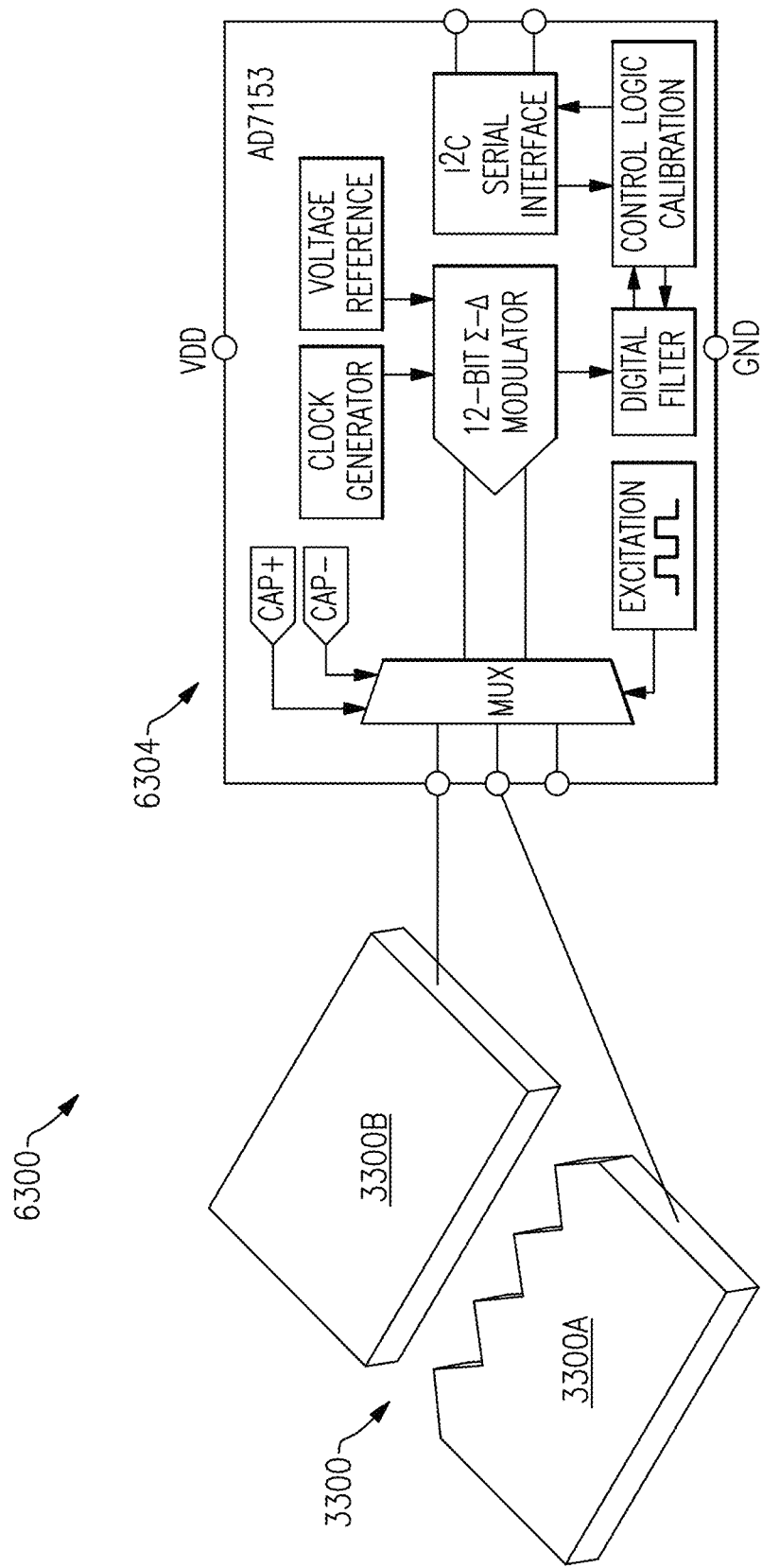

FIG. 63 illustrates an EOS monitor/protection device comprising a pair of conductive structures configured to electrically arc in response to an EOS event, and a detection system configured to detect a change in capacitance, according to embodiments.

Figure 64:
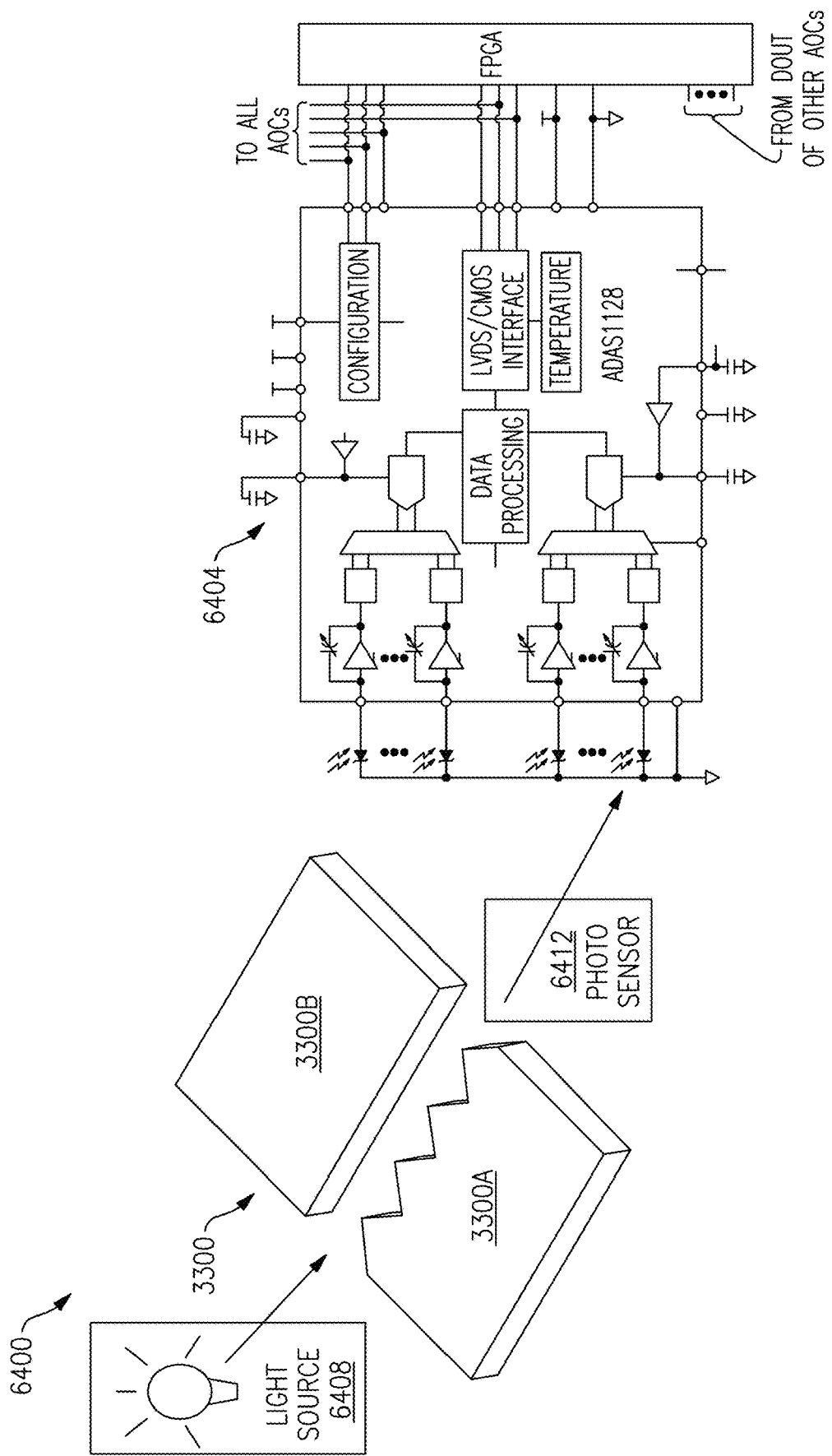

FIG. 64 illustrates an EOS monitor/protection device comprising a pair of conductive structures configured to electrically arc in response to an EOS event, and a detection system configured to detect a change in optical properties, according to embodiments.

Figure 65:
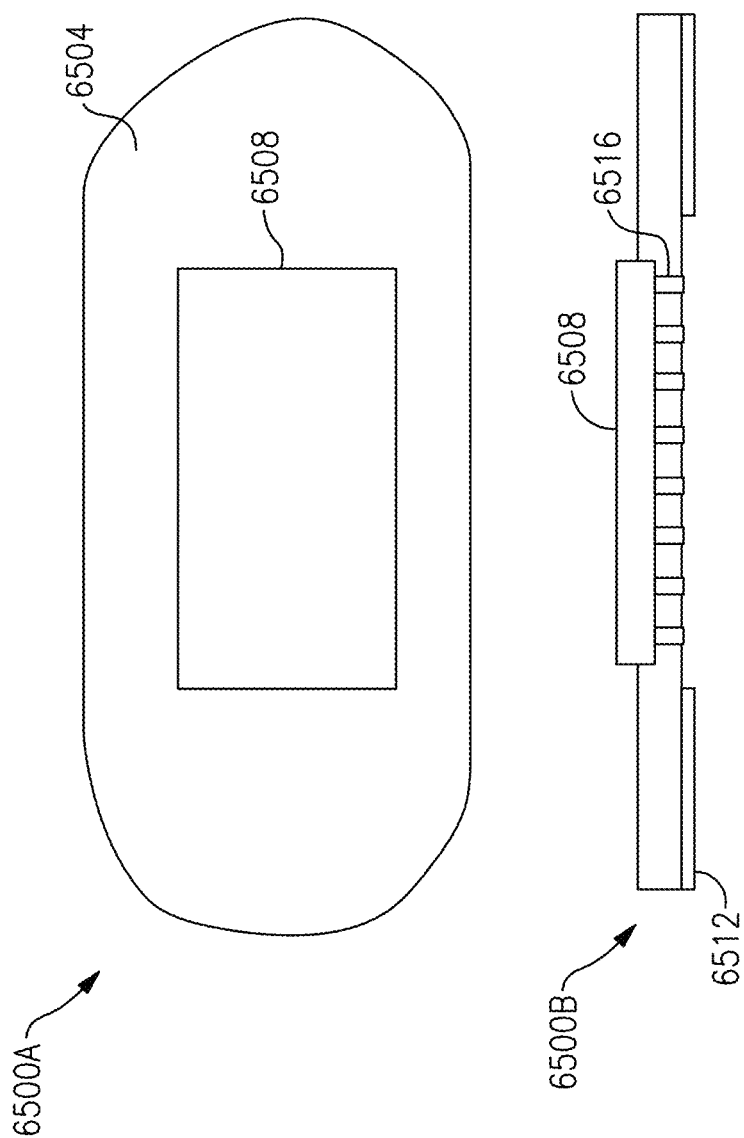

FIG. 65 illustrates a mobile and/or wearable device configured to harvest energy from arcing events in a pair of conductive structures in response to an EOS event, according to embodiments.

Figure 66:
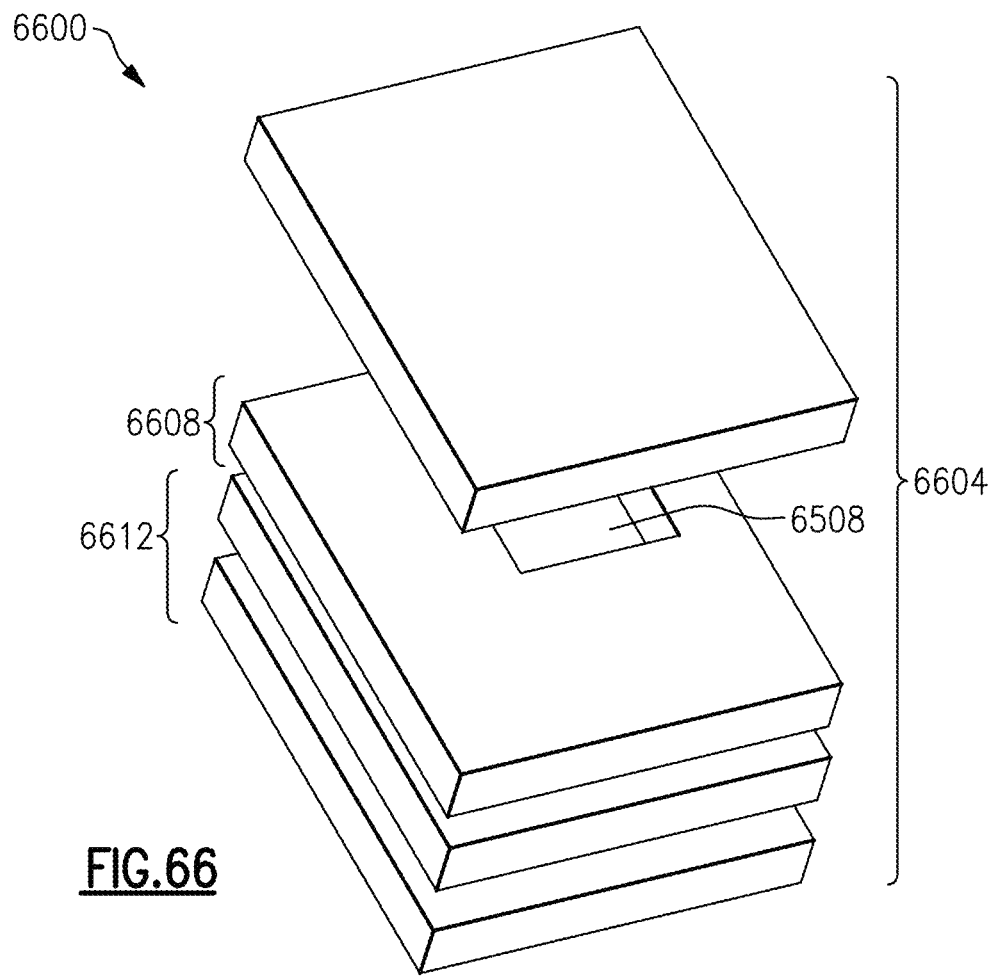

FIG. 66 illustrates a mobile and/or wearable device comprising a multilayer structure configured to optimize generation of static electricity and circuity configured to harvest the static electricity through arcing events in a pair of conductive structures, according to embodiments.

Figure 67:
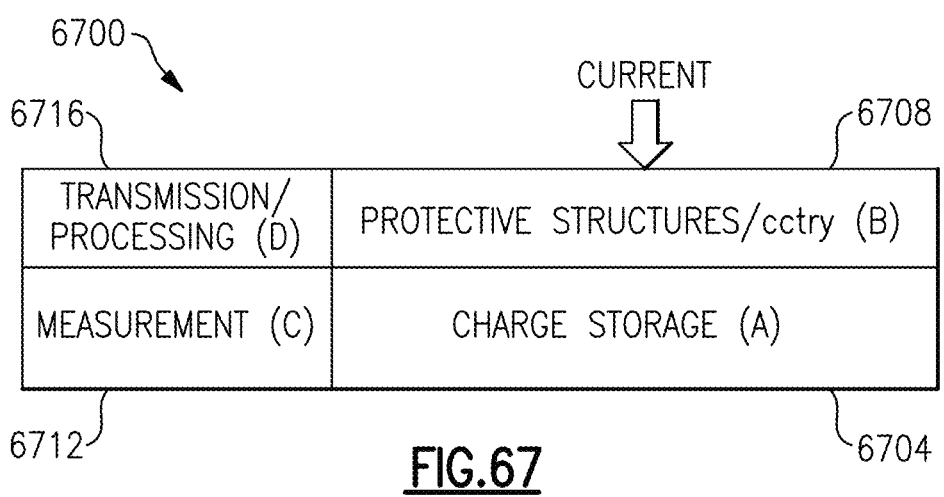

FIG. 67 is a block diagram of a system configured to collect, record and/or store energy generated from arcing events in a pair of conductive structures in response to an EOS event, according to embodiments.

Figure 68:
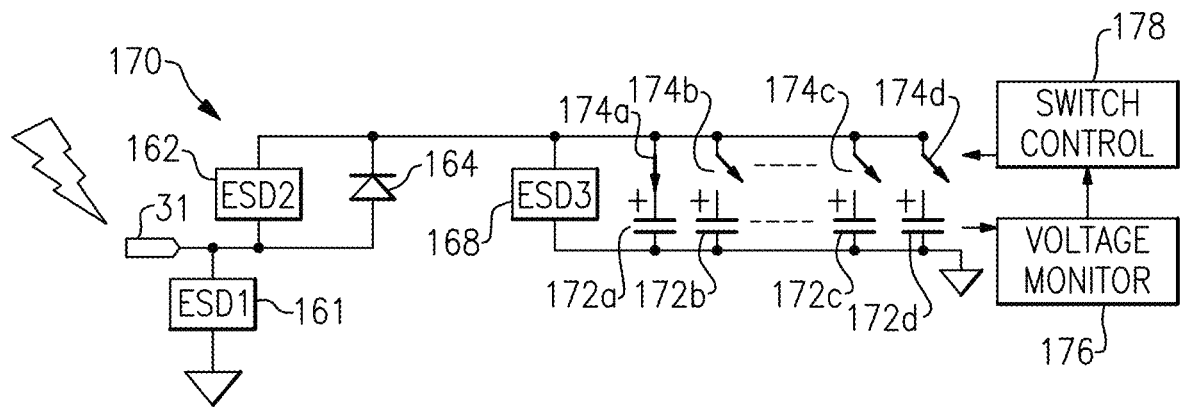

FIG. 68 is a schematic diagram of a portion of an illustrative electronic device configured to store charge associated with an electrostatic discharge event in a bank of storage elements according to an embodiment.

Figure 69:
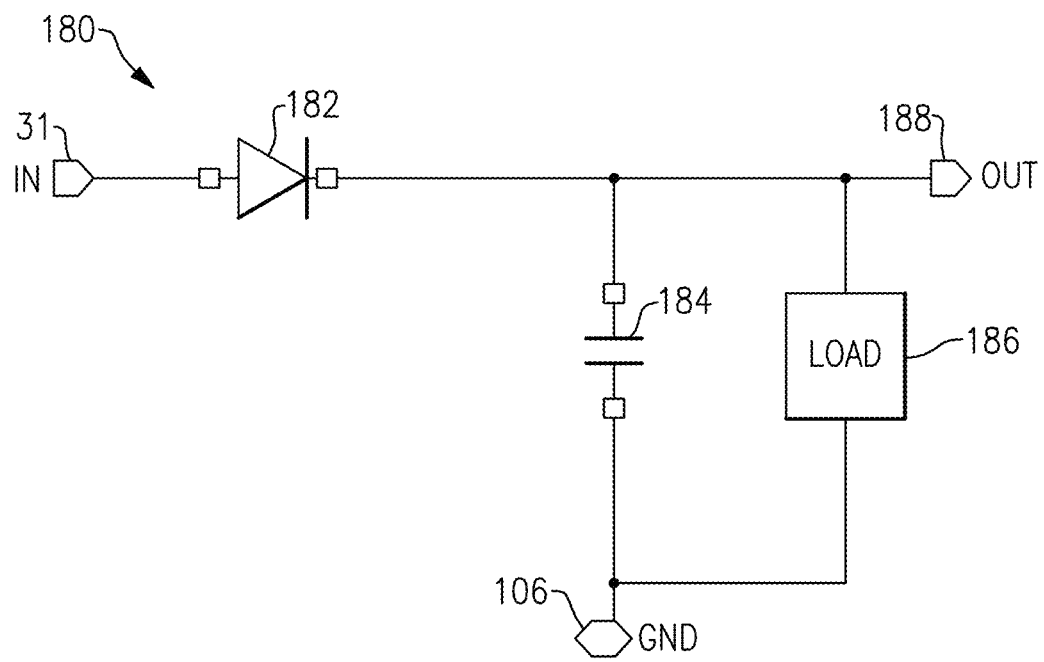

FIG. 69 is a schematic diagram of a circuit configured to store charge collected from various spark gap structures in response to an EOS event according to an embodiment.

Figure 70:
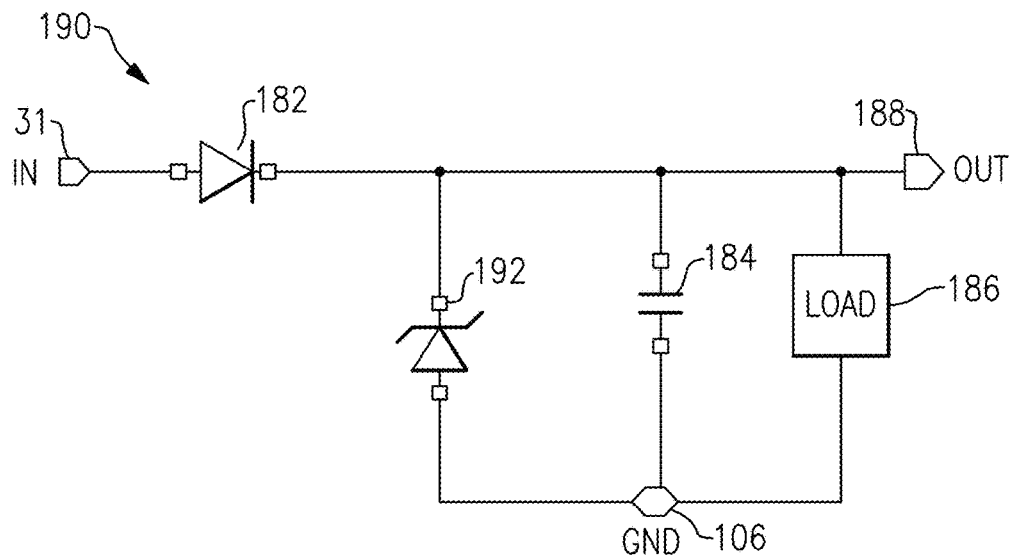

FIG. 70 is a schematic diagram of a circuit configured to store charge collected from various spark gap structures in response to an EOS event according to another embodiment.

Figure 71:
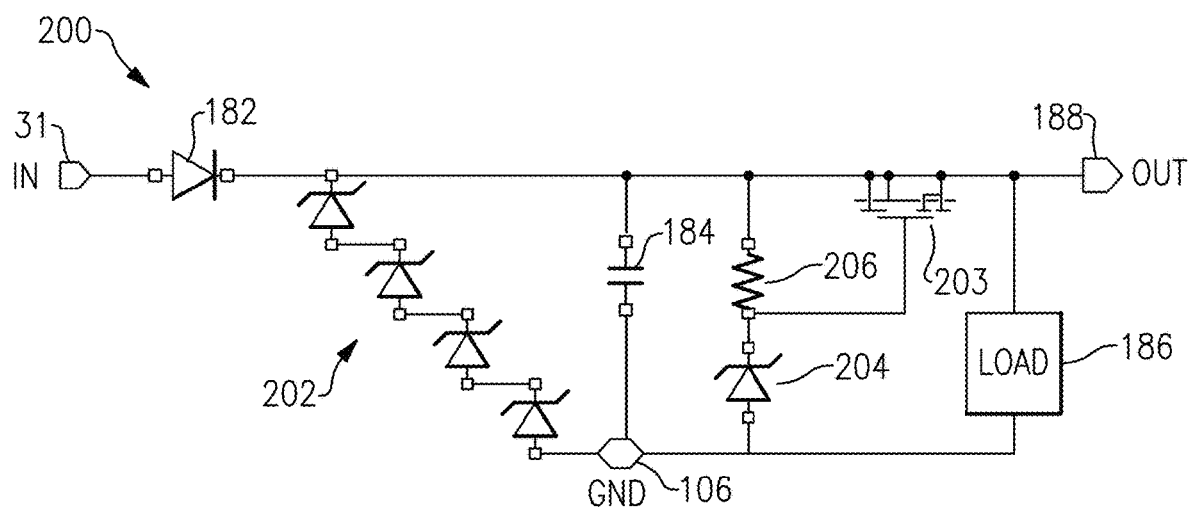

FIG. 71 is a schematic diagram of a circuit configured to store charge collected from various spark gap structures in response to an EOS event according to another embodiment.

Figure 72:
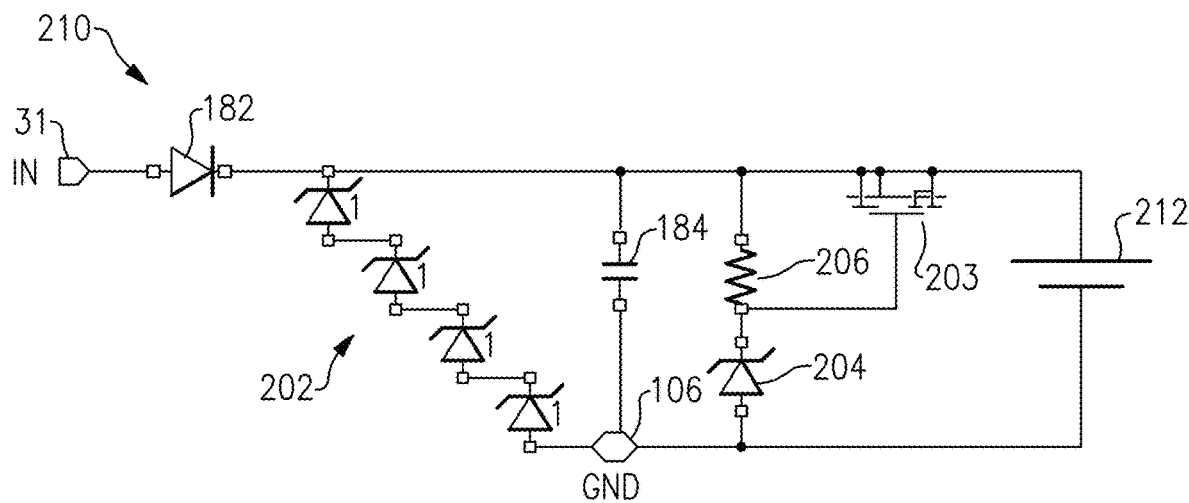

FIG. 72 is a schematic diagram of a circuit configured to store charge collected from various spark gap structures in response to an EOS event according to another embodiment.

Figure 73:
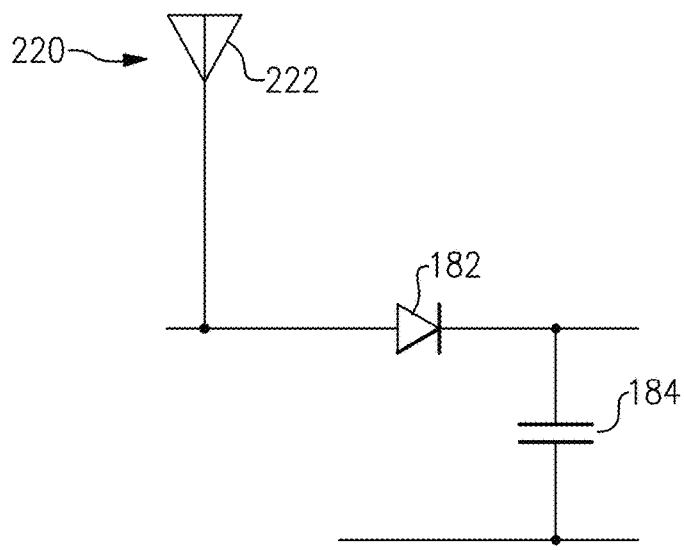

FIG. 73 is a schematic diagram of a circuit configured to store charge collected from various spark gap structures in response to an EOS event according to another embodiment.

FIGS. 74-77 illustrate examples of electric vehicle network systems comprising a plurality of vehicles configured to collect, record and/or store energy generated from arcing events in spark gap structures in response to an EOS event, according to embodiments.

Figure 78:
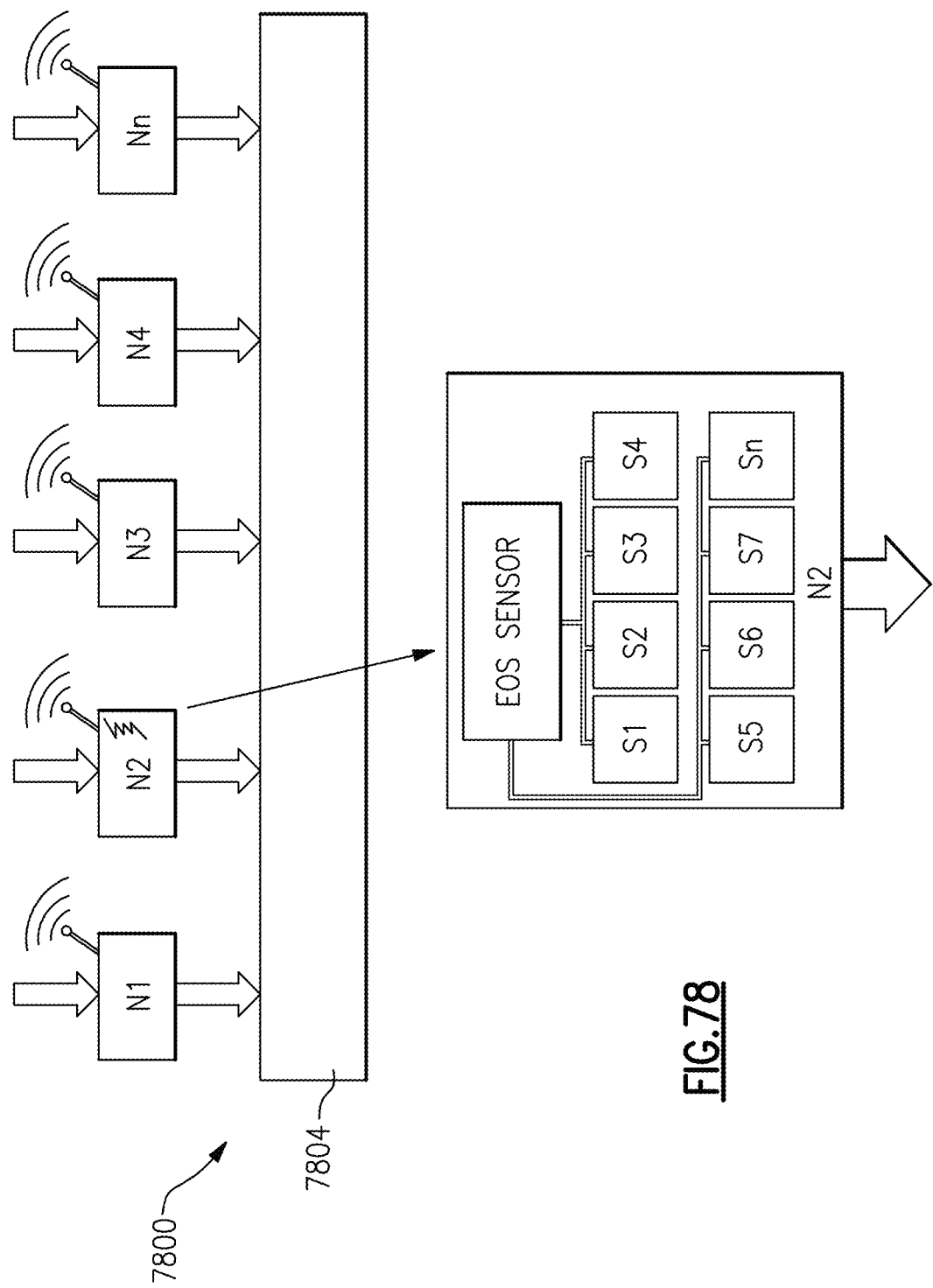
Figure 79:
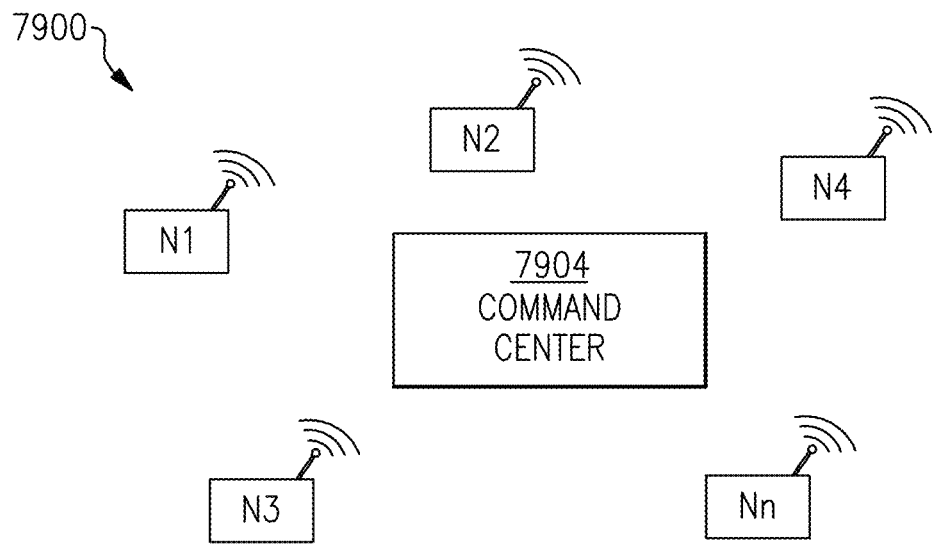
Figure 80:
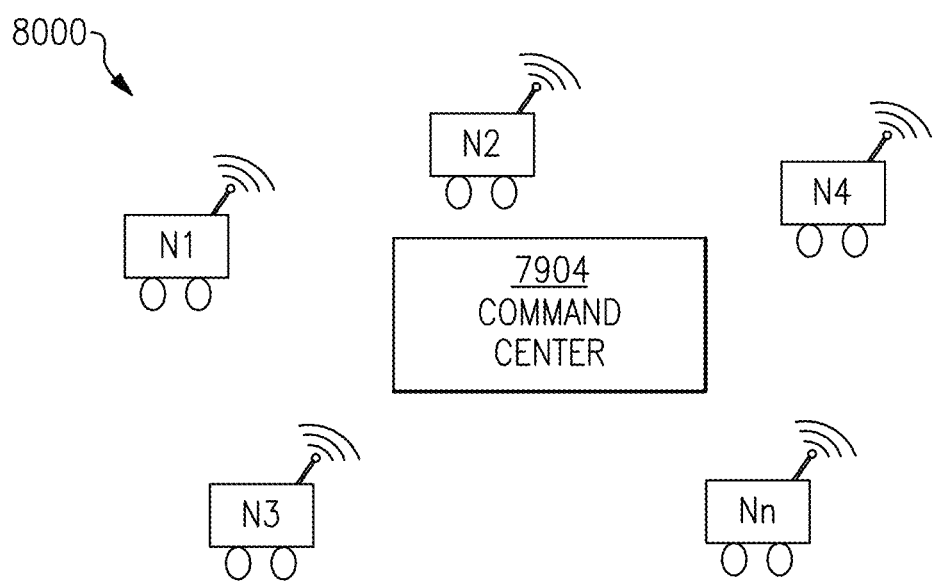

FIGS. 78-80 illustrate examples of sensor network systems comprising a plurality of nodes each comprising an EOS monitor/protection device comprising a pair of conductive structures configured to arc in response to an EOS event, according to embodiments.

Figure 81:
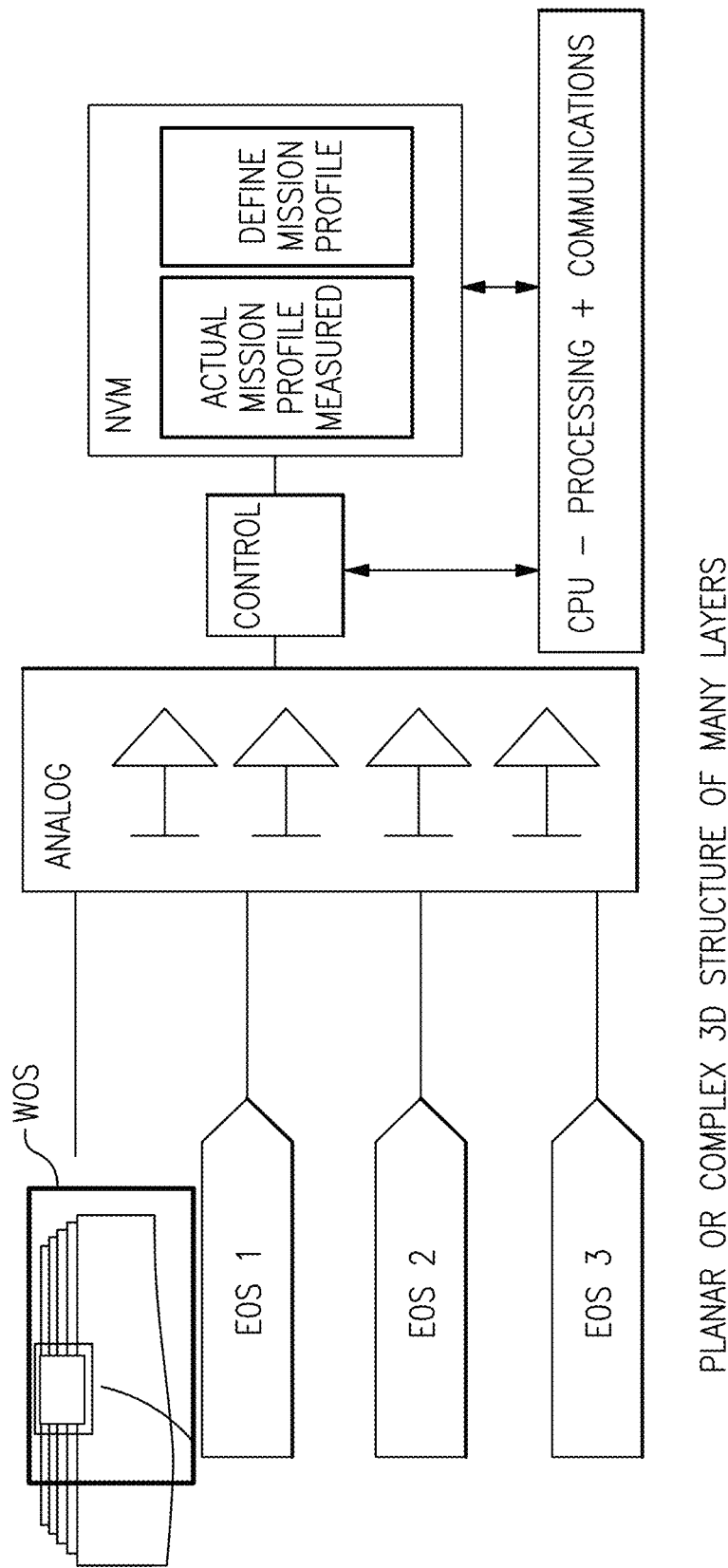

FIG. 81 illustrates various physical and electrical connections that can be made to an EOS monitor/protection device comprising a pair of conductive structures configured to arc in response to an EOS event, for integration into a sensor network system, according to embodiments.

Figure 82:
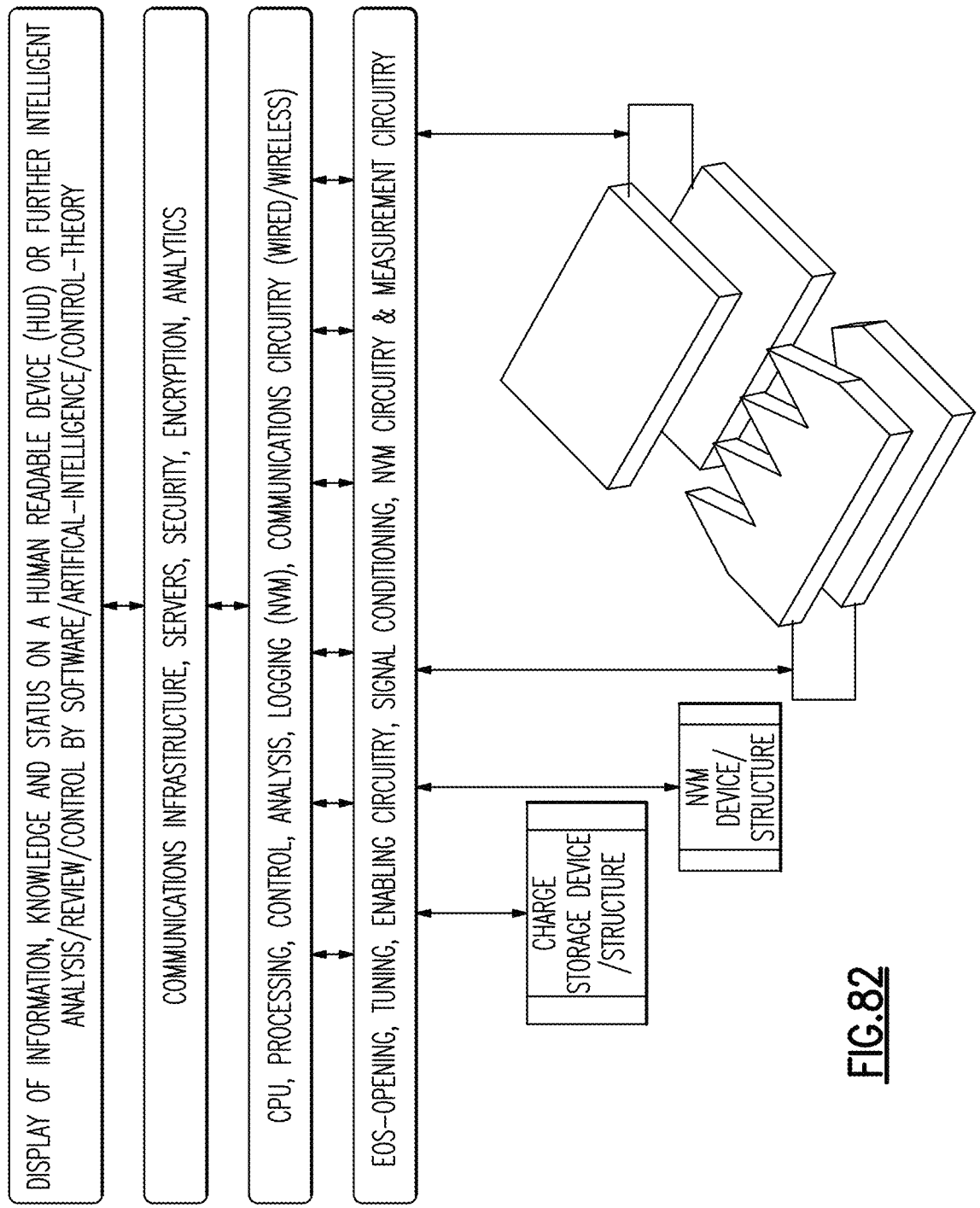

FIG. 82 illustrates a sensor network system including a wear-out monitor device in conjunction with an EOS monitor structure comprising a pair of conductive structures configured to arc in response to an EOS event, according to embodiments.

DETAILED DESCRIPTION

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawings and/or a subset of the illustrated elements. Further, some embodiments can incorporate any suitable combination of features from two or more drawings. The headings provided herein are for convenience only and do not necessarily affect the scope or meaning of the claims.

Various electronic devices for various applications including automotive and consumer electronics that are fabricated using low voltage CMOS processes are increasingly using input/output (I/O) interface pins that operate at relatively high bidirectional voltages. These devices often operate in relatively harsh environments and should comply with applicable electrostatic discharge (ESD) and electromagnetic interference immunity (EMI) specifications. Integrated circuits (ICs) can be particularly susceptible to damage from electrical overstress (EOS) events, such as ESD events. Robust ESD and EMI immunity is desirable because the electronic devices can be subject to a wide range of high voltage transient electrical events that exceed ordinary operating conditions. High voltage events are particularly common in the automotive electronics field.

The transient electrical events can be, e.g., a rapidly changing high energy signal such as an electrostatic discharge (ESD) event. The transient electrical event can be associated with an overvoltage event caused by a user contact or contact with other objects, or simply from malfunctions in electrical systems. In other circumstances, the transient electrical event can be generated by a manufacturer to test the robustness of the transceiver integrated circuit under a defined stress condition, which can be described by standards set by various organizations, such as the Joint Electronic Device Engineering Council (JEDEC), the International Electrotechnical Commission (IEC), and the Automotive Engineering Council (AEC).

Various techniques can be employed to protect a core or a main circuitry of the electronic devices, such as ICs against these damaging transient electrical events. Some systems employ external off-chip protection devices to ensure that core electronic systems are not damaged in response to the transient electrostatic and electromagnetic events. However, due to performance, cost, and spatial considerations, there is an increasing need for protection devices that are monolithically integrated with the main circuitry, that is, the circuitry to be protected Electronic circuit reliability can be enhanced by providing protection devices, e.g., ESD protection devices. Such protection devices can maintain relatively high voltage levels at certain locations, e.g., IC power high supply voltage ($V_{dd}$), within a predefined safe range by transitioning from a high-impedance state to a low-impedance state when the voltage of the transient electrical event reaches a trigger voltage. Thereafter, the protection device can shunt at least a portion of the current associated with the transient electrical event to, e.g., ground, before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for a protection device to be configurable for different current and voltage (I-V) blocking characteristics and able to render protection against positive and negative transient electrical events with fast operational performance and low static power dissipation at normal operating voltage conditions.

Electrical Overstress Monitor Devices and Protection Devices Having Spaced Conductive Structures.

Typical electrical overstress protection devices are designed to protect core circuitry from potentially damaging electrical overstress events. The EOS protection devices are often designed to protect the core circuitry based on a range of EOS conditions the core circuitry is expected to be subjected to during use. However, because EOS protection devices are designed to trigger when the damaging EOS event exceeds a trigger condition, e.g., trigger voltage or a threshold voltage, a triggering event only indicates that the trigger condition has been exceeded, without an indication of by how much, for example. Furthermore, when a potentially damaging EOS event close to but not exceeding the trigger condition of the EOS protection device occurs, no warning is provided, even though repeated occurrences of such EOS events can eventually lead to actual damage and failure of the core circuitry and/or the EOS protection device. Thus, there is a need for a monitor device which can provide semi quantitative or quantitative information about damaging EOS events, e.g., the voltage and dissipated energy associated with the damaging EOS events, regardless of whether the EOS protection device has been triggered. Such a monitor device can detect an EOS event and relay a warning to a user, e.g., as a preventive maintenance, before more damaging EOS exceeding a threshold voltage limit of a core circuit affects the device. In addition, when the device is damaged by an EOS event, the monitor device can provide a history of the EOS event(s) that may have caused the damage to the device, thereby providing valuable diagnostic information to determine a root cause of the EOS event(s).

To provide these and other advantages, an electrical overstress (EOS) monitoring device is disclosed according to various embodiments. The EOS monitoring device comprises a pair of spaced conductive structures that are configured to electrically arc in response to an EOS event. Advantageously, when the core circuitry fails from a damaging EOS event despite having an EOS protection device, or when the ESC protection device itself fails as a result of a damaging EOS event, information regarding the nature of the damaging EOS event can be obtained using the EOS monitoring device. Such information may include, e.g., voltage and/or energy associated with the EOS event. In addition, when potentially damaging EOS event close to but not exceeding the trigger condition of the EOS protection device occurs, the EOS monitoring device can be used to provide a warning, such that repeated occurrences of such EOS events can be prevented from leading to actual damage or failure of the core circuitry and/or the EOS protection device. In addition, the EOS monitoring device can advantageously be configured to serve as an EOS protection device itself. Furthermore, the EOS monitoring device can serve as a monitor and/or the EOS protection device regardless of whether the core circuitry is activated. In the description below and in the figures, the term "ESD protection device" is employed to readily distinguish the label for the EOS monitoring device; however, the skilled artisan will appreciate that the so-called "ESD" protection device may protect against a wider array of EOS events and is not limited to protection against ESD events.

As such, information associated with the occurrence of an EOS event e.g., voltage and/or energy associated with the EOS event, can be made unavailable to an electronic system using the EOS monitoring device disclosed herein. Various embodiments can provide more reliable circuit operation in various applications. For instance, various embodiments can reduce failures of electronics in a car or other vehicle and improve safety of a driver and/or a passenger. As another example, for electronics in healthcare applications, such as heart rate monitoring applications, embodiments can be used to more reliably detect a change in a physiological parameter so that proper action can be taken responsive to detecting such a change. When circuits in such healthcare applications fail, health can be adversely impacted. In applications where there is a need for reliable circuit operation, embodiments disclosed herein can reduce or minimize unknown potential damage to critical circuits. Furthermore, the "monitoring" function need not be responsive in real time. Rather, it is useful to have a monitoring devices that can be inspected after device failure, to determine how many or what level of EOS event occurred in the failed part for diagnostic purposes. Such information can be obtained, for example, by electrical monitoring during use or after failure, or by visual inspection of the failed part, as will be understood by the description below. The diagnostic information on the extent of the EOS event may be useful in pinpointing the cause of the EOS event for either avoiding such events in the future or designing parts to be more resistant to such events.

As noted above, while this disclosure may discuss "ESD" protection devices or circuits and ESD events for illustrative purposes, it will be understood that any of the principles and advantages discussed herein can be applied to any other electrical overstress (EOS) condition. EOS events can encompass a variety of events including transient signal events lasting about 1 nanosecond or less, transient signal events lasting hundreds of nanoseconds, transient signal events lasting on the order of 1 microsecond, and much longer duration events, including direct current (DC) overstresses.

Figure 1A:
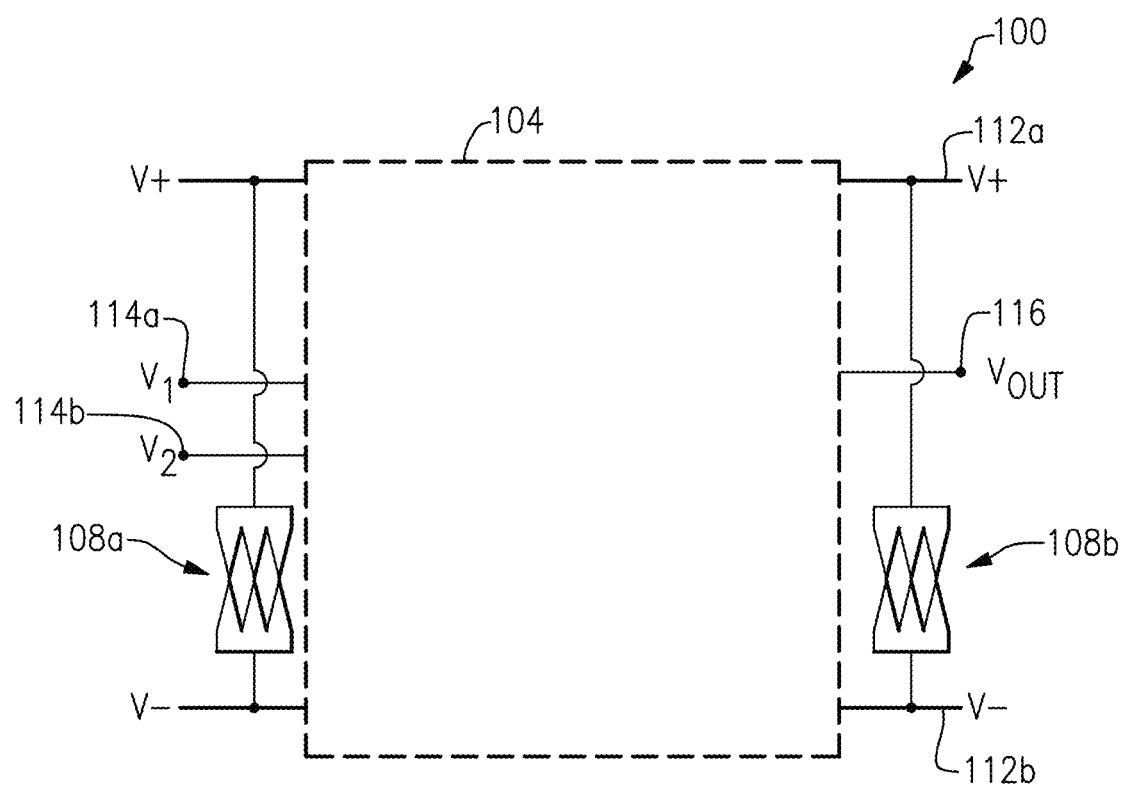
FIG. 1A is a schematic diagram of semiconductor device having a core circuit and electrical overstress (EOS) monitor devices including spaced conductive structures, according embodiments.

FIG. 1A is a schematic diagram of an electronic device 100 having a core circuit 104 and electrical overstress (EOS) monitor devices 108a, 108b including spaced conductive structures, according embodiments. The spaced conductive structures may be referred to as spark-gap devices, and they are configured to allow arcing across a dielectric gap between conductive structures. The core circuit 104 may be any suitable semiconductor-based circuit to be protected, which can include transistors, diodes and resistors, among other circuit elements. The core circuit 104 may be connected to a voltage high supply 112a, e.g., $V_{dd}$ or $V_{cc}$, and a voltage low supply 112b, e.g., $V_{ss}$ or $V_{ee}$. The core device 104 includes input voltage terminals 114a, 114b and an output terminal 116. Electrically connected between the voltage high supply 112a and the voltage low supply 112b and electrically in parallel with the core circuit 104 are EOS monitor devices 108a, 108b each having spaced conductive structures. In the illustrated embodiment, each of the monitor devices 108a, 108b includes a first conductive structure connected to the voltage high supply 112a serving as an anode and a second conductive structure connected to the voltage low supply 112b serving as a cathode. At least one gap of designed distance is provided between the first and second conductive structures. In FIG. 1A, each EOS monitor device 108a, 108b has three such gaps formed in parallel, and as will be described below, the three gaps can have three different sizes. In response to an ESD event, the EOS monitor devices 108a, 108b are configured to electrically arc. The spaced conductive structures of each of the EOS monitor devices 108a, 108b are formed of a material, have shapes and have a spacing between the first and second conductive structures such that each of EOS monitor devices 108a, 108b is configured to arc at a trigger voltage $V_{TR}$. Where the EOS monitor devices 108a, 108b have multiple gaps, each gap has its own trigger voltage $V_{TR}$. The arc may occur across all gaps smaller than the distance across which the EOS voltage will arc.

Figure 1B:
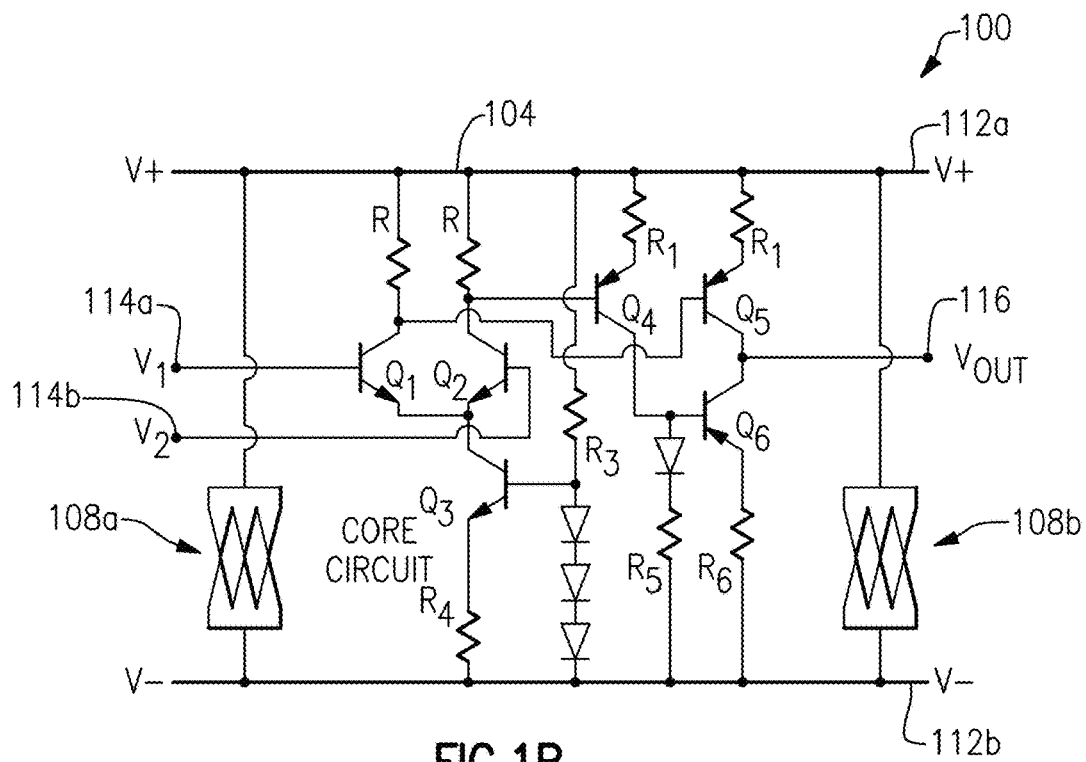
FIG. 1B illustrates one implementation of the semiconductor device illustrated in FIG. 1A with an example core circuit.

FIG. 1B is a schematic diagram of an electronic device 100 illustrating one example of a core circuit 104 electrically connected to electrical overstress (EOS) monitor devices 108a, 108b including spaced conductive structures, according embodiments. The core circuit 104 comprises one or more of resistors, e.g., R, R1, R3, R5, R6, and/or one or more diodes, and/or one or more transistors Q1, Q2, Q4, Q5, among other circuit elements.

In the illustrated embodiments of FIGS. 1A and 1B, for illustrative purposes, EOS monitor devices 108a, 108b are disposed between the voltage high supply ($V^+$) 112a and the voltage low supply ($V^-$) 112b. However, embodiments are not so limited and in other embodiments, EOS monitor devices can be disposed in lieu of or in addition to the EOS monitor devices 108a, 108b between any two voltage nodes of the $V^+$ 112a, the $V^-$ 112b, $V_1$, $V_2$ and $V_{out}$, where an electrical overstress condition may develop therebetween.

Figure 1C:
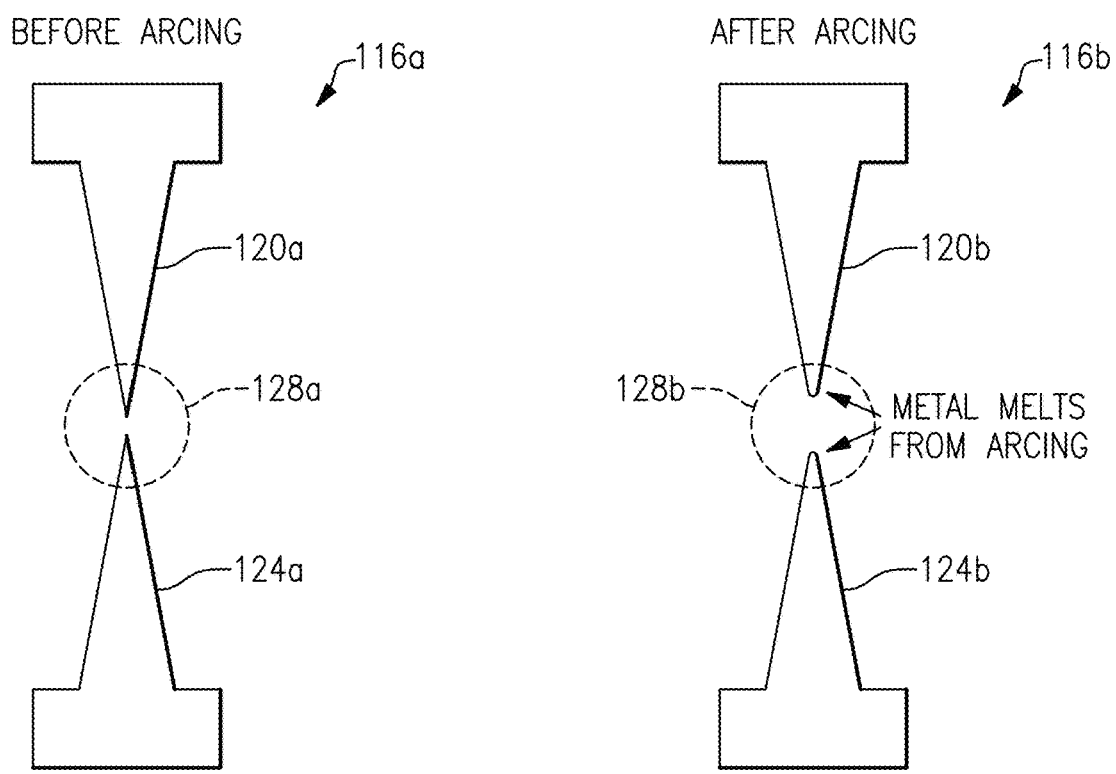
FIG. 1C is a schematic diagram of an electrical overstress (EOS) monitor device including a pair of spaced conductive structures, before and after electrically arcing in response to an EOS event, according to embodiments.

FIG. 1C is a schematic diagram of an electrical overstress (EOS) monitor device including a pair 116A/116B of spaced conductive structures, before (116A) and after (116B) electrically arcing in response to an EOS event, according to embodiments. The pair 116A of spaced conductive structures includes a cathode 120A and an anode 124A prior to arcing, and the pair 116B of spaced conductive structures includes an anode 120B and the anode 124B subsequent to arcing.

Prior to experiencing arcing due to an ESD event, the pair 116A of spaced conductive structures has a pre-arc inter-electrode spacing 128A. As described infra, the pre-arc inter-electrode spacing 128A can be tuned, among other factors, such that the resulting EOS monitor devices are configured to arc at a desired trigger voltage $V_{TR}$. Upon experiencing arcing, the pair 116B of spaced conductive structures has a post-arc inter-electrode spacing 128B that is greater than the pre-arc inter-electrode spacing 128A. As described infra, the amount by which the post-arc inter-electrode spacing 128B increases relative to the pre-arc inter-electrode spacing 128A depends, among other factors, the magnitude of energy that is dissipated during arcing, as well as material properties of the pair conductive structures. Because of the increased inter-electrode spacing 128B, after experiencing arcing, the trigger voltage $V_{TR}$ of the pair 116B of spaced conductive structures increases. The structure and materials of the pair 116A spaced conductive structures can be tuned, among other factors, such that the resulting increased $V_{TR}$ is higher than the initial $V_{TR}$ by a desired amount. Thus, according some embodiments, whether an EOS event had occurred can be determined by measuring an increase in an open circuit voltage across the pair 116B of spaced conductive structures post-arcing relative to the pair 116A of spaced conductive structures prior to arcing. The change in the gap may also be detected in as a change in leakage current through a path that includes the gap. The change can also be detected visually, as the damaged tips will be apparent from visual inspection. Accordingly, the devices may be integrated (e.g., with metal levels of an integrated circuit) in a manner that allows visual inspection, such as with a microscope.

Without being limited to any theory, arcing of the spaced conductive structures can initiate as a result of an electric discharge that develops due to a flow of current from the cathode 120A to the anode 124A. The flow of current can be generated by various mechanisms, such as field emission, secondary emission and thermal emission, among other mechanisms. For example, under some circumstances, arcing of the spaced conductive structures can be initiated, facilitated or sustained by free electrons emitted by the cathode 120A during arcing through field emission, which refers emission of electrons that is induced by an electrostatic field. Field emission can occur under a relatively strong electric field (e.g., $10^7$ V/cm), in which free electrons are pulled out of the metal surface. Once initiated, under some circumstances, arcing of the spaced conductive structures can be further facilitated or sustained by free electrons emitted by the cathode 120A through thermionic emission. For example, the flow of current between the cathode 120A and the anode 120B can increase the temperature of the conductive material of the cathode 120A, which increases the kinetic energy of free electrons therein, thereby causing electrons to be ejected from the surface of the conductive material of the cathode 120A.

Thus generated free electrons (e.g., by field or thermoionic emission) can accelerate towards the anode 120B because of the potential difference between the cathode 120A and the anode 120B resulting from an EOS event. Such electrons can further decompose atoms of the inter-electrode material into charged particles, which can develop high velocities under the high electric field of an EOS event. These high velocity electrons moving from cathode 120A toward the anode 120B collide with atoms of the inter-electrode material, e.g., air or a dielectric material, between the cathode 120A and the anode 120B and decompose them into charged particles i.e. electrons and ions.

As described supra, free electrons and charged particles are involved in initiating the arc and their maintenance. Without subscribing to any scientific theory, emitting electrons by the cathode 120A depends on several factors, including material properties such as work function and ionization potential of the cathode and/or the anode, as well as their physical shapes and dimensions. In addition, as described supra, the amount by which the $V_{TR}$ increases upon arcing depends on several factors, including material properties such as melting point of the cathode and the anode, as well as their physical shapes and dimensions.

In consideration of the above emission properties and melting properties, among other factors, one of both of the cathode 120A and the anode 120B can be formed of suitable conductive and/or semiconductive material, e.g., n-doped poly silicon and p-doped poly silicon, metals including C, Al, Cu, Ni, Cr, Co, Ru, Rh, Pd, Ag, Pt, Au, Ir, Ta, and W, conductive metal nitrides, conductive metal silicides including tantalum silicides, tungsten silicides, nickel silicides, cobalt silicides, and titanium silicides, conductive metal oxides including $RuO_2$, mixtures or alloys of the above, etc., according to various embodiments. In some embodiments, one of both of the cathode 120A and the anode 120B can comprise a transition metal and may be, for example, a transition metal nitride, such as TiN, TaN, WN, or TaCN.

In some embodiments, the cathode 120A and the anode 120B can be formed of or comprise the same conductive material, while in other embodiments, the cathode 120A and the anode 120B can be formed of or comprise different conductive materials.

Figure 1D:
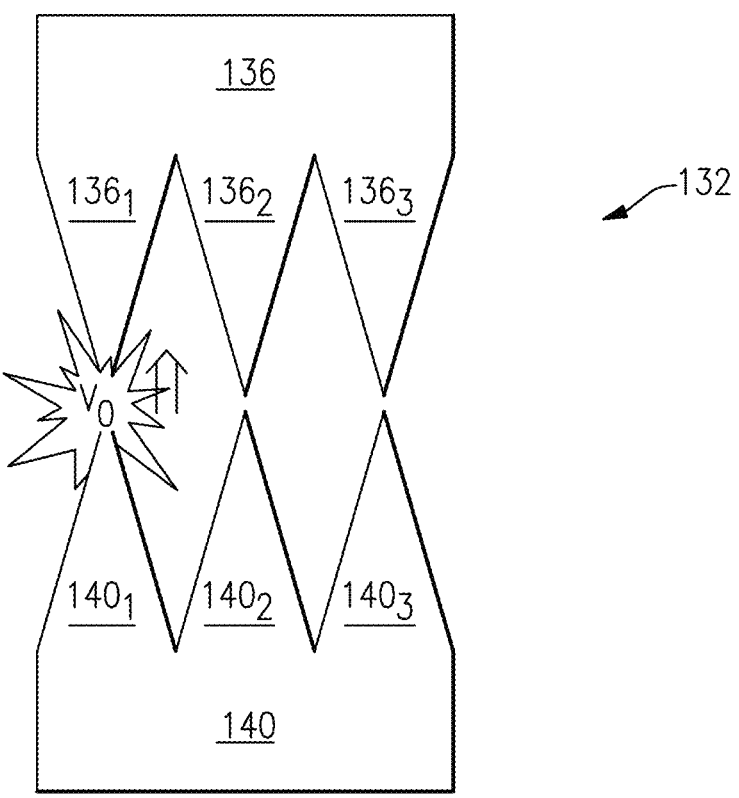
FIG. 1D is a schematic diagram of an EOS monitor device including a plurality of pairs of spaced conductive electrically connected in parallel, according to embodiments.

FIG. 1D is a schematic diagram of an EOS monitor device 132 including a plurality of pairs of spaced conductive structures electrically connected in parallel, according to embodiments. The EOS monitor device 132 includes a plurality of pairs of spaced conductive structures. The plurality of pairs of spaced conductive structures are formed by a cathode 136 which includes a plurality of cathode conductive structures $136_1$, $136_2$, $136_3$, and an anode 140 which includes a plurality of corresponding anode conductive structures $140_1$, $140_2$, $140_3$.

Figure 9A:
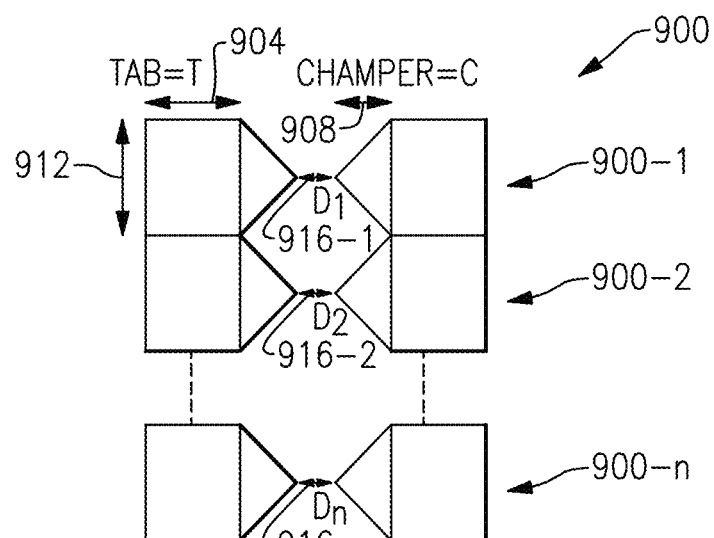
FIG. 9A is a schematic top-down view of a plurality of pairs of spaced conductive structures electrically connected in parallel with different gaps corresponding to different trigger voltages, according to embodiments.
Figure 10A:
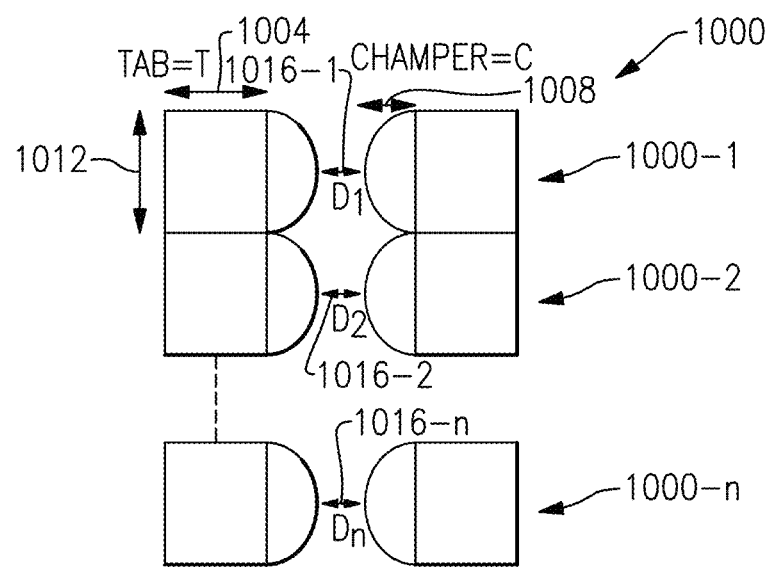
FIG. 10A is a schematic top-down view of a plurality of pairs of spaced conductive structures electrically connected in parallel with different gaps corresponding to different trigger voltages, according to embodiments.

Referring to FIGS. 9A and 10A, in various embodiments, the plurality of pairs of spaced conductive structures can be differently spaced pairs of spaced conductive structures having, wherein at least a subset of the pairs have different spacing between corresponding cathodes and anodes. The differently spaced pairs of spaced conductive structures can be described as having multiple sized gaps D1, D2, . . . and Dn therebetween, where n is the number of pairs.

In various other embodiments, the plurality of pairs of spaced conductive structures can have nominally the same spacing between corresponding cathodes and anodes.

Without subscribing to any scientific theory, as described supra, under some circumstances, the generation of electrons for causing the arcing between the cathode and the anode can depend on the electric field there between. As a result, the spacing between the cathode and the anode can be selected or configured to arc at different threshold or trigger voltages.

Accordingly, in some embodiments, the pairs of spaced conductive structures can advantageously include differently spaced pairs of spaced conductive structures. These embodiments can be advantageous in estimating the actual voltage of an ESD event. For example, after an ESD event, by identifying a pair of spaced conductive structures having the largest separation distance among arced pairs of spaced conductive structures, an overstress voltage associated with the EOS event can be estimated. The trigger voltage associated with each gap can be known in advance, and damage to the tips bordering one gap, without damage to another gap, can indicate an event between the threshold voltages of the two gaps.

However, embodiments are not so limited. In some other embodiments, the pairs of spaced conductive structures can advantageously have nominally the same spacing.

Referring again to FIG. 1D, the plurality of pairs of spaced conductive structures are formed by a cathode 136, which includes a plurality of cathode conductive structures $136_1$, $136_2$, $136_3$, and an anode 140, which includes a plurality of corresponding anode conductive structures $140_1$, $140_2$, $140_3$. In the illustrated embodiment, three pairs of spaced conductive structures formed by cathode conductive structures $136_1$, $136_2$, $136_3$ and anode conductive structures $140_1$, $140_2$, $140_3$ are illustrated. However, in various embodiments, the EOS monitor device 132 can include any suitable number of pairs of cathode conductive structures and anode conductive structures. The spark-gap device represented by conductive fingers $136_1$ and $140_1$ is shown as being damaged, indicating an EOS event exceeding the trigger voltage for the left-most spark-gap device, and also indicating that the EOS event was below the trigger voltages for the other two spark-gap devices represented by conductive finger pairs $136_2/140_2$ and $136_3/140_3$.

Figure 1E:
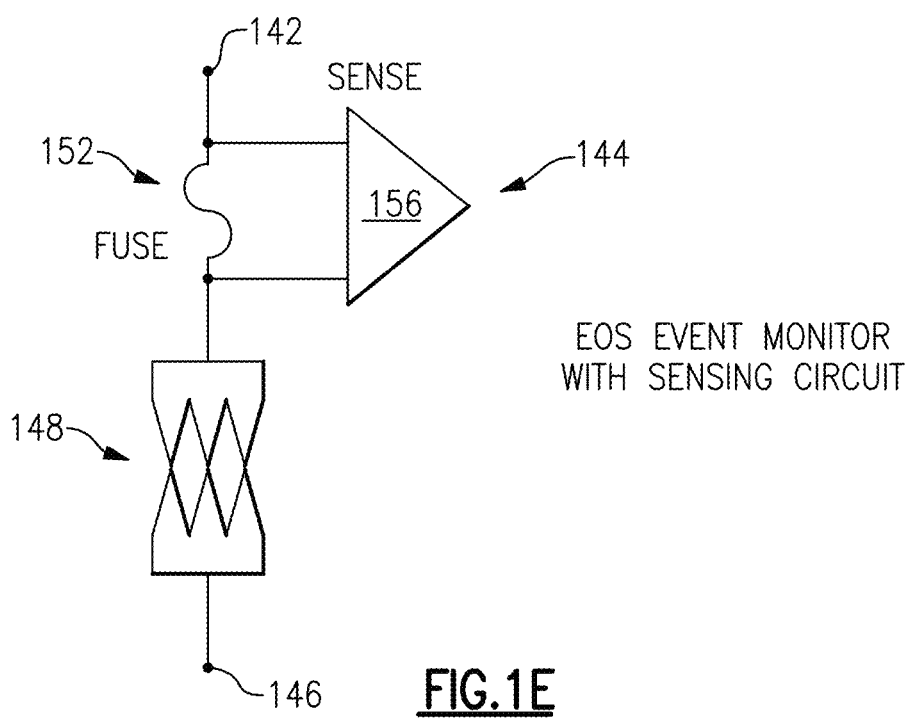
FIG. 1E is a schematic illustration of an EOS monitor device including a pair of spaced conductive structures electrically connected in series with a fuse, according to embodiments.

FIG. 1E is a schematic diagram of an EOS monitor device 144 including a first terminal 146, e.g., a high voltage terminal, and a second terminal 142, e.g., a low voltage terminal, according to some embodiments. Disposed between the first and second terminals 146, 148 is a spark-gap monitor device 148 including a plurality of pairs of spaced conductive structures electrically connected in series with a fuse 152, according to embodiments. The plurality of pairs 148 of spaced conductive structures are similar to those described above with respect to FIG. 1D. In some other embodiments, the first terminal 146 may be a low voltage terminal and the second terminal 148 may be a high voltage terminal.

Having the fuse 152 can be advantageous for several reasons. For example, the fuse 152 can be configured to estimate the current, speed and/or energy associated with the EOS event, according to various embodiments. In some embodiments, the fuse 152 can be rated based on a maximum current that the fuse can flow continuously without interrupting the circuit. Such embodiments can be advantageous when, in addition to the voltage of the EOS event which the spaced conductive structures 148 can be used to estimate, it is desirable to obtain the current generated by the EOS event. In some other embodiments, the fuse 152 can be rated based on the speed at which it blows, depending on how much current flows through it and the material of which the fuse is made. The operating time is not a fixed interval, but decreases as the current increases. Such an embodiment can be advantageous when, in addition to the voltage of the damaging EOS event, which the spaced conductive structures of the spark-gap monitor device 148 can be used to estimate, the current rating of the fuse 152 can be used to estimate the current of the EOS event, when it is desirable to obtain the duration of the EOS event. In some embodiments, the fuse 152 can be rated based on a maximum energy that the fuse can continuously conduct without interrupting the circuit. Such embodiments can be advantageous when, in addition to the voltage of the EOS event which the spaced conductive structures 148 can be used to estimate, it is desirable to obtain the energy generated by the EOS event. For example, the energy rating can be based on the value of $I^2t$, where I represents the current and t represents the duration of the EOS event. In various embodiments, $I^2t$ may be proportional to the energy associated melting the material of the fuse 152. Since the $I^2t$ rating of the fuse is proportional to the energy the fuse 152 consumes before melting, it can be a measure of the thermal damage that can be produced by the EOS event.

Still referring to FIG. 1E, the fuse 152 can additionally be advantageous for determining whether an EOS event had occurred by detecting an open circuit across the fuse 152 that is serially connected to the spark-gap monitor device 148 using, e.g., a sensing circuitry 144, which can include an operational amplifier 156.

Still referring to FIG. 1E, the fuse 152 can further be advantageous for shutting off the current flowing through the fuse 152 after an EOS event to prevent damage to other circuitry including the core circuit. This is because, once triggered, the spark-gap monitor device 148 may continue to pass high levels of current until the voltage across it falls below a holding voltage, as discussed infra, particularly where a power source is connected during the EOS event. By having a fuse 152 in series, the current flow thorough the conductive structures of the spark-gap monitor device 148 may be shut off upon exceeding a prescribed current, time and/or energy associated with the EOS event that is experienced by the spark-gap monitor device 148, thus limiting damage to the core circuits and other connected devices.

Figure 2A:
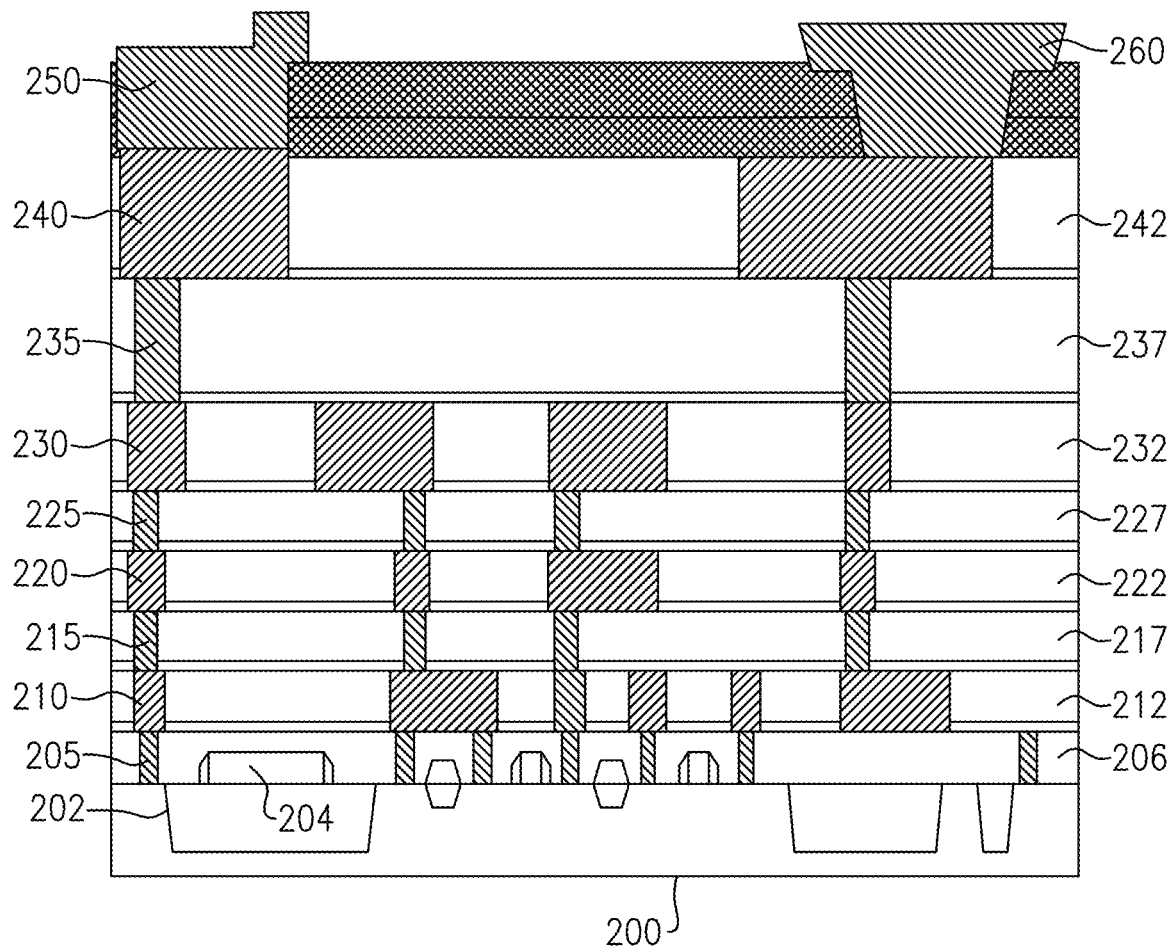
FIG. 2A is a schematic cross-sectional view of a semiconductor device having multiple levels of interconnect metallization, where one or more of the multiple levels can include an EOS monitor device, according to embodiments.

FIG. 2A is a schematic cross-sectional view of a semiconductor device including a substrate and multiple levels of interconnect metallization, where one or more of the multiple levels of interconnect metallization include an EOS monitor device, according to embodiments. The semiconductor device includes a spark-gap monitor device including pair of spaced conductive structures integrated with the substrate, where the spaced conductive structures are configured to electrically arc in response to an EOS event as described above with respect to FIGS. 1A-1D. The illustrated levels of interconnect metallization can be, e.g., Cu-based (either dual or single damascene process-based), Al-based (subtractive patterning-based) or based on other suitable metallization technology. The illustrated semiconductor device of FIG. 2A includes a semiconductor substrate 200 e.g., a silicon substrate. The semiconductor device includes one or more of various front-end structures including, e.g., and isolation regions 202, e.g., shallow trench isolation (STI) regions, wells, metal-oxide-semiconductor (MOS) transistors, bipolar junction transistors and PN junctions, to name a few. The semiconductor device additionally includes multilayer interconnect metallization structures including contacts 205 (Via 0), vias 215 (Via 1), 225 (Via 2) and 235 (Via 3). The semiconductor device additionally includes interconnect metallization levels 210 (Metal 1), 220 (Metal 2), 230 (Metal 3) and 240 (Metal 4), where Metal n and Metal n+1 are interconnected by Via n. One or more EOS monitor devices including a pair of spaced conductive structures can be formed in one or more of metallization levels 210, 220, 230 and 240. In addition, in some embodiments, fuses serially connected to the spaced conductive structures an also be formed in one or more of the same or different metallization levels 210, 220, 230 and 240. It will be understood, of course, that semiconductor devices can include additional metal levels, and that the spark-gap monitor devices can be formed at any suitable metal level in the back-end-of-line metallization layers of a semiconductor substrate. Furthermore, in other embodiments, the substrate may be a different material (e.g., glass) for a standalone EOS monitor die. Regardless of whether or not integrated with other devices, and whether or not formed on a semiconductor substrate, semiconductor fabrication techniques, such as photolithography and etching, can be used to define the spaced conductive structures, such as fingers, of spark-gap devices. The fabrication can be performed at the wafer level with subsequent dicing, regardless of whether the spark-gap device(s) are formed in a standalone monitor die or integrated with semiconductor device circuits.

Still referring to FIG. 2A, each of metallizations (Metal 1 to Metal 4) or vias (Vias 0 to Via 3) are formed, or buried, in one or more dielectric layers. In the present disclosure, dielectrics between two adjacent metal levels are referred to as inter-layer dielectrics (ILD), while dielectrics embedding a metal interconnect layer are referred to as intra-metal dielectrics (IMD). As shown in FIG. 2A, dielectric layers 217, 227, and 237 are ILD layers, while dielectric layers 212, 222, 232 and 242 are IMD layers. The semiconductor device additionally includes dielectric layers 206 (ILD 0), 212 (IMD 1), 217 (ILD 1), 222 (IMD 2), 227 (ILD 2), 232 (IMD 3), 237 (ILD 3) and 242 (IMD 4). The semiconductor device can additionally include atop the interconnect metallization levels a passivation layer including wire bond 250 and metal bump 260, which can be used, e.g., in flip chip packaging. For illustrative purposes, the interconnect metallization process architecture of FIG. 2A has four levels of metal, namely Metal 1 (210), Metal 2 (220), Metal 3 (230) and Metal 4 (240). However, embodiments are not so limited, and the interconnect metallization process architecture according to various embodiments can include more (five or more) or less (3 or less) metal levels. In the illustrated multi-level metal interconnect process architecture, alternating levels of metallization can run orthogonal to the levels above and below to minimize inter-level interference. In addition, the pitch of each interconnect metallization level can be higher compared to a lower interconnect metallization level. The semiconductor device can further include, at the top, I/O outputs passivated through, e.g., Al wire bonds (e.g., wire bond 250) or solder balls (e.g., metal bump 260), according to embodiments.

Still referring to FIG. 2A, each of the metallization levels and vias can be formed of any suitable metal described supra. According to various embodiments, the pair of spaced conductive metal structures can be formed in any of the metal levels 1 to n and can have a thickness from 0.1 µm to 10 µm, 0.1 µm to 5 µm, 0.1 µm to 1 µm, 0.1 µm to 0.5 µm, 0.5 µm to 1 µm, or any range defined by these values.

Each of IMD and ILD layers can be formed of a suitable dielectric material, e.g., silicon dioxide or silicon nitride, according to some embodiments. According to some other embodiments, the IMD and ILD layers can be formed of a suitable low-k material, e.g., fluorine-doped silicon dioxide, carbon-doped silicon dioxide, porous silicon dioxide, porous carbon-doped silicon dioxide, spin-on organic polymeric dielectric material and spin-on silicon-based polymeric dielectric material, to name a few.

Figure 2B:
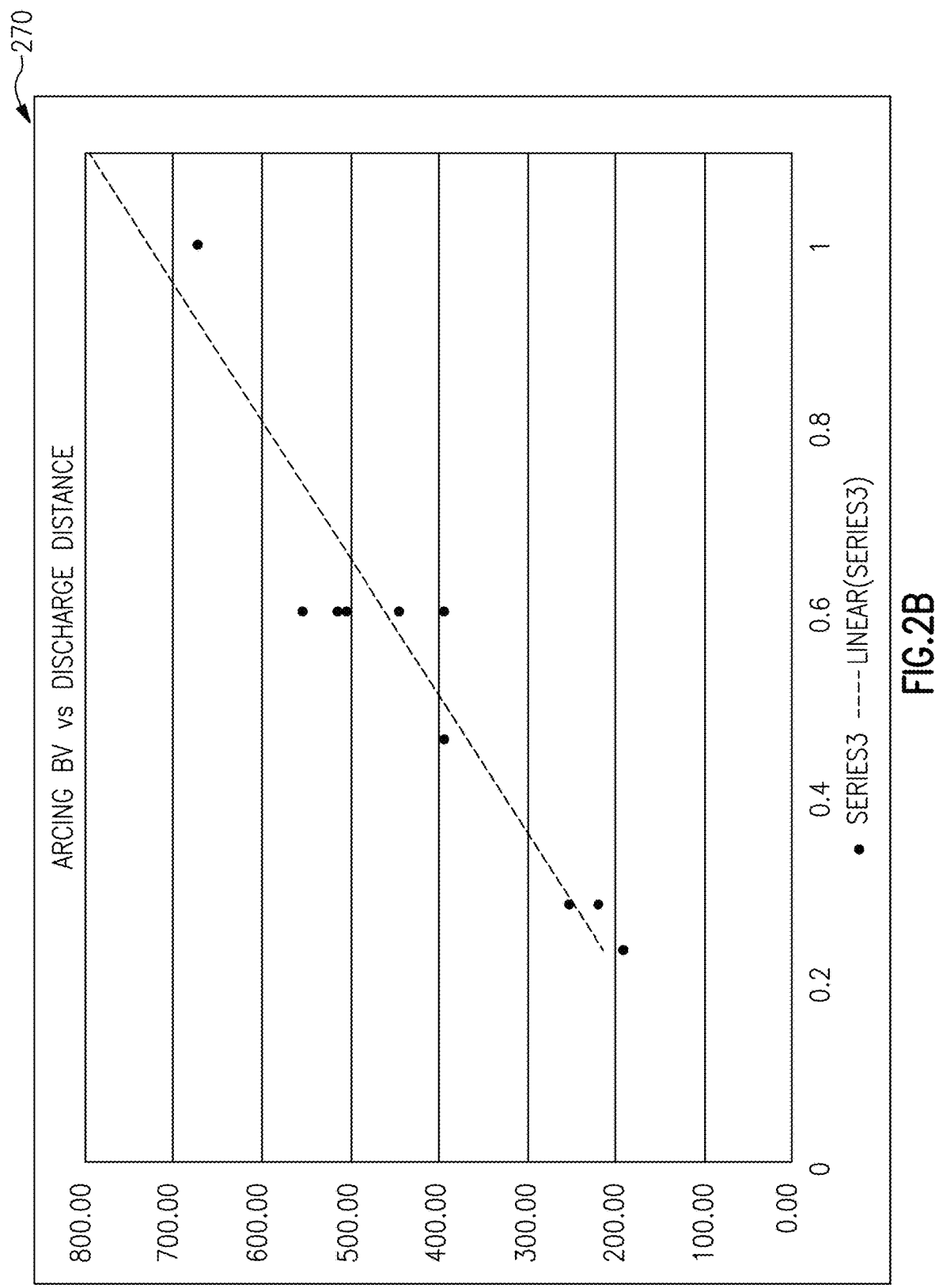
FIG. 2B is a graph illustrating an experimentally observed correlation between arcing voltages and spacing of conductive structures formed at various metallization levels, according to embodiments.

FIG. 2B is a graph 270 illustrating experimentally observed correlation between arcing voltages and spacings of EOS monitor devices each including a pair of spaced conductive structures formed at various metallization levels including metallization levels 1 through 5, according to embodiments. The graph plots arcing voltages in volts (y-axis) of various spaced conductive structures similar to those described above with respect to FIGS. 1A-1E, as a function of the spacing in microns (x-axis) between the cathode and the anode. As discussed supra, a generally linear relationship can be observed between the arcing voltages and the spacing between the cathode and the anode. Additional experimentally observed correlation is further illustrated with respect to FIG. 13.

Figure 3:
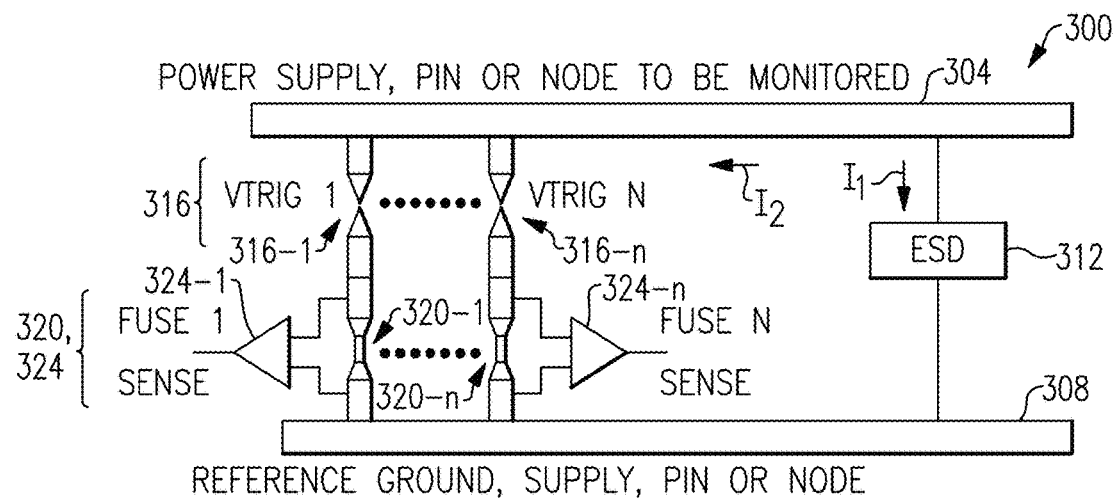
FIGS. 3 and 4 are schematic diagrams of EOS monitor devices including a plurality of pairs of spaced conductive structures configured to monitor voltage and/or energy associated with EOS events, according to embodiments.

FIG. 3 is a schematic diagram of an EOS monitor device 300 including a plurality of differently spaced pairs of conductive structures 316 configured to monitor voltage and/or energy associated with an EOS event, according to embodiments. The plurality of differently spaced pairs of conductive structures 316 includes pairs 316-1, 316-2, . . . 316-n of conductive structures each having a different gap therebetween, where the differently spaced pairs 316-1, 316-2, . . . 316-n of conductive structures are electrically connected in parallel and configured to electrically arc in response to different electrical overstress voltages $V_{TR1}$, $V_{TR2}$, . . . $V_{TRn}$, respectively. The plurality of differently spaced pairs of conductive structures 316 are connected between a voltage high supply, a voltage high pin or a voltage high node 304 at one end and a plurality of fuses 320 and a plurality of sense circuits 324 at the other end. The plurality of fuses 320 are connected to the plurality of differently spaced conductive structure 316 at one end and a voltage low supply, a voltage low pin or a voltage low node 308 at the other end. The plurality of fuses 320 includes fuses 320-1, 320-2, . . . 320-n serially connected to the differently spaced pairs 316-1, 316-2, . . . 316-n of conductive structures. The fuses 320-1, 320-2, . . . 320-n are configured to blow in response to different levels current, different durations and/or different energies, as described above with respect to FIG. 1E. The fuses 320-1, 320-2, . . . 320-n are connected to and configured to be sensed by sense circuits 324-1, 324-2, . . . 324-n.

Still referring to FIG. 3, the EOS monitor device 300 additionally includes an EOS protection device, labeled as ESD device 312, which can be a semiconductor-based EOS protection device, electrically connected in parallel to the plurality of differently spaced pairs of conductive structures 316 and the plurality of fuses 320. The EOS monitor device 300 is electrically connected to a core circuit (not shown).

In operation, in response to an EOS event, the ESD device 312 is triggered at a ESD trigger voltage $V_{TR\_ESD}$, followed by the plurality of spaced conductive structures 316 at $V_{TR1}$, $V_{TR2}$, . . . $V_{TRn}$ each lower than the $V_{TR\_ESD}$. Upon triggering, the ESD device 312 connected to the core circuit is configured to draw a majority current I1 resulting from an EOS overstress event, while the pairs of differently spaced conductive structures 316 connected to the core circuit is configured to draw a minority current I2 resulting from the EOS overstress event. In various embodiments, the EOS monitor device 300 can be configured such that I2 is 50% of I1 or less, 10% or less of I1, or 2% or less of I1, according to embodiments, such that the plurality of differently spaced conductive structures 316 is configured to serve primarily as a monitoring device to monitor voltage and/or energy associated with the EOS overstress event without drawing a relatively high level of current relative to the ESD device 312. Nevertheless, the fuses 324 protect against excessive current flow, particularly for applications where the EOS event may occur while connected to a power supply.

Figure 4:
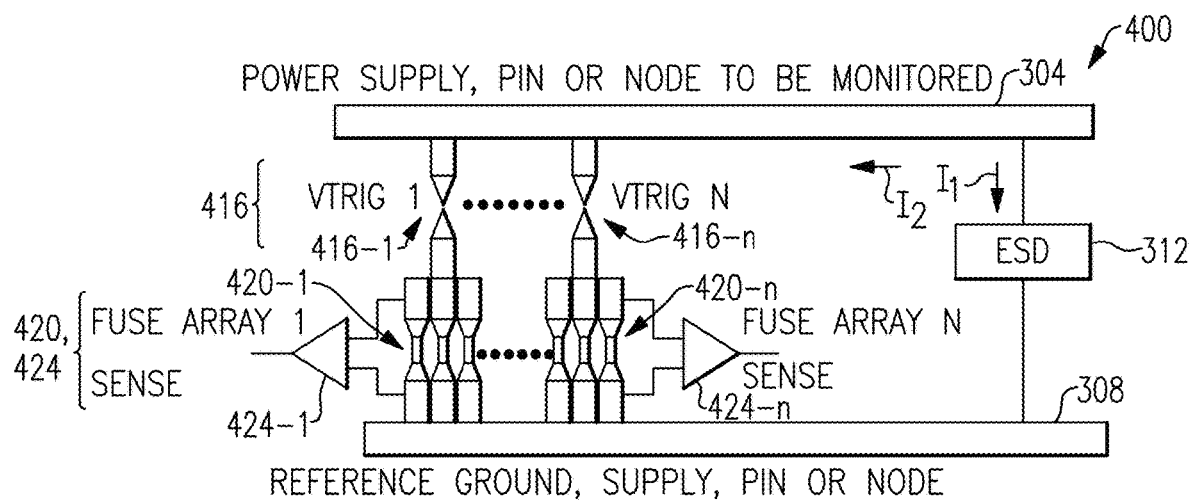

FIG. 4 is a schematic diagram of an EOS monitor device 400 including a plurality of differently spaced pairs of conductive structures 416 configured to monitor voltage and/or energy associated with an EOS event, according to embodiments. The EOS monitor device 400 is configured similarly in some respects to the EOS monitor device 300 described above with respect to FIG. 3, whose similarities will not be described in detail. In the EOS monitor device 400, a plurality of differently spaced pairs of conductive structures 416 are connected between a voltage high supply, a voltage high pin or a voltage high node 304 at one end and a plurality of fuses 420 and a plurality of sense circuits 424 at the other end. The plurality of fuses 320 are connected to the plurality of differently spaced conductive structure 416 at one end and a voltage low supply, a voltage low pin or a voltage low node 308 at the other end. Unlike the EOS monitor device 300 described above with respect to FIG. 3, however, each of the fuses 420-1, 420-2, . . . 420-n serially connected to the differently spaced pairs 416-1, 416-2, . . . 416-n of conductive structures in turn includes a plurality of fuse elements. The fuses 420-1, 420-2, . . . 420-n are configured to blow in response to different levels of current, different durations and/or different energies, as described above with respect to FIG. 1E. In addition, each of the parallel fuse elements of each of fuses 420-1, 420-2, . . . 420-n are in turn configured to blow in response to different levels current, different durations and/or different energies, as described above with respect to FIG. 1E.

Thus, the EOS monitor devices 300 (FIG. 3) and 400 (FIG. 4) comprise pairs of conductive structures that have different gaps and configured to arc in response to overstress voltages that are related, e.g., linearly related to the different gaps, such that, in response to an EOS event, a voltage associated with the EOS event can be estimated. For example, the voltage can be estimated by identifying a pair of spaced conductive structures having the largest separation distance among arced pairs of spaced conductive structures, and estimating therefrom a maximum voltage associated with the EOS event.

In addition, the EOS monitor devices 300 (FIG. 3) and 400 (FIG. 4) comprise one or more different fuses serially connected to different pairs of conductive structures having different gaps such that, in response to an EOS event, an energy associated with the EOS event can be estimated. For example, the energy can be estimated by, for a given pair of arced conductive structure, identifying the energy rating of the blown fuse (FIG. 3) or identifying the energy rating of a fuse having the largest energy rating among blown fuses (FIG. 4) (assuming that still higher energy rated fuses remain unblown), and estimating therefrom the energy associated with the EOS event.

Figure 5A:
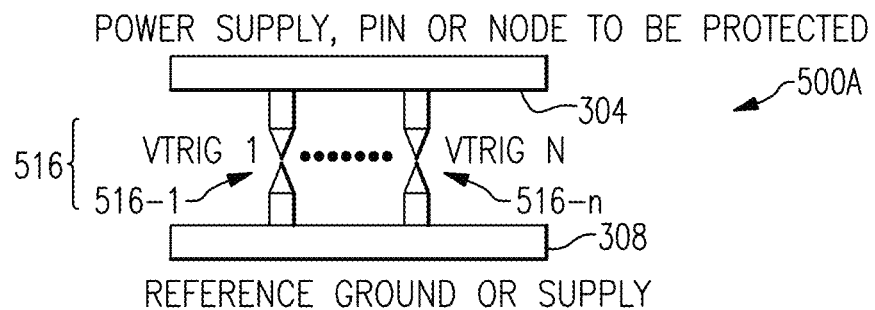
FIGS. 5A and 5B are schematic diagrams EOS protection devices including a plurality of pairs of spaced conductive structures configured to serve as electrostatic discharge (ESD) devices to protect a core device against an EOS event, according to embodiments.

FIG. 5A is a schematic diagram of an EOS protection device 500A including a plurality of pairs of differently spaced conductive structures 516 configured as EOS protection devices to protect a core device against an EOS event, according to embodiments. Unlike the EOS monitor devices illustrated with respect to FIGS. 3 and 4, the EOS protection device 500A may not include one or more fuses. The EOS protection device 500A includes a plurality of differently spaced pairs of conductive structures 516 which includes pairs 516-1, 516-2, . . . 516-n of differently spaced conductive structures each having a different gap therebetween, where the differently spaced pairs 516-1, 516-2, . . . 516-n of conductive structures are electrically connected in parallel and configured to electrically arc in response to different electrical overstress voltages $V_{TR1}$, $V_{TR2}$, . . . $V_{TRn}$, respectively. The plurality of differently spaced pairs of conductive structures 516 are connected between a voltage high supply, a voltage high pin or a voltage high node 304 at one end and a voltage low supply, a voltage low pin or a voltage low node 308 at the other end.

In operation, the EOS protection device 500A is configured as both a protection and a monitor device, and the pairs of differently spaced conductive structures 516 connected to the core circuit are configured to draw a majority or substantially all of the current resulting from the EOS overstress event and steer it to the ground, voltage low supply, a voltage low pin or a voltage low node 308.

Figure 5B:
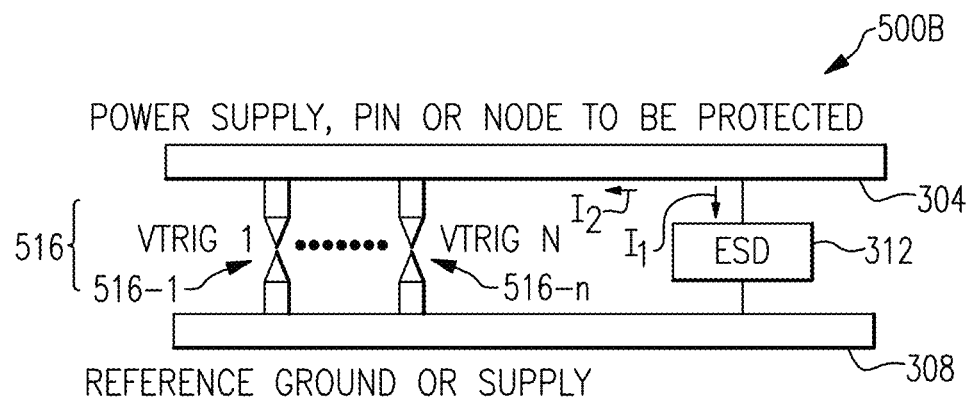

FIG. 5B is a schematic diagram of an EOS protection device 500B including a plurality of differently spaced pairs of conductive structures 516 configured as EOS monitor devices to allow determination of a maximum level of voltage for one or more EOS events, according to embodiments.

Unlike the EOS protection device 500A described above with respect to FIG. 5A, the EOS monitor device 500B additionally includes an EOS protection device, labeled as an ESD device 312, which can be a semiconductor-based ESD device, electrically connected in parallel to the plurality of differently spaced conductive structures 516. The EOS monitor device 500B is electrically connected to a core circuit (not shown). Having the EOS protection device 500A in addition to the ESD device 312 can be advantageous where the ESD device 312 itself can be damaged under high current.

In operation, in response to an EOS event, the ESD device 312 is triggered at a ESD trigger voltage $V_{TR\_ESD}$, followed by the plurality of spaced conductive structures 516 at $V_{TR1}$, $V_{TR2}$, . . . $V_{TR}$ n each lower than the $V_{TR\_ESD}$, in a similar manner described above with respect to FIG. 3. Upon triggering, the EOS protection device 500B is configured as a protection device and the pairs of differently spaced conductive structures 516 connected to the core circuit are configured to draw a majority or substantially all of the current resulting from the EOS overstress event and steer it to the voltage low supply, a voltage low pin or a voltage low node 308. The ESD device 312 connected to the core circuit can be configured to draw a minority current I1 resulting from an EOS overstress event, while the pairs of differently spaced conductive structures 316 connected to the core circuit are configured to draw a majority current I2 resulting from the EOS overstress event. In various embodiments, the EOS monitor device 300 can be configured such that I2 is 50% of I1 or more, 90% or more of I1, or 98% or more of I1, according to embodiments, such that the plurality of differently spaced conductive structures 516 are configured to serve primarily as an EOS protection device to protect the core circuit.

It will be appreciated that, while in FIGS. 5A and 5B, for clarity, the illustrated EOS protection devices 500A and 500B include the pairs of spaced conductive structures 516-1, . . . , 516-n each of which are connected directly between a voltage high node 304 and a voltage low node 308, in various implementations, each of the spaced conductive structures 516 may be connected, e.g., serially connected, to a sensing element, e.g., a serially connected fuse or a serially connected resistor, for detecting whether the spaced conductive structures have been triggered in response to an electrical overstress event. These configurations are further illustrated elsewhere in the specification, e.g., with respect to FIGS. 7A and 7B.

Figure 6:
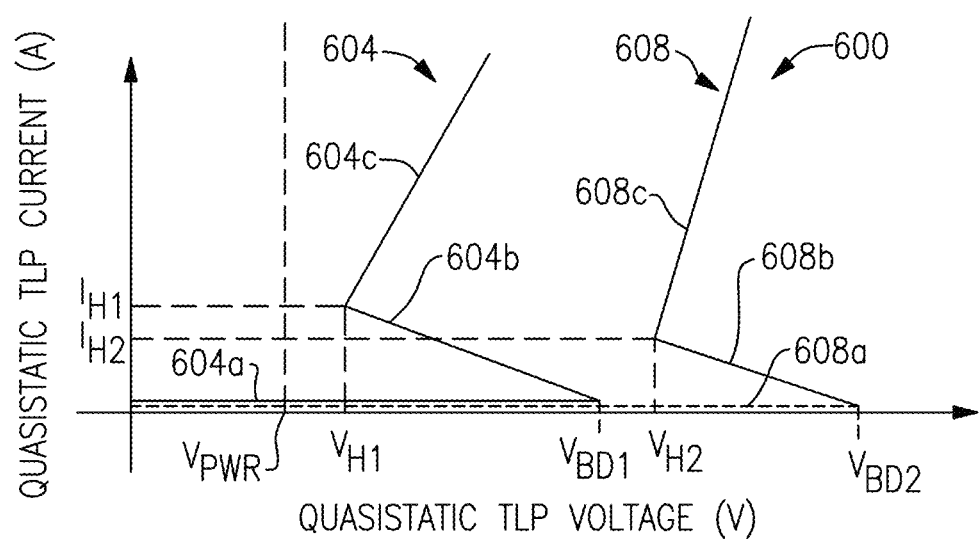
FIG. 6 illustrates schematic quasistatic current-voltage curves of a pair of spaced conductive structures and an ESD device, according to embodiments.

FIG. 6 is a graph 600 illustrating schematic quasistatic current-voltage (IV) curves 604, 608 of a pair of spaced conductive structures and an EOS protection device, respectively, according to embodiments. The IV curve 604 schematically illustrates a quasistatic response of the pair of spaced conductive structures (e.g., 516 in FIG. 5B) to an EOS event, and the curve 608 schematically illustrates a quasistatic response of an EOS protection device (e.g., 312 in FIG. 5B) to the EOS event. The x-axis and the y-axis represent the quasistatic voltage and the corresponding current, respectively. The IV curves 604 and 608 have respective blocking regions ("OFF" regions) 604a and 608a, respectively characterized by very high impedances, between the origin and respective breakdown voltages $V_{BD1}$ and $V_{BD2}$. $V_{BD1}$ may correspond to a triggering voltage ($V_{TR}$) of the pair of spaced conductive structures and $V_{BD2}$ may correspond to a triggering voltage ($V_{TR}$) or a threshold voltage ($V_{TH}$) of a BJT or an avalanche diode of the ESD device. When the voltage of the EOS event exceeds $V_{BD2}$, dV/dI becomes zero and switching of the EOS protection device occurs. The switching of the EOS protection device is followed by switching of the pair of spaced conductive structures when the voltage across the spaced conductive structures exceeds VBD2, upon which dV/dI becomes zero and switching of the pair of spaced conductive structures occurs. The blocking regions 604a and 608a are followed by respective negative resistance regions 604b and 608b (also referred to as "snap-back region") between VBD1 and a first hold voltage VH1 and between VBD2 and a second hold voltage VH2, respectively, followed by respective positive resistance regions ("ON" regions) 604c and 608c. At the hold voltages $V_{H1}$ and $V_{H2}$, the corresponding holding current values are $I_{H1}$ and $I_{H2}$, respectively, which can represent minimum level of currents that can maintain the "ON" states of the respective devices. According to embodiments, the pair of spaced conductive structures and the EOS protection device are configured such that, under quasistatic conditions or in response to a voltage signal having a relatively long duration (e.g., longer than about 100 ns or longer than about 1 μs), the $V_{BD1}$ of the spaced conductive structures is lower than the $V_{BD2}$ and $V_{H2}$ of the EOS protection device, such that the pair of spaced conductive structures is triggered while the EOS protection device remains conducting after being switched to a low impedance state in response to an EOS event. It will be appreciated that when the $V_{BD1}$ of the spaced conductive structures is higher than the $V_{BD2}$ and $V_{H2}$ of the EOS protection device, the pair of spaced conductive structures may not trigger.

It will be appreciated that, under operational conditions in which the core circuit is powered up, once activated, the pair of spaced conductive structures may continue to conduct high levels of current even after the EOS event has ceased, if the voltage high supply voltage 304 (FIGS. 3-5B) is at a higher voltage relative to the hold voltage $V_{H1}$ of the pair of spaced conductive structures. Thus, still referring to FIG. 6, in various embodiments, it can be desirable to have the EOS monitor devices configured such that its hold voltage is greater than the voltage high supply voltage $V_{PWR}$. In the following, with respect to FIGS. 7A-8B, embodiments of EOS monitor devices and EOS protection devices having hold voltages higher than the VpwR are described.

Figure 7A:
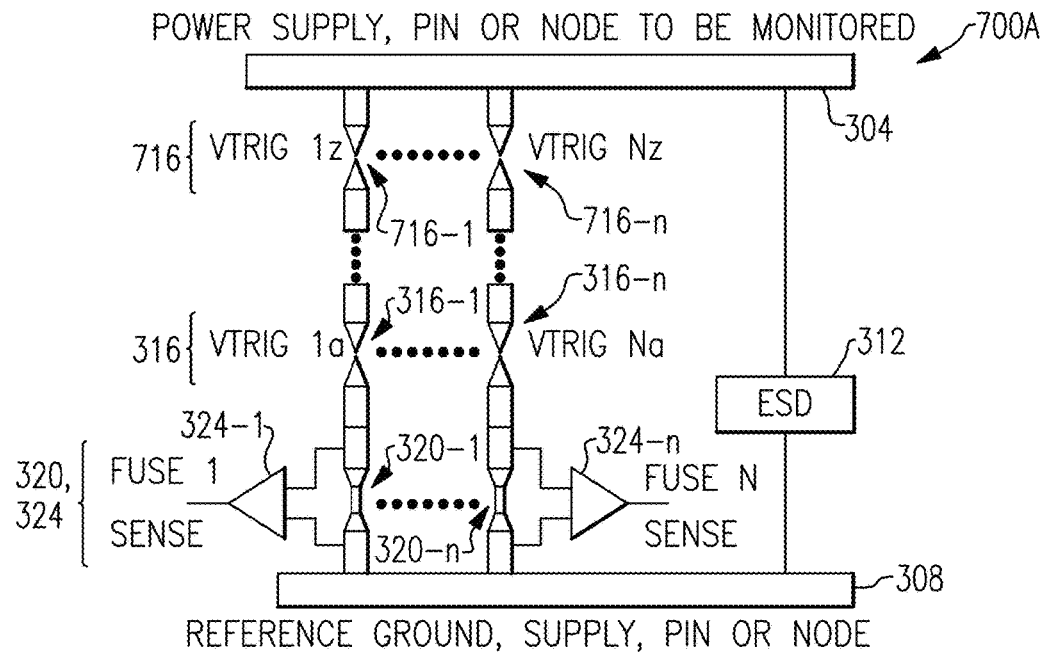
FIGS. 7A and 7B are schematic diagrams of EOS monitor devices including a plurality of serially connected pairs of spaced conductive structures configured to monitor voltage and/or energy associated with an EOS event, according to embodiments.

FIG. 7A is a schematic diagram of an EOS monitor device 700A including a plurality of serially connected pairs of spaced conductive structures configured to monitor voltage and/or energy associated with an EOS event, according to embodiments. The EOS monitor device 700A is configured similarly to the EOS monitor device 300 described supra with respect to FIG. 3, except the EOS monitor device 700A additionally includes a second through zth plurality of differently spaced pairs of conductive structures 716, wherein each includes differently spaced pairs 716-1, 716-2, . . . 716-n of conductive structures each having a different gap therebetween. Each of differently spaced pairs 716-1, 716-2, . . . 716-n of conductive structures is connected to the voltage high supply 304 on one end and serially connected to a corresponding one of differently spaced pairs 316-1, 316-2, . . . 316-n of conductive structures each having a different gap therebetween. Each serially connected the pairs, e.g., 716-1/316-1, 716-2/316-2, . . . and 716-n /316-n, are in turn electrically connected in parallel to result in a net hold voltage that is greater than each pair of conductive structures alone. Thus, each serially connected pair, e.g., 716-1/316-1, 716-2/316-2, . . . or 716-n /316-n is configured to electrically arc in response to different electrical overstress voltages $V_{TR1}$, $V_{TR2}$, . . . $V_{TRn}$, respectively.

Figure 7B:
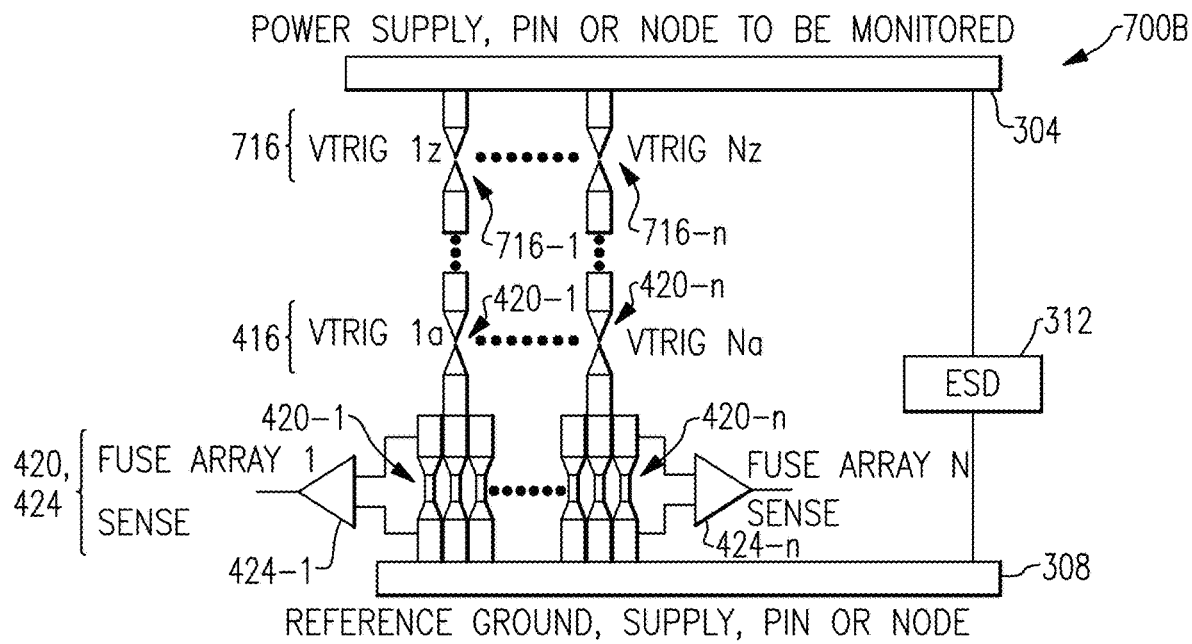

FIG. 7B is a schematic diagrams of an EOS monitor device including a plurality of serially connected pairs of spaced conductive structures configured to monitor voltage and/or energy associated with an EOS event, according to embodiments. The EOS monitor device 700B is configured similarly to the EOS monitor device 400 described supra with respect to FIG. 4, except the EOS monitor device 700A additionally includes a second through zth plurality of differently spaced pairs of conductive structures 716, wherein each including differently spaced pairs 716-1, 716-2, . . . 716-n of conductive structures each having a different gap therebetween. In an analogous manner as described above with respect to the EOS monitor device 700A of FIG. 7A, the serially connected pairs, e.g., 716-1/416-1, 716-2/416-2, . . . and 716-n /416-n, are in turn electrically connected in parallel to result in a net hold voltage that is greater than each pair of conductive structures alone. Thus, each serially connected pair, e.g., 716-1/416-1, 716-2/416-2, . . . or 716-n /416-n is configured to electrically arc in response to a different electrical overstress voltage $V_{TR1}$, $V_{TR2}$, . . . $V_{TRn}$, respectively.

Figure 8A:
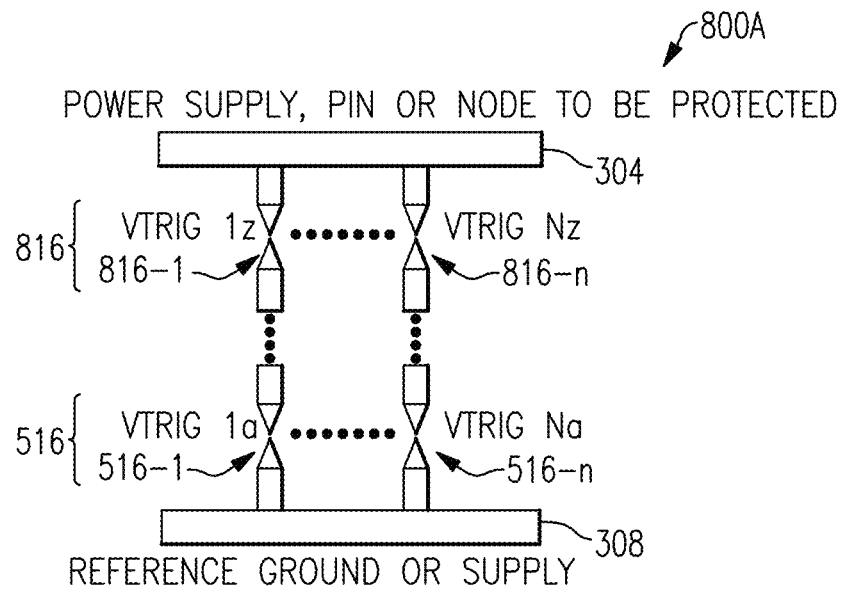
FIG. 8A is a schematic diagram of an EOS protection and monitoring arrangement including a plurality of serially connected pairs of spaced conductive structures configured as electrostatic discharge (ESD) devices to protect a core device against an EOS event, according to embodiments.
Figure 8B:
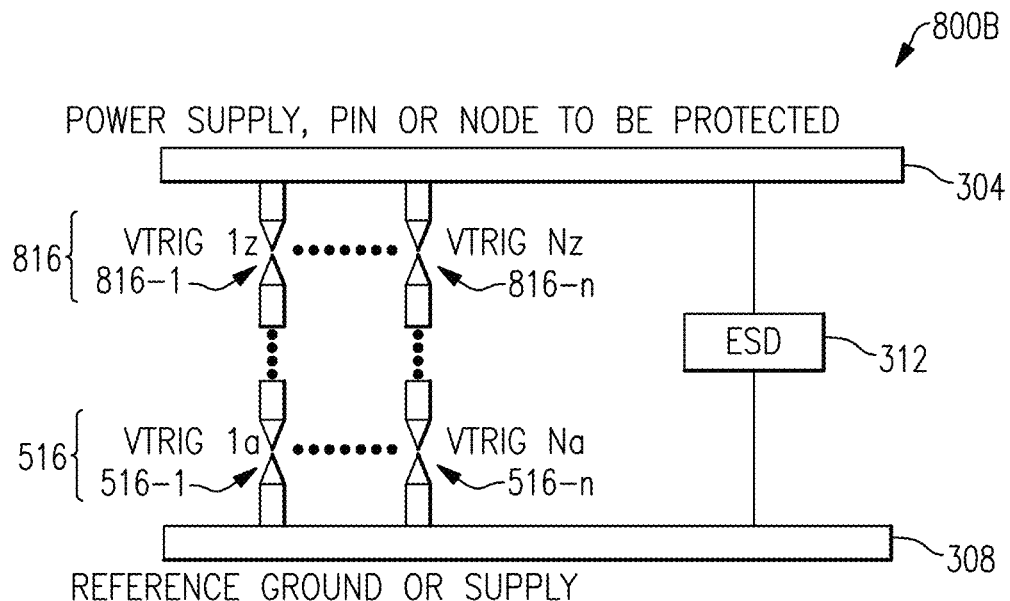
FIG. 8B is a schematic diagram of an EOS protection and monitoring arrangement including a plurality of serially connected pairs of spaced conductive structures configured to monitor EOS events and a separate electrostatic discharge (ESD) device configured to protect a core device against an EOS event, according to embodiments.

FIGS. 8A and 8B are schematic diagrams EOS protection devices 800A and 800B, respectively, each including a plurality of serially connected pairs of spaced conductive structures configured as EOS protection devices to protect a core device against an EOS event, according to embodiments. Each of EOS protection devices 800A and 800B is configured similarly to the EOS monitor devices 500A (FIG. 5A) and 500B (FIG. 5B) described supra, respectively, except each of the EOS protection devices 800A and 800B additionally include a second through zth plurality of differently spaced pairs of conductive structures 816, each of which includes differently spaced pairs 816-1, 816-2, . . . 816-n of conductive structures each having a different gap therebetween. In an analogous manner as described above with respect to the EOS monitor devices 700A and 700B of FIGS. 7A and 7B, respectively, each serially connected the pairs, e.g., 816-1/516-1, 616-2/616-2, . . . and 816-n/516-n, are in turn electrically connected in parallel to result in a net hold voltage that is greater than each pair of conductive structures alone. Thus, each serially connected pair, e.g., 816-1/516-1, 816-2/516-2, . . . or 816-n /616-n is configured to electrically arc in response to a different electrical overstress voltages $V_{TR1}$, $V_{TR2}$, . . . $V_{TRn}$, respectively.

Thus, referring back to FIG. 6, by including a plurality of serially connected pairs of spaced conductive structures, embodiments of EOS monitor devices and ESD devices have hold voltages higher than the $V_{PWR}$ supplied to the core circuit, such that conduction through the serially connected pairs of spaced conductive structures cease when the ESD event ceases, thereby preventing excessive post ESD event leakage and/or damage to the core circuit.

FIG. 9A is a schematic top-down view of a plurality of pairs 900 of differently spaced conductive structures electrically connected in parallel, according to embodiments. In the illustrated embodiment, the plurality of pairs 900 has n number of pairs 900-1, 900-2, . . . and 900-n of spaced conductive structures comprising fingers in the shape of protrusions having sharpened tips. The number n can be any suitable number ranging from 1 to 100, 2 to 10, for instance 5. Each protrusion can be described as having a width 912, a tab (T) 904 and a chamfer (C) 908, and the pairs 900-1, 900-2, . . . and 900-n of protrusions can be described as having gaps D1, D2, . . . and Dn therebetween, respectively. One quantitative implementation has the following parameters:

Nominal arcing voltage=800V/μm
Tab T=20 μm for 10A
Variable Chamfer C=2.5 um, 5 um, 20 um, 40 um, 100 um for D=0.15 um
C=10 μm for 5-finger structures
Metallization levels: Met5, Met4, with 1 default structure in Met3/2/1
D=0.075 μm for arcing voltage of 60V
D=0.1 μm for arcing voltage of 80V
D=0.125 μm for arcing voltage of 100V
D=0.15 μm arcing voltage of 120V (Default)
D=0.175 μm for arcing voltage of 140V
D=0.2 μm for arcing voltage of 160V
D=0.28 μm for arcing voltage of 224V (220V measured)
Metallization thickness =0.53 μm for Met 1-Met 4; 0.95 to 0.99 μm for Met 5.

Figure 9B:
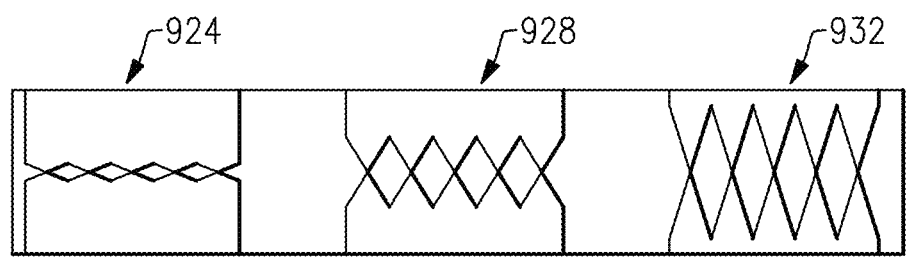
FIG. 9B are schematic top-down views of lithographically patterned, deposited metal layers, showing different configurations of pairs of spaced conductive structures electrically connected in parallel, according to embodiments.

FIG. 9B are schematic top-down views of patterned metal layers 924, 928 and 932 showing different configurations of pairs of spaced conductive structures having sharpened tips electrically connected in parallel, according to embodiments. The patterns can be defined photolithographically using semiconductor fabrication technology. According to embodiments, the sharpened tips can have a tip or an apex formed by two sides forming an angle of 10 to 170 degrees, 10 to 50 degrees, 50 to 90 degrees, 90 to 130 degrees, 130 to 170 degrees, or any angle between these values.

FIG. 10A is a schematic top-down view of a plurality of pairs 1000 of spaced conductive structures electrically connected in parallel, according to embodiments. In the illustrated embodiment, the plurality of pairs 1000 has n number of pairs 1000-1, 1000-2, . . . and 1000-n of spaced conductive structures comprising fingers in the shape of protrusions having blunt or rounded tips. The number n can be any suitable number ranging from 1 to 100, 2 to 10, for instance 5. Each protrusion can be described as having a width 1012, a tab (T)1004 and a chamfer (C) 1008, and the pairs 1000-1, 1000-2, . . . and 1000-n of protrusions can be described as having gaps D1, D2, . . . and Dn therebetween, respectively. One quantitative implementation has the following parameters:

Nominal arcing voltage=800V/μm
Tab T=20 μm for 10A, C=T/2
Default is 5× finger structure
Metallization levels: Met5, Met4, with 1 default structure in Met3/2/1
D=0.075 μm for arcing voltage of 60V
D=0.1 μm for arcing voltage of 80V
D=0.125 μm for arcing voltage of 100V
D=0.15 μm for arcing voltage of 120V (Default)
D=0.175 μm for arcing voltage of 140V
D=0.2 μm for arcing voltage of 160V
D=0.28 μm for arcing voltage of 224V calculated (220V measured)
Variable Chamfer C for D=0.15 μm
T=5 μm, 10 μm, 40 m
Metallization thickness=0.53 μm for Met 1-Met 4; 0.95 to 0.99 μm for Met 5.

Figure 10B:
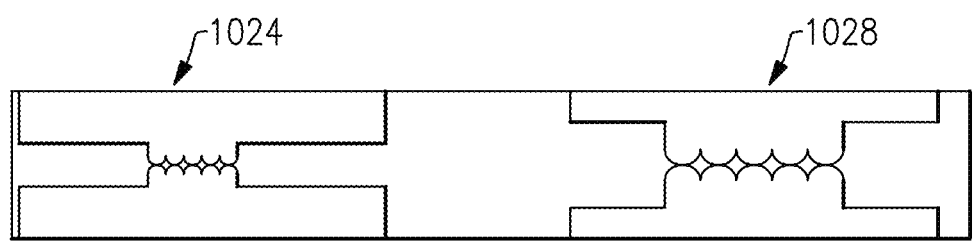
FIG. 10B are schematic top-down views of lithographically patterned, deposited metal layers, showing different configurations of pairs of spaced conductive structures electrically connected in parallel, according to embodiments.

FIG. 10B are schematic top-down views of patterned metal layers 924, 928 and 932 showing different configurations of pairs of spaced conductive structures having rounded tips electrically connected in parallel, according to embodiments. The patterns can be defined photolithographically using semiconductor fabrication technology.

Figure 11:
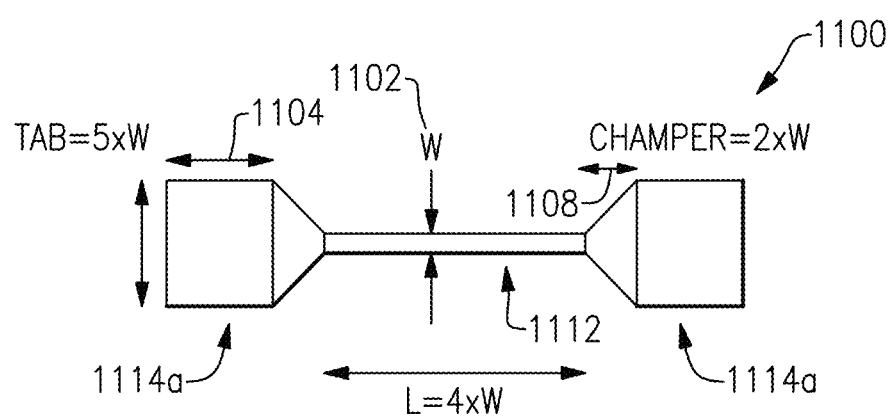
FIG. 11 is a schematic top-down view of a fuse that can be connected in series with spark-gap devices, according to embodiments.

FIG. 11 is a schematic top-down view of a fuse 1100, according to embodiments. In the illustrated embodiment, the fuse has two end portions 1114a, 1114b connected by a connecting portion 1102. The end portions of the fuse 1114a 1114b can be described as having a width 1112, a tab (T) 1104 and a chamfer (C) 1108, and the connecting portion can as a width 1102. One quantitative implementation has the following parameters:

Met1 to Met4 transient current density=0.45A/μm
Met5 transient current density=0.9A/μm
Met5 W=2 μm for current of 2 A
Met5 W=5 μm for current 5 A
Met5 W=10 μm for current 10 A
Met3 W=4 μm for current 2 A
Met3 W=10 μm for current 5 A
Met3 W=20 μm for current 10 A
Met1 W=4 μm for current 2 A
Met1 W=10 μm for current 5 A
Met1 W=20 μm for current 10 A
Chamfered connection
L=50 μm
Metallization thickness=0.53 μm for Met 1-Met 4; 0.95 to 0.99 μm for Met 5

Figure 12:
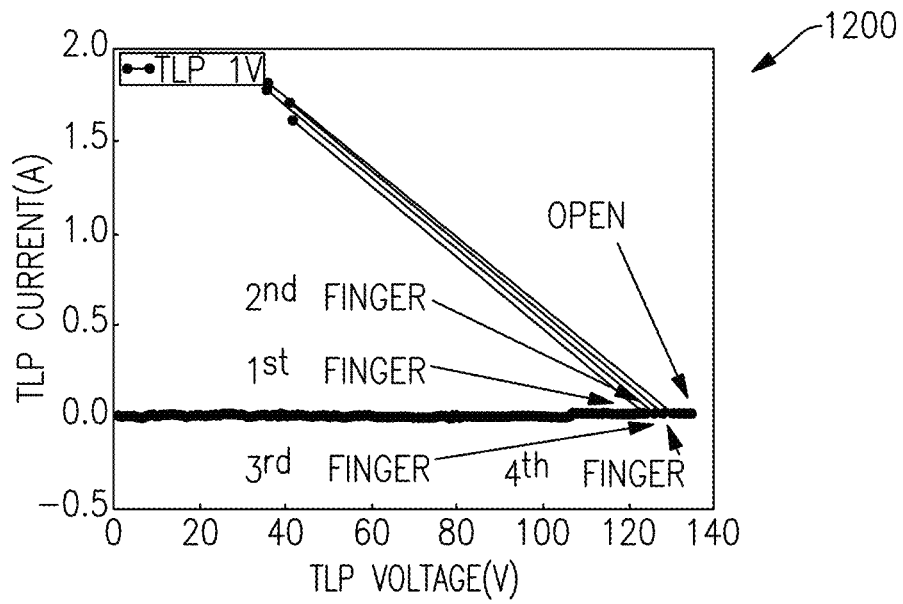
FIG. 12 illustrates experimental current-voltage curves measured on an electrical overstress (EOS) monitor device including a plurality of pairs of spaced conductive electrically connected in parallel, according to embodiments.

FIG. 12 is a graph 1200 illustrating experimental current-voltage (IV) curves measured on an electrical overstress (EOS) monitor device including a plurality of pairs of spaced conductive electrically connected in parallel, according to embodiments. In particular, the IV curves are those of an EOS monitor device having five pairs of differently spaced conductive structures electrically connected in parallel, similar to those described above with respect to FIG. 9B.

Figure 13:
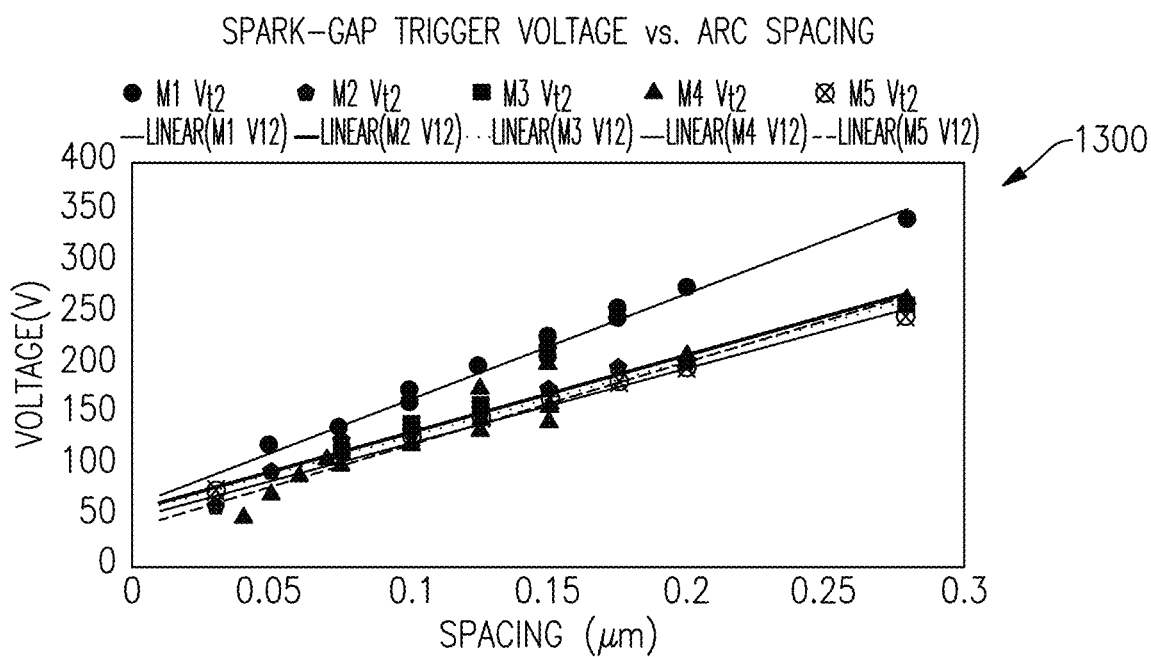
FIG. 13 is a graph illustrating experimentally observed relationships between arcing voltages and spacing of EOS monitor devices each including a pair of spaced conductive structures formed at various metallization levels for back end of line (BEOL) metallization in a semiconductor device, according to embodiments.

FIG. 13 is a graph 1300 illustrating experimentally observed correlations between arcing voltages and the spacing of conductive structures of EOS monitor devices, where each includes a pair of spaced conductive structures formed at various metallization levels (Metal 1 to Metal 5), according to embodiments. The voltage-spacing relationships are those of EOS monitors device having a plurality of pairs of differently spaced conductive structures electrically connected in parallel, similar to those described above with respect to FIGS. 9A and 9B. The structures formed at each metallization level generally show a linear relationship between the arcing voltage and the spacing, or gap size. Based on such correlations, precise tuning of trigger voltage can be obtained for a voltage range of about 20 V to about 1000 V. Additional experimentally observed correlation is further illustrated with respect to FIG. 2B.

Figure 14A:
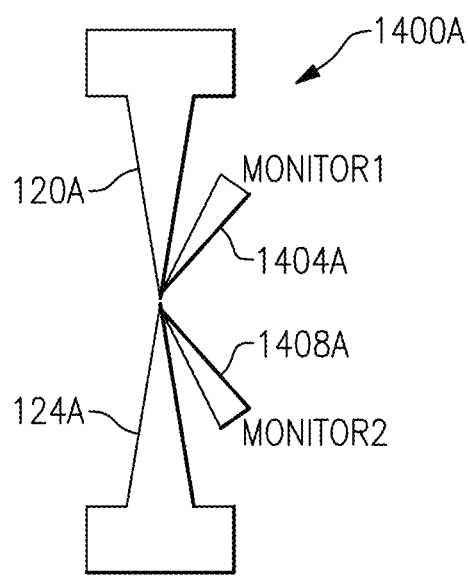
FIGS. 14A and 14B are schematic illustrations of an electrical overstress (EOS) monitor device including a pair of spaced conductive structures, before and after electrically arcing in response to an EOS event, according to embodiments.
Figure 14B:
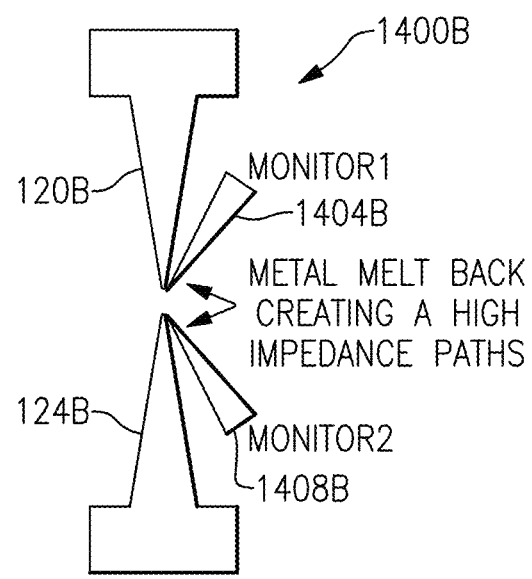

FIGS. 14A and 14B are schematic illustrations of a spark-gap device for serving as an integrated an electrical overstress (EOS) monitor device, including a pair 1400A/1400B of spaced conductive structures, before (FIG. 14A) and after (FIG. 14B) electrically arcing in response to an EOS event, according to embodiments. Similar to the schematic diagram of the electrical overstress (EOS) monitor described above with respect to FIG. 1B, the pair 1400A of spaced conductive structures includes a cathode 120A and an anode 124A prior to arcing, and the pair 1400B of spaced conductive structures includes an anode 120B and the anode 124B subsequent to arcing. In addition, the EOS monitor device includes cathode and anode monitor probes 1404A/1404B and 1408A, 1408B, respectively. Referring to FIG. 14A, prior to arcing, the cathode and anode monitor probes 1404A and 1408A contact the cathode 120A and the anode 124A, respectively. Referring to FIG. 14B, as a result of arcing, one or both of the cathode and anode monitor probes 1404B and 1408B become disconnected from the cathode 120B and an anode 124B, respectively. Thus, whether an arcing has occurred across the cathode and the anode can be determined visually, or based on whether an open circuit is detected between the cathode 120B and the cathode probe 1404B and/or between the anode 124B and the anode probe 1408B.

Figure 15:
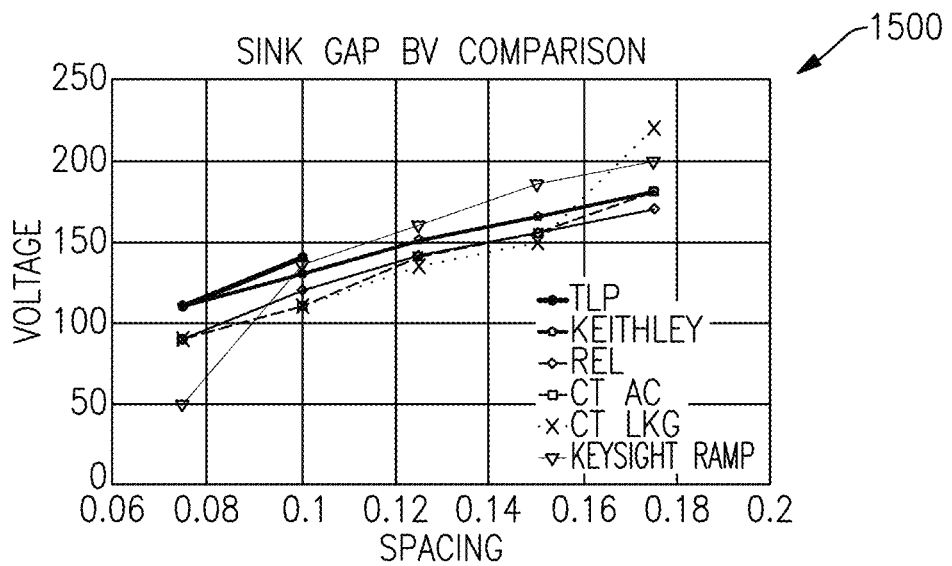
FIG. 15 is a graph illustrating experimentally observed wafer-level relationships between arcing voltages and spacing between a pair of spaced conductive structures, according to embodiments.

FIG. 15 is a graph 1500 illustrating experimentally observed wafer-level relationships between arcing voltages and spacing of a pair of spaced conductive structures, according to embodiments. The measurements were performed using different types of testers. The TLP measurement was performed under a transmission line pulse mode, while other measurements were performed under DC-type mode.

Figure 16:
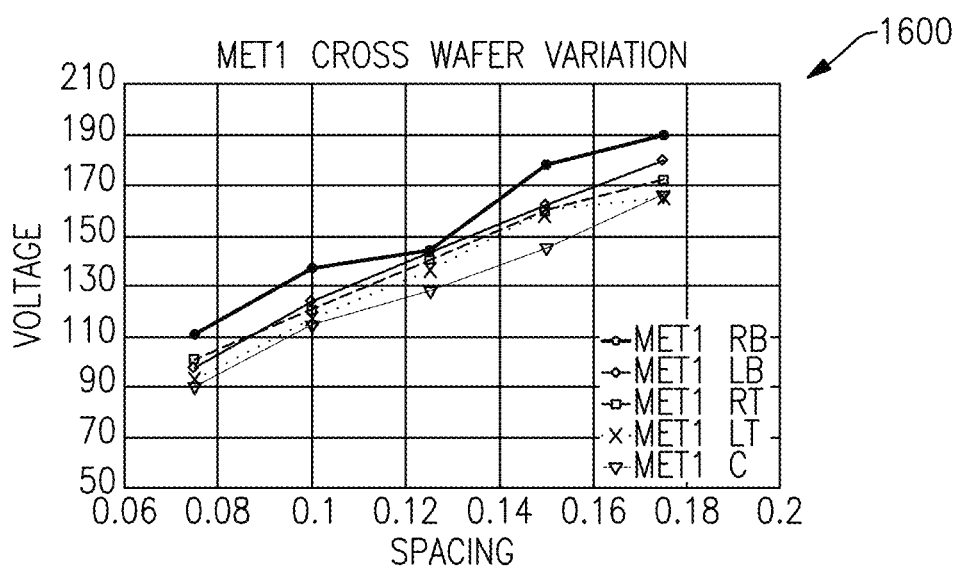
FIG. 16 is a graph illustrating experimentally observed wafer-level relationships between arcing voltages (also referred to as breakdown voltages or BV) and spacing between a pair of spaced conductive structures formed at metal 1 level, according to embodiments.

FIG. 16 is a graph 1600 illustrating experimentally observed wafer-level relationships between arcing voltages and spacing of a pair of spaced conductive structures formed at metal 1 level, according to embodiments. The measurements were performed under DC-type mode using a Keithley tester. RB, LB, RT, LT and C indicate right bottom, left bottom, right top, left top and center locations, respectively, of the tested wafer.

Figure 17:
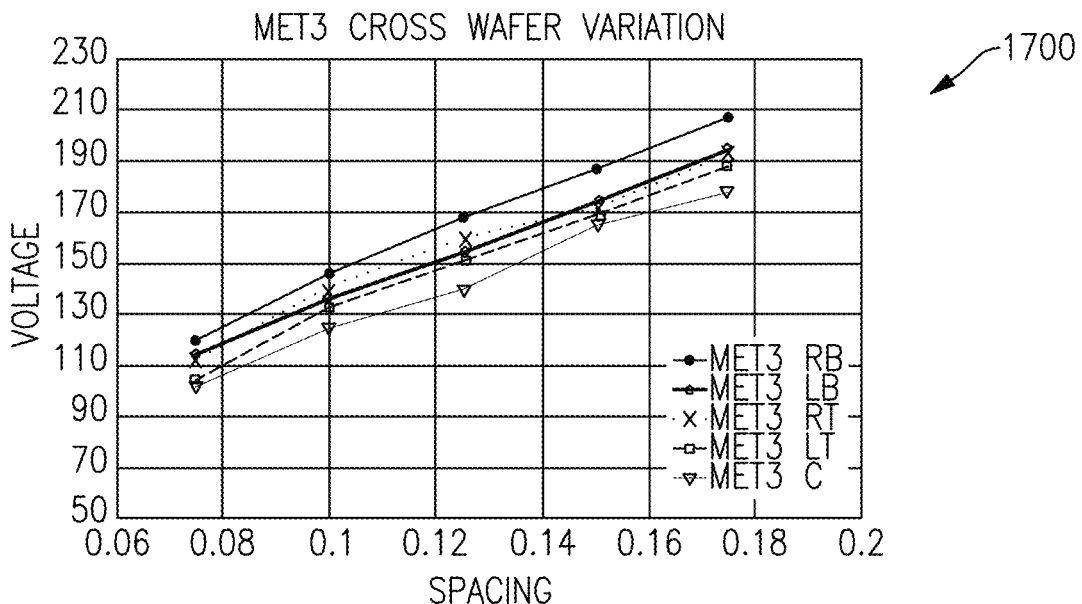
FIG. 17 is a graph illustrating experimentally observed wafer-level relationships between arcing voltages and spacing between a pair of spaced conductive structures formed at metal 3 level, according to embodiments.

FIG. 17 is a graph 1700 illustrating experimentally observed wafer-level relationships between arcing voltages and spacing of a pair of spaced conductive structures formed at metal 3 level, according to embodiments. The measurements were performed under DC-type mode using a Keithley tester. RB, LB, RT, LT and C indicate right bottom, left bottom, right top, left top and center locations, respectively, of the tested wafer.

Figure 18:
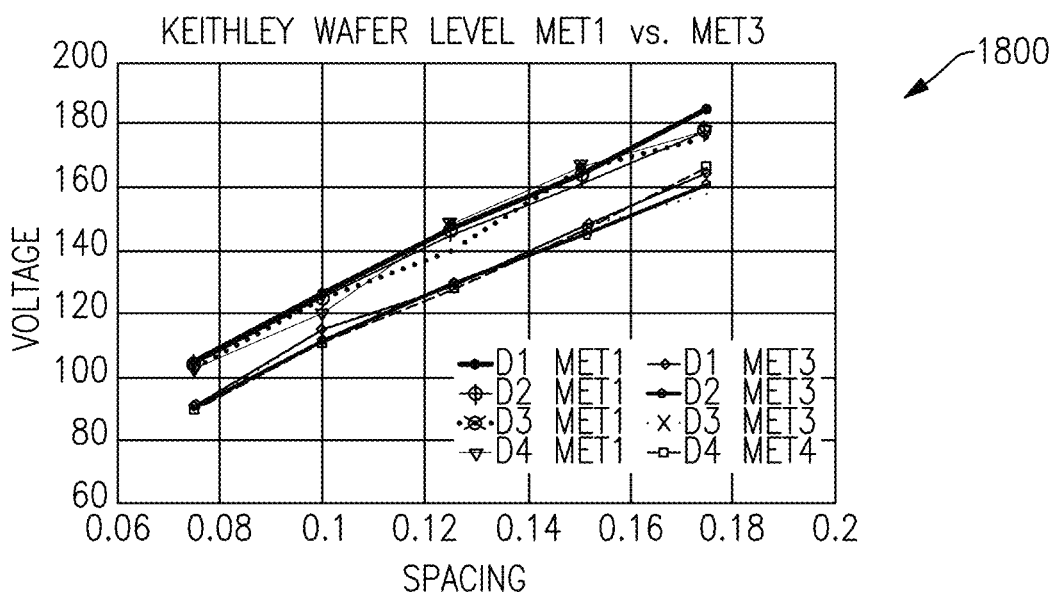
FIG. 18 is a graph illustrating experimentally observed wafer-level relationships between arcing voltages and spacing between a pair of spaced conductive structures formed at metal 1 and 3 levels, according to embodiments.

FIG. 18 is a graph 1800 illustrating experimentally observed wafer-level relationships between arcing voltages and spacing of a pair of spaced conductive structures formed at metal 1 and metal 3 levels, according to embodiments. The measurements were performed under DC-type mode using a Keithley tester. D1, D2, D3, and D4 indicate different locations of the tested wafer.

Figure 19:
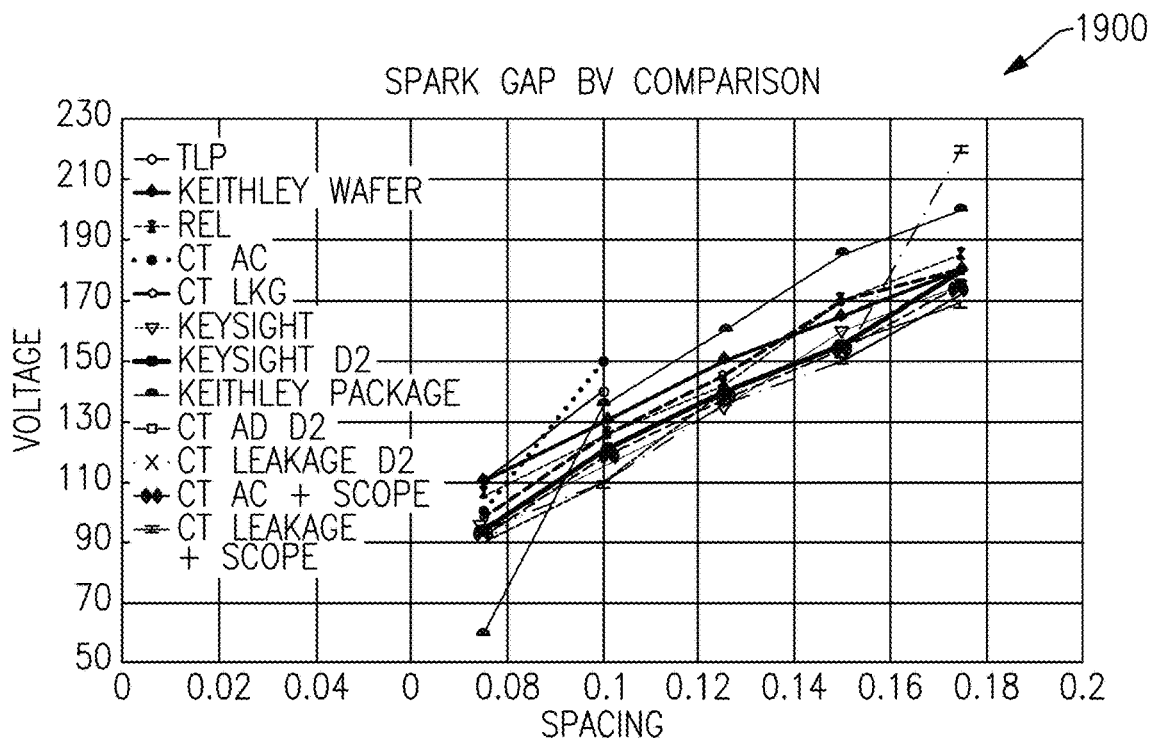
FIG. 19 is a graph illustrating experimentally observed wafer-level relationships between arcing voltages and spacing of a pair of spaced conductive structures formed at metal 3 level, according to embodiments.

FIG. 19 is a graph is a graph 1900 illustrating experimentally observed wafer-level relationships between arcing voltages and spacing of a pair of spaced conductive structures, according to embodiments. The measurements were performed using different types of testers. The TLP measurement was performed under a transmission line pulse mode, while other measurements were performed under DC-type mode.

Figure 20:
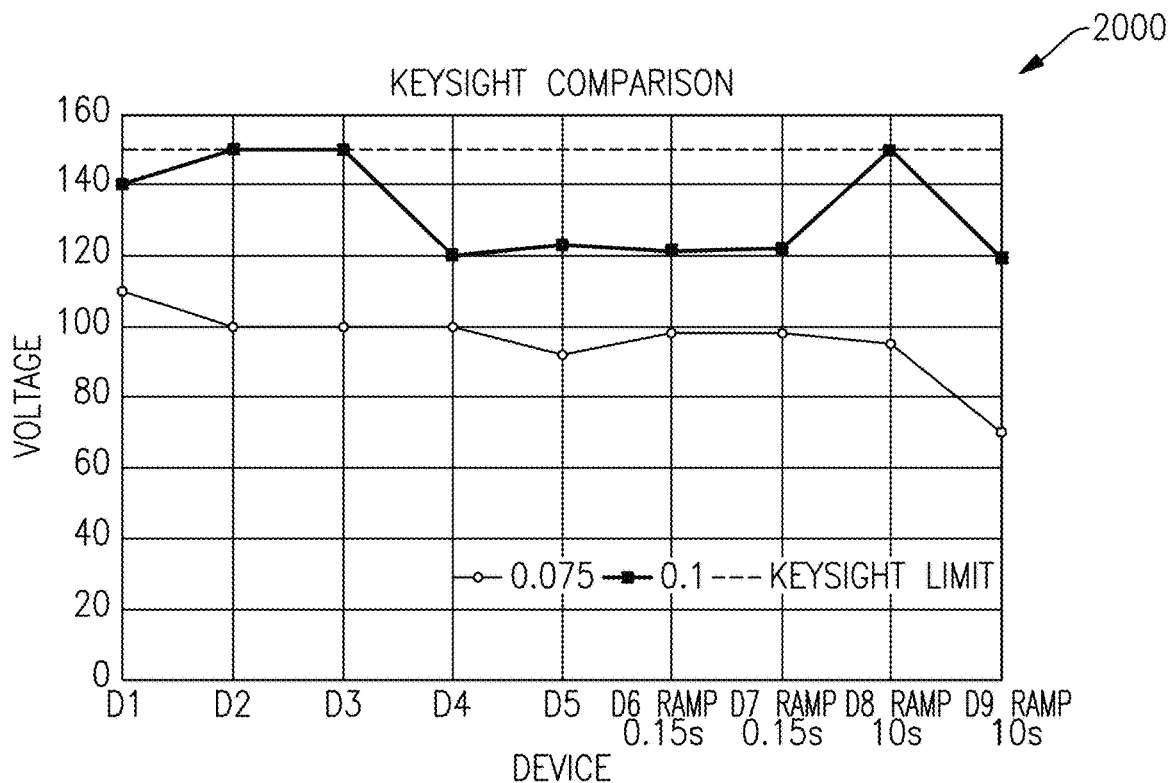
FIG. 20 is a graph illustrating experimentally observed repeatability of arcing voltages across the wafer for nominal spacing of a pair of spaced conductive structures formed at metal 1 level, according to embodiments.

FIG. 20 is a graph illustrating experimentally observed repeatability of arcing voltages across the wafer for nominal spacing of a pair of spaced conductive structures formed at metal 1 level, according to embodiments. The tested gaps were 0.075 micron gaps measured under 5 s ramp from 0 to 120V and 0.1 microns gaps measured under 5 s ramp from 0 to 150V.

Figure 21:
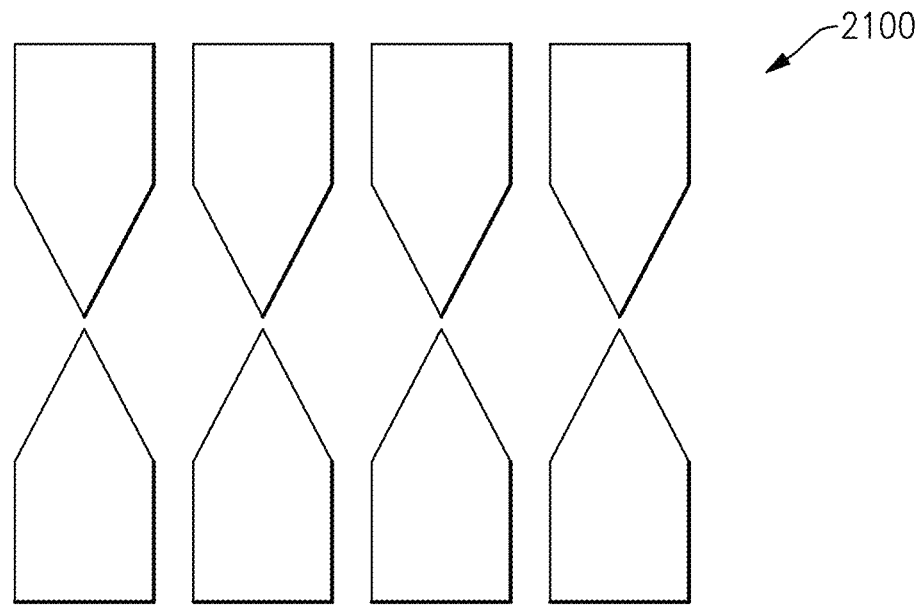
FIG. 21 is a schematic a top-down view of a plurality of pairs of spaced conductive structures electrically connected in parallel, covered with passivation, according to embodiments.

FIG. 21 is a schematic illustration of a top-down view of a plurality of pairs 2100 of spaced conductive structures electrically connected in parallel, covered with passivation (not shown), according to embodiments. When covered with passivation, whether an EOS event had occurred in the semiconductor device can be determined by measuring a change in a leakage current across the pair of spaced conductive structures, by detecting an open circuit across a fuse that is serially connected to the pair of spaced conductive structures.

Example Visual and Electrical Detection of EOS Events

As described above, according to various embodiments disclosed herein, electrical overstress (EOS) events can be monitored using EOS monitor devices that include a pair of spaced conductive structures or a spark gap structure, and the information gathered from the EOS monitor devices can be used to prevent damage to core circuits. In some embodiments, monitoring may not be responsive in real time. Rather, it may be useful to have a monitoring device that can be inspected after an EOS event has occurred to determine, e.g., the number and magnitude of the EOS events for diagnostic purposes. For example, in some embodiments, electrical monitoring can be performed by visual inspection of the EOS monitor device. The diagnostic information regarding, e.g., the extent of the EOS event may be useful in determining the cause of the EOS events for either avoiding such events in the future or designing parts to be more resistant to such events. In the following, example devices provide these and other advantages.

Figure 22:
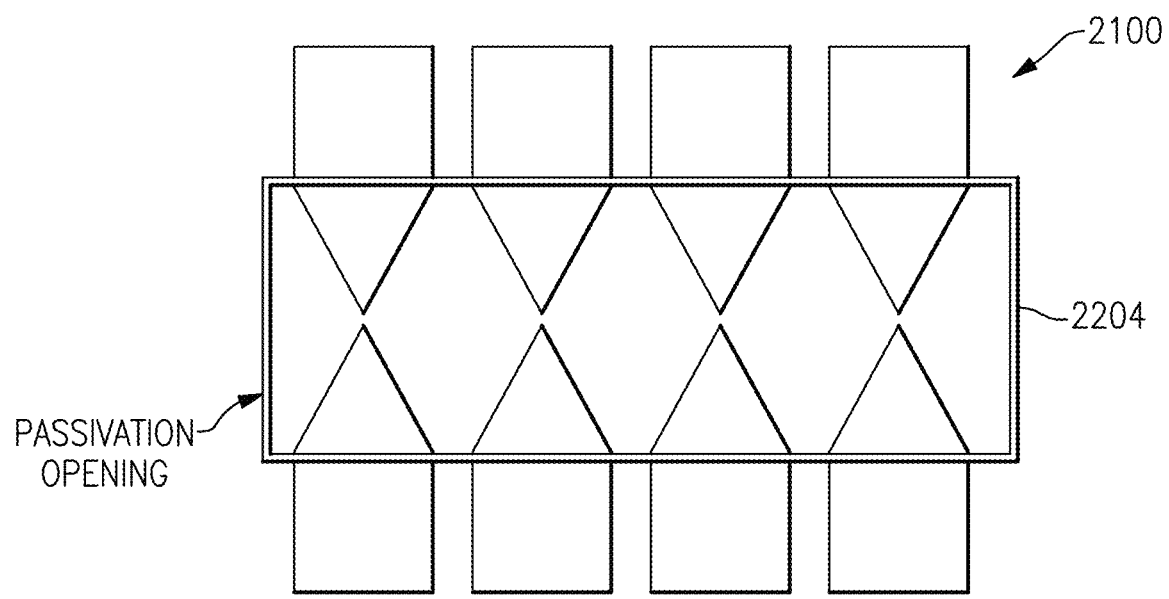
FIG. 22 is a schematic top-down view of a plurality of pairs of spaced conductive structures electrically connected in parallel and having an exposed portion that includes the gaps, according to embodiments.

FIG. 22 is a schematic illustration of a top-down view of a plurality of pairs 2200 of spaced conductive structures electrically connected in parallel having an exposed portion 2204, e.g., formed by an opening in the passivation, according to embodiments. In addition to the methods discussed supra, when a portion of the conductive structures are exposed, whether an EOS event had occurred in the semiconductor device can be determined by visually determining based on a change in appearance. The change in appearance can be detected with naked eyes in some embodiments, while in some other embodiments, the change in appearance can be detected using optical and/or electron microscopy techniques. Having the exposed portions can have other applications, e.g., monitoring corrosion or degradation of the conductive structures.

Figure 23:
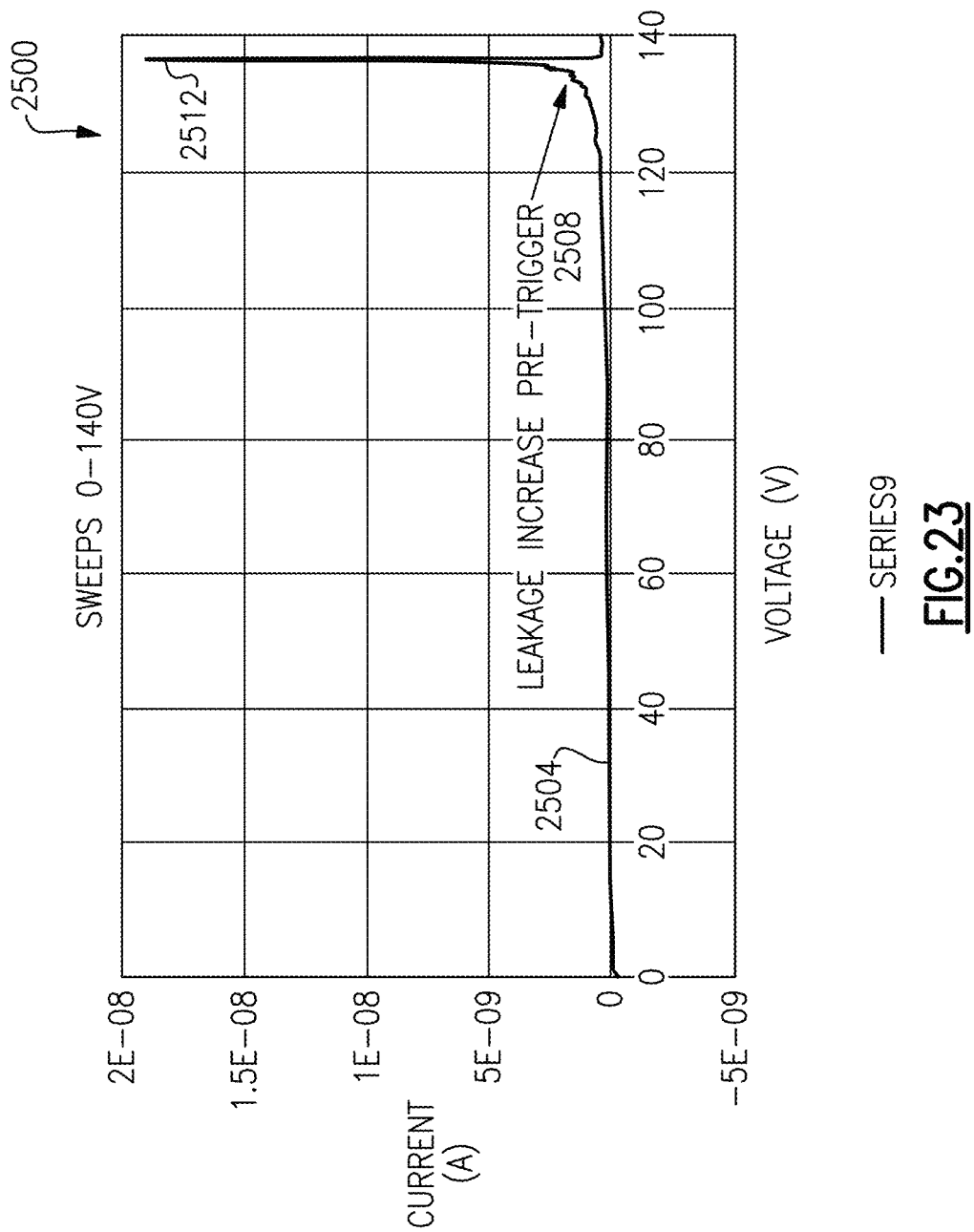
FIG. 23 illustrates a current-voltage (IV) curve of a DC sweep across a plurality of pairs of spaced conductive structures (shown in FIG. 25B), according to embodiments.

FIG. 23 illustrates a current-voltage (IV) curve 2500 of a DC sweep across a plurality of pairs of spaced conductive structures, according to embodiments. As the IV curve 2500 illustrates, as the voltage applied across the plurality of pairs of spaced conductive structures is increased, the current initially gradually increases in the baseline region 2504, increases very rapidly in the pre-trigger region 2508, and peaks in the trigger region 2512. The IV curve 2500 illustrates several advantages of the pairs of spaced conductive structures according to various embodiments described herein. According to some embodiments, various regions of the IV curve 2500 can be used to detect an EOS event not only at or above the trigger voltages of the pairs of the conductive structures, i.e., after an arcing event has occurred, but can also be used to detect an EOS event at voltages lower than the trigger voltage, i.e., before an arcing event occurs. For example, when current across a space between a pair of conductive structures increases by several factors, e.g., a decade or more within less than about 20V, 10V, or 5V, a user may infer that that an EOS event is about to occur, before an actual EOS event occurs. In addition, as illustrated, relatively low amount of current (e.g., less than 5 nA or less than 1 nA) may be sufficient for such detection.

In some embodiments, the spaced conductive structures can be configured to determine whether an EOS event had occurred by measuring a change in various other measurable or otherwise observable parameters caused by damage to the spark gap tips, e.g., a change in capacitance between the pair of spaced conductive structures, or a change in magnetic properties associated with the pair of spaced conductive structures.

Detection of EOS Events in Different Time Duration Regimes

As discussed supra, various spaced conductive structures can be used to monitor electrical overstress events based on the occurrence of an arcing event across pairs of spaced conductive structures. The inventors have found, e.g., as illustrated above with respect to FIG. 19, that the occurrence of an arcing event across the conductive structures is relatively independent of the test method, even though the different test methods apply pulses having different effective pulse widths across the conductive structures. The relative independence of the applied pulse width on the resulting arcing voltage can be advantageous, because the monitor devices having the spaced conductive structures can be designed based on test results obtained in one time duration regime, while the actual EOS event that monitor device and/or the core circuit is exposed to may be in a different time duration regime. In the following, test results illustrating this and other advantages are described.

Figure 24:
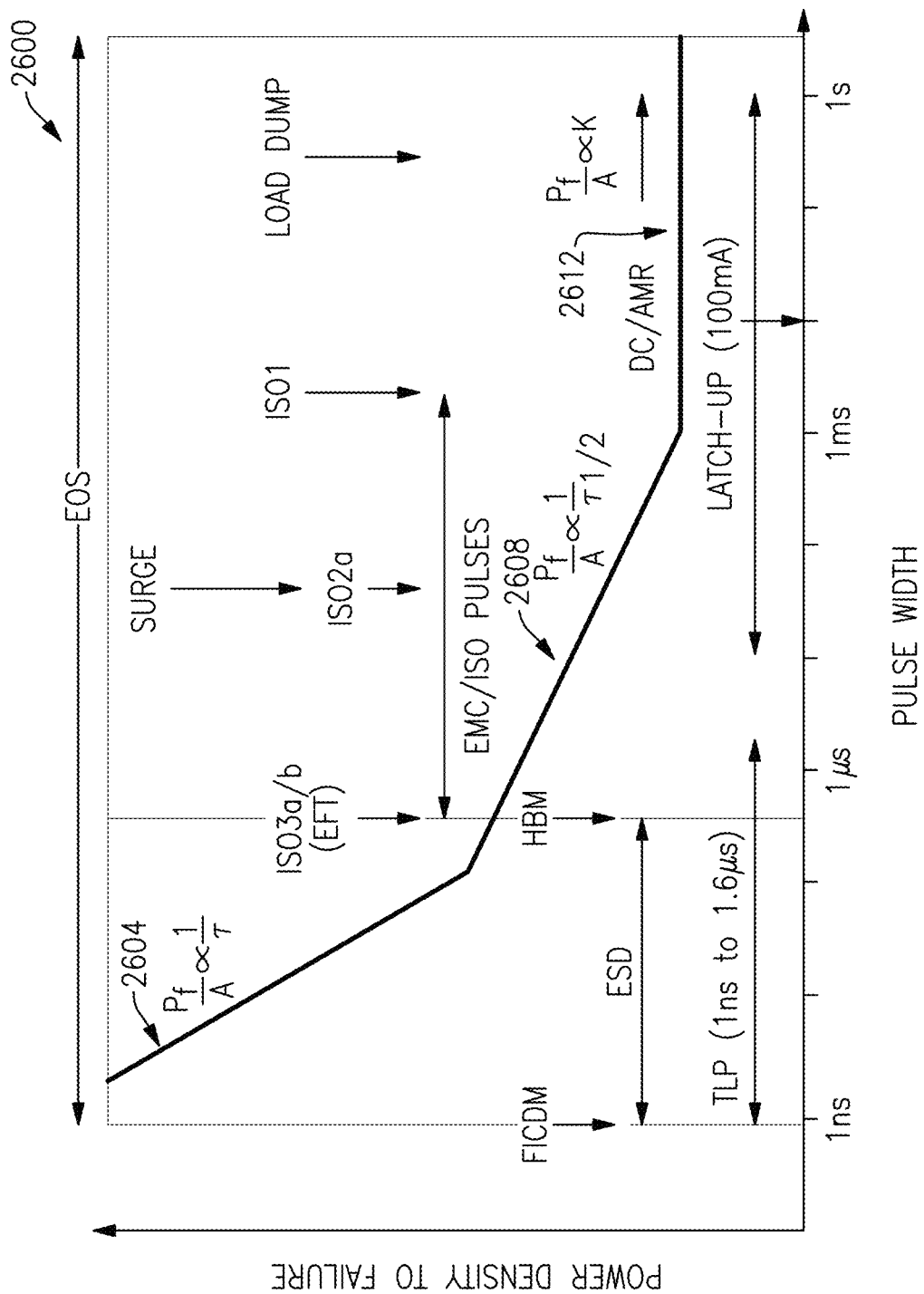
FIG. 24 is a graph (Wunsch-Bell curve) schematically illustrating the dependence of power density to failure on the applied pulse width for electronic circuits.

FIG. 24 is a graph 2600, sometimes referred to as Wunsch-Bell curve, schematically illustrating the dependence of power density-to-failure on the applied pulse width for electronic circuits. Without being bound to any theory, the graph 2600 may be considered to illustrate three regimes of the dependence, including an adiabatic regime 2604, a thermal diffusion-controlled regime 2608 and a DC/steady state regime 2612. In the adiabatic regime 2604, the power density to failure ($P_f/A$) can be proportional to $1/\tau$, where $P_f$ is the power to failure, A is the device cross-sectional area through which current flows and $\tau$ is the observed time-to-failure. In the thermal diffusion-controlled regime 2608, the $P_f/A$ can be proportional to $1/\tau^{1/2}$, and in the DC/steady state regime 2612, the $P_f/A$ can be proportional to a constant (K). The graph 2600 also illustrates time durations corresponding to various ESD model regimes, e.g., human body model (HBM), field-induced charge device model (FICDM), EMC/ISO pulses and DC/AMR. In the past, testing of EOS events in the relatively fast pulse regimes including the adiabatic regime 2604 had been relatively difficult. In the following, testing results in these relatively short time duration regimes are described, e.g., using transmission line pulse (TLP) testing methods. As described herein, TLP testing is performed using a transmission line, e.g., a charged 50 Ohm transmission line, to deliver a pulse, e.g., a square wave, having 1 ns to 1.6 µs pulse width and having 0.1 ns to 45 ns rise time.

Figure 25:
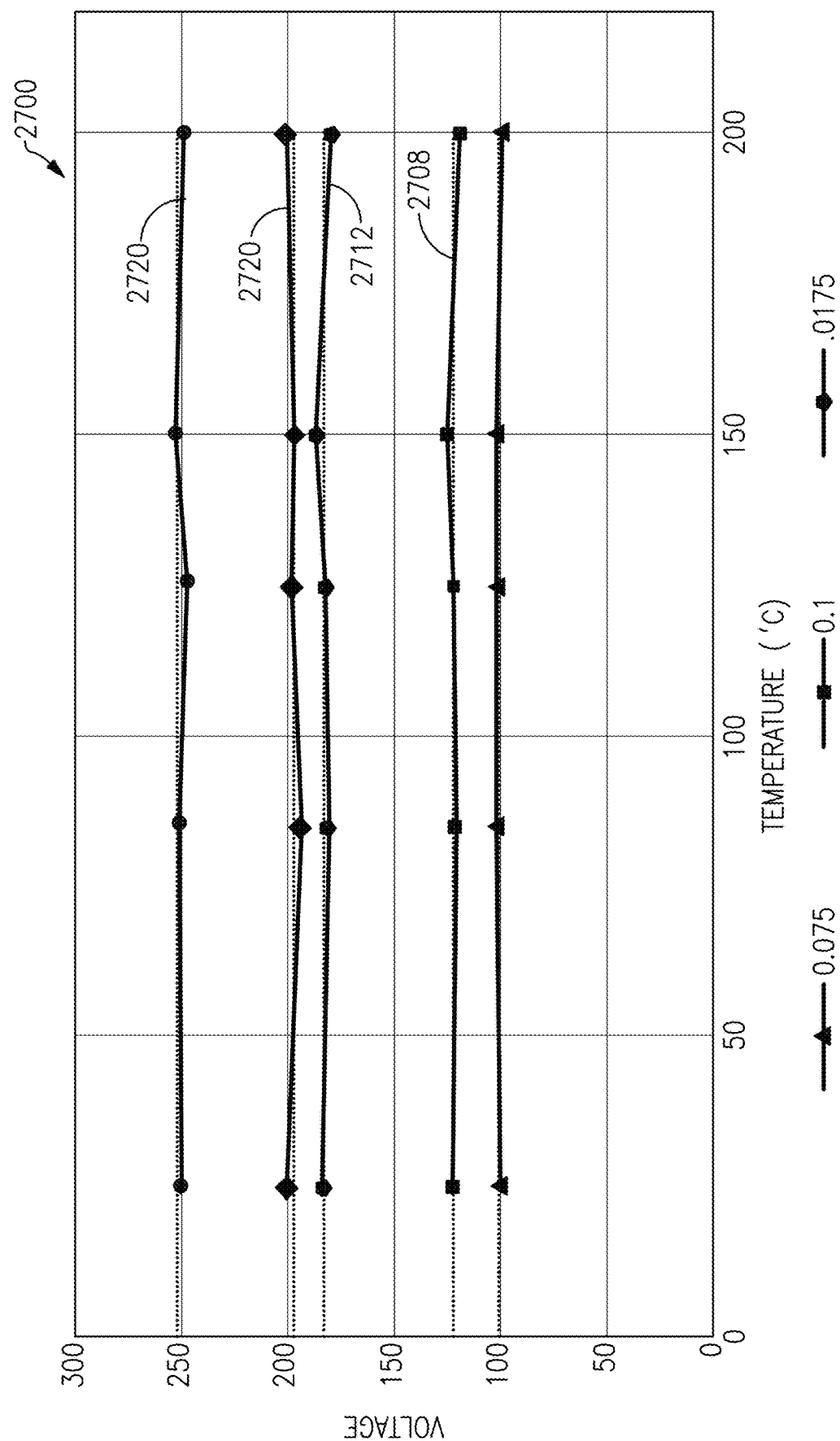
FIG. 25 is a graph illustrating temperature dependence of triggering voltages of various pairs of spaced conductive structures having different gaps, according to embodiments.

FIG. 25 is a graph 2700 illustrating temperature dependence of triggering voltages of various spaced conductive structures 2824 having different gaps, according to embodiments. The trigger voltages of the spaced conductive structures represented in the y-axis were measured under TLC testing conditions. The tested spaced conductive structures were fabricated using metal 4 conductive structures, and curves 2704, 2708, 2712, 2716 and 2720 plot trigger voltage measured for conductive structures having 0.075 µm, 0.1 µm, 0.175 mm, 0.2 µm and 0.28 µm, respectively. The inventors have found that the trigger voltage is relatively temperature independent in the tested temperature range of 25° C. to 200° C. The relative temperature independence can be advantageous for various reasons. For example, while the temperature which the core circuit and the monitor device having the spaced conductive structures can be subjected to varying temperatures, the triggering voltage of the spaced conductive structures remain relatively constant, thereby preserving the accuracy of the monitor results relatively independent of the temperature, at least within normal operational temperature ranges encompassed by 25° C. to 200° C.

Figure 26B:
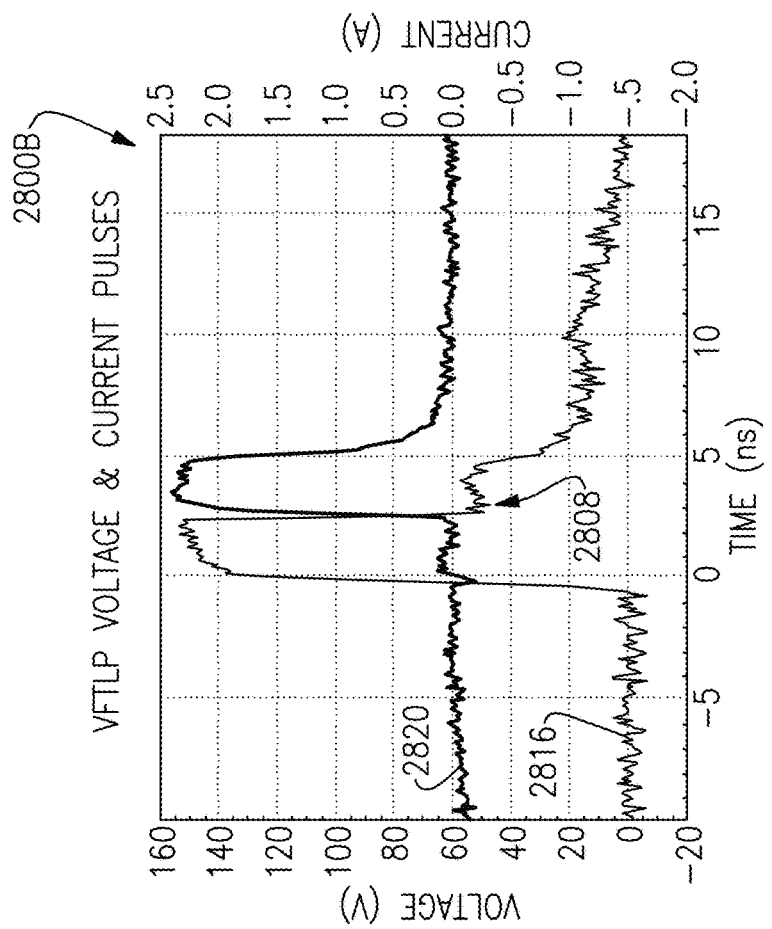
FIG. 26B illustrates an overlaid voltage-time (V-t) curve and a current-time (I-t) curve corresponding to the VFTLP IV curve of FIG. 26A.
Figure 26A:
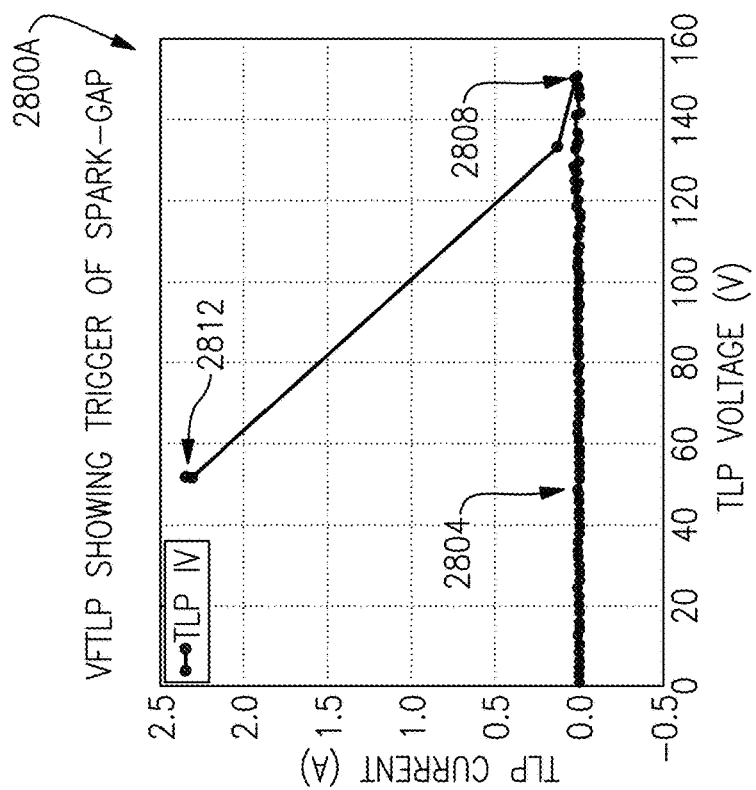
FIG. 26A illustrates a very fast transmission line pulse (VFTLP) current-voltage (IV) curve measured on a pair of spaced conductive structures fabricated using metal 2 structures, according to embodiments.

FIGS. 26A-26B illustrate electrical and visual monitoring results from testing a spaced pair of conductive structures 2824. FIG. 26A illustrates a very fast TLP (VFTLP) IV curve 2800A measured on a pair of spaced conductive structures fabricated using metal 2 structures. The IV curve 2800A corresponds to the IV response of the conductive structures 2824 tested using a charged 50 Ohm transmission line. As the IV curve 2800A illustrates, as the applied VFTLP voltage is increased, the voltage across the spaced pair of conductive structures initially increases proportionally in the baseline region 2804, starts to rapidly decrease in a trigger region 2808 and snaps to a holding voltage in a hold region 2812. The VFTLP current initially slowly increases in the baseline region 2804 and increases very rapidly from the trigger region 2808 to the holding region 2812.

FIG. 26B is a graph 2800B illustrating overlaid voltage-time (V-t) curve 2816 and current-time (I-t) curve 2820 corresponding to the VFTLP IV curve described with respect to FIG. 26A. At time zero, application of a 5 ns VFTLP voltage pulse across the pair of conductive structures results in a rapid rise in voltage across therebetween. At the trigger region 2808, the voltage collapses, accompanied by a rapid rise in current flowing through the pair of spaced conductive structures.

Trigger Voltage Tuning by Varying Materials, Thicknesses and/or Gap Distances of the Spaced Conductive Structures.

As described above with respect to FIGS. 15-19, the trigger voltage of the pairs of spaced conductive structures can be tuned by varying the distance between the pairs of spaced conductive structures, as well as by varying the thickness of the pairs of spaced conductive structures. In addition, as described above with respect to FIGS. 9A, 9B, 10A, 10B, the inventor have found that the trigger voltage of the pairs of spaced conductive structures can provide another degree of freedom with respect to tuning the trigger voltage. Furthermore, inventors have found that forming the spaced conductive structures using different materials can yet provide another degree of freedom with respect to tuning the trigger voltage.

Figure 27:
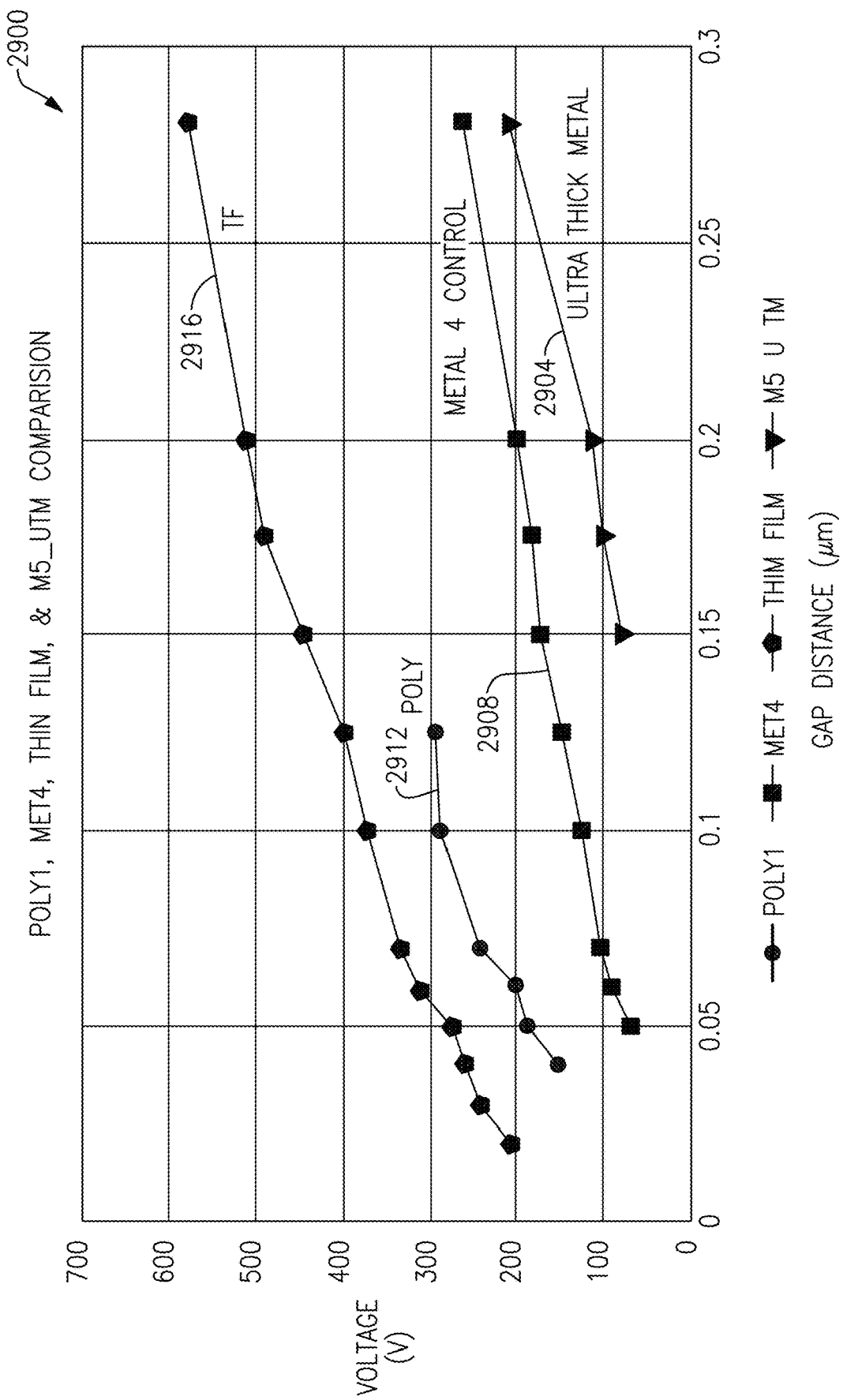
FIG. 27 is a graph illustrating the dependence of trigger voltages of pairs of spaced conductive structures formed of different materials on the gap distance under transmission line pulse (TLP) testing conditions.

FIG. 27 is a graph 2900 illustrating the dependence of trigger voltages, under TLP conditions, of spaced conductive structures formed of different materials on the gap distance. The trigger voltage versus gap distance (V-d) curves 2904, 2908, 2912 and 2916 show the dependence of the trigger voltages of pairs of spaced conductive structures formed using metal 5 structures, metal 4 structures, polycrystalline silicon and a carbon-based thin film material, respectively. The nominal gap distance and the shapes of the spaced conductive structures corresponding to the V-d curves 2904, 2908, 2912 and 2916 are the same. On the other hand, the pairs of spaced conductive structures corresponding to the V-d curves 2904, 2908 are formed of the same material but have different thicknesses, showing that higher thickness results in lower trigger voltage, as discussed supra. In addition, spaced conductive structures formed of thinner materials can be designed to have relatively smaller gap distances before suffering substantial yield loss due to shorting. The pairs of spaced conductive structures corresponding to the V-d curves 2908, 2912, 2916 are formed of different materials while having the same thickness, showing higher resistance of the material of the pairs of spaced conductive structures can lead to higher trigger voltages.

Design Considerations for the Hold Voltage of Spaced Conductive Structures

As described above with respect to FIG. 6, upon triggering a pair of spaced conductive structures, the corresponding portion of the IV curve is characterized by a "snap-back" region, followed by a collapse in voltage to a hold voltage $V_H$. In some applications, e.g., EOS monitoring of powered core circuitry, the $V_H$ of the pair of spaced conductive structures may desirably be controlled to a higher value than a predetermined value. For example, when the monitor devices are integrated with some circuitry electrically connected in parallel, e.g., power supply circuitry, the $V_H$ of the pair of the pair of spaced conductive structures may be higher than that of the power supply circuitry. This may be because, e.g., if $V_H$ is lower than the power supply voltage, upon triggering of the pair of spaced conductive structures in response to an EOS event, resulting in a collapse of the voltage across the pair of conductive structures to $V_H$, the power supply may latch-up after the EOS event ends. In the following, experimental results are described that demonstrate this effect. Accordingly, according to various embodiments, monitor devices including pairs of spaced conductive structures have hold voltages that are higher than a voltage of the power supply for the core circuit.

FIG. 28A schematically illustrates experimentally controlling effective $V_H$ in TLP testing using transmission lines that have different load values. As illustrated, because when the pair of spaced conductive structures is triggered, the IV curve has a negative slope according to the load line defined by the load values of the transmission line, using a transmission line having a higher load value, e.g., 500 Ohms, results in a collapse of the voltage across the spaced conductive structures to a lower $V_H$, compared to the $V_H$ that results when using a transmission line has a lower load value, e.g., 50 Ohms. FIG. 28B illustrates experimental verification of the effect of load values on $V_H$ schematically illustrated with respect to FIG. 28A. As illustrated, for pairs of conductive structures having nominally the same trigger voltages, compared to $V_H$ values 3208A obtained from TLP testing using relatively low load (e.g., 50 Ohm transmission lines), $V_H$ values 3208B obtained using transmission lines having higher load values (e.g., 500 Ohms, 1500 Ohms) have relatively lower $V_H$ values.

Figure 29A:
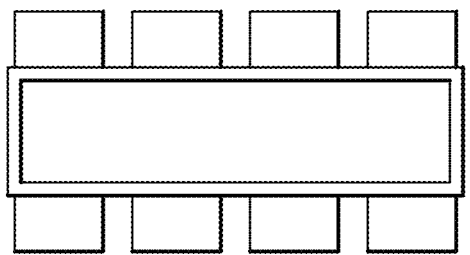
FIG. 29A is a schematic top-down view of a plurality of pairs of spaced conductive structures electrically connected in parallel with an opening formed in the passivation layer that includes the gaps and is filled with different materials, according to embodiments.
Figure 29B:
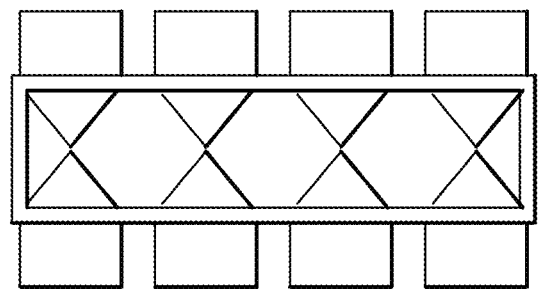
FIG. 29B is a schematic top-down view of a plurality of pairs of spaced conductive structures electrically connected in parallel with an opening formed in the passivation layer that includes the gaps and is filled with different materials, according to embodiments.
Figure 29C:
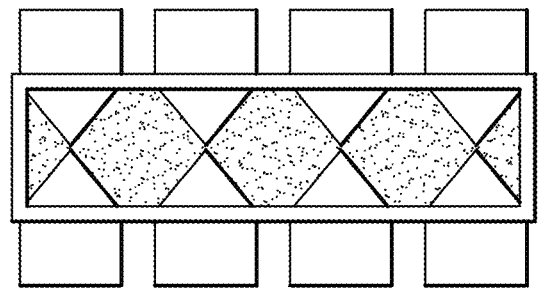
FIG. 29C is a schematic top-down view of a plurality of pairs of spaced conductive structures electrically connected in parallel with an opening formed in the passivation layer that includes the gaps and is filled with different materials, according to embodiments.

FIGS. 29A-29C are schematic top-down views of a plurality of pairs of spaced conductive structures electrically connected in parallel with an opening formed in the passivation layer that is filled with different materials, according to embodiments. The opening can be filled with semipermeable membrane/gel (FIG. 29A), (reactive) metal material (FIG. 29B) or (insulating) material in the gaps between the conductive structures.

Figure 30:
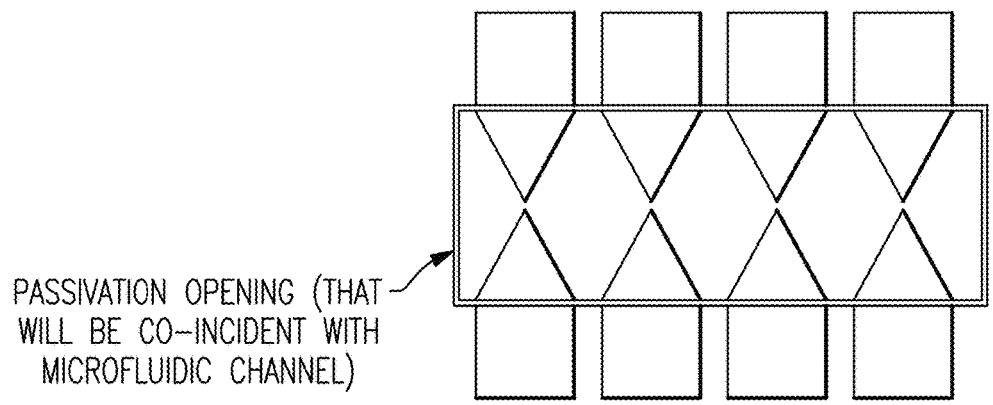
FIG. 30 is a schematic top-down view of a plurality of pairs of spaced conductive structures electrically connected in parallel having an opening formed in the passivation layer that overlaps with a microfluidic channel, according to embodiments.

FIG. 30 is a schematic top-down view of a monitor device having a plurality of pairs of spaced conductive structures electrically connected in parallel having an opening formed in the passivation layer that overlaps with a microfluidic channel, according to embodiments. The illustrated pairs of spaced conductive structures are configured such that, upon arcing, the gaps between conductive structures (e.g., metal structures) may increase, which can create a wider path or a channel for fluid to flow in a specific direction. A monitor device including the pairs of spaced conductive structures could be electrically modified to create or modify a path for fluid to flow along a specific path. In some embodiments, the conductive structures, e.g., metal structures, could be configured to react with the fluid in the channel. In some embodiments, a measurement/analysis of the fluid before and after arcing can provide an electrical signature associated with a chemical change, e.g., a change in pH or gas concentration, for applications in biomedical or chemical analysis.

Figure 31:
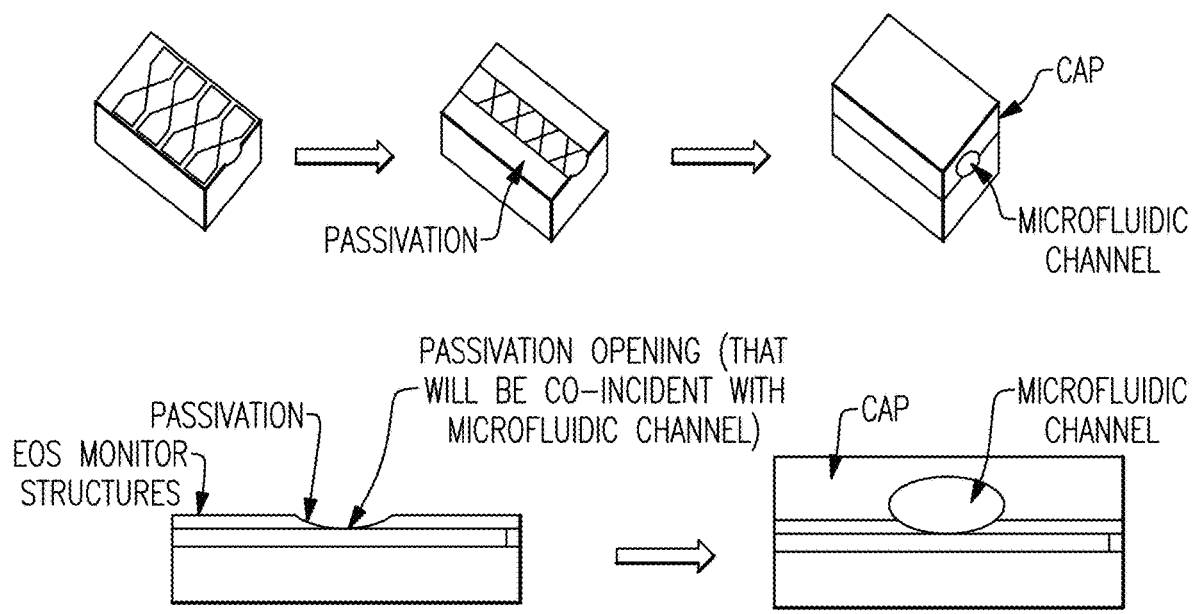
FIG. 31 is a process flow for fabricating microfluidic channels over an EOS monitor, according to embodiments.
Figure 32:
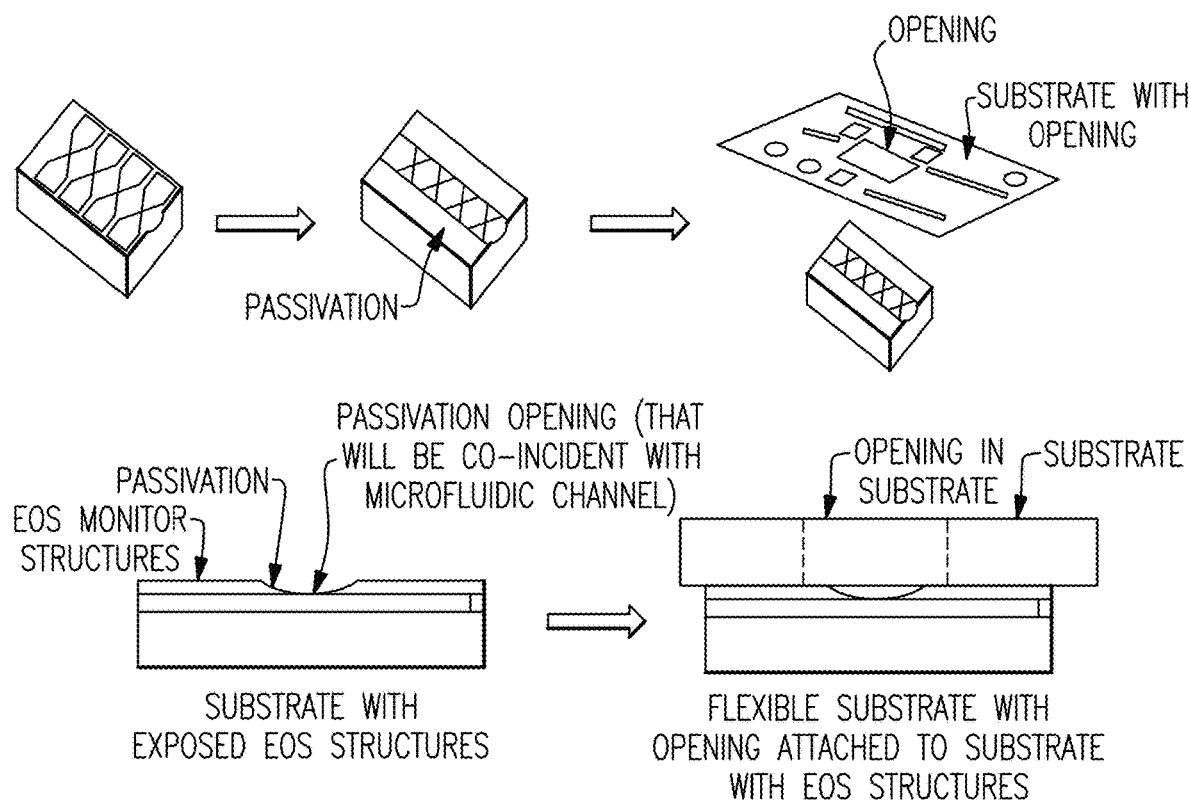
FIG. 32 is a process flow for integrating a flexible substrate with an EOS monitor, according to embodiments.

FIGS. 31 and 32 illustrate monitor devices having pairs of spaced conductive structures according to some embodiments, where a cap or a protective cover is formed over the pairs of spaced conductive structures, such that a sealed channel can be formed (for fluid to pass through). Similar to the monitor device illustrated with respect to FIG. 30, the conductive structures, e.g., metal structures, enclosed by the cap could be configured to react with the fluid in the channel.

In some embodiments, a measurement/analysis of the fluid before and after arcing can provide an electrical signature associated with a chemical change, e.g., a change in pH or gas concentration, for applications in biomedical or chemical analysis. In some embodiments, the substrates can be flexible for wearable applications.

Spark Gap Structures for Different Applications

Various embodiments of EOS monitor or EOS protection devices described above comprise one or more pairs of conductive structures or spark gap structures. The conductive structures serve as arcing electrodes in response to an EOS event. The pairs of conductive structures have protrusions, e.g., sharpened or rounded tips for both electrodes of the spark gap devices, that facilitate arcing. The protrusions can be tailored for various desirable physical attributes associated with arcing, including trigger voltage. In the following, for some applications, an EOS monitor/protection device comprises one or more pairs of conductive structures, where the conductive structures are shaped differently.

As described herein, the differently shaped conductive structures affect arcing. The differently shaped conductive structures may include surfaces facing each other that are shaped differently. The differently shaped conductive structures may include facing surfaces that include points that define the shortest distance between the conductive structures. The differently shaped conductive structures may include facing surfaces that have different shapes when the viewed in one or more directions. It will be appreciated that shapes of facing surfaces of the conductive structures may appear to be substantially the same when viewed in one direction while appearing to be different in a different direction. By way of illustration of this effect, referring to FIG. 33, a pair of conductive structures including first and second conductive structures 3300A, 3300B each comprising a plurality of protrusions or tips may be viewed in any one of x, y and z directions. For illustrative purposes, in FIG. 33, the points that define the shortest distance between the conductive structures is illustrated to be in the x-direction, also referred to herein as the gap direction. In a top down view in the z direction, the arcing surfaces of first and second conductive structures 3300A, 3300B facing each other across the gap are different (a sharpened tip versus a straight edge). However, when the first and second conductive structures 3300A, 3300B have the same thickness (in the z direction), and when the surfaces of first and second conductive structures 3300A, 3300B facing each other are vertically straight (in the z direction), the surfaces of first and second conductive structures 3300A, 3300B facing each other across the gap may appear to be similar or the same when viewed in the y direction. For clarity, as described herein, a differently shaped pair of conductive structures include surfaces facing each other that are shaped differently when viewed in at least one of two directions that are orthogonal to the gap direction. For example, in FIG. 33, the differently shaped first and second conductive structures 3300A, 3300B can have surfaces facing each other that are shaped differently when viewed along the gap in the y direction, e.g., a horizontal direction orthogonal to the x direction. Alternatively, or in addition, the surfaces of the two electrodes can be different when viewed in the z direction, e.g., a top down direction orthogonal to the x-direction, as shown.

For clarity, as described herein, a differently shaped pair of conductive structures does not refer to a pair of conductive structures that may include surfaces facing each other that have some differences due to manufacturing variations.

For example, lithographically patterned structures may have a tolerance window of critical dimensions such as, e.g., +/−10%. In these structures, the targeted shapes are the same but the resulting shapes are slightly different due to manufacturing variability. The shapes that are only different due to unintended manufacturing variations are not different within the meaning of the term as used herein.

In the following, some embodiments, e.g., embodiments having two conductive structures (e.g., FIGS. 33, 35-38, 43A-54D) can be adapted for any embodiment described above with respect to FIGS. 1-32. Some other embodiments. e.g., embodiments having more than two conductive structures (e.g., FIGS. 34,39-42) can be adapted for any embodiment described above where multiple pairs of conductive structures can be electrically connected, e.g., electrically connected in parallel, e.g., embodiments described above with respect to FIGS. 1A, 1B, 35B, 7A-8B.

In some embodiments, at least one of the conductive structures does not have a protrusion or a tip. Such conductive structure can provide various advantages, including increasing trigger voltage and/or less wear out, which can enable increased repeated usage of the EOS monitor/protection device with less change in trigger voltage with repeated usage.

Figure 33:
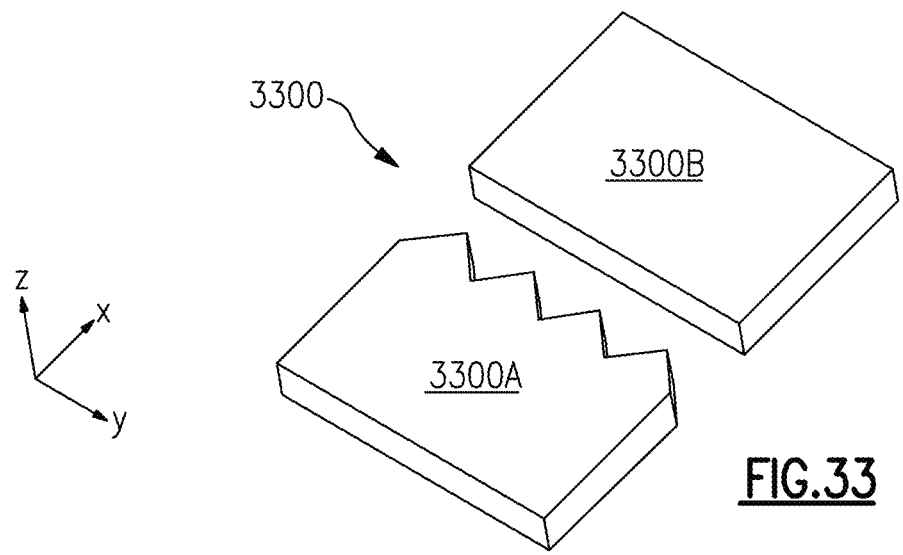
FIG. 33 is a schematic perspective view of a pair of conductive structures of an EOS monitor/protection device that is configured to arc in response to an EOS event, where one but not the other of the conductive structures of the pair includes a protrusion, according to embodiments.

FIG. 33 illustrates a pair of conductive structures 3300 included as part of an EOS monitor/protection device that serves as a cathode-anode pair configured to electrically arc in response to an EOS event, according to embodiments. The pair of conductive structures 3300 is configured such that one but not the other of the two conductive structures 3300 of the pair comprises one or more protrusions or tips. The pair of conductive structures 3300 includes a first conductive structure 3300A, which can be electrically connected to one of a voltage high node or a voltage low node, and serve as one of a cathode or an anode. The pair of conductive structures 3300 additionally includes a second conductive structure 3300B, which can be electrically connected to the other of the voltage high node or the voltage low node, and serve as the other of the cathode or the anode. In the illustrated embodiment, the second conductive structure 3300B comprises a straight edge facing the first conductive structure 3300A through which arcing occurs. In a similar manner as described above, e.g., with respect to the cathode 136 in FIG. 1D, the first conductive structure 3300A includes a plurality of protrusions or tips that serve to facilitate arcing and as arcing paths. However, unlike the anode 140 described above with respect to FIG. 1D, the second conductive structure 3300B does not have protrusions or tips. Thus, the pair of conductive structures 3300 comprises a plurality of spark gaps or arcing paths electrically connected in parallel, where each of the spark gaps is defined by a protrusion or a tip on one side but not the other side.

In various embodiments, the protrusions or tips of the first conductive structure 3300A can be configured in any shape or configuration as described above, e.g., including FIGS. 9A-10B, the details of which are omitted herein for brevity. For example, the protrusion can be sharpened to have a desirable tip angle or be rounded to have a desirable radius of curvature to provide particular electrical attributes such as arcing or trigger voltage. In addition, the plurality of spark gaps formed by the protrusions can have the same or different gap distances.

In the illustrated embodiment, four spark gaps are shown for illustrative purposes. However, in actual implementation, the first conductive structure 3300A can have any suitable number of protrusions greater than one. Where there are more than one protrusions, the protrusions can be the same or different from each other.

Figure 34:
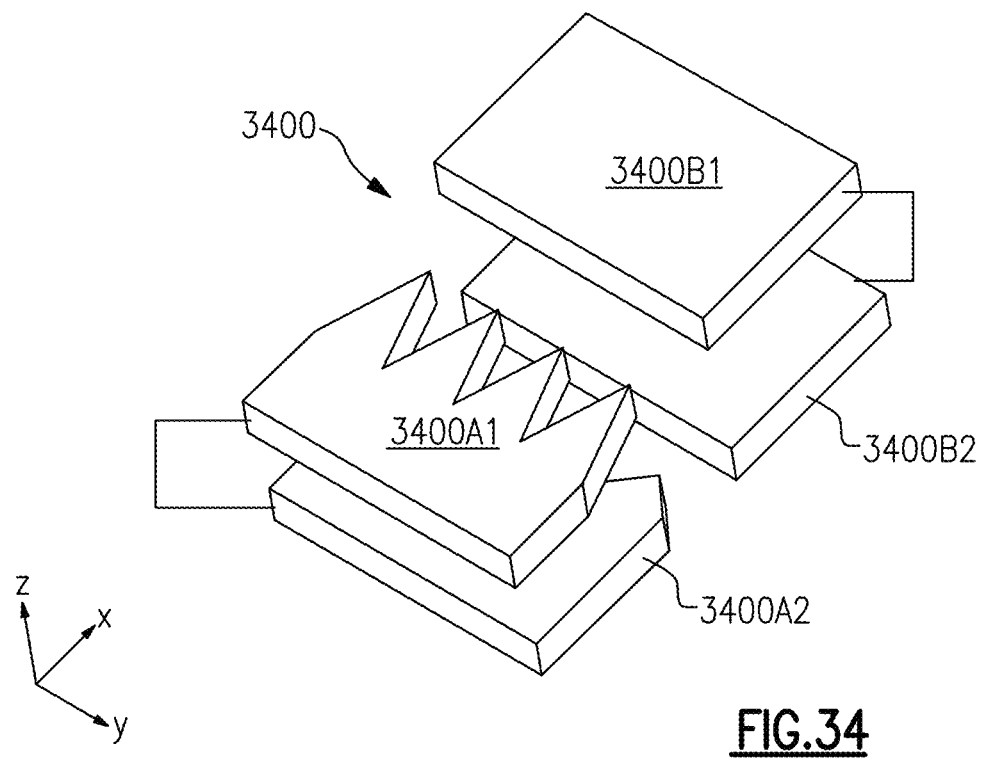
FIG. 34 is a schematic perspective view of a stack of pairs of conductive structures of an EOS monitor/protection device that is configured to arc in response to an EOS event, according to embodiments.

FIG. 34 illustrates a plurality of pairs of conductive structures 3400 included as part of an EOS monitor/protection device, where each pair serves as a cathode-anode pair configured to electrically arc in response to an EOS event, according to embodiments. The plurality of pairs of conductive structures are vertically stacked, e.g., in a surface normal direction of a substrate on which the conductive structures 3400 are formed. In the illustrated embodiment, the plurality of pairs of conductive structures 3400 includes a first (upper) pair of conductive structures including a first conductive structure 3400A1 and a second conductive structure 3400B1, and a second (lower) pair of conductive structures in including a third conductive structure 3400A2 and a fourth conductive structure 3400B2, Each of the first and second pairs of conductive structures is configured similarly to the pair of conductive structures 3300 described above with respect to FIG. 33, where one (first and third conductive structures 3400A1, 3400A2) but not the other (3400B1, 3400B2) of the two conductive structures of each pair comprises one or more protrusions or tips, and the details of similarities are omitted herein for brevity. Similarly, the protrusions or tips of the first and third conductive structures 3400A1, 3400A2 can be configured in any shape or configuration as described above, e.g., including FIGS. 9A-10B, the details of which are omitted herein for brevity.

In the illustrated embodiment, the first and third conductive structures 3400A1, 3400A2 are electrically shorted to each other, and the second and fourth conductive structures 3400B1, 3400B2 are electrically shorted to each other. Advantageously, by stacking the upper and lower pairs of conductive structures, the lateral footprint occupied by the pairs of conductive structures 3400 can be greatly reduced. While two pairs of conductive structures are shown for illustrative purposes, according to embodiments, any suitable number of pairs can be stacked to at least partly overlap with each other.

Still referring to FIG. 34, in some embodiments, different pairs of conductive structures can be integrated as part of different interconnect metallization levels of a semiconductor device, e.g., the semiconductor device described above with respect to FIG. 2A. For example, the lower pair of conductive structures in FIG. 34 can be integrated as part of an nth metallization level, and the upper pair of conductive structures in FIG. 34 can be formed as part any of an >nth metallization level. When integrated as part of different interconnect metallization levels of a semiconductor metallization structure as described with respect to FIG. 2A, each of the spark gaps formed by each of the upper and lower pairs of conductive structures can be tuned to have desirable arcing voltages among other attributes described above, e.g., with respect to FIG. 2B.

In the illustrated embodiment, the first and third conductive structures 3400A1, 3400A2 are electrically shorted to each other, and the second and fourth conductive structures 3400B1, 3400B2 are electrically shorted to each other, such that, as a whole, the plurality of spark gaps or arcing paths formed by the upper and lower pairs of conductive structures serve as spark gaps that are electrically connected in parallel, where each of the spark gaps is defined by a protrusion or a tip on one but not the other side. However, embodiments are not so limited, and in other embodiments, the upper and lower pairs of conductive structures can be electrically separated and serve as part of independent EOS monitor or EOS protection structures.

In the illustrated embodiment, the protrusions of the first and third conductive structures 3400A1, 3400A2 can have different shapes and/or have different distances from the corresponding second and fourth conductive structures 3400B1, 3400B2, such that the upper and lower pairs of conductive structures are configured to electrically arc in response to different EOS events, e.g., EOS events having different voltages. However, embodiments are not so limited, and in other embodiments, the upper and lower pairs of conductive structures can be arranged to be the same.

While not illustrated, various alternative configurations to that described above with respect to FIG. 34 are possible. For example, the relative positions of first and second conductive structures 3400A1, 3400B1 and/or of third and fourth conductive structures 3400A2, 3400B2 can be switched. In addition, one or both of second and fourth conductive structures 3400B1, 3400B2 can have one or more protrusions, and one or both of first and third conductive structures 3400A1, 3400A2 can have a straight edge. Additionally, the multiple pairs can be arranged electrically in parallel at different metallization layers without needing to be vertically aligned.

Figure 35:
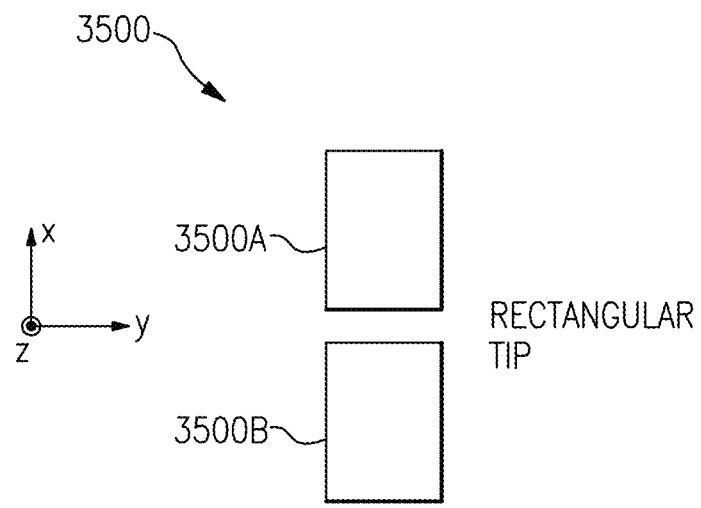
FIG. 35 is a schematic top down view of a pair of conductive structures of an EOS monitor/protection device that is configured to arc in response to an EOS event, where the conductive structures include straight edges facing each other, according to embodiments.

FIG. 35 illustrates a pair of conductive structures 3500 included as part of an EOS monitor/protection device that serves as a cathode-anode pair configured to electrically arc in response to an EOS event, according to embodiments. The pair of conductive structures 3500 includes a first conductive structure 3500A and a second conductive structure 3500B. Unlike the pairs of conductive structures described above with respect to FIGS. 33 and 34, the pair of conductive structures 3500 is configured such that both of the first and second conductive structures 3500A, 3500B comprise flat tips or straight edges facing each other. That is, neither of the first and second conductive structures 3500A, 3500B comprises a protrusion or a sharpened tip. In the illustrated embodiment, each of the first and second conductive structures 3500A, 3500B is rectangularly shaped.

Figure 36:
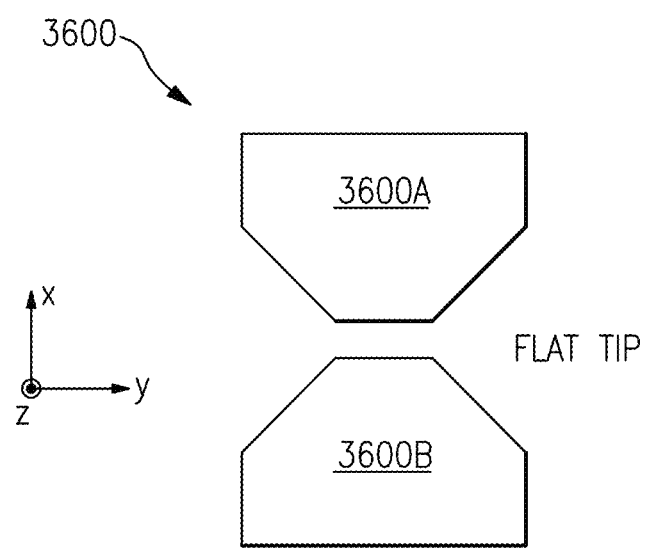
FIG. 36 is a schematic top down view of a pair of conductive structures of an EOS monitor/protection device that is configured to arc in response to an EOS event, where the conductive structures include straight edges facing each other, according to embodiments.

FIG. 36 illustrates a pair of conductive structures 3600 included as part of an EOS monitor device or an EOS protection device that serves as a cathode-anode pair configured to electrically arc in response to an EOS event, according to embodiments. The pair of conductive structures 3600 includes first and second conductive structures 3600A, 3600B that have flat tips in a similar manner as the first and second conductive structures 3500A, 3500B of the pair of conductive structures 3500 illustrated in FIG. 35 except, instead of having a rectangular shape, each of first and second conductive structures 3600A, 3600B have a polygonal shape, where the sides of the polygons facing each other comprise flat straight edges.

The pairs of conductive structures 3500 (FIG. 35) and 3600 (FIG. 36) provide several advantages. For example, because the area of conduction during arcing in response to an EOS event can be large relative to the embodiments, the pairs of conductive structures 3500 (FIG. 35) and 3600 (FIG. 36) can tolerate higher levels of current. In addition, because heat generated at the tips have larger volumes through which it can be dissipated, the wear out or damage from the change in shape of the tips due to melting as described above, e.g., with respect to FIG. 1C, may be reduced. For example, in response to an EOS event, the triggering voltage of the conductive structures may change, e.g., by less than 300 V, 200V, 100V, 50V, or a value in a range defined by any of these values. Thus, the pairs of conductive structures 3500 (FIG. 35) and 3600 (FIG. 36) can be reused multiple times as part of either an EOS monitor or an EOS protection device. The pairs of conductive structures 3500 (FIG. 35) and 3600 (FIG. 35) can be implemented, e.g., as part of two metal rails that may be running adjacent or parallel to each other, or as part of any other metallization structures, including interconnect metallization described above. Because the magnitude of change in shape in response to an EOS event in the pairs of conductive structures 3500 (FIG. 35) and 3600 (FIG. 36) may be significantly smaller compared to other embodiments disclosed herein having sharpened protrusions or tips, some detection methods that rely on visible changes in the shapes of the tips or the distance between the tips may not be suitable in these embodiments. However, visible changes in the gap itself, e.g., changes in the dielectric material in the gap, may still be detected to infer that an EOS event had occurred. Other detection techniques, e.g., leakage current change or a fuse-based detection described herein can be used with these embodiments.

Figure 37:
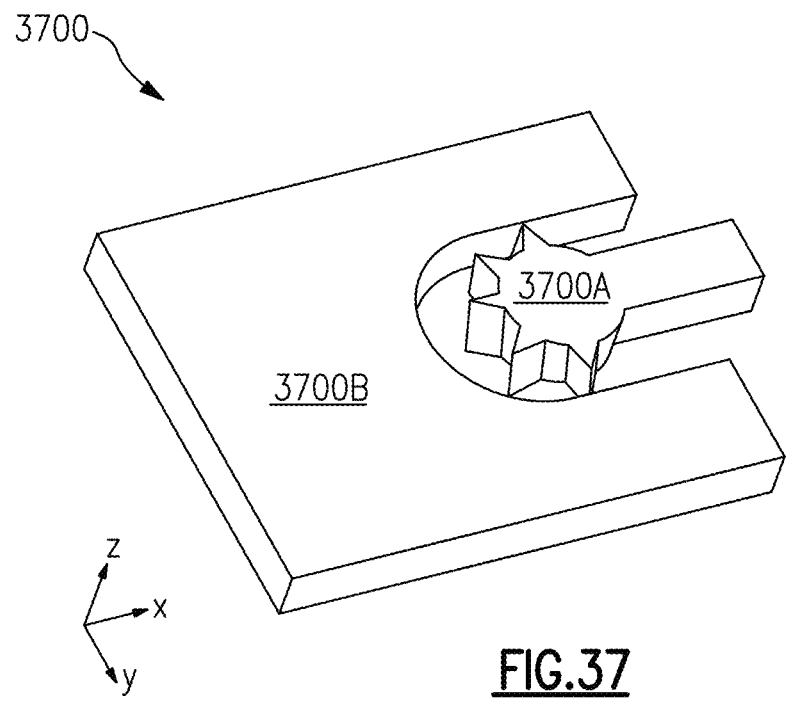
FIG. 37 is a schematic perspective view of a pair of conductive structures of an EOS monitor/protection device that is configured to arc in response to an EOS event, where one of the conductive structures includes a protrusion and the other one of the conductive structures at least partly laterally surrounds the one of the conductive structures, according to embodiments.

FIG. 37 illustrates a pair of conductive structures 3700 included as part of an EOS monitor/protection device that serves as a cathode-anode pair configured to electrically arc in response to an EOS event, according to embodiments. Similar to pairs of conductive structures described above, e.g., with respect to FIG. 33, the pair of conductive structures 3700 is configured such that one but not the other of the two conductive structures of the pair comprises a one or more protrusions or tips. However, unlike the pair of conductive structures described above, the conductive structures comprises a first conductive structure 3700A serving as one of a cathode or an anode during arcing, and a second conductive structure 3700B that at least partly laterally surrounds the first conductive structure 3700A and serves as the other of the cathode or the anode during arcing. The first conductive structure 3700A comprises a circular base region from which a plurality of protrusions or tips radially extend outward towards the second conductive structure 3700B. The second conductive structure 3700B comprises a rounded edge facing and surrounding the protrusions of the first conductive structure 3700A through which arcing occurs. Except for the radial geometry of the spark gaps, the pair of conductive structures 3700 is configured analogously to the pair of conductive structures 3300 described above with respect to FIG. 33, where one (the first conductive structure 3700A) but not the other (3700B) of two conductive structures of the pair comprises a one or more protrusions or tips, and the details of similarities are omitted herein for brevity. Similarly, the protrusions or tips of the first conductive structure 3700A can be configured in any shape or configuration as described above, e.g., including FIGS. 9A-10B, the details of which are omitted herein for brevity. Accordingly, the pair of conductive structures 3700 can benefit from the advantages of the pair of conductive structures 3300 described above with respect to FIG. 33. In addition, by radially arranging the spark gaps, the lateral footprint occupied by the pair of conductive structures 3700 can also be greatly reduced.

Still referring to FIG. 37, while in the illustrated embodiment, the first conductive structure 3700A comprises the plurality of protrusions or tips, alternative embodiments are possible. For example, an arrangement in which the second conductive structure 3700B comprises the plurality of protrusions or tips extending radially inward, while the first conductive structure 3700A has a rounded body but does not include any protrusions, is possible.

Figure 38:
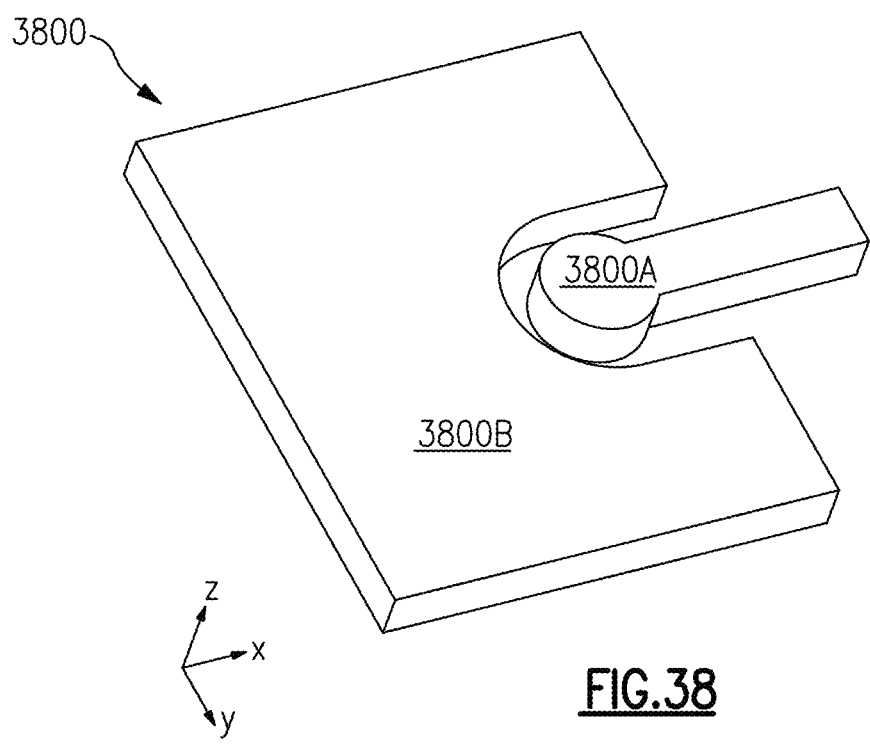
FIG. 38 is a schematic perspective view of a pair of conductive structures of an EOS monitor/protection device that is configured to arc in response to an EOS event, where one of the conductive structures at least partly laterally surrounds the other one of the conductive structures, according to embodiments.

FIG. 38 illustrates a pair of conductive structures 3800 included as part of an EOS monitor device or an EOS protection device that serves as a cathode-anode pair configured to electrically arc in response to an EOS event, according to embodiments. Similar to pairs of conductive structures described above with respect to FIG. 37, the pair of conductive structures 3800 includes a first conductive structure 3800A serving as one of a cathode or an anode during arcing, and a second conductive structure 3800B at least partly laterally surrounding the first conductive structure 3800A and serving as the other of the cathode or the anode during arcing. However, unlike the pair of conductive structures 3700 described above with respect to FIG. 37, in the illustrated embodiment, neither of the pair of conductive structures comprises any protrusion or tip.

Still referring to FIG. 38, the first conductive structure 3800A comprises a circular arcing base region and the second conductive structure 3800B comprises a rounded edge facing and surrounding the arcing base region of the first conductive structure 3800A through which arcing occurs. Except for the radial geometry, the pair of conductive structures 3800 is configured analogously to the pair of conductive structures 3500 described above with respect to FIG. 35, where both of the first and second conductive structures 3800A, 3800B comprise rounded edges facing each other, without having any protrusion or sharpened tip. Accordingly, the pair of conductive structures 3800 can benefit from the advantages of the pair of conductive structures 3500 described above with respect to FIG. 35, including high current capability and reusability. In addition, by radially arranging the spark gaps, the lateral footprint occupied by the pair of conductive structures 3700 can also be greatly reduced.

Figure 39:
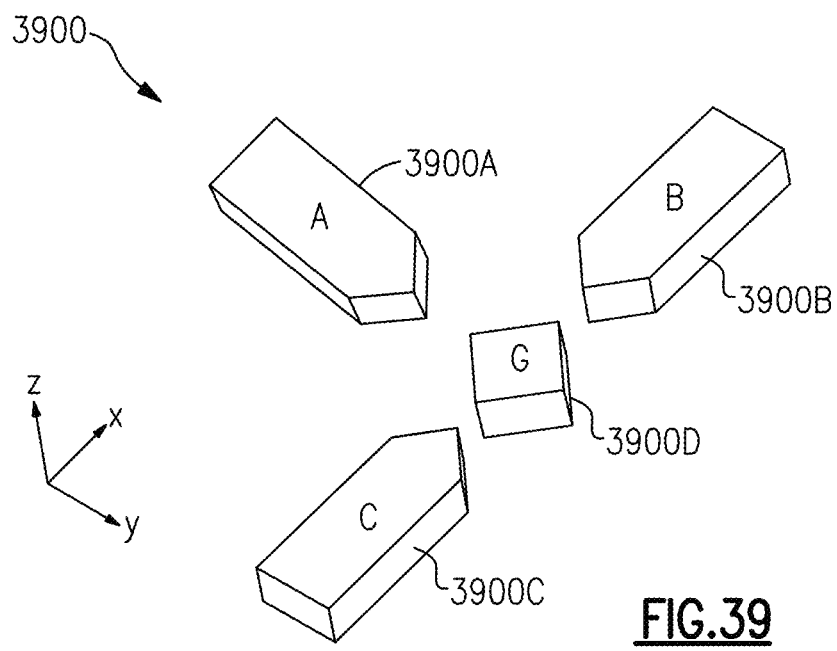
FIG. 39 is a schematic perspective view of a plurality of pairs of conductive structures of an EOS monitor/protection device that are configured to arc in response to an EOS event, where a plurality of first conductive structures each including a protrusion serves as one of a cathode or an anode, and a second conductive structure serves as the other of the cathode or the anode, according to embodiments.

FIG. 39 illustrates a plurality of conductive structures 3900 included as part of an EOS monitor device or an EOS protection device, which includes a plurality of cathode-anode pairs configured to electrically arc in response to an EOS event, according to embodiments. The conductive structures 3900 comprises a first conductive structure 3900D serving as one of a cathode or an anode during arcing, and a plurality of second conductive structures 3900A-3900C serving as the other of the cathode or the anode during arcing. The second conductive structures 3900A-3900C are illustrated as being physically separated from each other, but can be electrically separated or connected to each other. Each of the second conductive structures 3900A-3900C comprises a protrusion or a tip directed towards the first conductive structure 3900D. Each of the second conductive structures 3900A-3900C can, independently or in parallel electrical connection with another one of the second conductive structures 3900A-3900C, be connected to a voltage high node or a voltage low node, and serve as one of a cathode or an anode. The first conductive structure 3900D comprises a plurality of protrusions, where each protrusion generally points towards a corresponding protrusion of each of the second conductive structures 3900A-3900C. The first conductive structure 3900D can be electrically connected to the other of the voltage high node or the voltage low node, e.g., a common ground, or serve as the other of the cathode or the anode.

In various embodiments, each of the protrusions or tips of the first conductive structure 3900D and the second conductive structures 3900A-3900C can be configured to be the same or different and in any shape or configuration as described above, e.g., including those described above with respect to FIGS. 9A-10B, the details of which are omitted herein for brevity. For example, the protrusions of the first conductive structure 3900A and each of the second conductive structures 3900A-3900C can be sharpened to have a desirable tip angle or be rounded to have a desirable radius of curvature to provide particular electrical attributes such as arcing voltage. In addition, the plurality of spark gaps formed by the first conductive structure 3900D and the second conductive structures 3900A-3900C can have the same or different gap distances.

While each of the illustrated first conductive structure 3900D and the second conductive structures 3900A-3900C has a protrusion or a tip, embodiments are not so limited, and the protrusion can be omitted from one or more of the second conductive structures 3900A-3900C, and/or one or more protrusions can be omitted from the first conductive structure 3900D, and replaced with a straight edge, in a similar manner as described above.

Figure 40:
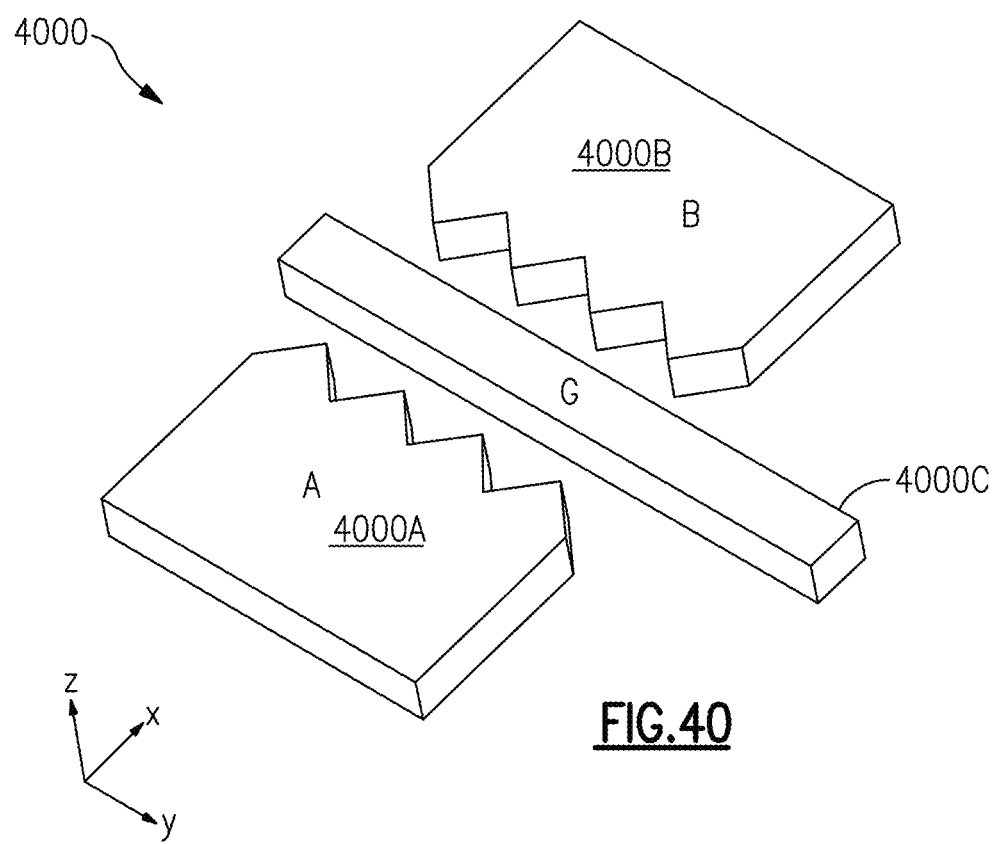
FIG. 40 is a schematic perspective view of a plurality of pairs of conductive structures of an EOS monitor/protection device that are configured to arc in response to an EOS event, where a plurality of first conductive structures each including one or more protrusions serves as one of a cathode or an anode, and a second conductive structure comprising a line serves as the other of the cathode or the anode, according to embodiments.

FIG. 40 illustrates a plurality of conductive structures 4000 included as part of an EOS monitor device or an EOS protection device, which includes a plurality of cathode-anode pairs configured to electrically arc in response to an EOS event, according to embodiments. The conductive structures 4000 comprise a first conductive structure 4000C comprising a conductive line serving as one of a cathode or an anode during arcing, and a plurality of physically separate second conductive structures 4000A, 4000B each comprising a plurality of protrusions and serving as the other of the cathode or the anode during arcing. The second conductive structures 4000A, 4000B are physically separated from each other, but can be electrically separated or connected to each other. Each of the second conductive structures 4000A, 4000B comprises a protrusion or a tip directed towards the first conductive structure 4000C, e.g., an edge of the line. Each of the second conductive structures 4000A, 4000B can, independently or in parallel electrical connection with each other, be connected to one of a voltage high node or a voltage low node. The first conductive structure 4000C comprises, in a similar manner as described above with respect to the second conductive structure 3300B described above with respect to FIG. 33, a straight edge. However, the first conductive structure 4000C comprises straight edges on opposite sides facing each of the second conductive structures 4000A, 4000B. The first conductive structure 4000C can be electrically connected to the other of the voltage high node or the voltage low node, e.g., a common ground, or serve as the other of the cathode or the anode.

Still referring to FIG. 40, the second conductive structures 4000A, 4000B are configured to be the same. However, embodiments are not so limited. For example, referring to FIG. 41, a plurality of conductive structures 4100 comprising a first conductive structure 4100C and a plurality of physically separate second conductive structures 4100A, 4100B each comprising a plurality of protrusions are configured similarly as the plurality of conductive structures 4000 (FIG. 40). Unlike FIG. 40, however, different ones of the second conductive structures 4100A, 4100B have differently arranged protrusions or tips.

Figure 41:
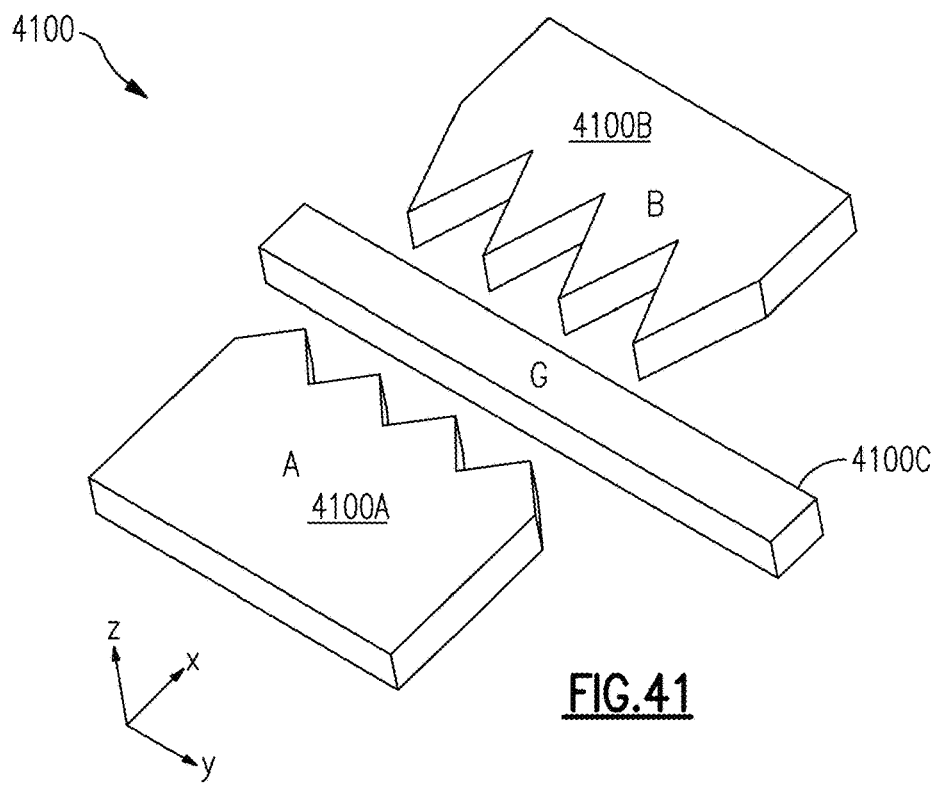
FIG. 41 is a schematic perspective view of a plurality of pairs of conductive structures of an EOS monitor/protection device that are configured to arc in response to an EOS event, including a plurality of differently shaped first conductive structures, where each of the first conductive structures including one or more protrusions serves as one of a cathode or an anode, and including a second conductive structure comprising a line serving as the other of the cathode or the anode, according to embodiments.

In addition, in the illustrated embodiments of FIGS. 40 and 41, while the protrusions or tips within the same ones of the second conductive structures 4000A, 4000B (FIG. 40) and 4100A, 4100B (FIG. 41) are arranged to be the same, embodiments not so limited, and the protrusions of one of the second conductive structures (4000A, 4000B, 4100A, 4100B) can be configured to be different from one another and in any shape or configuration as described above, e.g., including FIGS. 9A-10B, the details of which are omitted herein for brevity. In addition, the plurality of spark gaps formed can have the same or different gap distances.

Figure 42:
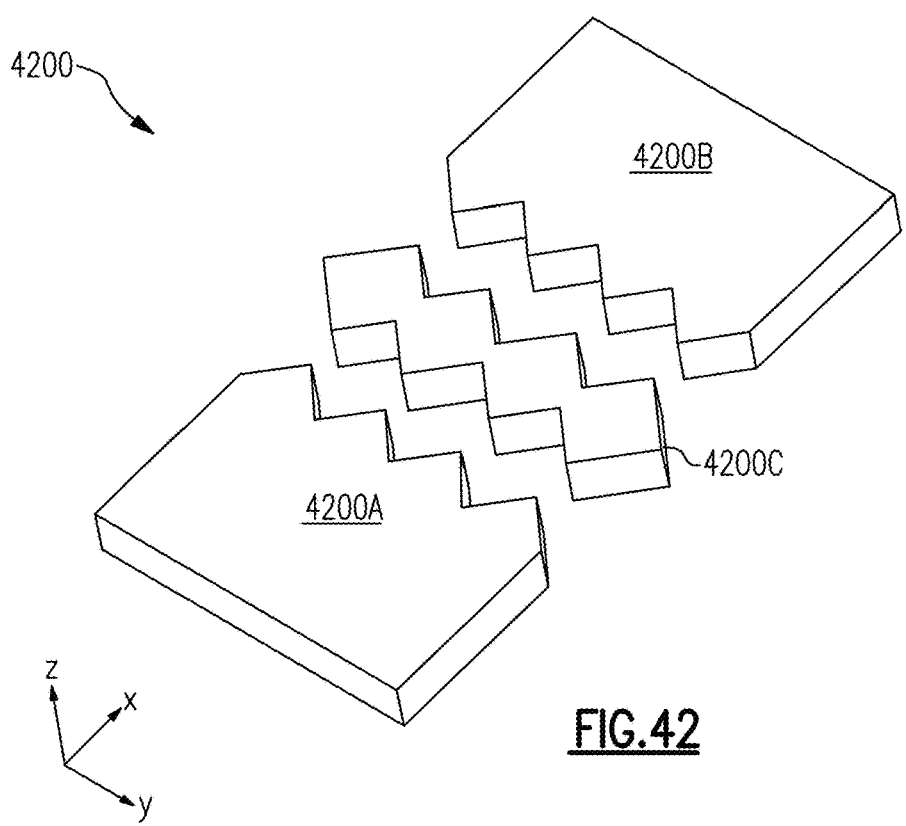
FIG. 42 is a schematic perspective view of a plurality of pairs of conductive structures of an EOS monitor/protection device that are configured to arc in response to an EOS event, including a plurality of differently shaped first conductive structures, where each of the first conductive structures including one or more protrusions serves as one of a cathode or an anode, and including a second conductive structure comprising a line having one or more protrusions serving as the other of the cathode or the anode, according to embodiments.

Yet a further variations of the conductive structures 4000 (FIG. 40) and 4100 (FIG. 41) are possible. Referring to FIG. 42, a plurality of conductive structures 4200 comprising a first conductive structure 4200C and a plurality of physically separate second conductive structures 4200A, 4200B each comprising a plurality of protrusions are configured similarly as the plurality of conductive structures 4000 (FIG. 40). Also similarly, the conductive structures 4200 comprise a first conductive structure 4200C comprising a conductive line. However, unlike FIG. 40, the first conductive structure 4200C comprises a plurality of protrusions on opposing sides facing each of the first and second conductive structures 4200A, 4200B. The protrusions formed on first and second sides of the first conductive structure 4200C are generally pointed towards corresponding protrusions of each of the second conductive structures 4200A, 4200B.

Spark Gap Structures Configured for Post Fabrication Trigger Voltage Tuning

As described above, various embodiments of EOS monitor or EOS protection devices comprising one or more pairs of conductive structures or spark gap structures can be tailored for various desirable electrical parameters associated with arcing by adjusting various physical parameters during fabrication. For example, the trigger voltage of the conductive structures can be tuned using various attributes of the conductive structures, e.g., the shapes and the arcing distance between the conductive structures. For example, when the conductive structures include a protrusion, the sharpness of the protrusion and/or the distance between the protrusion and the nearest conductive structure, e.g., another protrusion, can be controlled to control the trigger voltage. However, in some applications, it may be desirable to tune the electrical parameters after fabrication, e.g., prior to use. In the following, an EOS monitor or EOS protection device comprises one or more pairs of conductive structures that are configured such that the electrical parameters associated with arcing, e.g., the trigger voltage, are tunable post-fabrication.

Figure 44A:
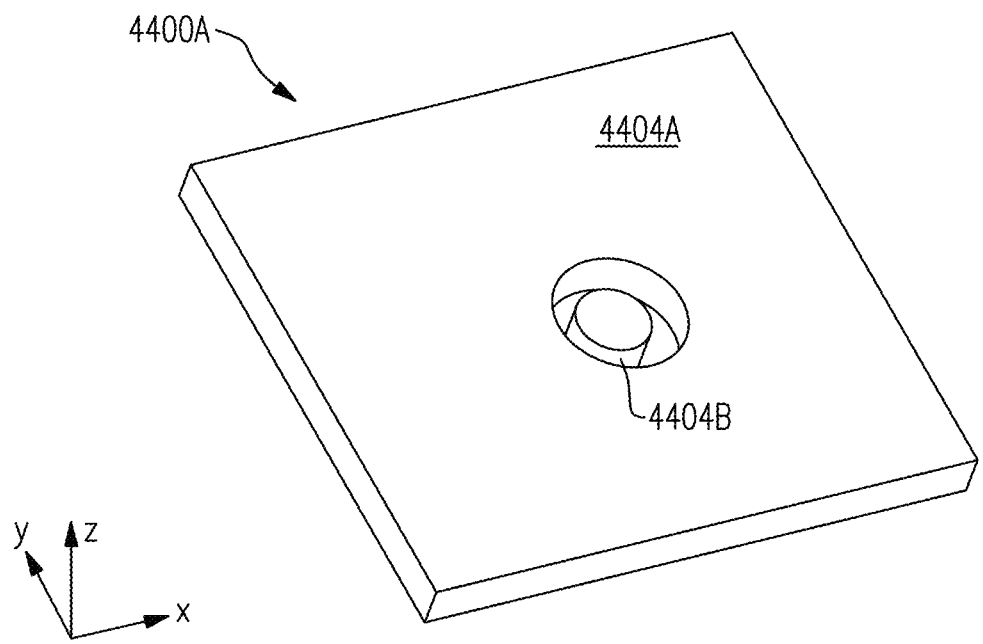
FIG. 44A is a schematic perspective view of post-fabrication adjustable pair of conductive structures of an EOS monitor/protection device that is configured to arc in response to an EOS event, where one of the conductive structures at least partly laterally surrounds the other one of the conductive structures, where the physical positions of one or both of the conductive structures of the pair are configured to be shifted post-fabrication, according to embodiments.
Figure 44B:
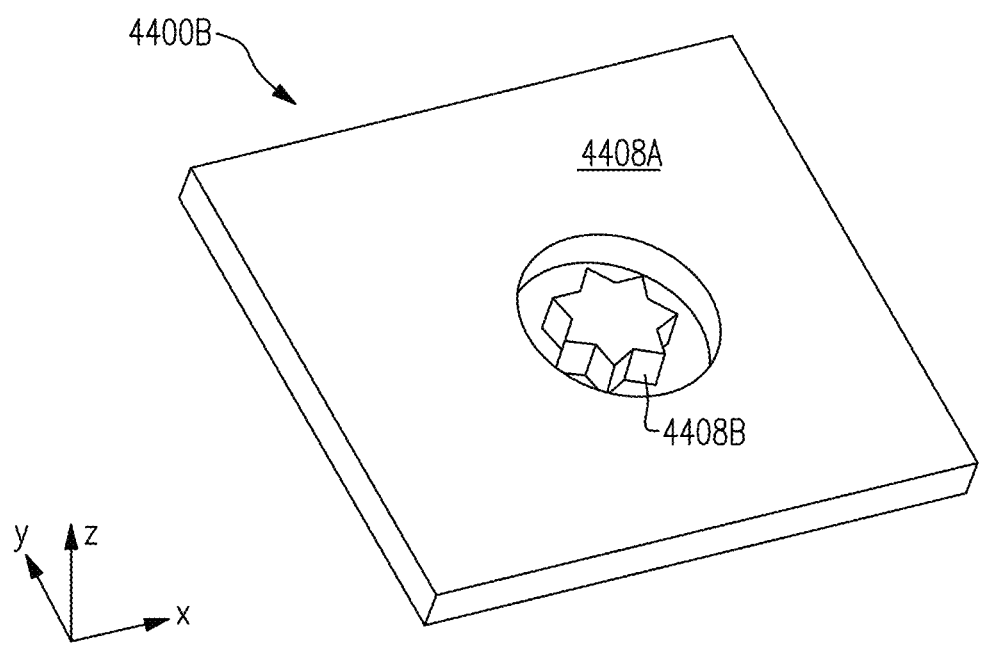
FIG. 44B is a schematic perspective view of post-fabrication adjustable pair of conductive structures of an EOS monitor/protection device that is configured to arc in response to an EOS event, where one of the conductive structures at least partly laterally surrounds the other one of the conductive structures, where the physical positions of one or both of the pair of conductive structures are configured to be shifted post-fabrication, according to embodiments.

FIGS. 43A-43B illustrate an embodiment in which one of the pair of conductive structures comprises a conductive line that is configured to be reduced in width upon passing current therethrough, such that gap distance of the pair of conductive structures is tunable. FIGS. 44A, 44B and 55 illustrate embodiments in which one or both of the conductive structures are configured to be positionally displaced relative to one another such that gap distance of the pair of conductive structures is tunable. Such structure can provide various advantages, including EOS monitors and protection devices with application-specific and field-adjustable electrical parameters.

FIGS. 43A-43B illustrate a post-fabrication adjustable pair of conductive structures 4300A, 4300B included as part of an EOS monitor/protection device that serves as a cathode-anode pair configured to electrically arc in response to an EOS event, according to embodiments. The post-fabrication adjustable pair of conductive structures 4300A, 4300B, which includes a first conductive structure 4304B and a second conductive structure 4304A that are arranged in a similar manner as first and second conductive structures 4000C, 4000A/4000B described above with respect to FIG. 40, additional details of which are omitted herein for brevity. In addition, in the illustrated embodiment, the second conductive structure 4304B, which may be configured as a line, is configured such that the lateral width can be controllably reduced post-fabrication, thereby correspondingly increasing the distance from the first conductive structure 4304A, as well as the corresponding arcing voltage. FIGS. 43A and 43B illustrate before and after the controlled width reduction of the second conductive structure 4304B, respectively. In one implementation, the lateral width of the second conductive structure 4304B may be achieved by controllably inducing electromigration in the second conductive structure 4304B. For example, the material and the electrical resistance of the second conductive structure 4304B may be selected such that a predetermined reduction in the width of the second conductive structure 4304B is achieved by passing a corresponding amount of current using a suitably configured current or voltage source connected thereto. For example, the second conductive structure 4304B may be formed of copper or aluminum.

FIG. 44A illustrates a post-fabrication adjustable pair of conductive structures 4400A included as part of an EOS monitor device or an EOS protection device that serves as a cathode-anode pair configured to electrically arc in response to an EOS event, according to embodiments. The pair of conductive structures 4400A includes a first conductive structure 4404A serving as one of a cathode or an anode during arcing, and a second conductive structure 4404B at least partly laterally surrounding the first conductive structure 4404A and serving as the other of the cathode or the anode during arcing. The first conductive structure 4404A comprises a circular arcing structure and the second conductive structure 4404B comprises a plate having a hole formed therethrough, where the hole surrounds the second conductive structure 4404B. The sidewall of the hole faces the circular edge of the second conductive structure 4404B, through which arcing occurs. Except for a lack of a horizontal line connected to the circular arcing structure of the first conductive structure 4404A and the complete lateral surrounding of the first conductive structure 4404A by the second conductive structure 4404B, the pair of conductive structures 4404A is configured analogously to the pair of conductive structures 3800 described above with respect to FIG. 38, additional details of which are omitted herein for brevity.

In the illustrated embodiment, one or both of the first and second conductive structures 4404A, 4404B are configured to be adjusted in physical position post-fabrication. For example, one or both of the first and second conductive structures 4404A, 4404B may be connected to a micro-mover (not shown) of a micro-electromechanical system (MEMS). For example, the micro-mover may be an electromagnetic (EM) actuator that is physically connected to one or both of the first and second conductive structures 4404A, 4404B and configured to translate, e.g., linearly translate one or both of the first and second conductive structures 4404A, 4404B. For example, one or both of the first and second conductive structures 4404A, 4404B may be linearly translated in one or more of x, y and z directions, such that the arcing distance between the first and second conductive structures 4404A, 4404B may be correspondingly reduced, which may in turn lead to a correspondingly lower trigger voltage.

It will be appreciated that the arrangement of the post-fabrication adjustable pair of conductive structures 4400A illustrated in FIG. 44A using a micro-mover is but one example of various arrangements of the conductive structures. In practice, any pair of conductive structures configured for arcing in response to an EOS event described herein can benefit from the inventive concept. For example, one or both of the first and second conductive structures 4404A, 4404B can have one or more protrusions as described above with respect to various embodiments.

FIG. 44B illustrates an alternative embodiment of a post-fabrication adjustable pair of conductive structures 4400B, which includes a first conductive structure 4408A and a second conductive structure 4408B that are arranged in a similar manner as described above with respect to FIG.

44A, additional details of which are omitted herein for brevity. However, unlike the conductive structures 4400A (FIG. 44A), the second conductive structure 4408B of the pair of conductive structures 4400B comprises a plurality of protrusions or tips. The protrusions are arranged in a similar manner as described above in various embodiments, e.g., the first conductive structure 3700A (FIG. 37), the details of which are omitted herein for brevity. In addition, as described above with respect to FIG. 44A, one or both of the first and second conductive structures 4408A, 4408B may be linearly translated in one or more of x, y and z directions, such that the arcing distance between the first conductive structure 4408A and any one of the protrusions of the second conductive structure 4408B may be correspondingly reduced, which may in turn lead to a correspondingly lower trigger voltage.

Figure 45:
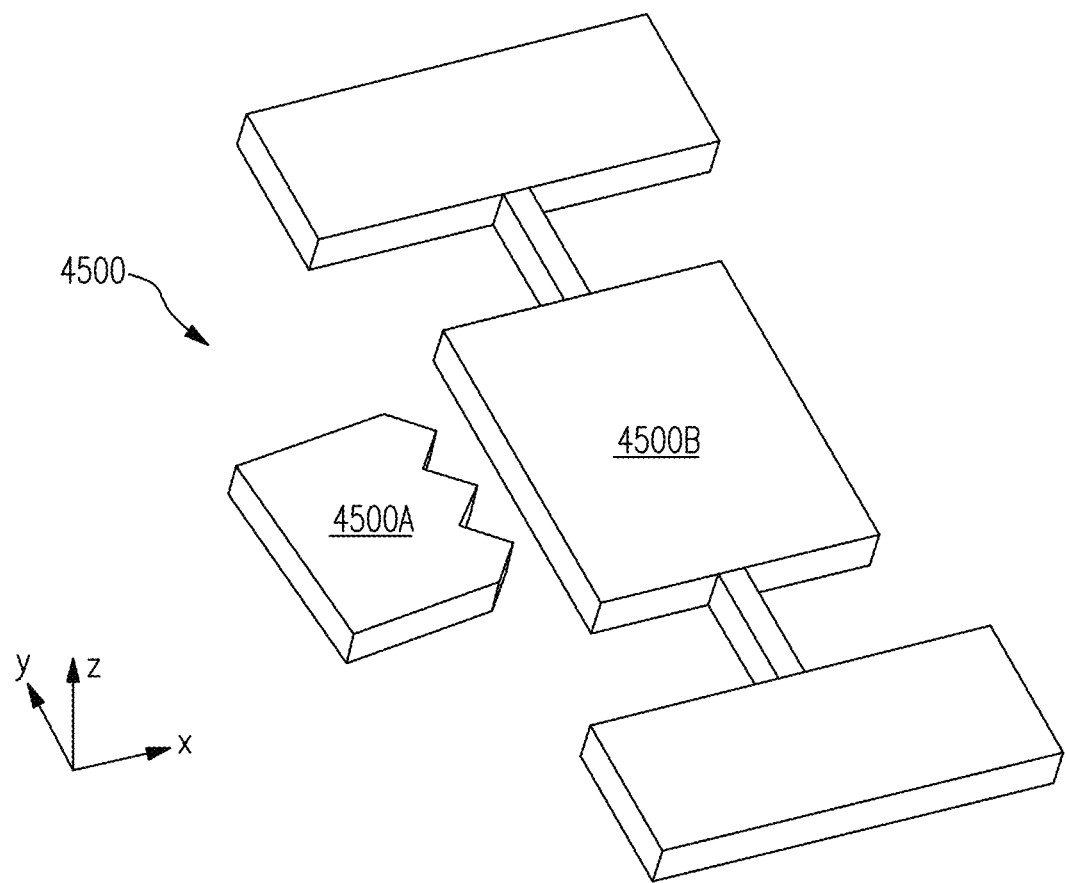
FIG. 45 is a schematic perspective view of a post-fabrication adjustable pair of conductive structures of an EOS monitor/protection device that is configured to arc in response to an EOS event, where at least one of the conductive structures includes a protrusion, and where the physical positions of one or both of the pair of conductive structures are configured to be shifted post-fabrication, according to embodiments.

To provide another alternative example, FIG. 45 illustrates a post-fabrication adjustable pair of conductive structures 4500, which includes a first conductive structure 4500A and a second conductive structure 4500B that are arranged in a similar manner as described above with respect to FIG. 33, additional details of which are omitted herein for brevity. However, unlike the conductive structures 3300 (FIG. 33), one or both of the first and second conductive structures 4500A, 4500B may be linearly translated in one or more of x, y and z directions, such that the arcing distance between the second conductive structure 4500B and the protrusions of the first conductive structure 4500A may be correspondingly reduced, which may in turn lead to a correspondingly lower trigger voltage.

Self-Limiting Spark Gap Structures with Integrated Fuse Structures

In various embodiments described above, e.g., with respect to FIGS. 3, 4, and 7A-7B, an EOS monitor device including conductive structures configured to monitor voltage and/or energy associated with an EOS event can include a fuse connected thereto. In addition to using the fuse to monitor voltage and/or energy associate with the EOS event, the fuse can also be used as a protective device to limit the amount of current passing through the conductive structure, and to prevent damage to other circuits connected thereto. Advantageously, in some embodiments, the conductive structures and can be integrated with a fuse as part of an interconnect metallization layer of a metallization structure of a semiconductor device, e.g., the semiconductor device described above with respect to FIG. 2A. Thus, in various embodiments, an EOS monitor device or an EOS protection device comprises one or more spark gap structures comprising a pair of conductive structures serving as a cathode-anode pair configured to electrically arc in response to an EOS event, and further comprising an integrated fuse serially connected to the pair of conductive structures.

FIGS. 46A, 46B illustrate a pair of conductive structures 4600A, 4600B, respectively, which includes a first conductive structure 4604A and a second conductive structure 4604B that share similarities with those described above with respect to FIG. 33, additional details of which are omitted herein for brevity. While on one side, the second conductive structure 4604B facing the first conductive structure has a straight edge arranged in a similar manner as described above with respect to FIG. 33, on the other side, the second conductive structure 4604B has a tapered portion in which the width continuously reduces to a narrow constriction 4612, followed by a line structure. Referring to FIG. 46A, in operation, in response to an EOS event, current flows across the gap between the protrusion(s) of the first conductive structure 4604A and the second conductive structure 4604B. Because of the increased resistance at the constriction 4612, the metal at the constriction 4612 may melt and eventually form a void 4616, as illustrated in FIG. 46B. Thus, an open circuit is created, thereby shutting the current off to prevent excessive current from undesirably flowing through connected circuits, e.g., a core circuit to be protected or monitored. Thus, the constriction 4612 serves as a fuse serially connected to the pair of conductive structures 4600A, 4600B.

Spark Gap Structures Integrated as Partial Vias

Various embodiments of EOS monitor or EOS protection devices comprising one or more pairs of conductive structures or spark gap structures described above can be fabricated as standalone components outside of a core circuit to be monitored or protected, or as a device integrated with the core circuit to be monitored or protected. In the latter implementation, any of embodiments described above, e.g., embodiments described with respect to FIGS. 33-46B can be fabricated as part of different interconnect metallization levels of a semiconductor device, e.g., the semiconductor device described above with respect to FIG. 2A. For example, various conductive structures that are horizontally or laterally arranged can formed as part of an nth metallization level, e.g., an nth metal layer. In some embodiments, instead of being formed by patterning a metal layer of a metallization level, the conductive structures can be formed as part of an nth metal via, as described above with respect to FIG. 2A.

Figure 47B:
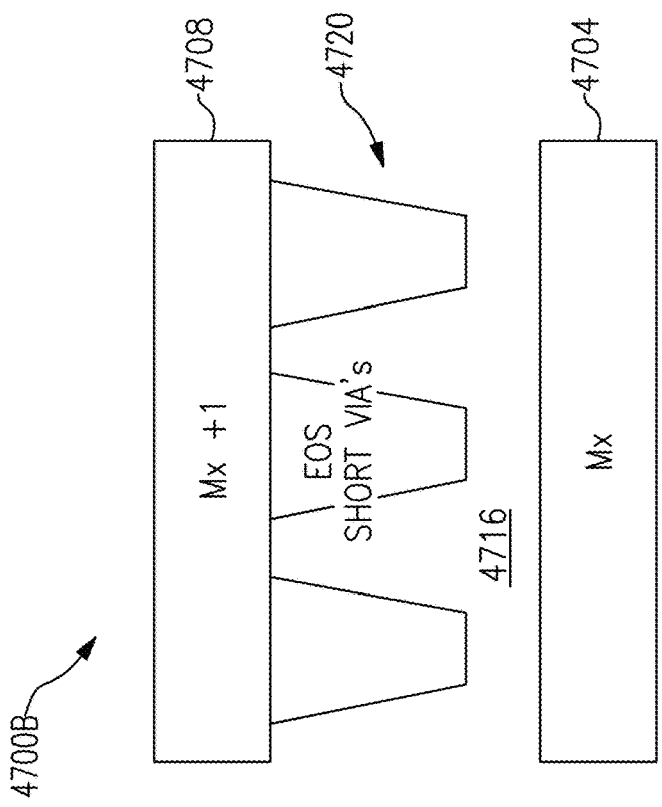
FIG. 47B is a schematic side view of a metallization including two vertically adjacent metal layers connected by partial via structures that are configured as pairs of conductive structures of an EOS monitor/protection device and are configured to arc in response to an EOS event, according to embodiments.
Figure 47A:
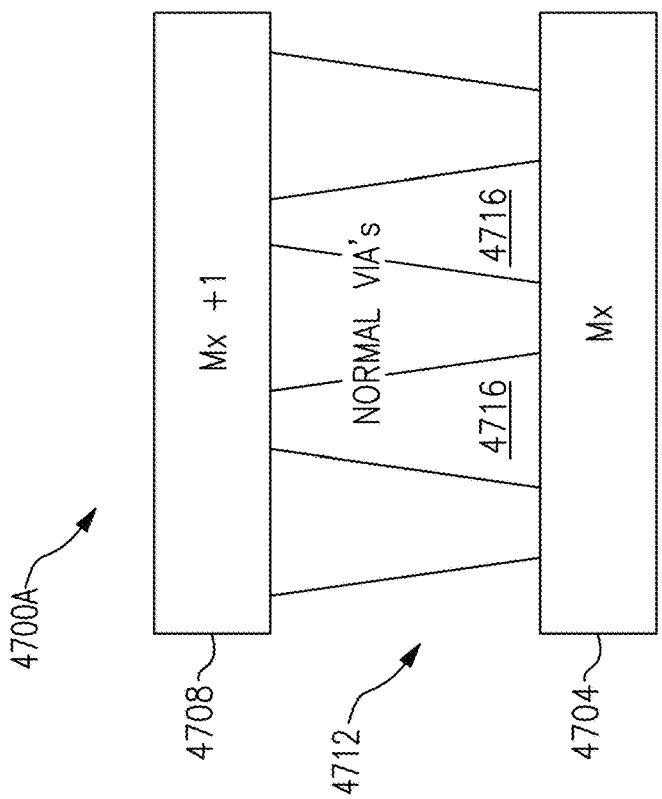
FIG. 47A is a schematic side view of a metallization including two vertically adjacent metal layers connected by via structures.

FIG. 47A illustrates an example backend metallization structure showing two vertically adjacent metal layers 4704, 4708 connected by "normal" via structures 4712 formed therebetween. The spaces between the via structures 4712 are filled with a dielectric layer 4716, e.g., an interlayer dielectric (ILD) layer/intermetal dielectric (IMD) layer.

FIG. 47B illustrates an example backend metallization structure showing two vertically adjacent metal layers 4704, 4708 connected by partial conductive via structures 4720 formed therebetween. In these embodiments, the partial conductive via structures 4720 and the electrically separated adjacent metal layer 4704 serve as the pair(s) of conductive structures configured to arc in response to an EOS event. The partial conductive via structures 4270 contact upper metal layer 4708 at first ends while being separated from the lower metal layer 4704 at the second ends. The spaces between the via structures 4712, as well as the gap between the partial conductive via structures 4270 and the lower metal layer 4704 are filled with a dielectric layer 4716, e.g., an ILD/IMD layer. Advantageously, in some implementations, the partial conductive via structures can be arranged as an N×M array.

Spark Gap Structures Integrated with Barrier Structures to Suppress Formation or Propagation of Cracks Various embodiments of EOS monitor or EOS protection devices described herein rely on the arcing across one or more pairs of conductive structures. Because arcing events involve a dielectric breakdown, they release a substantial amount of energy such as electrical and thermal energy to the surrounding areas, which can cause, among other things, a relatively high level of mechanical stress in the conductive structures themselves as well as surrounding regions. The mechanical stress can in turn cause cracking in the surrounding regions, e.g., the surrounding intermetal dielectric (IMD) regions. Under some circumstances, cracks generated in the IMD regions may extend as far down as the substrate level and/or extend as far up as beyond the IMD regions and into passivation layers formed above the IMD regions. The presence of the cracks may create electrical opens or shorts immediately or subsequently from exposure to the environment, e.g., moisture. Thus, the inventors have recognized a need for barrier structures to prevent the cracks from forming and/or propagating.

FIG. 48A illustrates a side view of a portion of a backend interconnection structure 4800A of an integrated circuit device comprising an EOS monitor or an EOS protection device comprising one or more pairs of conductive structures configured to arc in response to an EOS event, according to embodiments, The pairs of conductive structures are fabricated as part of an interconnect metallization structure, e.g., as part of one or more metallization levels, as described above, e.g., with respect to FIG. 2A. The backend interconnection structure 4800A includes a pair of conductive structures 4804 configured to arc in response to an EOS event, which can be arranged in a similar manner as described above with respect to various embodiments described above, additional details of which are omitted herein for brevity. The backend interconnection structure 4800A additionally includes barrier structures 4808A, 4808B disposed adjacent to, e.g., above and/or below, the pair of conductive structures 4804. The barrier structures can include electrically floating structures, e.g., floating metal layers, polysilicon layers and/or via structures, that serve as a mechanical barrier to generation or propagation of cracks in the regions adjacent the pair of conductive structures 4804. In the illustrated implementation, the barrier structures 4808A, 4808B, are themselves laterally separated by a gap under and above the spacing of the spark gap. The gap between laterally adjacent barrier structures is wider than the gap between the pair of conductive structures such that the barrier structures are not configured to electrically arc in response to the EOS event. The barrier structures 4808A, 4808B as arranged can prevent an electrical short across the pair of conductive structures 4804 and/or through the barrier structures 4808A, 4808B, after arcing has occurred. In some implementations, each of the barrier structures 4808A, 4808B may include two plates of metal layers that are vertically connected by one or more vias, which can provide added mechanical rigidity. In some implementations, vias may be formed without the metal layers. In some other implementations, instead of an array of vias, a single large via may be used.

FIG. 48B illustrates a side view of a portion of a backend interconnection structure 4800B of an integrated circuit device comprising an EOS monitor or an EOS protection device comprising one or more pairs of conductive structures described above that are fabricated as part of interconnect metallization levels, e.g., as part of one or more of metallization level, as described above with respect to FIG. 2A, according to some other embodiments. Similar to the backend interconnection structure 4800A (FIG. 48A), the backend interconnection structure 4800B includes a pair of conductive structures 4804 which can be arranged in a similar manner, additional details of which are omitted herein for brevity. The backend interconnection structure 4800B additionally includes barrier structures 4812A, 4812B disposed adjacent to, e.g., above and/or below, the pair of conductive structures 4804, in a similar manner as described above with respect to FIG. 48A. However, unlike the backend interconnection structure 4800A (FIG. 48A), the barrier structures 4808A, 4808B do not include vias while including layers of metal plates.

It will be appreciated that, while in some embodiments described above with respect to FIGS. 48A and 48B, the barrier structures may be electrically floating, embodiments are not so limited, and in other embodiments, the barrier structures may be electrically connected to other parts of the integrated circuit device.

In some embodiments, the barrier structures also serve as a backend metallization structure of a circuit, e.g., a core circuit or a sensing circuit. However, embodiments are not so limited and in other embodiments, the barrier structures do not serve other purpose outside of serving as crack generation and/or propagation suppression structures.

Spark Gap Structures Configured for Low Trigger Voltage

In some applications, a pair of conductive structures or a spark gap structure included as part of an EOS monitor device and/or an EOS protection device that serves as a cathode-anode pair configured to electrically arc in response to an EOS event can be designed to trigger at a relatively low (e.g., <100V) voltage. To address these and other needs, various embodiments described herein are directed to an electrical overstress (EOS) monitor/protection device comprising a pair of conductive structures configured to electrically arc in response to an EOS event at a relatively low trigger voltage less than about 100V, 80V, 60V, 40V, 20V, 10V, 5V, 1V, 0.5V, or a voltage in a range defined by any of these values. The trigger voltage may be, e.g., in a range defined by any value in the experimental graph illustrated in FIG. 13. The pair of conductive structures are integrated on a semiconductor substrate and separated by a dielectric layer serving as an arcing medium.

FIGS. 49A and 49B illustrate integrated systems 4900A and 4900B, respectively, that include an EOS monitor/protection device 4904 electrically connected to and configured to monitor and/or protect a core system/module/circuit 4908. As depicted in FIG. 49A, in some implementations, the EOS monitor/protection device 4904 is disposed upstream relative to the core system/module/circuit 4904 and a ground 4912, and the core system/module/circuit 4904 is electrically interposed between the EOS monitor/protection device 4904 and the ground 4912. In alternative implantations depicted in FIG. 49B, the EOS monitor/protection device 4904 is disposed downstream relative to the EOS monitor/protection device 4904, and the EOS monitor/protection device 4904 is electrically interposed between the core system/module/circuit 4908 and the ground 4912. The illustrated EOS monitor/protection device 4904A and 4904B are configured for low voltage monitoring and/or protection, and may be used to monitor or protect various integrated semiconductor devices, e.g., transistors, diodes and metallization structures against EOS events.

In the following, various embodiments of an integrated circuit device with EOS monitoring or protection include a semiconductor substrate and one or more conductive structures or spark gap structures integrated on the semiconductor substrate and configured to electrically arc in response to an EOS event at a trigger voltage less than about 100V.

FIGS. 50A-50D illustrate side views of intermediate structures at various stages of fabricating an EOS monitor/protection device 5000D configured to electrically arc in response to an EOS event at a trigger voltage less than about 100V, according to embodiments. The EOS monitor/protection device 5000D comprises a pair of conductive structures that are configured to arc in response to an EOS event, in a similar manner as described above with respect to various embodiments. Referring to FIG. 50D, the pair of conductive structures of the EOS monitor/protection device 5000D comprises a doped region 5016 in a semiconductor substrate 5004 that is doped heavier relative to the semiconductor substrate 5004. The doped region 5016 serves as a first conductive structure of the pair of conductive structures, and as one of a cathode or an anode during arcing. The pair of conductive structures additionally includes a conductive structure 5024, e.g., a conductive via or a plug structure, that is formed above the doped region 5016 and serves as the second conductive structure of the pair of conductive structures, and the other of the cathode or the anode during arcing. The doped region 5016 and the conductive structure 5024 are interposed by a first dielectric layer 5008 that serves as an arcing medium. The conductive structure 5024 can be formed of multiple layers of materials. For example, in the illustrated embodiment, the conductive structure 5024 includes a trigger voltage tuning layer 5024A contacting the first dielectric layer 5008 and a current carrying or filler conductive structure 5024B formed on the trigger voltage tuning layer 5024A. Additional details of the feature of the pair of conductive structures are provided below, along with a method of forming the same.

Referring to FIG. 50A, an intermediate structure 5000A is illustrated, which includes a substrate 5004 in which a doped region 5016 is formed, followed by formation of a first dielectric layer 5008 on the substrate 5004 and formation of a second dielectric layer 5012 over the substrate 5004.

The substrate 5004 can be implemented in a variety of ways, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials. The substrate can also be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer. In addition, it will be appreciated that the various structures described herein can be at least partially formed in an epitaxial layer formed at or near a surface region.

The doped region 5016 can be doped with the same or opposite dopant type as the substrate 5004 when the substrate 5004 is doped. The doped region 5016 can generally have a peak dopant concentration between about $1 \times 10^{13}$ $cm^{-3}$ and about $1 \times 10^{22}$ $cm^{-3}$. In some embodiments, the doped region 5016 comprises a heavily doped regions ($N^+$ or $P^+$ regions) that can have a peak doping concentration exceeding about $1 \times 10^{18}$ $cm^{-3}$ or about $1 \times 10^{19}$ $cm^{-3}$. However, embodiments are not so limited and the doped region 5016 can include a lightly doped region ($N^-$ or $P^-$ regions) that can have a peak doping concentration lower than about $1 \times 10^{14}$ $cm^{-3}$ or about $1 \times 10^{13}$ $cm^{-3}$. The doped region 5016 can also include an intermediately doped region having a doping concentration in a range defined by any of the above values.

The doped region 5016 can be formed by ion implantation of dopants, e.g., p-type or n-type dopants. For example, when the doped region 5016 comprises a localized doped region, the doped region 5016 may be formed by patterning an opening through a masking layer (not shown), e.g., a photoresist layer, formed over the substrate 5004. The patterning may be performed, e.g., lithographically. The ion implantation may be performed at any suitable point during fabrication including before formation of the first dielectric 5008, after formation of the first dielectric layer 5008, after formation of the second dielectric layer 5012, by forming and patterning the masking layer on the substrate 5004 before formation of the first dielectric 5008, after formation of the first dielectric layer 5008, and after formation of the second dielectric layer 5012, respectively.

However, embodiments are not so limited. For example, other masking (e.g., imprinting or shadow masking) and doping (e.g., diffusion) techniques may be used in lieu or in addition to using a patterned resist layer as an implantation mask The material and the thickness of the first dielectric layer 5008 are selected such that it can relatively reliably break down at a low voltage thereacross. In various embodiments, a suitable dielectric material may include $SiO_2$, $Si_3N_4$, $TiO_2$, $Ta_2O_5$, $SrTiO_3$, $ZrO_2$, $HfO_2$, $Al_2O_3$, $La_2O_3$, $Y_2O_3$, $HfSiO_4$, $LaAlO_3$ or non-stoichiometric versions of the above as well as various mixtures and combinations or stacks thereof, to name a few. Without being bound to any theory, it will be appreciated that, in some instances, dielectric materials with relatively high conduction band offsets relative to the electron emitting trigger voltage tuning layer 5024A may give rise to relatively higher triggering voltage, due to a higher energy barrier the electrons must overcome before substantial current starts to flow therethrogh, which may eventually lead to a full onset of arcing. The first dielectric layer 5008 may be formed using a suitable technique, such as thermal oxidation, atomic layer deposition (ALD), chemical vapor deposition (CVD), physical vapor deposition (PVD), evaporation, spin-coating, etc., to name a few. It will be appreciated that the thickness can be selected based on a variety of factors, including the desired trigger voltage for arcing, the material of the first dielectric layer 5008, the doping type/level of the doped region 5016 serving as one of a cathode or an anode, the material of the trigger voltage tuning layer 5024A contacting the first dielectric layer 5008, and the shape of the conductive structure (5024, FIG. 50D) serving as the other of the cathode or the anode, among other physical attributes of the EOS monitor/protection device 5000D (FIG. 54D). According to various embodiments, for trigger voltage less than about 100V, the thickness of the first dielectric layer 5008 can be between about 1-10 nm, 10-20 nm, 20-50 nm, 50-100 nm, 100-200 nm, 200-300 nm, 300-400 nm, 400-500 nm, 500-600 nm, 600-700 nm, 700-800 nm, 800-900 nm, 900 nm-1000 nm, or a thickness in a range defined by any of these values.

The material and the thickness of the second dielectric layer 5012 are selected such that it can serve as suitable template for defining the shape of the current carrying structure 5024B, as described below. The material of the second dielectric layer 5012 is selected such that it can be etched selectively against the first dielectric layer 5008, as described below. A suitable material for the second dielectric layer 5012 can include a different material from the first dielectric layer 5008, e.g., a dielectric material such as $SiO_2$ or $Si_3N_4$, polysilicon, amorphous silicon, a polymeric material or a metal. The thickness can be, e.g., greater than that of the first dielectric layer 5008, e.g., 100 nm-100 μm.

Referring to FIG. 50B, an intermediate structure 5000B is illustrated, which represents the intermediate structure 5000A (FIG. 50A), which has been further processed to form an opening 5020 through the second dielectric layer 5012. The opening 5020 may be formed by a suitable masked etching process. For example, a photoresist layer (not shown) may be formed on the second dielectric layer 5012 and locally removed to form an opening therethrough, followed by a suitable etching process to form the opening 5020. The patterning may be performed, e.g., lithographically or using other suitable techniques. The bottom of the opening 5020 at least partly laterally overlaps the doped region 5016. In the illustrated embodiment, the opening 5020 is laterally formed within the doped region 5016. The suitable etching process can be a wet and/or a dry etching process, where the etch removal is substantially selective between the first and second dielectric materials 5008, 5012, such that the etch removal stops at the first dielectric layer 5008.

The opening 5020 is formed to have a suitable shape that is adapted for arcing, e.g., at a voltage less than about 100V. For example, in the illustrated embodiment, the opening 5020 has a tapered profile such that the sidewalls of the opening 5020 forms an angle θ greater than >90° with respect to the horizontal surface of the bottom surface of the opening 5020. For example, the θ may be 90°-100°, 100°-110°, 110°-120°, 120°-130°, 130°-140°, 140°-150°, 150°-160°, 160°-170°, or any angle in a range defined by any of these values, according various embodiments. While not illustrated, the opening 5020 can have any suitable lateral shape, i.e., the shape apparent in a top-down view, e.g., circle, oval or a polygon. In the illustrated embodiment, the bottom surface of the opening 5020 has a suitable width d which, in combination with the θ, defines the sharpness of the arcing region of the conductive structure 5024 (FIG. 50D).

Referring to FIG. 50C, an intermediate structure 5000C is illustrated, which represents the intermediate structure 5000B (FIG. 50B), which has been further processed to form the trigger voltage tuning layer 5024A on the inner surfaces of the opening 5020. The trigger voltage tuning layer 5024A may be selectively deposited in the opening 5020, or blanket deposited followed by removing from regions outside the opening 5020.

The material of the trigger voltage tuning layer 5024A is selected to have a particular work function to tune the trigger voltage or the arcing voltage of the pair of conductive structures. Without being bound to any theory, tt will be appreciated that the trigger voltage or the arcing voltage of the pair of conductive structures can depend in part on an energy difference between a metal work function of the trigger voltage tuning layer 5024A and the Fermi level of the doped region 5016.

In some embodiments, when the doped region 5016 is p-doped, the trigger voltage tuning layer 5024A may include a p-doped semiconductor such as polycrystalline silicon or a suitable "p-type" metal such that the work function $\Phi_m$ of the trigger voltage tuning layer 5024A is engineered to be between about 4.1 eV and about 4.65 eV, between about 4.1 eV and about 4.4 eV, or between about 4.4 eV and about 4.65 eV. However, embodiments are not so limited, and in other embodiments, the trigger voltage tuning layer 5024 may have these work function values when the doped region 5016 is n-doped.

In some other embodiments, when the doped region 5016 is n-doped, the trigger voltage tuning layer 5024A may include an n-doped semiconductor material such as n-doped polycrystalline silicon or a suitable metal such that the work function $\Phi_m$ of the trigger voltage tuning layer 5024A is engineered to be between about 4.65 eV and about 5.2 eV, between about 4.65 eV and about 4.9 eV, or between about 4.9 eV and about 5.2 eV. However, embodiments are not so limited, and in other embodiments, the trigger voltage tuning layer 5024 may have these work function values when the doped region 5016 is p-doped.

In various embodiments, suitable metals for the trigger voltage tuning layer 5024A include, e.g., aluminum (Al), tungsten (W), titanium (Ti), tantalum (Ta), niobium (Nb), molybdenum (Mo), rubidium (Ru), WN, TiN, TaN, TaCN, and $TaSi_xN_y$, to name a few.

In some embodiments, trigger voltage tuning layer 5024A may be chosen such that the difference ($\Phi_m - E_F$), where $\Phi_m$ is the work function of the trigger voltage tuning layer 5024A and $E_F$ is the Fermi level of the doped region 5016 channel region, does not exceed about 0.8 eV, 0.5 eV, 0.3 eV, 0.2 eV or a value in any range defined by these values.

The trigger voltage tuning layer 5024A may be formed by a suitable technique, e.g., atomic layer deposition (ALD), chemical vapor deposition (CVD) or physical vapor deposition (PVD).

Referring to FIG. 50D, an intermediate structure 5000D is illustrated, which represents the intermediate structure 5000C (FIG. 50C), which has been further processed to fill the remaining space in the opening 5020 with a current carrying metal or a filler metal to form the current carrying conductive structure 5024B to complete formation of the conductive structure 5024. The current carrying metal may be a suitable material such as aluminum, copper, tungsten, or heavily doped silicon, to name few examples. The current carrying conductive structure 5024B may be blanket deposited, followed by removal from regions outside the opening 5020 by, e.g., chemical mechanical polishing. The current carrying conductive structure 5024B may be formed by a suitable technique, e.g., atomic layer deposition (ALD), chemical vapor deposition (CVD) and physical vapor deposition (PVD).

Thus, the pair of conductive structures comprising a doped region 5016 in a semiconductor substrate 5004 that is doped heavier relative to the semiconductor substrate 5004 serving as one of a cathode or an anode during arcing in response to an EOS event, and a conductive structure 5024 serving as the other of the cathode or the anode during arcing in response to the EOS event is formed, as described above.

FIGS. 51A-51D illustrate side views of intermediate structures at various stages of fabricating an EOS monitor/protection device 5100D configured to electrically arc in response to an EOS event at a trigger voltage less than about 100V, according to some other embodiments. The EOS monitor/protection device 5100D comprises a pair of conductive structures that are configured in a similar manner as described above with respect FIGS. 50A-50D in some aspects, and a detailed description of similar aspects are omitted herein for brevity. For example, referring to FIG. 51D, the pair of conductive structures comprises a doped region 5016 formed in a semiconductor substrate 5004 that is doped heavier relative to the semiconductor substrate 5004, and serves as one of the cathode or the anode during arcing. The pair of conductive structures additionally includes a conductive structure 5124 formed above the doped region 5016 and serves as the second conductive structure of the pair of conductive structures, and the other of the cathode or the anode during arcing. The doped region 5016 and the conductive structure 5124 are interposed by a first dielectric layer 5008. However, unlike the conductive structure 5024 described above with respect to FIG. 50D, the conductive structure 5124 does not include includes a trigger voltage tuning layer 5024A. In addition, the conductive structure 5124 does not have tapered sidewalls and the lateral width of the conductive structure 5124 is relatively constant in a vertical direction, instead of decreasing towards the substrate 5004. Additional details of the feature of the pair of conductive structures are provided below, along with a method of forming the same.

Referring to FIG. 51A, an intermediate structure 5100A is illustrated, which includes a substrate 5004 in which a doped region 5016 is formed, followed by formation of a first dielectric layer 5008 on the substrate 5004 and formation of a second dielectric layer 5012. At this stage of fabrication, the intermediate structure 5100A is similar to the intermediate structure 5000A described above with respect to FIG. 50A, and the details of the fabrication steps are omitted herein for brevity.

Referring to FIG. 51B, an intermediate structure 5100B is illustrated, which represents the intermediate structure 5100A (FIG. 51A), which has been further processed to form an opening 5120 through the second dielectric layer 5012. The opening may be formed in a similar manner as that described above with respect to FIG. 50B except, the lateral dimension d of the opening 5120 is larger than the width of the doped region 5016 and laterally extends outside of the lateral footprint occupied by the doped region 5016. In addition, the opening 5120 is formed to have a relatively straight profile instead of having tapered sidewalls.

Referring to FIG. 51C, an intermediate structure 5100C is illustrated, which represents the intermediate structure 5100B (FIG. 51B), which has been further processed to fill the opening 5120 with a trigger the voltage tuning layer to form the conductive structure 5124. The trigger voltage tuning layer may be selectively deposited in the opening 5120, or blanket deposited followed by removing from regions outside the opening 5120.

Referring to FIG. 51D, an intermediate structure 5100D is illustrated, which represents the intermediate structure 5100C (FIG. 51C), which has been further processed to form a contact 5128.

Referring to FIGS. 51C and 51D, in the illustrated embodiment, while a single voltage tuning layer 5124 fills the opening 5120 (FIG. 51B) to form the conductive structure 5124, embodiments are not so limited. In some other embodiments, in a similar manner as described above with respect to FIGS. 50C-50D, the opening 5120 (FIG. 51B) may first be lined with a thin layer of trigger voltage tuning layer, followed by filling of the remaining space in the opening with a current carrying conductive material, in a similar manner as described above with respect to FIGS. 50C-50D to complete the formation of the second conductive structure 5124.

FIGS. 52A-52D illustrate side views of intermediate structures at various stages of fabricating an EOS monitor/protection device 5200D configured to electrically arc in response to an EOS event at a trigger voltage less than about 100V, according to some other embodiments. The EOS monitor/protection device 5200D comprises a pair of conductive structures that are configured in a similar manner as described above with respect FIG. 50D in some aspects, and a detailed description of similar aspects are omitted herein for brevity. However, unlike FIG. 50D, referring to FIG. 52D, the pair of conductive structures comprises a metal layer 5204 formed over a substrate (not shown), e.g., a semiconductor substrate, on which the first dielectric layer 5008 is formed. The metal layer 5204 serves as one of a cathode or an anode during arcing. The pair of conductive structures additionally includes a conductive structure 5024 formed above the metal layer 5204 and serves as the second conductive structure of the pair of conductive structures, or the other of the cathode or the anode during arcing, in a similar manner as described above with respect to FIG. 50D. The metal layer 5204 and the conductive structure 5024 are interposed by the first dielectric layer 5008 that serves as an arcing medium. The conductive structure 5024 includes a trigger voltage tuning layer 5024A contacting the first dielectric layer 5008 and a current carrying conductive structure 5024B formed on the trigger voltage tuning layer 5024A. Additional details of the feature of the pair of conductive structures are provided below, along with a method of forming the same.

Referring to FIG. 52A, an intermediate structure 5200A is illustrated, which includes a metal layer 5204, which may be formed on a substrate (not shown). The substrate may include a suitable substrate described above with respect to FIG. 50A. Instead of forming a doped region in the substrate as described above with respect to FIGS. 50A and 51A, in the illustrated embodiment, the metal layer 5204 serves as one of the conductive structures of the pair of conductive structures. The formation of the metal layer 5204 is followed by formation of a first dielectric layer 5008 on the metal layer 5204 and a second dielectric layer 5012 on the first dielectric layer 5012. At this stage of fabrication, the intermediate structure 5200A is similar to the intermediate structure 5000A described above with respect to FIG. 50A, except that the semiconductor substrate having a doped region is omitted and replaced by the metal layer 5204, which serves as the first conductive structure of the pair of conductive structures adapted for arcing in response to an EOS event.

Referring to FIG. 52B, 52C and 52D, intermediate structures 5200B, 5200C and 5200D are illustrated, which are analogously fabricated as the corresponding intermediate structures 5000B (FIG. 50B), 5000C FIG. 50C) and 5000D (FIG. 50D), respectively, a detailed description of which is omitted herein for brevity.

The metal layer 5204 may comprise or be formed of the same or a different material as the trigger voltage tuning layer 5024A or the current carrying layer 5024B described above with respect to FIGS. 50C and 50D, depending on the desired trigger voltage.

Figure 53A:
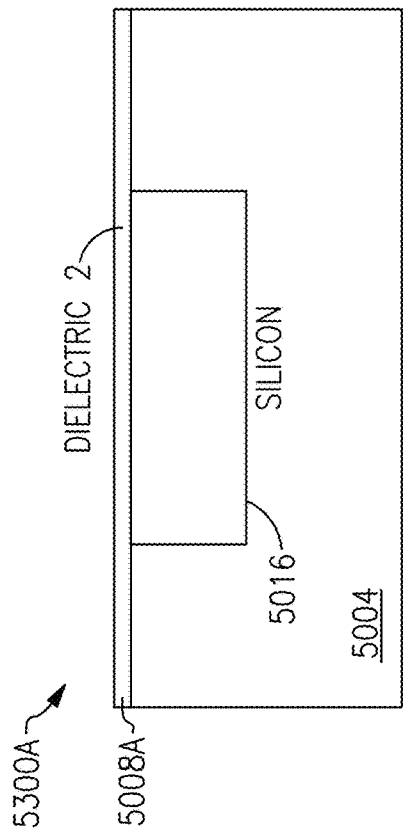
Figure 53B:
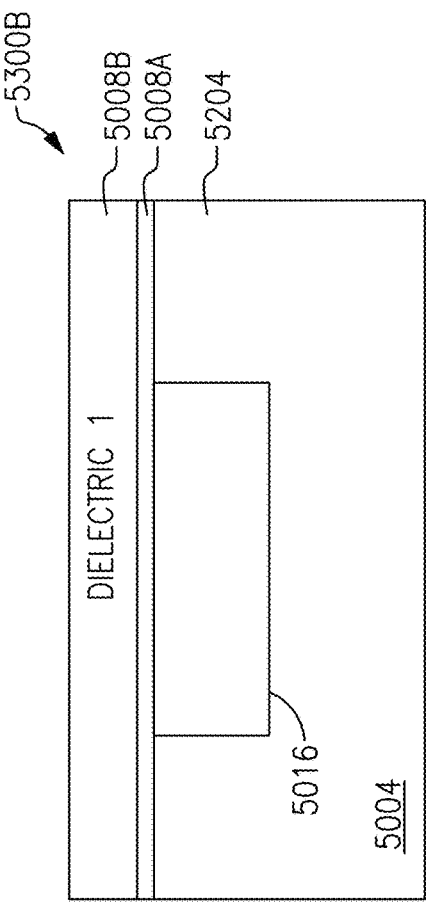
Figure 53C:
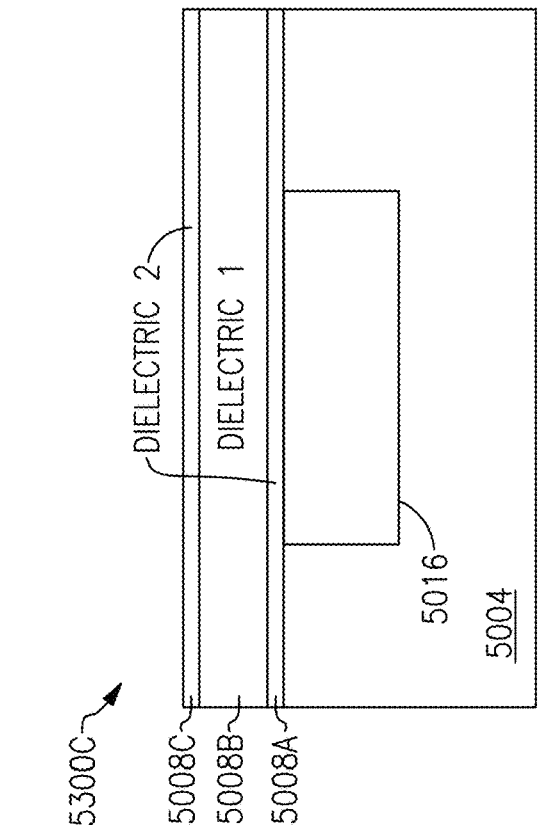
Figure 53D:
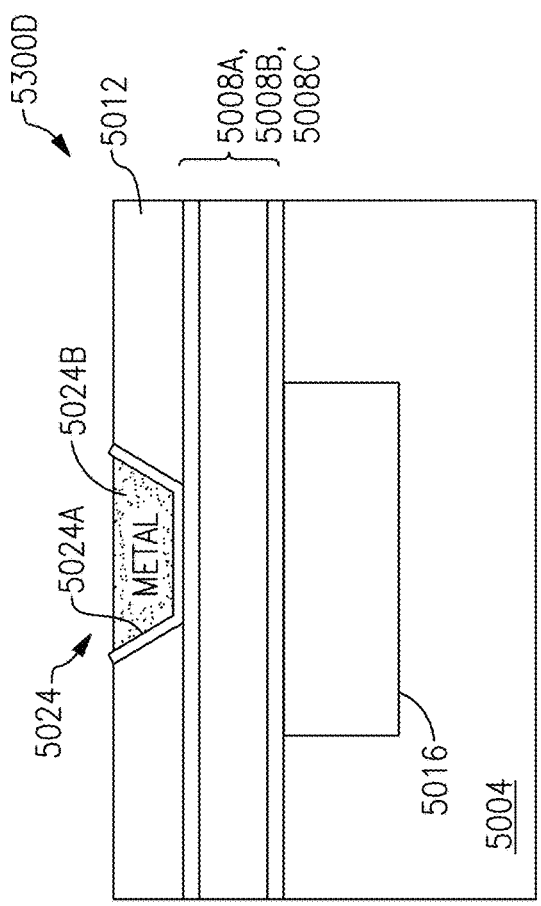

FIGS. 53A-53D illustrate side views of intermediate structures at various stages of fabricating an EOS monitor/protection device 5300D configured to electrically arc in response to an EOS event at a trigger voltage less than about 100V, according to embodiments. The EOS monitor/protection device 5300D comprises a pair of conductive structures that are configured to arc in response to an EOS event, in a similar manner as described above with respect to FIG. 50D. Referring to FIG. 53D, similar to FIG. 50D, the pair of conductive structures of the EOS monitor/protection device 5000D comprises a doped region 5016 in a semiconductor substrate 5004 that is doped heavier relative to the semiconductor substrate 5004, and serves as a first conductive structure of the pair of conductive structures, and as one of a cathode or an anode during arcing. The pair of conductive structures additionally includes a conductive structure 5024 formed above the doped region 5016 and serves as the second conductive structure of the pair of conductive structures, or the other of the cathode or the anode during arcing. However, unlike FIG. 50D, the doped region 5016 and the conductive structure 5024 are interposed by a stack of dielectric layers 5008A/5008B/5008C. The conductive structure 5024 can be formed of multiple layers of materials. For example, in the illustrated embodiment, the conductive structure 5024 includes a trigger voltage tuning layer 5024A contacting the stack of dielectric layers 5008A/5008B/5008C and a current carrying conductive structure 5024B formed on the trigger voltage tuning layer 5024A. Additional details of the feature of the pair of conductive structures are provided below, along with a method of forming the same.

Referring to FIG. 53A, an intermediate structure 5300A is illustrated, which includes a substrate 5004 in which a doped region 5016 is formed, followed by formation of a first dielectric layer 5008A of the stack of dielectric layers 5008A/5008B/5008C on the substrate 5004. The method of forming the intermediate structure 5300A is similar to that described above with respect to the intermediate structure 5000A described above with respect to FIG. 50A, the details of which are omitted herein for brevity.

Referring to FIGS. 53B and 53C, intermediate structures 5300B and 5300C are illustrated, which show successive formation of a second dielectric layer 5008B and a third dielectric layer 5008C, respectively, thereby completing the formation of the stack of dielectric layers 5008A/5008B/5008C.

In various embodiments, first, second and third dielectric layers 5008A, 5008B and 5008C of the stack of dielectric layers 5008A/5008B/5008C can be formed of dielectric materials having first, second and third conduction band energies, respectively, or first, second and third electron barrier heights relative to the work function of the trigger voltage tuning layer 5024A (FIG. 53D). In addition, the stack of dielectric layers 5008A/5008B/5008C can be formed of dielectric materials having first, second and third thicknesses, and/or first, second and third dielectric constants, according to embodiments. For example, each of first, second and third dielectric layers 5008A, 5008B and 5008C of the stack of dielectric layers 5008A/5008B/5008C can be one of suitable dielectric materials described above, e.g., $SiO_2$, $Si_3N_4$, $TiO_2$, $Ta_2O_5$, $SrTiO_3$, $ZrO_2$, $HfO_2$, $Al_2O_3$, $La_2O_3$, $Y_2O_3$, $HfSiO_4$, $LaAlO_3$ or non-stoichiometric versions of the above various mixtures and combinations or stacks thereof, to name a few. According to embodiments, the combination of materials and the thicknesses of the stack of dielectric layers 5008A/5008B/5008C are selected such that it can relatively reliably break down at desired voltage thereacross less than, e.g., 100V.

In some embodiments, each of the first, second and third dielectric layers 5008A, 5008B, 5008C may be formed of a different material and/or have a different thickness.

In some other embodiments, two of the first, second and third dielectric layers 5008A, 5008B, 5008C may be formed of the same material and/or have the same thicknesses.

In some embodiments, first and third dielectric layers 5008A, 5008C may be formed of the same material and/or have about the same thickness.

In some embodiments, the stack of dielectric layers 5008A/5008B/5008C is selected such that the conduction bands or electron barrier heights relative to the work function of the trigger voltage tuning layer 5024A (FIG. 53D) of one or both of the outer first and third dielectric layers 5008A, 5008C are lower than those of the second dielectric layer 5008B disposed in the middle. As configured, relative to single layer formed of the same material as the second dielectric layer 5008B, the stack of layers 5008A/5008B/5008C may provide a lower triggering voltage. For example, a stack of $HfO_2/Al_2O_3/HfO_2$ may provide a lower the trigger voltage relative to a single layer of $Al_2O_3$ having the same thickness as the combined thickness of the stack of $HfO_2/Al_2O_3/HfO_2$.

However, embodiments are so limited and in other embodiments, the stack of dielectric layers 5008A/5008B/5008C is selected such that the conduction bands or electron barrier heights relative to the work function of the trigger voltage tuning layer 5024A (FIG. 53D) of one or both of the outer first and third dielectric layers 5008A, 5008C are higher than those of the second dielectric layer 5008B disposed in the middle. For example, a stack of $Al_2O_3/HfO_2/Al_2O_3$ may lower the trigger voltage relative to a single layer of $Al_2O_3$ having the same thickness as the combined thickness of the stack of $Al_2O_3/HfO_2/Al_2O_3$.

In some other embodiments, the stack of dielectric layers 5008A/5008B/5008C is selected such that the conduction bands or electron barrier heights relative to the work function of the trigger voltage tuning layer 5034A (FIG. 53D) of first to third dielectric layers 5008A-5008C are graded in one direction. As configured, relative to single layer formed of the same material as the second dielectric layer 5008B, the stack of layers 5008A/5008B/5008C may lower the triggering voltage. For example, a stack of $HfO_2/Al_2O_3/SiO_2$ or $SiO_2/Al_2O_3/HfO_2$ may lower the trigger voltage relative to a single layer of $SiO_2$ having the same thickness as the combined thickness of the three-layer stacks.

It will be appreciated that various other combinations are possible. Where two of the first to third dielectric layers 5008A-5008C are different, the conduction bands of the stack of dielectric layers 5008A/5008B/5008C can be ordered to have any combination, e.g., high/medium/low, high//low/medium, medium/high/low, medium/low/high, low/high/medium, or low/medium/high.

In addition, while in the illustrated embodiment, the stack of dielectric layers 5008A/5008B/5008C include three layers, other embodiments are possible, e.g., stacks having two layers or four or more layers. In these embodiments, any suitable combination and order of the layers are possible in a manner similar to the three layer embodiment described herein.

Spark Gap Structures with Engineered Arcing Medium

As described above, various physical features of the spark gap structures can be adjusted to control electrical parameters, e.g., trigger voltage, associated the EOS monitor device and/or an EOS protection device that include the spark gap structures. For example, the gap distance, the material and the shape of the arcing tips can be controlled to control the trigger voltage and/or the amount of current flow after triggering. In the following, various structures and methods associated with the arcing medium are disclosed, which provide yet another degree of freedom in controlling the electrical parameters, e.g., trigger voltage, associated the EOS monitor device and/or an EOS protection device. FIGS. 54A-54D illustrate side views of intermediate structures at various stages of fabricating an EOS monitor/protection device configured to electrically arc in response to an EOS event, where the arcing medium can be customized, according to some embodiments.

Referring to FIG. 54A, a side view of an intermediate structure 5400A is illustrated, which includes a substrate 5004. A first dielectric layer 5408 is formed on the substrate 5004, followed by a pair of conductive structures including a first conductive structure 5412A and a second conductive structure 5412B, which serve as a laterally arranged cathode-anode pair during arcing. The first and second conductive structures 5412A, 5412B can be laterally arranged in a similar manner as any of various pairs of conductive structures configured for arcing in response to an EOS described above. The first dielectric layer 5408 can be formed of any material that can serve to electrically isolate the substrate 5004 from the pair of conductive structures 5412A, 5412B, e.g., $SiO_2$ or $Si_3N_4$. The lateral gap 5416 between the first and second conductive structures 5412A, 5412B represents the spark gap, which can be a void or filled with a customized arcing medium, according to embodiments.

Referring to FIG. 54B, an intermediate structure 5400B is illustrated, which represents the intermediate structure 5400A (FIG. 54A), which has been further processed to form fill the gap 5416 with an arcing medium 5420, according to embodiments. The arcing medium 5420 can be a suitable material for customizing, among other things, the trigger voltage at which the pair of the conductive structures are configured to arc, in response to an EOS event. The arcing medium 5420 can be a suitable material, e.g., a solid dielectric material. For example, the arcing medium 5420 can be any inorganic material such those described above, e.g., the first dielectric layer 5008 described above with respect to FIGS. 50A-50D. However, embodiments are not so limited and the arcing medium 5420 can be a suitable solid organic dielectric material, e.g., a polymeric material. The acing medium 5420 can be, e.g., deposited as a blanket material and removed from outside the gap 5416 by, e.g., etching or by chemical mechanical polishing. Still further embodiments are possible, and the arcing medium 5420 can be a liquid dielectric material.

Referring to FIG. 54C, an intermediate structure 5400C is illustrated, which represents the intermediate structure 5400B (FIG. 54B), which has been further processed to encapsulate or cap the arcing medium 5420 with a second dielectric material 5424, thereby completing the fabrication of the EOS monitor/protection device 5400C filled with a customized arcing medium 5420, according to some embodiments.

While in the illustrated embodiment of FIG. 54C, the arcing medium 5420 includes a condensed matter, e.g., a solid or liquid dielectric material, embodiments are not so limited. In some embodiments, it may be desirable to have the arcing medium 5420 be a gas, e.g., air or an inert gas. Referring to FIG. 54D, an alternative embodiment is illustrated, in which the arcing medium 5420 is removed to form a void 5424, which is filled with a gas to serve as the arcing medium. Such structure may be formed by, e.g., filing the gap 5416 with a sacrificial medium using the process flow described with respect to FIGS. 54A-54C and, subsequent to encapsulation with the second dielectric material 5424, selectively removing, e.g., by wet etching.

FIGS. 55A and 55B illustrate side views of alternative embodiments to the embodiment described above with respect to FIG. 54D, where the arcing medium comprises a gas, according to some embodiments.

In FIG. 55A, the pair of conductive structures 5412A, 5412B, after being formed in a similar manner as described above with respect to FIG. 54A, are encapsulated in a cavity 5424 filled with a desirable gas, e.g., an inert gas such as $N_2$ or air, and sealed, e.g., hermetically sealed, by a packaging layer 5508.

In FIG. 55B, the pair of conductive structures (not shown), after being formed in a similar manner as described above with respect to FIG. 54A, are encapsulated in a cavity 5424 filled with a desirable gas, e.g., an inert gas such as $N_2$ or air, and hermetically sealed, e.g., hermetically sealed, by interconnection metallization structures 5512.

FIG. 56 illustrates a top down view of an EOS monitor/ protection device 5600 configured to electrically arc in response to an EOS event, where the arcing medium can be customized and engineered, according to alternative embodiments. In the illustrated embodiment, as an alternative to the embodiments described above with respect to FIGS. 54C, 54D, the arcing medium 5612 can be customized post-fabrication of the pair of conductive structures, according to embodiments. The EOS monitor/protection device 5600 comprises a pair of conductive structures including a first conductive structure 5604A and a second conductive structure 5604B, each having a plurality of protrusions or tips. The device can be fabricated in a similar manner as described above, e.g., with respect to FIGS. 54A-54C, except the arcing medium region or the spark gap region can initially be void or be filled with a sacrificial material. Subsequent to encapsulation, an opening 5608 is formed through the topmost encapsulation layer, e.g., a passivation layer, to access the arcing medium region. The accessed arcing medium region can then be filled with a desired material 5612.

FIG. 57 illustrate top down views of EOS monitors/ protection devices 5700A, 5700B configured to electrically arc in response to an EOS event, where the arcing medium can be customized and engineered, e.g., post-fabrication, according to various other alternative embodiments. The EOS monitor/protection device 5700A comprises first and second conductive structures 5704A, 5704B each having a single protrusion. The EOS monitor/protection device 5700B comprises first and second conductive structures 5708A, 5708B where only the second conductive structure 5708B has a plurality of protrusions. Each of the EOS monitors/protection devices 5700A, 5700B comprises an opening 5608 formed through the topmost encapsulation layer, e.g., a passivation layer, to access the arcing medium region 5612, in a similar manner as described above with respect to FIG. 56.

The openings 5608A, 5608B, 5608C illustrate alternative embodiments of the arrangement of the arcing media. The opening 5608A shows an arcing medium region 5612A, which is homogenously filled with any suitable arcing medium described above, e.g., with respect to FIGS. 54A-54D. The opening 5608B shows an arcing medium region 5612B, which is filled with different arcing media for different arcing regions, e.g., corresponding to different protrusions of the second conductive structure 5708B of the EOS monitor/protection device 5700B. The opening 5608C shows an arcing medium region 5612C, which is filled with different arcing media having different shapes for different arcing regions, e.g., corresponding to different protrusions of the second conductive structure 5708B of the EOS monitor/ protection device 5700B.

FIG. 58 illustrate top down views of EOS monitors/ protection devices 5800A, 5800B, 5800C and 5800D configured to electrically arc in response to an EOS event, where the arcing medium can be customized and engineered, e.g., post fabrication, according to various other alternative embodiments. The devices 5800A, 5800B, 5800C and 5800D include different combinations and permutations of pairs of conductive structures described above with respect to FIG. 57. The different pairs of conductive structures can be electrically connected in parallel or separated, and each pair of conductive structures can include first and/or second conductive structures that can in turn include one, multiple or no protrusion. The different pairs of conductive structures are also separated by any of the engineered arcing medium described above with respect to FIG. 57, the detailed description of which is omitted herein for brevity.

Isolation Structures for Spark Gap Structures

The inventors have recognized that, when pair of conductive structures or a spark gap of various EOS monitor/ protection devices disclosed herein arcs in operation in response to an EOS event, the current discharged therefrom can undesirably couple through the substrate to other parts of the EOS monitor/protection device as well as other parts of the core integrated circuit that includes the EOS monitor/ protection device. When the EOS monitor/protection device includes a plurality of spark gaps, arcing in one spark gap can potentially trigger neighboring spark gaps, even if the neighboring spark gaps have a higher trigger voltage. To suppress the undesirable coupling through the substrate, an isolation structure may be implemented according to embodiments.

FIG. 59 illustrates a side view of an EOS monitor/ protection device 5900 configured to electrically arc in response to an EOS event with substrate isolation, according to embodiments. The EOS monitor/protection device 5900 comprises a pair of conductive structures 5916A, 5916B formed over a well, e.g., a high voltage p-type well (HVPW) 5908 formed in a semiconductor substrate 5904, that are configured to arc in response to an EOS event, which can represent any pair of conductive structures configured as a spark gap according to various embodiments disclosed herein. The first conductive structure 5916A, which may serve as an anode, may be connected to an external pin. The second conductive structure 5916B, which may serve as a cathode, is electrically connected to the HVPW 5908, e.g., through a heavily doped p-type ($p^+$) region 5910, and may be tied to ground or a negative power supply. The pair of conductive structures 5916A, 5916B may be electrically isolated by a high voltage isolation structure comprising an n-type buried layer (NBL) 5912 formed under the HVPW 5908 to provide vertical isolation, and high voltage n-type well (HVNW) regions 5920 formed on lateral sides of the HVPW 5908 to provide lateral isolation. In some implementations, the HVNW regions 5920 may surround the HVPW 5908, e.g., in a ring configuration, such that the HVNW regions 5920 and the NBL 5912 are configured as a high voltage tub isolation structure. The high voltage isolation structure may further comprise heavily doped ($n^+$) regions 5924 formed in the HVNW regions 5920.

Other embodiments are possible. For example, a simple well isolation, e.g., an N well isolation, a deep well isolation, e.g., a deep N-well isolation with or without isolation P-well, oxide-filled trench isolation and/or silicon-on-insulator (SOI) isolation approaches may also be used to provide isolation to the pair of conductive structures 5916A, 5916B.

Optical Proximity Correction for Trigger Voltage Reduction

For designing a pair of conductive structures for EOS monitor/protection devices that are configured as spark gaps that arc in response to a relatively low voltage EOS event, conventional metallization fabrication processes may introduce a relatively high level of variability. For example, for applications where a spark gap structure should not trigger at a voltage lower than 50V using 0.18 µm patterning technology, in order to account for device-to-device variability and manufacturing variability margin, a nominal design may be targeted to have a trigger voltage that is higher, e.g., >60V, >70V, or even >80V. Using conventional lithography, a typical standard deviation in trigger voltage window may be about +/−10V around the trigger voltage. However, for certain applications, a 20V variability window may be unacceptably large for low voltage operation. To achieve lower variability in trigger voltage, in some manufacturing implementations, a higher grade metal mask may be used to achieve smaller variation in trigger voltage. In some other implementations, optical proximity correction (OPC) of chrome-based masks may be employed. OPC corrects errors that may be introduced in lithography for small dimensions by moving edges or adding extra polygons to the pattern written on the photomask. This may be performed by pre-computed look-up tables based on width and spacing between features (known as rule based OPC) or by using compact models to dynamically simulate the final pattern and thereby drive the movement of edges, typically broken into sections, to find the best solution (known as model based OPC). An illustrative example is shown in FIG. 60, which shows overlaid images of a pattern 6000 that is desired to be printed on the wafer, a mask pattern 6004 that is printed using OPC, and a pattern 6008 that may actually be printed, which is much closer to the desired shape 6000 than if the pattern was printed using a mask shape that has the same shape as the desired pattern 6000. Using OPC techniques, a standard deviation in trigger voltage window of about +/−10V around a trigger voltage less than about 100V may be achieved, according to implementations.

Spark Gap Structures in Series with a Thin Film/Polysilicon Fuse and Metal Hybrid Fuse In various embodiments described above, e.g., with respect to FIGS. 3, 4, and 7A-7B, an EOS monitor device including conductive structures configured to monitor voltage and/or energy associated with an EOS event according to some embodiments include a fuse connected thereto. In addition to using the fuse to monitor voltage and/or energy associate with the EOS event, the fuse can also be used as a protective device to limit the amount of current passing through the conductive structure, e.g., to prevent damage to other circuits connected thereto. The fuse can be formed of a suitable material that can melt and open a circuit when a target amount of current flows therethrough.

The inventors have discovered that, under some circumstances, it is desirable to connect a pair of conductive structures or spark gap structures described herein to a plurality of different fuses in series, where the fuses are formed of different materials. It will be appreciated that fuses formed only of meal can keep conducting until the EOS is removed, which can lead to damage to a core circuit. For example, as described above with respect to FIG. 6, when $V_H$ of a pair of conductive structures after triggering is lower than the power supply voltage, upon triggering of the pair of conductive structures in response to an EOS event, the power supply may latch-up after even the EOS event ends, which may damage the power supply. When the current follow through a metal fuse in series with the pair of conductive structures does not generate sufficient heat to melt the metal of the metal fuse, the fuse might not blow. Thus, for unknown stress conditions or powered applications, a metal fuse may not be ideal where the power supply can continue to conduct after the EOS event has passed. Thus, there is a need for a fuse that can reduce the damage by shutting the current flow during a latch up condition. The inventors have discovered that a hybrid fuse comprising a thin film (TF)/polysilicon (poly) fuse in series with a metal fuse may be adapted for such circumstances, because a TF/poly fuse may be designed to blow based on whether an energy density limit has been exceeded (e.g., power x time) in response to an EOS event.

FIG. 61 schematically illustrates an EOS monitor/protection device 6100 comprises a pair of conductive structures 6198A, 6108B configured to electrically arc in response to an EOS event connected in series with a hybrid or composite fuse 6120 comprising a TF/poly fuse 6116 in series with a metal fuse 6112, according to embodiments. The EOS monitor/protection device 6100 comprises, between first and second terminals 6104A, 6104B, first and second conductive structures 6108A, 6108B electrically connected in series with a hybrid or composite fuse 6120. The composite fuse 6120 comprises a TF/poly fuse 6116 electrically connected to one or more metal fuses 6112. In the illustrated embodiment, the TF/poly fuse 6116 is disposed between two metal fuses 6112. To provide a relatively low resistance, the length of the TF/poly fuse is suitably short in length. However, when the fuse blows, it can cause a damage over an area larger than the length of the fuse. Thus, in the illustrated embodiment, the metal fuses 6112 are formed on both sides of the TF/poly fuse 6116 have narrow metal tracks having lengths longer than the fuse blow damage area.

In the various embodiments of the hybrid or composite fuse 6116, the TF/poly fuse 6116 can be doped n-type or p-type. In one embodiment, the doping concentration can be $1\times10^{14}/cm^3$ to $1\times10^{16}/cm^3$ $1\times10^{16}/cm^3$ to $1\times10^{18}/cm^3$, or greater than $1\times10^{19}/cm^3$. The metal fuses 6112 can be formed of any suitable metal such as Cu, Al, W, Ni, Pa, Pt, TiN, TaN, WN, AlCu, AlSiCu, etc. In various embodiments, a ratios of resistances $R_1/R_2$ and $R_2/R_1$ between R1 of the TF/poly fuse 6116 and R2 of the metal fuses 6112 can be in a range between 1,000 and 1, 100 and 1, 10 and 2, or 2 and 1.

Spark Gap Structures Coupled with a Blocking Device and an ESD Protection Device As described above, EOS monitor/protection devices according to various embodiments comprise a pair of conductive structures configured to electrically arc in response to an EOS event connected in series with a fuse. Having the fuse can be advantageous for several reasons, including providing means for estimating the current, speed and/or energy associated with the EOS event, and for determining whether an EOS event had occurred by detecting an open circuit across the fuse, and/or to prevent damage to other circuitry including the sensing circuit or the core circuit. However, when a resistance path having a lower resistance parallel to the path across the fuse exists, the fuse can be bypassed, thereby defeating the purpose of the fuse and/or damaging other parts of the integrated circuit device. Thus, according to embodiments, the EOS monitor devices according to embodiments include a blocking device electrically connected to the spark-gap monitor device.

FIGS. 62A, 62B and 62C are circuit block diagrams of EOS monitor/protection devices 6200A, 6200B and 6200C, respectively, each comprising a pair of conductive structures 6216 configured to electrically arc in response to an EOS event that is connected to a fuse and a blocking device, according to embodiments. The pair of conductive structures 6216 includes a first conductive structure 6216A electrically connected to a voltage high supply, a voltage high pin or a voltage high node 6204 at one end. The pair of conductive structures 6216 includes a second conductive structure 6216B connected to a fuse 6220, which is in turn connected to a voltage low pin or a voltage low node 6208 at the other end. While only illustrated in FIG. 62A, each of the EOS monitor/protection devices 6200A, 6200B, 6200C further includes a sense circuit 6224 between the second conductive structure 6216B and the voltage low node 6208, which is configured to detect a change in electrical characteristics across the fuse 6220 as described above.

The EOS monitor/protection devices 6200A, 6200B and 6200C additionally include blocking devices 6228A, 6228B and 6228C, respectively, between the sense circuit 6224 and the second conductive structure 6216B, and between the second conductive structure 6216B and an intermediate voltage node 6212. The blocking devices 6228A, 6228B, 6228C are configured such that, in response to an EOS event, when the pair of conductive structures 6216 is triggered at a trigger voltage, the current preferentially flows between the voltage high node 6204 and the voltage low node 6208 through the fuse 6220, instead of bypassing the fuse 6220 and flowing through the sensing circuit 6224, and that the fuse 6220 serves the various functions intended, including estimating the current, speed and/or energy associated with the EOS event, determining whether an EOS event had occurred by detecting an open circuit across the fuse, and/or to prevent damage to other circuitry including the sensing circuit 6224.

Referring to FIG. 62A, the blocking device 6228A comprises a blocking diode. In response to an EOS event, e.g., an EOS event having a positive potential at the voltage high node 6204 relative to the voltage low node 6208, the blocking diode may be reverse-biased with a reverse breakdown voltage that is higher than the voltage (IR) drop across the fuse 6220. As a result, a dominant amount of the EOS current is forced to flow through the fuse 6220.

Referring to FIG. 62B, the blocking device 6228B comprises a blocking resistor. In response to an EOS event, e.g., an EOS event having a positive potential at the voltage high node 6204 relative to the voltage low node 6208, the blocking resistor has a resistance higher than the resistance of the fuse 6220 such that the IR drop across the blocking device 6228B is higher than that through the fuse 6220. As a result, a dominant amount of the EOS current is forced to flow through the fuse 6220.

Referring to FIG. 62C, the blocking device 6228C comprises a blocking resistor and a blocking diode in series. In response to an EOS event, e.g., an EOS having a positive potential at the voltage high node 6204 relative to the voltage low node 6208, the combination of the blocking diode and the blocking resistor has a resistance higher than the resistance of the fuse 6220, such that the IR drop across the blocking device 6228C is higher than that through the fuse 6220. As a result, a dominant amount of the EOS current is forced to flow through the fuse 6220.

Referring back to FIG. 62A-62C, the EOS monitor/protection devices 6200A, 6200B and 6200C according to some embodiments additionally include a separate ESD protection device 6232, e.g., a semiconductor device-based ESD protection device electrically connected in parallel with the pair of conductive structures 6216. The EOS protection device 6232 is provided in addition to and connected to the pair of conductive structures 6212 that can serve as an EOS monitor/protection device.

Without limitation, the ESD protection device 6232 can include a diode-based ESD protection device, a bipolar transistor-based ESD protection devices, or a semiconductor-controlled rectifier (SCR)-based ESD. FIGS. 62D to 62G illustrate example ESD protection devices that can be implemented in one or more embodiments. Any of the electrostatic discharge protection devices illustrated in 62D to 62G can be implemented in connection with any suitable embodiment related to electrical overstress event detection. In some embodiments, each of the EOS protection devices illustrated in FIGS. 62D to 62G can be an EOS protection device which is provided in addition to and connected to the pair of conductive structures 6216 serving as an EOS monitor protection device, as describe supra according to various embodiments.

Figure 62D:
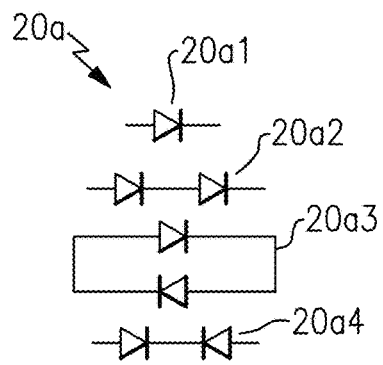

FIG. 62D illustrates diode-based ESD protection devices 20a. FIG. 62D illustrates a unidirectional blocking junction diode 20a1, series-forward blocking junction diodes 20a2 for proportional increase of forward-biased conduction and reverse blocking voltage, antiparallel low voltage drop-conduction and decoupling diodes 20a3, and a high back-to-back diode based bidirectional blocking device 20a4.

Figure 62E:
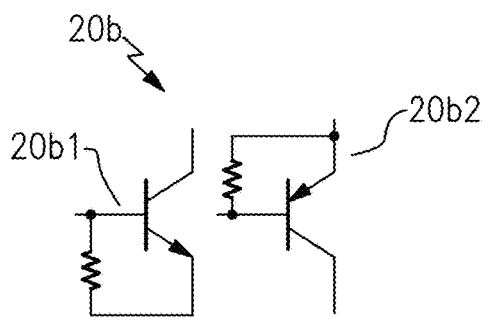

FIG. 62E illustrates bipolar transistor-based ESD protection devices 20b including an NPN ESD device 20b1 and a PNP ESD device 20b2. From collector to emitter (NPN) and emitter to collector (PNP), the bipolar transistors function as relatively high blocking voltage elements until reaching a breakdown voltage, at which point the device triggers and provides a low conduction path and high holding voltage between its terminals. In the opposite voltage polarity, a forward-biased junction is obtained.

Figure 62F:
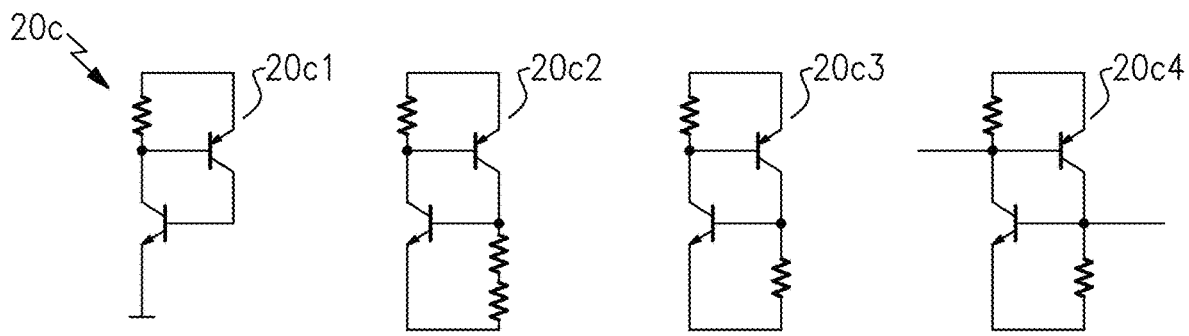

FIG. 62F illustrates coupled unidirectional NPN and PNP thyristor-like ESD protection devices 20c. The ESD protection devices shown in FIG. 62F can be referred to as semiconductor-controlled rectifiers. In some instances, semiconductor-controlled rectifiers are silicon controlled rectifiers (SCRs). The NPN and PNP thyristor-like ESD devices include configurations with: floating NPN base 20c1, leading to a lower trigger voltage; an NPN in collector-emitter breakdown voltage mode with base-emitter resistance 20c2, leading to an intermediate trigger voltage; a traditional configuration with fixed base resistance 20c3 for highest thyristor trigger voltage; and thyristor bipolar base external latch trigger and latch release control 20c4.

Figure 62G:
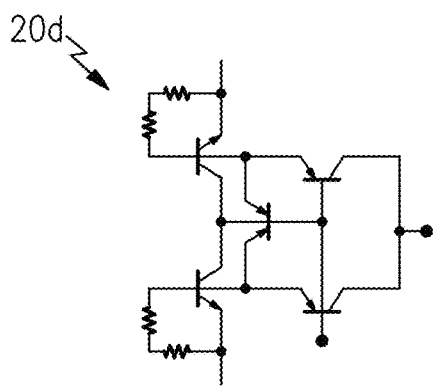

FIG. 62G illustrates a coupled NPN-PNP-NPN bi-directional high blocking thyristor like ESD protection device 20d. The bidirectional breakdown voltage in this device can be closely defined by the base-emitter junction of the PNP device illustrated in the center of this device.

Referring back to FIGS. 62A-62C, in operation, when the ESD protection device 6232 is included, the EOS monitor/protection devices 6200A, 6200B and 6200C may be configured such that the pair of conductive structures 6216 may be configured to trigger in response to relatively more severe EOS events, e.g., having higher voltage, compared to the ESD device 6232.

In some implementations, the trigger characteristics of the ESD protection device 6232 and the pair of conductive structures 6216 may be tuned such that the two devices synergistically work together. For example, the ESD protection device 6232 may have a relatively lower trigger voltage such that in response to an EOS, the ESD protection device 6232 triggers before the pair of conductive structures 6216, possibly accompanied by a snapback, thereby limiting the voltage across the voltage high and low nodes 6204, 6208. A transient resistance across the ESD protection device 6232 may allow the voltage across the voltage high and low nodes 6204, 6208 to rise until the pair of conductive structures 6216 is triggered, thereby suppressing or preventing damage to the core circuit.

The ESD protection device 6232 according to some embodiments, e.g., an SCR-based protection device, may have a transient overshoot voltage. In these circumstances, the pair of conductive structures 6212 may be designed to have a triggering voltage that is lower than the overshoot voltage, such that the overshoot voltage triggers the pair of conductive structures 6216.

Advantageously, the semiconductor ESD protection device 6232 according to some embodiments can clamp the voltage across the voltage high and low nodes 6204, 6208, such that the voltage across thereacross may be lower than the EOS signal itself. Therefore, the actual trigger voltage of the pair of conductive structures 6216 may be designed to be lower. For example, the pair of conductive structures 6216 may be tuned for a pin voltage of 80V with ESD clamping, while the applied external voltage from an EOS may be as high as 120V.

Detection of Arcing Based on a Change in Capacitance or Optical Properties

As described above, in various embodiments, an EOS monitor/protection device comprises a pair of conductive structures configured to electrically arc in response to an EOS event and a sensing circuit configured to detect a change in a physical property of the EOS monitor structure caused by the EOS event. As described above, e.g., with respect to FIG. 1C, whether an EOS event had occurred can be determined, e.g., by measuring an increase in an open circuit voltage across the pair of spaced conductive structures post-arcing relative prior to arcing, a change in leakage current through a path that includes the gap, or by visual inspection, such as with a microscope. Additional implementations are described herein.

In some embodiments, whether an EOS event had occurred can be determined by measuring a change in a capacitance across the pair of conductive structures that may in turn be caused by a change in a gap distance across the pair of conductive structures in response to the EOS event. The change in a capacitance across the pair of conductive structures may also be caused by a change in a dielectric constant of a dielectric material between the pair of conductive structures.

FIG. 63 illustrates an EOS monitor/protection device 6300 comprising a pair of conductive structures 3300 configured to electrically arc in response to an EOS event, and a detection system configured to detect a change in capacitance, according to embodiments. For illustrative purposes only, the illustrated pair of conductive structures 3300 is configured such that one but not the other two conductive structures of the pair comprises a one or more protrusions or tips, in a similar manner as described above with respect to FIG. 33, the details of which is omitted herein for brevity. However, any other examples of pairs of conductive structures disclosed herein can be employed. The EOS monitor/protection device 6300 additionally comprises a capacitance detection module 6304. The capacitance detection module 6304 may include, e.g., a capacitance-to-digital converter (CDC). As one example, the illustrated CDC is a sigma-delta ($\Sigma-\Delta$) capacitance-to-digital converter. In the illustrated example, the input terminals of the CDC is connected directly to the first and second conductive structures 3300A, 3300B. The architecture features high resolution (e.g., up to 12-bit effective resolution) and high linearity (±0.05%) and can accept up to, e.g., 5 pF common-mode capacitance, which can be balanced by a programmable on-chip, digital-to-capacitance converter (CAPDAC).

In some other embodiments, whether an EOS event had occurred can be determined by measuring a change in an optical property, e.g., an optical transmissivity, of a material in a gap between the pair of conductive structures, which is in turn caused by a change in the physical property of the material in the gap of the pair of conductive structures.

FIG. 64 illustrates an EOS monitor/protection device 6400 comprising a pair of conductive structures 3300 configured to electrically arc in response to an EOS event, and a detection system configured to detect a change in optical properties, according to embodiments. For illustrative purposes only, the illustrated pair of conductive structures 3300 is configured such that one but not the other two conductive structures of the pair comprises a one or more protrusions or tips, in a similar manner as described above with respect to FIG. 33, the details of which is omitted herein for brevity. However, any other examples of pairs of conductive structures disclosed herein can be employed. The EOS monitor/protection device 6400 additionally comprises a light source 6408, which can include a suitable light-emitting structures such as a light emitting diode, a photodetector 6412, and a signal detection module 6404 coupled to the photodetector 6412, The signal detection module 6404 may include, e.g., any suitable current-to-digital or analog-to-digital converter (ADC), which may contain low power, low noise, low input current integrators, simultaneous sample-and-holds, and/or high speed, high resolution ADCs.

Other changes in the physical property of the EOS monitor structure can be detected. For example, a change in leakage current across the pair of conductive structures can be detected, where the leakage current may be caused by a change in a gap distance across the pair of conductive structures, and/or a change in a dielectric material between the pair of conductive structures, among others.

Mobile/Wearable Devices Configured to Harvest Energy from Spark Gap Structures

People generate charge through every day movements. For this reason, ground straps are used widely throughout the electronic industry to protect sensitive devices/systems from ESD generated by handling. In the following, embodiments that can harvest the charge generated by the human body in motion are disclosed, e.g., by inducing or enhancing an ESD event. The generation of an ESD charge can be enhanced for harvesting by constructing a garment/wrist strap/structure (and also be connected to other devices/components/circuits as shown in this filing) that can be placed next to skin. In certain applications (e.g., exercise/endurance activities), vigorous movements can generate sufficient amount of charge (combined with suitably constructed materials with the relevant circuitry and storage embedded therein to conduct/harvest/distribute the charge) to carry out certain relatively low power and/or intermittent functions. In other applications, (e.g., healthcare) a wearable device can be configured to harvest sufficient energy to power some monitoring activities.

The inventors have realized that, in addition to monitoring and protecting against EOS events, pairs of conductive structures configured as spark gaps can be used to harvest energy from arcing events that occur in response to EOS events. The harvested energy can be used to power a core device, e.g., a health monitoring device, thereby reducing the reliance on a separate power source. One example application for the energy harvesting devices based on spark gaps include systems on a patch (SOP) that can be used for a medical/healthcare application. The SOP system can include devices configured for monitoring health, e.g., monitoring blood sugar/blood pressure, temperature, perspiration, etc. Another application include mobile devices having an external casing that can be configured to enhance and/or optimize the collection and delivery of charge.

FIG. 65 illustrates an embodiment of a mobile and/or wearable device 6500A (plan view)/6500B (side view) configured to harvest energy from arcing events in a pair of conductive structures in response to an EOS event. The mobile/wearable device 6500A/6500B includes a device region 6508 formed on a substrate 6504, e.g., a flexible substrate adapted to conform and/or attach to human skin. The device region 6508 includes a core device and a pair of conductive structures configured to arc in response to an EOS event and various associated circuitry described herein. For example, the device region 6508 includes core circuitry of the SOP, including circuitry for collecting, processing and storing health monitoring information. The device region 6508 can also include various sensing circuitry associated with the pair of conductive structures configured as a spark gap configured to harvest energy. The device region 6508 also includes circuitry and a storage device for storing the harvested charge, e.g., a battery, a capacitor, a supercapacitor, etc. The mobile/wearable device 6500A/6500B additionally includes conduits 6516, e.g., conductive vias, for electrically conducting external sources of charge, such as static charge, to the device region 6508 from the outside, e.g., skin when the device is configured as a wearable device. The transferred charge may undergo arcing events through the spark gaps and stored in the device region 6508. When configured as a wearable device, the flexible substrate 6508 may have formed thereon flexible adhesive layers 6512 for attaching to skin.

FIG. 66 illustrates a perspective view of an embodiment of a mobile and/or wearable device 6600 comprising a stack of layers configured to harvest energy from arcing events in a pair of conductive structures. The mobile/wearable device 6600 is configured in a similar manner as the device 6500A/6500B described above with respect to FIG. 65 except, the device 6600 comprises a stack of layers 6604 optimized for static electricity generation and harvesting. For example, the mobile/wearable device 6600 includes a device layer 6608 comprises a device region 6508 that includes a core device and a pair of conductive structures configured to arc in response to an EOS event and various associated circuitry described herein, in a similar manner as described above with respect to FIG. 65.

In addition, the device 6500 additionally includes a stack 6612 of materials/fabrics such that movement (by the user) causes friction and/or movement between layers to generate charge. The material/garment can be constructed from different materials/composites/layers such that as the garment (or wearable device) is worn, it generates charge (which can subsequently be harvested through the conductive vias that route to the storage elements). For example, a material could be constructed with constituent parts/fibers/layers that are configured to rub together in response to flexing/movement of the wearer. For example, a wrist strap (connected to a module similar to that shown in FIG. 65 which has conductive vias that can contact skin) could also be constructed with constituent parts/fibers/movable parts that rub together in response to movement by the wearer.

Energy Storage Using Spark Gap Structures

In the following, various embodiments are described in which systems and devices are configured to collect, record and/or store energy generated from arcing events in spark gap structures in response to an EOS event. Various embodiments of circuits and devices that can be used to collect, record and/or store energy as described in U.S. application Ser. No. 14/671,767, filed Mar. 27, 2015, incorporated herein in its entirety, can be used in conjunction with the various spark gap structures described herein.

FIG. 67 is a block diagram of a system 6700 configured to collect, record and/or store energy generated from arcing events in spark gap structures in response to an EOS event, according to embodiments. The system 6700 includes a charge storage module 6704. The charge storage module is configured to store the charge harvested generated in arcing in response to an EOS event. The charge storage module 6704 includes storage elements that are capable of storing or holding a defined quantity of charge. The system 6700 additionally includes a protective module 6708, which in turn includes protective structures/circuitry that can clamp the amount of charge so that circuitry of the core device does not get damaged. The system 6700 additionally includes a measurement module 6712, which in turn includes circuitry for measuring the quantity of the collected charge. The system 6700 additionally includes a communication module 6716, which in turn includes circuitry/structures that serve as a communication interface with different elements within the system. For example, the communication module 6716 can record and externally transmit the level of charge stored within the system 6700. In the following specific circuitry that can be included as part of the system 6700 are described.

FIG. 68 is a schematic diagram of a portion of an illustrative electronic device 170 configured to store charge associated with an electrostatic discharge event in a bank of storage elements according to an embodiment. Multiple ESD events can occur. Such ESD events can have different magnitudes. Having a bank of storage elements can enable charge associated with different ESD events to be efficiently stored. A plurality of switches 174a to 174d can each be arranged in series with a respective capacitor 172a to 172d. In an embodiment, a selected one of the switches 174a to 174d can be on at a time. This can selectively electrically connect a selected capacitor to the diode 164. Energy associated with an ESD event at the pin 31 can be steered by the diode 164 to capacitor of the plurality of capacitors 172a to 172d that is electrically connected to the diode 164 by way of a switch. A voltage monitoring circuit 176 can monitor the charge stored by each of the capacitors 172a to 172d. The voltage monitoring circuit can detect which capacitor stores the least charge. A switch control circuit 178 can turn on a selected switch based on information from the voltage monitoring circuit 176. Having the capacitor storing the least charge configured to capture charge associated with an ESD event can be an efficient way of capturing charge and can enable energy harvesting of as many relatively small ESD pulses as possible.

Various circuits can extract and store energy collected from various spark gap structures described herein, in response to an EOS event. Illustrative circuits configured to store charge associated with EOS events will be described with reference to FIGS. 69 to 73. These circuits provide examples of circuits that can harvest energy associated with EOS events in connection with any of the principles and advantages discussed herein. Moreover, features of the any of the example energy harvesting circuits can be implemented in combination with one or more other example energy harvesting circuits and systems. Various EOS monitor/protection devices described herein can be included with storage systems connected to energy harvesting devices. Where electrical surges or EOS events are being harvested, the system may be optimized such that sudden surges or charges above certain thresholds can be accommodated without damaging the system. The storage systems described herein could be applied to any energy harvesting system or any system that contains storage elements that are electrically connected to conductive structures configured to arc in response to an EOS event.

FIG. 69 is a schematic diagram of a circuit 180 configured to store charge collected from various spark gap structures in response to an EOS event according to an embodiment. As illustrated, the circuit 180 includes an input pin 31, a diode 182, a capacitor 184, a load 186, an output pin 188, and a ground pin 106. The diode 182 is an example of an EOS steering device. The capacitor 184 is an example of a storage element 144. When an EOS or ESD event occurs at the pin 31, which can be connected to a spark gap structure, and the EOS/ESD event has a positive polarity with respect to ground pin 106, the diode 182 can be forward biased and the capacitor 184 can be charged to a voltage. The voltage across the capacitor 184 can be approximately equal to the available charge divided by the capacitance of the capacitor 184. Once the voltage at the pin 31 drops below the voltage across the capacitor 184, the charging phase can stop. The diode 182 can become reverse biased and the capacitor 184 can remain in a charged state. In the configuration illustrated in FIG. 69, the capacitor 184 can have a breakdown voltage in excess of a maximum expected voltage associated with an ESD event. The load 186 can be a resistive load, for example. The charge across capacitor 184 can be provided to other circuitry by way of output pin 188.

FIG. 70 is a schematic diagram of a circuit 190 configured to store charge collected from various spark gap structures in response to an EOS event according to another embodiment. The circuit 190 provides clamping and voltage regulation. The circuit 190 is similar to the circuit 180 of FIG. 69 except that a separate ESD protection device 192 is included. The ESD protection device 192 can be arranged in parallel with the capacitor 184. The ESD protection device 192 can function as an ESD clamp and/or protection device. The ESD protection device 192 can ensure that the voltage on a plate of the capacitor 184 opposite ground is clamped to a voltage below the breakdown of the capacitor 184. The ESD protection device 192 can function is as a voltage regulator. When an ESD event is over, the ESD protection device 192 can shut current to ground GND until the voltage across the capacitor 184 is at approximately the breakdown voltage of the ESD protection device 192. In a specific example, if the ESD protection device 192 has a breakdown voltage of 5 Volts, once the ESD event is over the ESD protection device 192 can shunt current to ground GND until the voltage across the capacitor 184 is approximately 5 Volts. Accordingly, the voltage stored on the capacitor 184 can be regulated to a voltage safe to be used by downstream circuits. The ESD protection device 192 can be a Zener diode as illustrated.

FIG. 71 is a schematic diagram of a circuit 200 configured to store charge collected from various spark gap structures in response to an EOS event according to another embodiment. The circuit 200 provides clamping and voltage regulation. In FIG. 20, the ESD protection device 192 of FIG. 70 is replaced by an ESD clamp circuit 202. As illustrated, the ESD clamp cell 202 can be a stack of Zener diodes. As one example, the stack of Zener diodes can clamp the voltage across the capacitor 184 to approximately 20 Volts. The ESD clamp circuit 202 can be implemented by any suitable ESD clamp circuit such as NPN ESD device, an SCR, etc. A separate voltage regulator can be implemented, for example, by transistor 203, diode 204, and resistor 206. Any other suitable voltage regulator can alternatively be implemented. Moreover, such a voltage regulator can provide any suitable regulated voltage for a particular application.

FIG. 72 is a schematic diagram of a circuit 210 configured to store charge collected from various spark gap structures in response to an EOS event according to another embodiment. In the circuit 210, the charge stored in connection with an ESD event can be provided to a battery 212 to recharge the battery 212. Accordingly, energy harvested from an ESD event can be stored on a storage element, voltage can be regulated, and the battery 212 can be recharged using energy harvested from the ESD event.

FIG. 73 is a schematic diagram of a circuit 220 configured to store charge collected from various spark gap structures in response to an EOS event according to another embodiment. An EOS energy harvester can work in a similar way to how a radio receiver works. As shown in FIG. 22, a basic diode detector used for AM radio can implement diode 182. The diode 182 can receive a signal from the antenna 222 and the capacitor 184 can store charge associated with an EOS event. The diode 182 can be a crystal diode. The features of FIG. 73 can be combined with a voltage regulator and the energy stored by the capacitor 184 can be provided to other circuits and/or a battery, for example, as described above. Moreover, the features of FIG. 73 can be combined with a detection circuit configured to detect that an EOS event has occurred. Such a detection circuit can be implemented in accordance with the principles and advantages of the detection circuits discussed herein.

Energy harvesting circuits as discussed herein can be implemented in a variety of electronic systems that include a pair of conductive structures or spark gap structures configured to arc in response to an EOS that are described herein. For example, such circuits can be implemented in vertically integrated systems. The energy harvesting circuitry can be implemented on a dedicated die or layer of a vertically integrated system. Energy harvesting circuitry can be implemented at least partly on a layer in a vertically integrated system that includes prefabricated circuit elements, such as passives. Energy harvesting circuitry can be implemented at an integrated circuit level, at a system in a package level, at larger system level, or any combination thereof. When energy harvesting circuitry is implemented at a system level, die area may not be a limiting factor. Accordingly, relatively large EOS protection devices can provide higher than typical current density capabilities. Alternatively or additionally, relatively less complicated devices can be implemented at a system level, such as larger reverse biased diodes. Moreover, relatively high EOS protection can be provided at a system level and a higher level of charge may be captured than at a die level in certain applications.

The energy storage concepts described above can be implemented in an electric or autonomous vehicle network. A vehicle within the network may be constructed to have an energy harvesting component incorporated therein (e.g., a solar energy harvesting component) and may also have the capacity to be electrically charged (e.g., through one or more sources of power or charge generation). In such implementations, an energy storage system integrated in a vehicle may include some of the protective elements described above (e.g., protective structures to prevent damage to the storage elements from surges during charging—a function that (for example) a spark gap structure could at least partly perform). Also, in some implementations where the vehicle is configured to harvest energy, storage elements capable of collecting increments of charge that may be intermittent (and of varying quantities) may be used along with the capacity to be able to store different charge quantities and also recirculate charge already stored back through the system in parallel (while the whole system is operating). Examples have been described in this application where the system is divided into different storage elements that can be accessed in parallel—for example one storage element to be "opened" in order to gather charge (that could come from a harvesting exercise (including EOS harvesting)/a charging exercise via docking station etc., while another "fully charged" storage element could be accessed to redistribute the stored charge elsewhere within the system.

Figure 74:
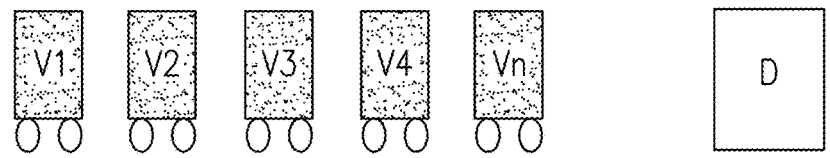

FIG. 74 illustrates an electric (or autonomous) vehicle network 7400 comprising a plurality of vehicles V1-Vn configured to collect, record and/or store energy. The storage systems described here could also contain the ability to record/measure EOS events that may be critical to the management of the storage system. The electric vehicle network 7400 comprises a plurality of electric vehicles V1-Vn, e.g., autonomous vehicles or drones, each containing a smart storage system configured to regulate/measure/communicate with a docking station D. The docking station D refers to a station where the electric vehicles V1-Vn can be docked/charged, etc. The smart storage system of each of the electric vehicles V1-Vn can communicate with the docking station D such that when the stored charge within the system goes below a certain threshold, certain functions, e.g., non-essential functions, can be switched off. The smart storage system within each of the vehicles V1-Vn can also contain built-in ESD protective elements based on spark gaps to prevent the structures/storage system from surges when the vehicles are being charged.

Figure 75:
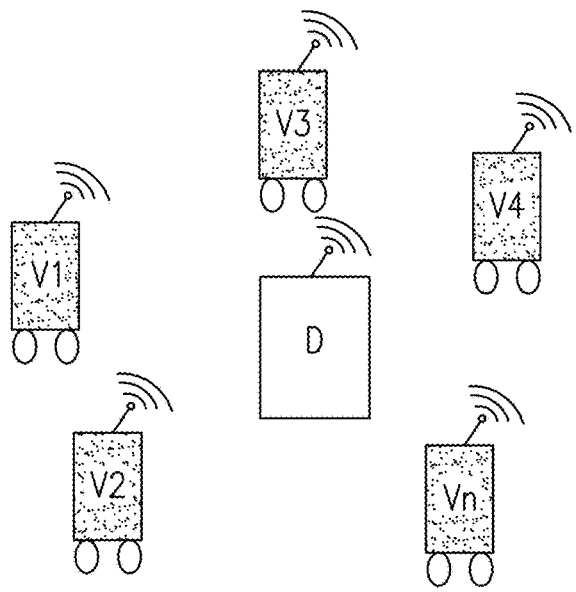

FIG. 75 illustrates an electric vehicle network 7500 comprising a plurality of vehicles which can be configured to collect, record and/or store energy. The network 7500 is similar to that described above with respect to FIG. 74 except, the smart storage system in each of the electric vehicles V1-Vn can communicate wirelessly with the docking station.

Figure 76:
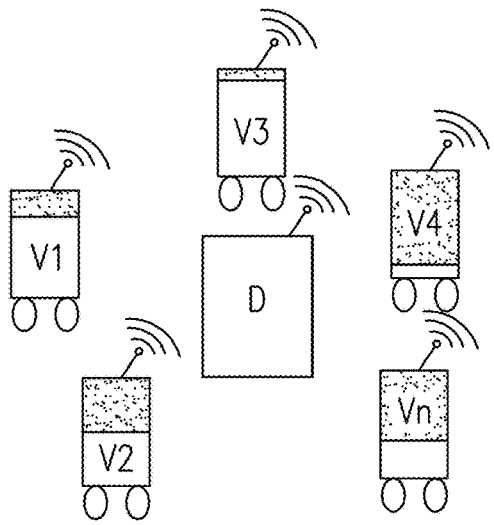

FIG. 76 illustrates an electric vehicle network 7600 comprising a plurality of vehicles configured to collect, record and/or store charge. A system can be constructed such that the charge status of each of the vehicles can be monitored, for example the charge level of each vehicle can be wirelessly transmitted and thus the energy levels of the whole electrical/autonomous fleet can be managed remotely. The network 7600 is similar to that described above with respect to FIG. 74 except, the smart storage system may also be constructed such that the electric vehicles V1-Vn having a stored charge that falls below a certain threshold level can be prioritized to make their way to the docking station D. In the illustrated example, V4 is the vehicle with the lowest stored charge and is prioritized to go back to the docking station D. The smart system would subsequently prioritize V3, followed by V1, followed by V2 to be charged, based on the respective storage levels.

Figure 77:
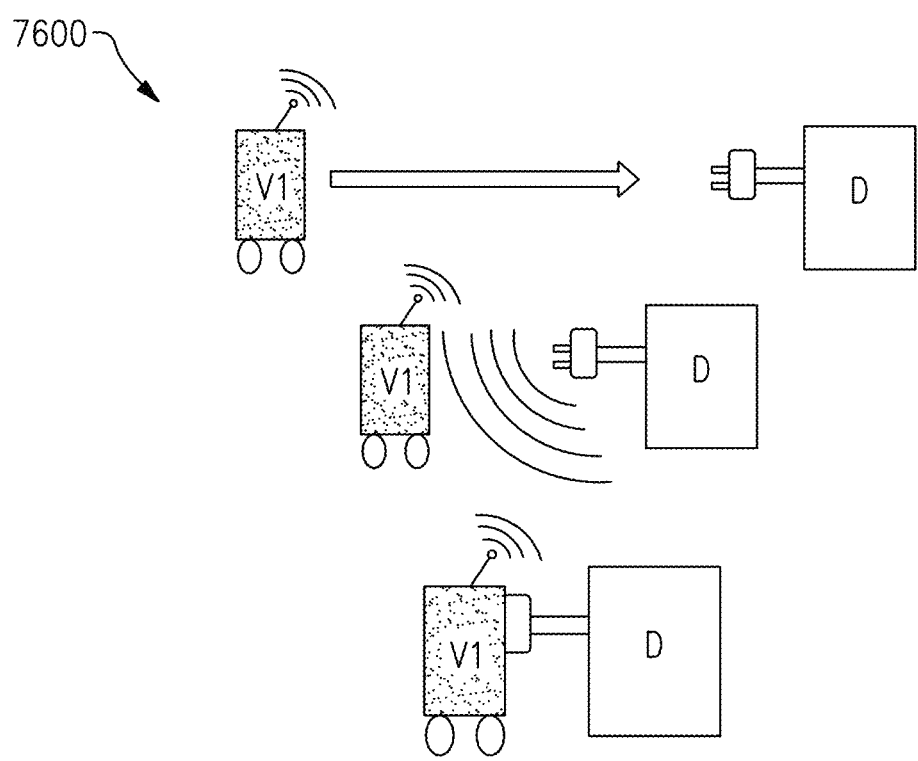

FIG. 77 illustrates an electric vehicle network 7700 comprising a plurality of vehicles configured to collect, record and/or store energy. The network 7700 is similar to that described above with respect to FIG. 74 except, the smart storage system may also be constructed such that, as the electric vehicles V1-Vn make their way to the docking station D, the docking station D may also be prepared to provide an amount of charge that is specific to each of the vehicles V1-Vn based on the respective amount of stored charge. In the illustrated example, when V1 approaches the docking station D, the docking station D is already prepared for the specific amount of charge needed by the vehicle V1. As the vehicle V1 approaches he docking station D, a proximity sensing circuitry enables/prepares for an efficient download of charge from the docking station D to the vehicle V1.

Sensor Network Systems

The EOS monitor/protection devices comprising a pair of conductive structures configured to electrically arc in response to an EOS event according to various embodiments can be implemented in a sensor network system. FIG. 78 illustrates a sensor network system 7800 comprising a network of EOS monitor/protection devices, according to embodiments.

The sensor network system 7800 includes nodes N1-Nn, which can represent, e.g., different locations within a line 7804, e.g., a production line or a manufacturing line. Each of the nodes N1-Nn includes various different components, e.g., boards/processing circuitry/sensors/battery/power managements circuitry etc. Each of the nodes N1-Nn additionally includes an EOS monitor/protection device comprising a pair of conductive structures according to various embodiments described herein. The EOS monitor/protection device can include detection and/or protective circuit such that EOS detection and protection is enabled in all components within the node.

The EOS monitor/protection device is configured to detect the occurrences and signatures associated with an EOS event. The detection of such an EOS event could be indicative of a failure of protective devices within the system and/or a malfunction resulting in components/elements of the system experiencing the EOS. The EOS event is flagged/communicated so that appropriate action can be taken. This could result in components or boards being replaced or (at a higher system level) a maintenance activity.

In the illustrated example, an EOS event is detected in the node N2. The system is configured such that the EOS event may be is flagged external to the system, e.g., by wired or wireless transmission. A high level system (with appropriate encryption/protocols etc.) could coordinate inputs from different notes as part of a preventive maintenance system. Aside from standard schedules of maintenance/replacement of components and parts, corrective actions or replacement activities could be escalated depending on any recorded EOS events.

FIG. 79 illustrates a sensor network system 7900 comprising a network of EOS monitor/protection devices, according to embodiments. The system 7900 includes nodes N1-Nn corresponding to the nodes described above with respect to FIG. 78. The system 7900 additionally includes a command center 7904 configured to receive information associated with EOS events detected by the nodes N1-Nn and transmitted wirelessly therefrom. In some implementations, as illustrated in the sensor network system 8000 of FIG. 80, the nodes N1-Nn can be implemented on mobile platforms, e.g., vehicles/autonomous vehicles/autonomous forklifts in a warehouse/drones or any vehicle with components/systems within it where the detection of an EOS could be indicative of a potential safety issue.

FIG. 81 illustrates various physical and electrical connections that can be made to various EOS monitor/protection devices described supra, for integration into a sensor network system, according to embodiments. By way of example, the illustrated EOS monitor/protection device comprises a pair of conductive structures configured similarly as those in FIG. 34. However, any pair of conductive structures can be implemented with the illustrated system.

Examples of Sensor Software Network Systems Based on Spark Gap-Based EOS Monitor Devices Example: System A The inventors have recognized that it can be difficult to determine the active lifespan of a part comprising a core circuit when the part sits on a shelf in an inactive state for a relatively very long time. Knowing how long a part sat inactive before been used can be useful in failure analysis and general characterization of a part's lifetime performance and capability.

To address these and other needs, a sensor network system based on a wear-out monitor device in conjunction with spark gap-based EOS monitors (EOS 1, EOS 2, and EOS 3) is illustrated in FIG. 82. In reference to FIG. 82, using a wear out monitor device, it can be determined whether the part has sat inactive for a long time before it was used. This is logged to non-volatile memory (NVM) or other persistent storage and can be used in precision analog circuit trimming and or post failure diagnostics, characterization or even to warn/indicate to the user the remaining lifetime and capabilities of the part. One or more of the sensors could be active.

A suitable cloud platform (cloud infrastructure that includes security, data processing and management technologies, across standard communication infrastructure) can be used to assist in failure diagnostics and or preventative-maintenance. As part of the sensor module registration process, significant attributes of the module such as unique-identifying-code, unique-identifying-profile of the EOS monitors can be recorded and reported, and compared to the standard product profile for the given device/module application space. This process could be available to users or restricted to a manufacturer's failure analysis organizations or a royalty based system protection division.

Once the sensor/module is registered, the manufacturer can provide an additional cloud service to help customers determine the operating conditions of the part, and expected lifetime remaining. For example an automotive device could flag final operation in xweeks/days/hours/minutes, giving the user a period of time to replace the device before it disables itself.

Thus, the System A can advantageously capture near full life history of a core circuit in a part during use, from calibration to failure analysis.

Example: System B

The inventors have recognized that the performance or accuracy of an EOS sensor can be dependent on the material and operating temperature range of the part. It would be useful to capture and correlate out of band temperature events, for example, temperature spikes for a brief moment or long exposure to a temperature range below the activation level of the WOS material.

To address these and other needs, a system according to embodiments based on wear-out monitor devices include a combination of passive and active sensors. Using the combination, additional readings can be made while the part is powered. These reading can be used in conjunction with a wear out sensor reading to determine a more complete temperature profile of the system. In conjunction with a wake-up timer an actual profile could be captured and stored in NVM or communicated for external processing in a supervisor system and or a cloud infrastructure.

Thus, the System B can advantageously provide accurate temperature profile logging at a device level.

Example: System C

The inventors have recognized that, it can be advantageous to detect die-cloning and or tampering and or other unauthorized access to a device and its internal system code.

To address these and other needs, a sensor network according to embodiments include an EOS sensor configured to generate a unique source of entropy with a predictable diffusion progression based on the standard mission profile for the device. The system algorithm can detect if an attempt is made to inject a foreign decryption key to unlock system code or that a physical/electrical event (e.g. removing the cap of a device—large heat spike) has occurred that might indicate that someone is attempting to gain unauthorized access to the device. This information can be used to 'brick' the device or otherwise attempt to put the IP sensitive parts of the device beyond the reach of the attacker.

The combination of intrusion sensors and "bricking" a device can be a solution for IoT applications and embedded hardware solutions, as hacking organizations invest significant resources in gathering information on the device or devices they wish to attack. When possible, the hackers physically obtain target devices they wish to hack and attempt to reverse engineer the device and use it to test possible attacks.

Flagging potential hacks sometimes does not result in shutting off the device. In such applications where forcing a module shutdown can result in severe consequences (personnel health, machine health, security breaches), the preferred approach is to log an alert with the cloud platform. The cloud administrators can remotely deactivate the device.

Communicating with a hosted service, e.g., a cloud hosted service, can be through a variety of mechanisms.

For more advanced triage purposes, geo-location hardware and monitoring can establish if the module was in the expected operating location.

Such use of technology can also be applied to internal failure analysis, where expensive processes and resources can be replaced by analyzing the cloud data. There is potential to sell this "intrusion detection" module and cloud service to customers with more expensive hardware or where it is preferred to conduct failure analysis in situ.

Thus, the System C can advantageously detect intrusions and protect device/customer IP.

Example: System D

The inventors have recognized that it can be advantageous to secure IoT modules in the cloud.

To address this and other needs, a system is configured such that, at any given time, the WOS records a unique diffusion amount and under normal operation the value can be within operating bands or rates of change. This value can be used to generate cryptographically signed code at boot time and algorithms can determine if firmware has been altered due to reverse engineering, de-soldering etc. More advanced solutions can combine the intrusion monitor with geo-location positioning.

Securing traffic to and from the device can be increased through an initial registration process with the cloud where intrusion module parameters are recorded. Future communications will include these variables as a salt for encrypting the channel. In effect, there will be a way to securely communicate with each module through its own diffusion fingerprint.

Thus, the System D can advantageously be configured such that device encryption becomes non-operational if operating life specifications are exceeded.

Example Embodiments

1. An electrical overstress (EOS) monitor device, comprising:
an EOS monitor structure comprising a pair of conductive structures configured to electrically arc in response to an EOS event; and
a sensing circuit configured to detect a change in a physical property of the EOS monitor structure caused by the EOS event.

2. The EOS monitor device of Embodiment 1, wherein the EOS monitor structure further comprises a resistor connected electrically in series with one of the conductive structures, and wherein the change in the physical property of the EOS monitor structure comprises a change in the resistance of the resistor.

3. The EOS monitor device of Embodiment 2, wherein the resistor comprises a fuse, and the change in the resistance is caused by an open circuit formed by the fuse in response to the EOS event.

4. The EOS monitor device of Embodiments 2 or 3, wherein the sensing circuit is electrically connected to the one of the conductive structures, wherein a first current path through the one of the conductive structures and the resistor is electrically in parallel to a second current path through the one of the conductive structures and the sensing circuit.

5. The EOS monitor device of Embodiment 4, further comprising a blocking device formed between the at least one of the conductive structures and the sensing circuit, wherein the blocking device is configured such that the second current path has a higher resistance compared to the first current path.

6. The EOS monitor device of Embodiment 5, wherein the blocking device comprises a blocking resistor having a higher resistance relative to the resistor.

7. The EOS monitor device of Embodiments 5 or 6, wherein the blocking device comprises a blocking diode configured to be reverse-biased for positive current flowing from the one of the conductive structures to the sensing circuit.

8. The EOS monitor device of any one of Embodiments 1 to 7, wherein the change in the physical property of the EOS monitor structure comprises a change in a capacitance across the pair of conductive structures.

9. The EOS monitor device of Embodiment 8, wherein the EOS monitor structure is configured such that the change in capacitance is caused at least in part by a change in a gap distance across the pair of conductive structures.

10. The EOS monitor device of Embodiments 8 or 9, wherein the EOS monitor structure is configured such that the change in capacitance is caused at least in part by a change in a dielectric constant of a dielectric material between the pair of conductive structures.

11. The EOS monitor device of any one of Embodiments 1 to 10, wherein the change in the physical property of the EOS monitor structure comprises a change in leakage current across the pair of conductive structures.

12. The EOS monitor device of Embodiment 11, wherein the EOS monitor structure is such that the change in leakage current is caused at least in part by a change in a gap distance across the pair of conductive structures.

13. The EOS monitor device of Embodiments 11 or 12, wherein the EOS monitor structure is such that the change in leakage current is caused at least in part by a change in a dielectric material between the pair of conductive structures.

14. The EOS monitor device of any one of Embodiments 1 to 13, wherein the change in the physical property of the EOS monitor structure comprises a change in optical transmissivity of a material in a gap between the pair of conductive structures.

15. The EOS monitor device of Embodiment 14, wherein the sensing circuit comprises a photodetector optically coupled to a light source for measuring the change in the optical transmissivity.

16. The EOS monitor device of any one of Embodiments 1 to 15, wherein the pair of conductive structures serves as a cathode-anode pair during arcing, wherein one or both of the pair of conductive structures comprises one or more protrusions.

17. The EOS monitor device of Embodiment 16, wherein one but not the other of the conductive structures of the pair comprises the one or more protrusions.

18. The EOS monitor device of Embodiment 17, wherein one or both of the pair of conductive structures comprise a substantially straight edge.

19. The EOS monitor device of Embodiment 18, wherein one of the conductive structures comprises a plurality of protrusions, wherein gap distances between different ones of the protrusions and the substantially straight edge are different.

20. The EOS monitor device of Embodiment 18, wherein the other of the pair of conductive structures comprises a conductive line configured to be reduced in width upon passing current therethrough, such that a gap distance between the pair of conductive structures is tunable.

21. The EOS monitor device of any one of Embodiments 1 to 20, wherein the EOS monitor structure comprises a plurality of vertically stacked pairs of conductive structures, wherein each of the stacked pairs serve as a cathode-anode pair during arcing.

22. The EOS monitor device of Embodiment 21, wherein at least one of the conductive structures of each of the pairs of conductive structures comprise one or more protrusions.

23. The EOS monitor device of Embodiment 22, wherein at least one of the conductive structures of different pairs of conductive structures comprise different protrusions configured to arc under different conditions.

24. The EOS monitor device of any one of Embodiments 1 to 23, wherein the EOS monitor structure comprises a first conductive structure serving as one of a cathode or an anode during arcing, and one or more second conductive structures serving as the other of the cathode or the anode during arcing.

25. The EOS monitor device of Embodiment 24, wherein the first conductive structure is separated from a plurality of second conductive structures by different gap distances, thereby forming different spark gaps configured to arc under different conditions.

26. The EOS monitor device of Embodiment 25, wherein the first conductive structure is laterally surrounded by a plurality of second conductive structures.

27. The EOS monitor device of Embodiment 24, wherein the first conductive structure comprises a conductive line and each of the second conductive structure comprises a plurality of protrusions forming a plurality of spark gaps.

28. The EOS monitor device of Embodiment 27, wherein the first conductive structure is interposed by two second conductive structures.

29. The EOS monitor device of Embodiment 28, wherein the first conductive structure comprises a plurality of protrusions.

30. The EOS monitor device of Embodiment 27, wherein the protrusions of the two second conductive structures are different.

31. The EOS monitor device of any one of Embodiments 1 to 30, wherein the EOS monitor structure comprises a first conductive structure and a second conductive structure at least partly laterally surrounding the first conductive structure.

32. The EOS monitor device of Embodiment 31, wherein at least one of the first conductive structure and the second conductive structure comprises one or more protrusions that form the one or more spark gap structures.

33. The EOS monitor device of any one of Embodiments 1 to 32, wherein the pair of conductive structures is interposed by an arcing medium.

34. The EOS monitor device of Embodiment 33, wherein the pair of conductive structures are formed in a dielectric material different from the arcing medium, and wherein the arcing medium is formed in a cavity formed in the dielectric material.

35. The EOS monitor device of Embodiments 33 or 34, wherein the EOS monitor structure comprises a plurality of pairs of conductive structures serving as anode-cathode pairs during arcing, wherein different pairs of conductive structures are interposed by different arcing media.

36. The EOS monitor device of Embodiments 33 or 34, wherein at least one of the conductive structures comprises a plurality of protrusions, and wherein different arcing media are formed adjacent to different protrusions.

37. The EOS monitor device of any one of Embodiments 33 to 36, wherein the arcing media comprises one or more of vacuum, a gas, a liquid and a solid dielectric.

38. The EOS monitor device of any one of Embodiments 1 to 37, wherein the EOS monitor structure is formed as part of an integrated circuit device.

39. The EOS monitor device of any one of Embodiments 1 to 38, wherein the EOS monitor structure is formed as part of a metallization level of the integrated circuit device.

40. The EOS monitor device of any one of Embodiments 1 to 39, wherein the EOS monitor structure comprises a partial conductive via formed between two metal layers, wherein the partial conductive via contacts one of the two metal layers at a first end while being separated from the other of the two metal layers at a second end.

41. The EOS monitor device of any one of Embodiments 1 to 38, wherein one of the pair of conductive structures comprises a doped region in a semiconductor substrate that is doped heavier relative to the semiconductor substrate, and the other of the pair of conductive structures comprises a conductive plug structure formed above the doped region, wherein the doped region and the conductive plug structure is interposed by a dielectric layer serving as an arcing medium.

42. The EOS monitor device of any one of Embodiments 1 to 38, wherein one of the pair of conductive structures comprises a conductive layer and the other of the pair of conductive structures comprises a conductive plug structure formed above the conductive layer, wherein the conductive layer and the conductive plug structure is interposed by a dielectric layer serving as an arcing medium.

43. The EOS monitor device of any one of Embodiments 1 to 38, wherein the one or more spark gap structures comprise a pair of metal layers laterally separated by void, wherein the pair of metal layers is formed vertically between dielectric layers.

44. The EOS monitor device of any one of Embodiments 1 to 43, wherein the sensing circuit is integrated as part of the integrated circuit device.

45. An integrated electrical overstress (EOS) monitor/protection device comprising a pair of conductive structures configured to electrically arc in response to an EOS event at a trigger voltage less than about 100V, wherein the pair of conductive structures are integrated on a semiconductor substrate and separated by a dielectric layer serving as an arcing medium.

46. The integrated electrical overstress (EOS) monitor/protection device of Embodiment 45, wherein one of the pair of conductive structures comprises a doped region in the semiconductor substrate that is doped heavier relative to the semiconductor substrate, and the other of the conductive structures comprises a conducting via structure formed above the doped region, wherein the doped region and the other of the conductive structures are directly interposed by the dielectric layer.

47. The integrated electrical overstress (EOS) monitor/protection device of Embodiment 46, wherein a doping concentration of the doped region, a work function of the conducting via structure and the thickness of the dielectric layer and the barrier height of the dielectric layer is such that the dielectric layer breaks down at a voltage less than about 100V.

48. The integrated electrical overstress (EOS) monitor/protection device of Embodiments 46 or 47, wherein the conducting via structure comprises a via structure formed through a second dielectric layer formed over the dielectric layer.

49. The integrated electrical overstress (EOS) monitor/protection device of any one of Embodiments 46 to 48, wherein the doped region and the conducting via structure is interposed by a plurality of dielectric layers.

50. The integrated electrical overstress (EOS) monitor/protection device of Embodiment 45, wherein one of the pair of conductive structures comprises a metal layer formed over the substrate and a conducting via structure formed above the conductive layer, wherein the metal layer and the conducting via structure is interposed by a dielectric layer.

51. The integrated electrical overstress (EOS) monitor/protection device of Embodiment 50, wherein a work function of the metal layer, a work function of the via structure and the thickness of the dielectric layer and the barrier height of the dielectric layer is such that the trigger voltage is less than about 100V.

52. The integrated electrical overstress (EOS) monitor/protection device of Embodiments 50 or 51, wherein the via structure is formed through a second dielectric layer formed over the dielectric layer.

53. The integrated electrical overstress (EOS) monitor/protection device comprising a pair of conductive structures configured to electrically arc in response to an EOS event, wherein the pair of conductive structures comprise a pair of metal layers laterally separated by volume of arcing medium, wherein the pair of metal layers are formed vertically between dielectric layers.

54. The integrated electrical overstress (EOS) monitor/protection device of Embodiment 53, wherein the arcing medium comprises one or more of vacuum, a gas, a liquid and a solid dielectric.

55. The integrated electrical overstress (EOS) monitor/protection device of Embodiment 53, wherein the volume is a fully enclosed volume of the arcing medium.

56. The integrated electrical overstress (EOS) monitor/protection device of any one of Embodiments 45 to 55, wherein the pair of conductive structures serves as an electrical overstress (EOS) monitor device.

57. The integrated electrical overstress (EOS) monitor/protection device of any one of Embodiments 45 to 56, wherein the pair of conductive structures serves as an EOS protection device.

58. The integrated electrical overstress (EOS) monitor/protection device of Embodiment 57, further comprising a semiconductor-based EOS protection device connected electrically in parallel to the one or more spark gap structures.

59. An apparatus comprising a pair of conductive structures serving as a cathode-anode pair configured to electrically arc in response to an EOS event, the apparatus further comprising an integrated fuse serially connected to the pair of conductive structures.

60. An apparatus comprising a pair of conductive structures serving as a cathode-anode pair configured to electrically arc in response to an EOS event, wherein one but not the other of the conductive structure of the pair comprises a plurality of protrusions.

61. An apparatus comprising a pair of conductive structures serving as a cathode-anode pair configured to electrically arc in response to an EOS event, wherein at least one of the conductive structures comprises a straight edge facing the other of the conductive structures.

62. An apparatus comprising a pair of conductive structures serving as a cathode-anode pair configured to electrically arc in response to an EOS event, wherein one of the pair of conductive structures comprises a conductive line configured to be reduced in width upon passing current therethrough.

63. An apparatus comprising a pair of conductive structures serving as a cathode-anode pair configured to electrically arc in response to an EOS event, wherein one or both of the conductive structures are configured to be positionally displaced relative to one another such that a distance between the conductive structures is variable.

64. An apparatus comprising a pair of conductive structures serving as a cathode-anode pair configured to electrically arc in response to an EOS event, wherein the conductive structures comprise a first conductive structure serving as one of a cathode or an anode during arcing, and a plurality of second conductive structures laterally surrounding the first conductive structure and serving as the other of the cathode or the anode.

65. An apparatus comprising a plurality of pairs of conductive structures serving as cathode-anode pairs configured to electrically arc in response to an EOS event, wherein different pairs of conductive structures are interposed by different arcing media, such that the different pairs are configured to arc under different conditions.

66. An apparatus comprising a plurality of pairs of conductive structures vertically stacked over a substrate, wherein each of the pairs of serves as a cathode-anode pair configured to electrically arc in response to an EOS event.

67. An apparatus comprising a pair of conductive structures serving as a cathode-anode pair configured to electrically arc in response to an EOS event, wherein the pair of conductive structures comprises a partial conductive via formed between two metal layers, wherein the partial conductive via contacts one of the two metal layers at a first end while being separated from the other of the two metal layers at a second end.

68. An apparatus comprising a pair of conductive structures serving as cathode-anode pair configured to electrically arc in response to an EOS event, wherein the pair of conductive structures comprises a doped region in a semiconductor substrate that is doped heavier relative to a semiconductor substrate, the doped region serving as one of a cathode or an anode during arcing, and a conductive structure formed above the doped region serving as the other of the cathode or the anode during arcing, wherein the doped region and the conductive structure are interposed by a dielectric layer.

69. An apparatus comprising a conductive layer formed over the substrate serving as one of a cathode or an anode during arcing and a conductive structure formed above the conductive layer serving as the other of the cathode or the anode during arcing, wherein the conductive layer and the conductive structure is interposed by a dielectric layer.

70. An apparatus comprising a pair of metal layers laterally separated by void serving as a cathode-anode pair configured to electrically arc in response to an EOS event, wherein the pair of metal layers are formed vertically between dielectric layers.

71. An apparatus comprising a plurality of pairs of conductive structures serving as cathode-anode pairs configured to electrically arc in response to an EOS event, wherein the pairs of conductive structures comprise first conductive structure serving as one of a cathode or an anode during arcing, and a plurality of second conductive structures serving as the other of the cathode or the anode during arcing.

72. An apparatus comprising a pair of conductive structures serving as a cathode-anode pair configured to electrically arc in response to an EOS event, wherein the apparatus further comprises a fuse connected electrically in series to one of the conductive structures, and wherein the apparatus further comprises a blocking device formed between the one of the conductive structures and a sensing circuit, wherein the blocking device is configured such that a current path through the blocking device is a higher resistance path relative to a current path through the fuse.

73. An apparatus comprising a plurality of pairs of conductive structures serving as cathode-anode pairs configured to electrically arc in response to an EOS event, wherein the pairs of conductive structures are isolated from each other by a tub isolation comprising a buried doped layer formed in a substrate.

74. An apparatus comprising a pair of conductive structures serving as a cathode-anode pair configured to electrically arc in response to an EOS event, and further comprising one or more fuses serially connected to the pair of conductive structures, wherein the one or more fuses comprise one or more of a thin film fuse, a polysilicon fuse and a metal fuse.

75. An apparatus comprising a pair of conductive structures serving as a cathode-anode pair configured to electrically arc in response to an EOS event, and further comprising one or more electrically floating metal layers above or below the pair of conductive structures and at least partially laterally overlapping with the one or more electrically floating metal layers.

76. An apparatus comprising a pair of conductive structures serving as a cathode-anode pair configured to electrically arc in response to an EOS event, and further comprising a second pair of conductive structures separated by a gap, wherein the second pair of conductive structures are electrically floating and are formed above or below the pair of conductive structures.

77. An apparatus comprising a pair of conductive structures serving as a cathode-anode pair configured to electrically arc in response to an EOS event, and further comprising an electrically floating array of vias connected to a common electrically floating metal layer formed above or below the pair of conductive structures.

78. An apparatus comprising a pair of conductive structures serving as a cathode-anode pair configured to electrically arc in response to an EOS event, and further comprising one or more electrically floating vias formed above or below one or both of the conductive structures of the pair of conductive structures.

79. An apparatus comprising a pair of conductive structures serving as a cathode-anode pair configured to electrically arc in response to an EOS event, and further comprises a semiconductor-based EOS protection device electrically connected in parallel to the pair of conductive structures, wherein the semiconductor-based EOS protection device and the pair of conductive structures are configured such that in response to the EOS event sufficient to trigger both the semiconductor-based EOS protection device and the pair of conductive structures, the semiconductor EOS protection device temporally triggers before the pair of conductive structures.

80. An electrical overstress (EOS) monitor/protection device, comprising:
two different conductive structures separated by a gap therebetween and configured to electrically arc in response to an EOS event, wherein facing surfaces of the two conductive structures have different shapes; and
a sensing circuit configured to detect a change in physical property of EOS monitor/protection device caused by the EOS event.

81. The EOS monitor/protection device of Embodiment 80, wherein one but not the other of the two conductive structures comprises one or more tips protruding towards the other of the two conductive structures.

82. The EOS monitor/protection device of Embodiment 80, wherein one of the two conductive structures comprises a substantially straight edge facing the other of the two conductive structures.

83. The EOS monitor/protection device of Embodiment 82, wherein the one of the two conductive structures comprise a conductive line extending in a direction orthogonal to a direction of separation of the two conductive structures.

84. The EOS monitor/protection device of Embodiment 83, wherein the conductive line is configured to be reduced in width upon passing current therethrough, thereby increasing a distance of the gap.

85. The EOS monitor/protection device of Embodiment 80, wherein one of the two conductive structures at least partly laterally surrounds the other of the two conductive structures.

86. The EOS monitor/protection device of Embodiment 80, wherein one or both of the two conductive structures are configured to be positionally displaced relative to one another post-fabrication such that a distance of the gap is tunable.

87. The EOS monitor/protection device of Embodiment 80, wherein the gap comprises an arcing medium comprising a solid dielectric.

88. The EOS monitor/protection device of Embodiment 80, further comprising an integrated fuse serially connected to the two conductive structures.

89. The EOS monitor/protection device of Embodiment 80, wherein one of the two conductive structures comprises a partial conductive via contacting a first metal layers at a first end while being separated from the other of the two conductive structures comprising a second metal layers at a second end.

90. The EOS monitor/protection device of Embodiment 80, wherein the two conductive structures is configured to electrically arc in response to the EOS event at a trigger voltage less than about 100V.

91. The EOS monitor/protection device of Embodiment 80, wherein the facing surfaces of the two conductive structures comprise surfaces of the two conductive structures that are closest to each other.

92. The EOS monitor/protection device of Embodiment 80, wherein the facing surfaces of the two conductive structures have different shapes prior to arcing in response to the EOS event.

93. The EOS monitor/protection device of Embodiment 80, wherein the facing surfaces of the two conductive structures have different shapes when the gap is viewed in one or both of a top down view in a direction perpendicular to a major substrate surface and a side view in a direction parallel to the major substrate surface.

94. An electrical overstress (EOS) monitor/protection device comprising a pair of conductive structures configured to electrically arc in response to an EOS event at a trigger voltage less than about 100V, wherein the pair of conductive structures are integrated on a semiconductor substrate and separated by a dielectric layer serving as an arcing medium.

95. The EOS monitor/protection device of Embodiment 94, wherein facing surfaces of conductive structures of the pair have different shapes.

96. The EOS monitor/protection device of Embodiment 94, further comprising a sensing circuit configured to detect a change in physical property of EOS monitor/protection device caused by the EOS event.

97. The EOS monitor/protection device of Embodiment 94, wherein one of the pair of conductive structures comprises a doped region in the semiconductor substrate that is doped heavier relative to the semiconductor substrate, and wherein the other of the pair of conductive structures comprises a conducting via structure laterally overlapping the doped region.

98. The EOS monitor/protection device of Embodiment 97, wherein the conducting via structure comprises a work function tuning metal lining a via formed through a second dielectric layer formed over the dielectric layer and a filler metal filling a remaining volume of the via.

99. The EOS monitor/protection device of Embodiment 97, wherein the doped region and the conducting via structure are interposed by a stack of different dielectric layers serving as the arcing medium.

100. The EOS monitor/protection device of Embodiment 97, wherein one of the pair of conductive structures comprises a metal layer formed over the semiconductor substrate, and wherein the other of the pair of conductive structures comprises a conducting via structure laterally overlapping the doped region.

101. The EOS monitor/protection device of Embodiment 94, wherein the trigger voltage is less than about 10V.

102. An electrical overstress (EOS) monitor/protection device, comprising:
a pair of conductive structures configured to electrically arc in response to an EOS event;
a fuse electrically connected to one of the conductive structures;
a blocking device electrically connected to the one of the conductive structures and configured such that a greater amount of current flows through the fuse relative to the blocking device in response to the EOS event.

103. The EOS monitor/protection device of Embodiment 102, wherein the blocking device comprises a blocking resistor having a higher resistance relative to the fuse.

104. The EOS monitor/protection device of Embodiment 102, wherein the blocking device comprises blocking diode configured to be reverse-biased in response to the EOS event.

105. The EOS monitor/protection device of Embodiment 102, further comprising a semiconductor-based electrostatic discharge (ESD) device electrically connected in parallel to the pair of conductive structures and the fuse.

106. The EOS monitor/protection device of Embodiment 105, wherein the ESD device is configured to trigger at a lower voltage relative to the pair of conductive structures.

107. The EOS monitor/protection device of Embodiment 102, wherein facing surfaces of the conductive structures of the pair have different shapes.

108. The EOS monitor/protection device of Embodiment 102, further comprising a sensing circuit connected to the blocking device and configured to detect a change in physical property of EOS monitor/protection device caused by the EOS event.

109. The EOS monitor/protection device of Embodiment 102, wherein the pair of conductive structures is configured to electrically arc in response to the EOS event at a trigger voltage less than about 100V.

110. An electrical overstress (EOS) monitor/protection device, comprising:
two conductive structures separated by a gap therebetween and configured to electrically arc in response to an EOS event, wherein facing surfaces of the two conductive structures comprise straight edges that extend in a direction orthogonal to a direction of shortest separation between the conductive structures; and
a sensing circuit configured to detect a change in a physical property of the EOS monitor/protection device caused by the EOS event.

111. The EOS monitor/protection device of Embodiment 110, further comprising a fuse serially connected to one of the two conductive structures, and wherein the sensing circuit is configured to detect an electrical open circuit formed in the fuse by the EOS event.

112. The EOS monitor/protection device of Embodiment 110, wherein the change in the physical property includes a change in one or more of a capacitance between the two conductive structures, a leakage current across the two conductive structures and a visual change of an arching medium in the gap.

113. The EOS monitor device according to any one of Embodiments 1-44, the EOS monitor/protection device according to any one of Embodiments 44-58 and 80-112, or the apparatus according to any one of Embodiments 59-79, further comprising a hybrid fuse serially connected to one of the conductive structures, wherein the hybrid fuse comprises a thin film/polycrystalline silicon fuse in electrical series with a metal fuse.

114. An electrical overstress (EOS) monitor/protection device, comprising:
two conductive structures separated by a gap therebetween and configured to electrically arc in response to an EOS event, wherein the two conductive structures are formed at a first metallization level; and a barrier structure formed at one or both of a second metallization and a third metallization that are metallization levels immediately adjacent to the first metallization level, wherein the barrier structure is configured to suppress formation or propagation of a crack caused the EOS event.

115. The EOS monitor/protection device of Embodiment 114, wherein the barrier structure comprises a pair of laterally adjacent plates separated by a gap therebetween, wherein the gap between the pair of plates is wider than a gap between the two conductive structures.

116. The EOS monitor/protection device of Embodiments 114 or 115, wherein the barrier structure is electrically floating.

CONCLUSION

In the embodiments described above, apparatus, systems, and methods for sensing electrical overstress events are described in connection with particular embodiments. It will be understood, however, that the principles and advantages of the embodiments can be used for any other systems, apparatus, or methods with a need for sensing and/or protecting against electrical overstress events.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog to digital converts, amplifiers, rectifiers, programmable filters, attenuators, variable frequency circuits, etc. Examples of the electronic devices can also include memory chips, memory modules, circuits of optical networks or other communication networks, and disk driver circuits. Consumer electronic products can include, but are not limited to, wireless devices, a mobile phone (for example, a smart phone), cellular base stations, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a wrist watch, a smart watch, a clock, a wearable health monitoring device, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An electrical overstress (EOS) monitor/protection device, comprising:
   two different conductive structures separated by a gap therebetween and configured to electrically arc in response to an EOS event, wherein the two conductive structures are lithographically defined using a semiconductor fabrication technology, and wherein arcing surfaces of the two conductive structures that face each other have different shapes; and
   a sensing circuit configured to detect a change in physical property of the EOS monitor/protection device caused by the EOS event.

2. The EOS monitor/protection device of claim 1, wherein one but not the other of the two conductive structures comprises one or more tips protruding towards the other of the two conductive structures.

3. The EOS monitor/protection device of claim 1, wherein one of the two conductive structures comprises a substantially straight edge facing the other of the two conductive structures.

4. The EOS monitor/protection device of claim 3, wherein the one of the two conductive structures comprises a conductive line extending in a direction orthogonal to a direction of separation of the two conductive structures.

5. The EOS monitor/protection device of claim 4, wherein the conductive line is configured to be reduced in width upon passing current therethrough, thereby increasing a distance of the gap.

6. The EOS monitor/protection device of claim 1, wherein one of the two conductive structures at least partly laterally surrounds the other of the two conductive structures.

7. The EOS monitor/protection device of claim 1, wherein one or both of the two conductive structures are configured to be positionally displaced relative to one another post-fabrication such that a distance of the gap is tunable.

8. The EOS monitor/protection device of claim 1, wherein the gap comprises an arcing medium comprising a solid dielectric.

9. The EOS monitor/protection device of claim 1, further comprising an integrated fuse serially connected to the two conductive structures.

10. The EOS monitor/protection device of claim 1, wherein one of the two conductive structures comprises a partial conductive via contacting a first metal layer at a first end while being separated from the other of the two conductive structures comprising a second metal layer at a second end.

11. The EOS monitor/protection device of claim 1, wherein the two conductive structures is configured to electrically arc in response to the EOS event at a trigger voltage less than about 100V.

12. The EOS monitor/protection device of claim 1, wherein the arcing surfaces of the two conductive structures have different shapes prior to arcing in response to the EOS event.

13. The EOS monitor/protection device of claim 1, wherein the arcing surfaces of the two conductive structures have different shapes when the gap is viewed in one or both of a top down view in a direction perpendicular to a major substrate surface and a side view in a direction parallel to the major substrate surface.

14. An electrical overstress (EOS) monitor/protection device comprising a pair of conductive structures that are separated by a deposited dielectric layer serving as an arcing medium and are configured to electrically arc in response to an EOS event, wherein the pair of conductive structures are lithographically defined using a semiconductor fabrication technology and integrated on a semiconductor substrate.

15. The EOS monitor/protection device of claim 14, wherein arcing surfaces of the pair of conductive structures that face each other have different shapes.

16. The EOS monitor/protection device of claim 14, further comprising a sensing circuit configured to detect a change in a physical property of EOS monitor/protection device caused by the EOS event.

17. An electrical overstress (EOS) monitor/protection device comprising a pair of conductive structures configured to electrically arc in response to an EOS event, wherein the pair of conductive structures are integrated on a semiconductor substrate and separated by a dielectric layer serving as an arcing medium, wherein one of the pair of conductive structures comprises a doped region in the semiconductor substrate that is doped heavier relative to an adjacent region in the semiconductor substrate, and wherein the other of the pair of conductive structures comprises a conducting via structure laterally overlapping the doped region.

18. The EOS monitor/protection device of claim 17, wherein the conducting via structure comprises a work function tuning metal lining a via formed through a second dielectric layer formed over the dielectric layer and a filler metal filling a remaining volume of the via.

19. The EOS monitor/protection device of claim 17, wherein the doped region and the conducting via structure are interposed by a stack of different dielectric layers serving as the arcing medium.

20. The EOS monitor/protection device of claim 17, wherein one of the pair of conductive structures comprises a metal layer formed over the semiconductor substrate, and wherein the other of the pair of conductive structures comprises a conducting via structure laterally overlapping the doped region.

\* \* \* \* \*